(12) United States Patent
Hamaguchi et al.

(10) Patent No.: US 12,334,706 B2
(45) Date of Patent: Jun. 17, 2025

(54) LIGHT EMITTING ELEMENT, LIGHT EMITTING ELEMENT ARRAY, AND METHOD OF MANUFACTURING LIGHT EMITTING ELEMENT ARRAY

(71) Applicant: SONY GROUP CORPORATION, Tokyo (JP)

(72) Inventors: Tatsushi Hamaguchi, Tokyo (JP); Kentaro Hayashi, Tokyo (JP); Masamichi Ito, Tokyo (JP); Mikihiro Yokozeki, Tokyo (JP); Rintaro Koda, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 812 days.

(21) Appl. No.: 17/613,816

(22) PCT Filed: May 25, 2020

(86) PCT No.: PCT/JP2020/020451
§ 371 (c)(1),
(2) Date: Nov. 23, 2021

(87) PCT Pub. No.: WO2020/246280
PCT Pub. Date: Dec. 10, 2020

(65) Prior Publication Data
US 2022/0247149 A1    Aug. 4, 2022

(30) Foreign Application Priority Data

Jun. 4, 2019  (JP) .................................. 2019-104380
May 12, 2020  (JP) .................................. 2020-083889

(51) Int. Cl.
*H01S 5/02* (2006.01)
*H01S 5/42* (2006.01)

(52) U.S. Cl.
CPC ............ *H01S 5/0207* (2013.01); *H01S 5/423* (2013.01)

(58) Field of Classification Search
None
See application file for complete search history.

(56) References Cited

U.S. PATENT DOCUMENTS 5,309,468 A    5/1994  Makiuchi
5,981,975 A   11/1999  Imhoff
(Continued)

FOREIGN PATENT DOCUMENTS

CN    101305309 A    11/2008
CN    103181040 A     6/2013
(Continued)

OTHER PUBLICATIONS

International Search Report and Written Opinion of PCT Application No. PCT/JP2020/020451, issued on Jul. 28, 2020, 11 pages of ISRWO.

*Primary Examiner* — Tuan N Nguyen
(74) *Attorney, Agent, or Firm* — CHIP LAW GROUP

(57) ABSTRACT

A light emitting element array includes a plurality of light emitting elements 10A arranged. Each light emitting element 10A includes: a stacked structure 20 including a stack of a first compound semiconductor layer 21 having a first surface 21a and a second surface 21b, an active layer 23 facing the second surface 21b of the first compound semiconductor layer 21, and a second compound semiconductor layer 22 having a first surface 22a and a second surface 22b; a first light reflection layer 41 formed on a base part surface 90 located on a first surface side of the first compound semiconductor layer 21; and a second light reflection layer 42 formed on a second surface side of the second compound semiconductor layer 22 and having a flat shape. The base part surface 90 extends to a peripheral region 99 surrounded (Continued)

by the plurality of light emitting elements. The base part surface 90 has a concavo-convex shape, and is differentiable.

22 Claims, 68 Drawing Sheets

(56) References Cited

U.S. PATENT DOCUMENTS

| | | | |
|---|---|---|---|
| 6,353,502 | B1 | 3/2002 | Marchant |
| 2002/0186737 | A1 | 12/2002 | Marion |
| 2008/0158683 | A1 | 7/2008 | Yun |
| 2009/0244713 | A1 | 10/2009 | Kodera et al. |
| 2009/0296222 | A1 | 12/2009 | Ganser et al. |
| 2013/0223466 | A1 | 8/2013 | Gronenborn et al. |
| 2019/0267774 | A1 | 8/2019 | Sato et al. |
| 2020/0028325 | A1 | 1/2020 | Mitomo et al. |

FOREIGN PATENT DOCUMENTS

| | | | | |
|---|---|---|---|---|
| CN | 109923742 | A | 6/2019 | |
| CN | 110785901 | A | 2/2020 | |
| CN | 110892597 | A | 3/2020 | |
| DE | 112018003684 | T5 | 5/2020 | |
| EP | 1257027 | A1 | 11/2002 | |
| EP | 3447862 | A1 | 2/2019 | |
| EP | 3561553 | A1 | 10/2019 | |
| EP | 3611811 | A1 | 2/2020 | |
| FR | 2824188 | A1 | 10/2002 | |
| JP | H07506220 | A | 7/1995 | |
| JP | 2002048903 | A | 2/2002 | |
| JP | 2002237653 | A | 8/2002 | |
| JP | 2002-374045 | A | 12/2002 | |
| JP | 2003262706 | A | 9/2003 | |
| JP | 2004526194 | A | 8/2004 | |
| JP | 2006066538 | A | 3/2006 | |
| JP | 2008-083685 | A | 4/2008 | |
| JP | 2009-510496 | A | 3/2009 | |
| JP | 2013-541854 | A | 11/2013 | |
| KR | 10-2009-0047495 | | 5/2009 | |
| KR | 10-2012-0134495 | A | 12/2012 | |
| WO | 2007/038954 | A1 | 4/2007 | |
| WO | 2008/026490 | A1 | 3/2008 | |
| WO | 2012/059864 | A1 | 5/2012 | |
| WO | WO-2018083877 | A1 * | 5/2018 | ........... H01S 5/0267 |
| WO | WO-2018139877 | A1 | 8/2018 | |
| WO | 2018/190030 | A1 | 10/2018 | |
| WO | WO-2018221042 | A1 | 12/2018 | |
| WO | 2019/003627 | A1 | 1/2019 | |
| WO | 2019/017044 | A1 | 1/2019 | |
| WO | 2019/038365 | A1 | 2/2019 | |

* cited by examiner

FIG. 24A
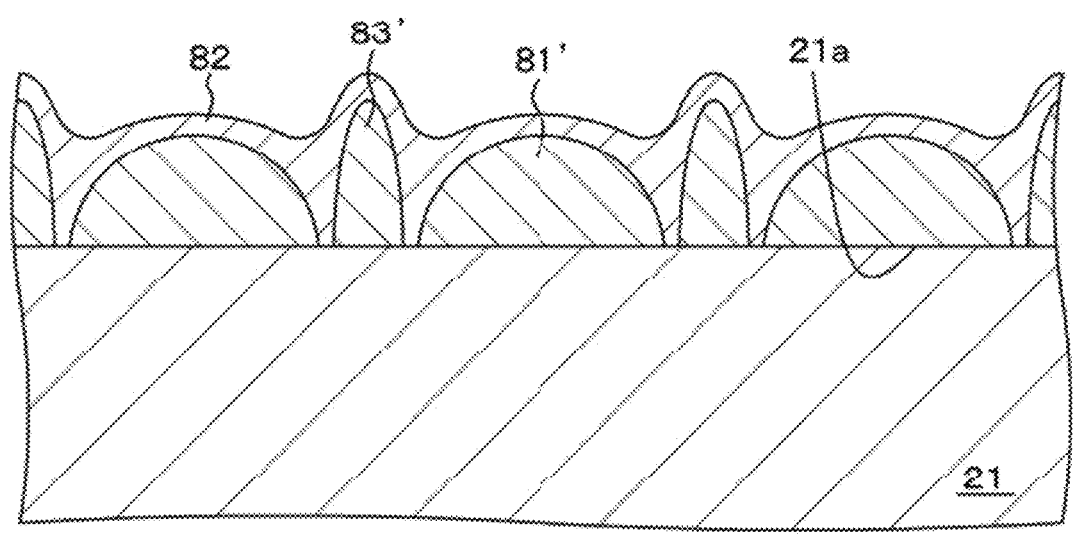
FIG. 24B
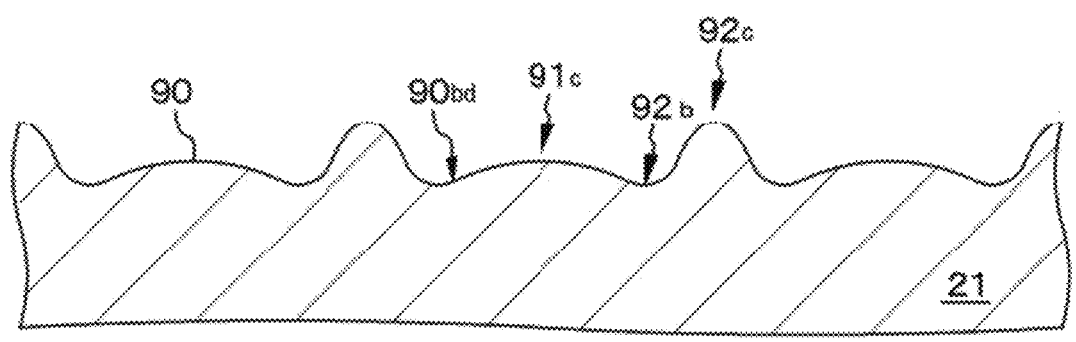
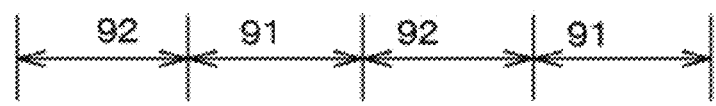

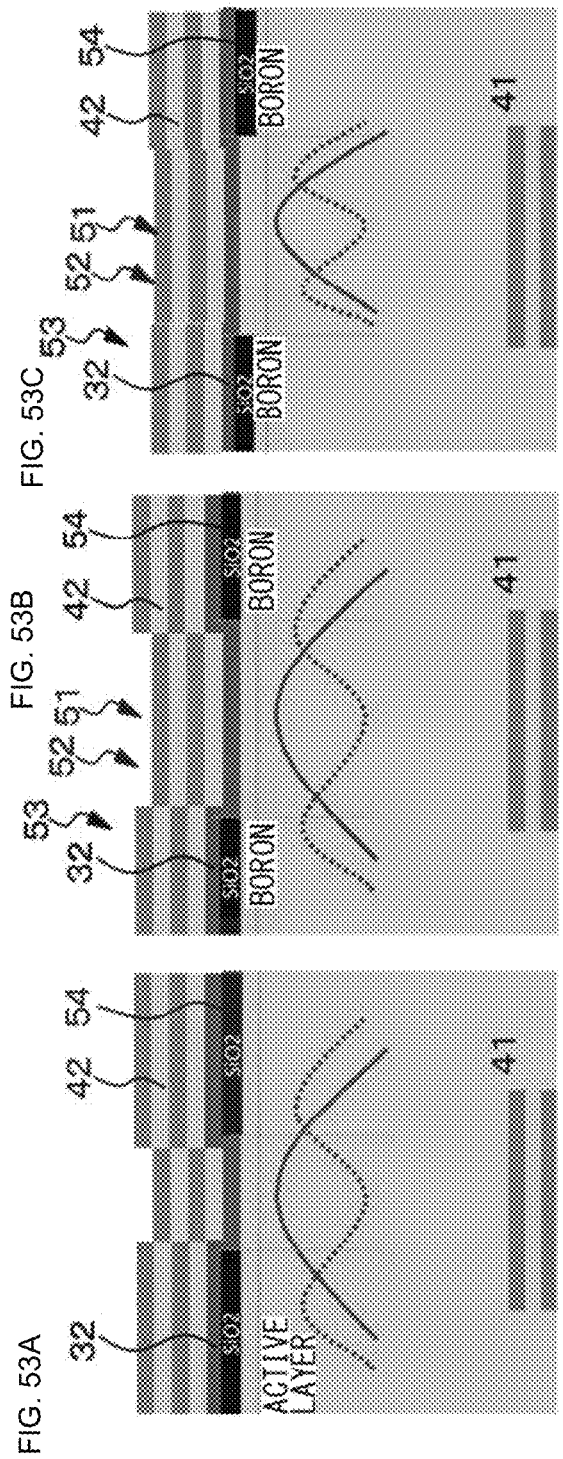

[FIRST LIGHT REFLECTION LAYER]

[FIRST LIGHT REFLECTION LAYER]

LIGHT EMITTING ELEMENT, LIGHT EMITTING ELEMENT ARRAY, AND METHOD OF MANUFACTURING LIGHT EMITTING ELEMENT ARRAY

CROSS REFERENCE TO RELATED APPLICATIONS

This application is a U.S. National Phase of International Patent Application No. PCT/JP2020/020451 filed on May 25, 2020, which claims priority benefit of Japanese Patent Application No. JP 2019-104380 filed in the Japan Patent Office on Jun. 4, 2019 and Japanese Patent Application No. JP 2020-083889 filed in the Japan Patent Office on May 12, 2020. Each of the above-referenced applications is hereby incorporated herein by reference in its entirety.

TECHNICAL FIELD

The present disclosure relates to a light emitting element, a light emitting element array, and a method of manufacturing a light emitting element array.

BACKGROUND ART

In a light emitting element including a surface emitting laser element (VCSEL), typically, laser light is resonated between two light reflection layers (Distributed Bragg Reflector layers, DBR layers) to thereby generate laser oscillation. In addition, in a surface emitting laser element having a stacked structure in which an n-type compound semiconductor layer (a first compound semiconductor layer), an active layer (a light emitting layer) including a compound semiconductor, and a p-type compound semiconductor layer (a second compound semiconductor layer) are stacked, typically, a second electrode including a transparent electrically-conductive material is formed on the p-type compound semiconductor layer, and a second light reflection layer including a stacked structure of an insulating material is formed on the second electrode. Further, a first light reflection layer including a stacked structure of an insulating material, and a first electrode are formed on the n-type compound semiconductor layer (in a case where the n-type compound semiconductor layer is formed on an electrically-conductive substrate, on an exposed surface of the substrate).

A structure in which the first light reflection layer also functions as a concave mirror is disclosed in, for example, WO2018/083877A1. Here, in the technique disclosed in this International Publication, for example, an n-type compound semiconductor layer is provided with a convex part with respect to an active layer, and a first light reflection layer is formed on the convex part.

CITATION LIST

Patent Literature

PTL 1: WO2018/083877A1

SUMMARY OF THE INVENTION

Problems to be Solved by the Invention

Incidentally, in the technique disclosed in this International Publication, as a schematic partial end view is illustrated in FIG. 67, a convex part 21' rises from a flat first compound semiconductor layer 21. Note that the rising portion of the convex part is indicated by an arrow "A" in FIG. 67. In addition, regarding reference numerals in FIG. 67, description will be given in Examples. Thus, in a case where an external force is applied to the light emitting element for some reason, stress is concentrated on the rising portion of the convex part, and this can cause damage to the first compound semiconductor layer and the like.

Accordingly, it is an object of the present disclosure to provide a light emitting element having a configuration or structure that is resistant to damage even under an external force applied thereto, a light emitting element array including such a light emitting element, and a method of manufacturing the light emitting element array including such a light emitting element.

Means for Solving the Problems

A light emitting element array according to each of first and second aspects of the present disclosure for achieving the above object includes a plurality of light emitting elements arranged.

Each of the light emitting elements includes:
a stacked structure including a stack of
  a first compound semiconductor layer having a first surface, and a second surface opposed to the first surface,
  an active layer facing the second surface of the first compound semiconductor layer, and
  a second compound semiconductor layer having a first surface facing the active layer and a second surface opposed to the first surface;
a first light reflection layer formed on a base part surface located on a first surface side of the first compound semiconductor layer; and
a second light reflection layer formed on a second surface side of the second compound semiconductor layer and having a flat shape.

In addition, in the light emitting element array according to the first aspect of the present disclosure,
the base part surface extends to a peripheral region surrounded by the plurality of light emitting elements, and
the base part surface has a concavo-convex shape, and is differentiable.

Further, in the light emitting element array according to the second aspect of the present disclosure,
when a portion of the base part surface on which the first light reflection layer is formed is referred to as a first portion of the base part surface and a portion of the base part surface extending from a part of the first portion of the base part surface is referred to as a second portion of the base part surface, and
when a virtual plane that is orthogonal to an orthogonal projection image of a line segment connecting a center of the first portion of the base part surface and a center of the second portion of the base part surface onto the first surface of the first compound semiconductor layer, that passes through the center of the first portion of the base part surface and that is parallel to a thickness direction of the stacked structure is referred to as a virtual $\eta\xi$ plane,
a height of the first portion of the base part surface is higher than a height of the second portion of the base part surface,
when cut along a virtual plane parallel to the virtual $\eta\xi$ plane, the first portion of the base part surface has a cross-sectional shape that is an upwardly convex shape and is differentiable, and the second portion of the base part surface has a cross-sectional shape that is an upwardly convex shape and is differentiable, with respect to the second surface of the first compound semiconductor layer, and the first portion of the base part surface and the second portion of the base part surface are continuous smoothly.

Here, when the base part surface is expressed by z=f(x, y), a differential value at the base part surface is obtainable by:

$$\partial z/\partial x = [\partial f(x, y)/\partial x]_y, \text{ and}$$

$$\partial z/\partial y = [\partial f(x, y)/\partial y]_x.$$

A light emitting element according to each of the first and second aspects of the present disclosure for achieving the above object includes:
  a stacked structure including a stack of
    a first compound semiconductor layer having a first surface, and a second surface opposed to the first surface,
    an active layer facing the second surface of the first compound semiconductor layer, and
    a second compound semiconductor layer having a first surface facing the active layer and a second surface opposed to the first surface;
  a first light reflection layer formed on a base part surface located on a first surface side of the first compound semiconductor layer; and
  a second light reflection layer formed on a second surface side of the second compound semiconductor layer and having a flat shape.

In addition, in the light emitting element according to the first aspect of the present disclosure,
  the base part surface extends to a peripheral region, and
  the base part surface has a concavo-convex shape, and is differentiable.

Further, in the light emitting element according to the second aspect of the present disclosure,
  when a portion of the base part surface on which the first light reflection layer is formed is referred to as a first portion of the base part surface and a portion of the base part surface extending from a part of the first portion of the base part surface is referred to as a second portion of the base part surface, and
  when a virtual plane that is orthogonal to an orthogonal projection image of a line segment connecting a center of the first portion of the base part surface and a center of the second portion of the base part surface onto the first surface of the first compound semiconductor layer, that passes through the center of the first portion of the base part surface and that is parallel to a thickness direction of the stacked structure is referred to as a virtual ηξ plane,
  a height of the first portion of the base part surface is higher than a height of the second portion of the base part surface,
  when cut along a virtual plane parallel to the virtual ηξ plane, the first portion of the base part surface has a cross-sectional shape that is an upwardly convex shape and is differentiable, and the second portion of the base part surface has a cross-sectional shape that is an upwardly convex shape and is differentiable, with respect to the second surface of the first compound semiconductor layer, and the first portion of the base part surface and the second portion of the base part surface are continuous smoothly.

A method of manufacturing a light emitting element array according to each of first to third aspects of the present disclosure for achieving the above object is a method of manufacturing a light emitting element array including
  a stacked structure including a stack of
    a first compound semiconductor layer having a first surface, and a second surface opposed to the first surface,
    an active layer facing the second surface of the first compound semiconductor layer, and
    a second compound semiconductor layer having a first surface facing the active layer and a second surface opposed to the first surface,
  a first light reflection layer formed on a base part surface located on a first surface side of the first compound semiconductor layer, and
  a second light reflection layer formed on a second surface side of the second compound semiconductor layer and having a flat shape.

In addition, the method of manufacturing a light emitting element array according to the first aspect of the present disclosure is further a method of manufacturing the light emitting element array including a plurality of light emitting elements in which
  the base part surface extends to a peripheral region surrounded by the plurality of light emitting elements, and
  the base part surface has a concavo-convex shape, and is differentiable. The method includes:
    forming, after forming the stacked structure, the second light reflection layer on the second surface side of the second compound semiconductor layer; subsequently,
    making, after forming a first sacrificial layer on a first portion of the base part surface on which the first light reflection layer is to be formed, a surface of the first sacrificial layer into a convex shape; thereafter,
    forming a second sacrificial layer on a second portion of the base part surface exposed between the first sacrificial layers and on the first sacrificial layers, and making a surface of the second sacrificial layer into a concavo-convex shape; subsequently,
    etching back the second sacrificial layer and the first sacrificial layer and further etching back inwardly from the base part surface, and thereby forming a convex part in the first portion of the base part surface and forming at least a concave part in the second portion of the base part surface, with respect to the second surface of the first compound semiconductor layer; and thereafter
    forming the first light reflection layer on the first portion of the base part surface.

In addition, the method of manufacturing a light emitting element array according to the second aspect of the present disclosure is further a method of manufacturing the light emitting element array including a plurality of light emitting elements in which
  the base part surface extends to a peripheral region surrounded by the plurality of light emitting elements, and the base part surface has a concavo-convex shape, and is differentiable. The method includes:
forming, after forming the stacked structure, the second light reflection layer on the second surface side of the second compound semiconductor layer; subsequently,
making, after forming a first sacrificial layer on a first portion of the base part surface on which the first light reflection layer is to be formed, a surface of the first sacrificial layer into a convex shape; thereafter,
etching back the first sacrificial layer and further etching back inwardly from the base part surface, and thereby forming a convex part in the first portion of the base part surface with respect to the second surface of the first compound semiconductor layer; subsequently,
etching back, after forming a second sacrificial layer on the base part surface, the second sacrificial layer and further etching back inwardly from the base part surface, and thereby forming a convex part in the first portion of the base part surface and forming at least a concave part in a second portion of the base part surface, with respect to the second surface of the first compound semiconductor layer; and thereafter,
forming the first light reflection layer on the first portion of the base part surface.

Furthermore, the method of manufacturing a light emitting element array of the third aspect of the present disclosure is further a method of manufacturing the light emitting element array in which
when a portion of the base part surface on which the first light reflection layer is formed is referred to as a first portion of the base part surface and a portion of the base part surface extending from a part of the first portion of the base part surface is referred to as a second portion of the base part surface, and
when a virtual plane that is orthogonal to an orthogonal projection image of a line segment connecting a center of the first portion of the base part surface and a center of the second portion of the base part surface onto the first surface of the first compound semiconductor layer, that passes through the center of the first portion of the base part surface and that is parallel to a thickness direction of the stacked structure is referred to as a virtual $\eta\xi$ plane,
a height of the first portion of the base part surface is higher than a height of the second portion of the base part surface. The method includes:
forming, after forming the stacked structure, the second light reflection layer on the second surface side of the second compound semiconductor layer; subsequently,
performing formation of a first sacrificial layer on the first portion of the base part surface on which the first light reflection layer is to be formed and, in conjunction therewith, formation of a second sacrificial layer extending from the first sacrificial layer and thinner than the first sacrificial layer on the second portion of the base part surface, and thereafter making the first sacrificial layer and the second sacrificial layer into a convex shape; subsequently,
etching back the first sacrificial layer and the second sacrificial layer and further etching back inwardly from the base part surface, and thereby obtaining the base part surface, in which, when cut along a virtual plane parallel to the virtual $\eta\xi$ plane, the first portion of the base part surface has a cross-sectional shape that is an upwardly convex shape and is differentiable, and the second portion of the base part surface has a cross-sectional shape that is an upwardly convex shape and is differentiable, with respect to the second surface of the first compound semiconductor layer, and the first portion of the base part surface and the second portion of the base part surface are continuous smoothly; and thereafter,
forming the first light reflection layer on the first portion of the base part surface.

BRIEF DESCRIPTION OF THE DRAWINGS

FIGS. 24A and 24B, subsequent to FIG. 23B, are schematic partial end views of the first compound semiconductor layer and the like for describing the method of manufacturing the light emitting element array of Example 2.

FIGS. 50A and 50B are a layout state of the first sacrificial layer and the second sacrificial layer for forming the first portion and the second portion of the base part surface in a light emitting element array of Example 11, and a schematic partial end view of the first compound semiconductor layer and the like.

FIGS. 53A, 53B and 53C are conceptual diagrams illustrating light field intensities in an existing light emitting element, the light emitting element of Example 13, and a light emitting element of Example 18, respectively.

MODES FOR CARRYING OUT THE INVENTION

Figure 1:
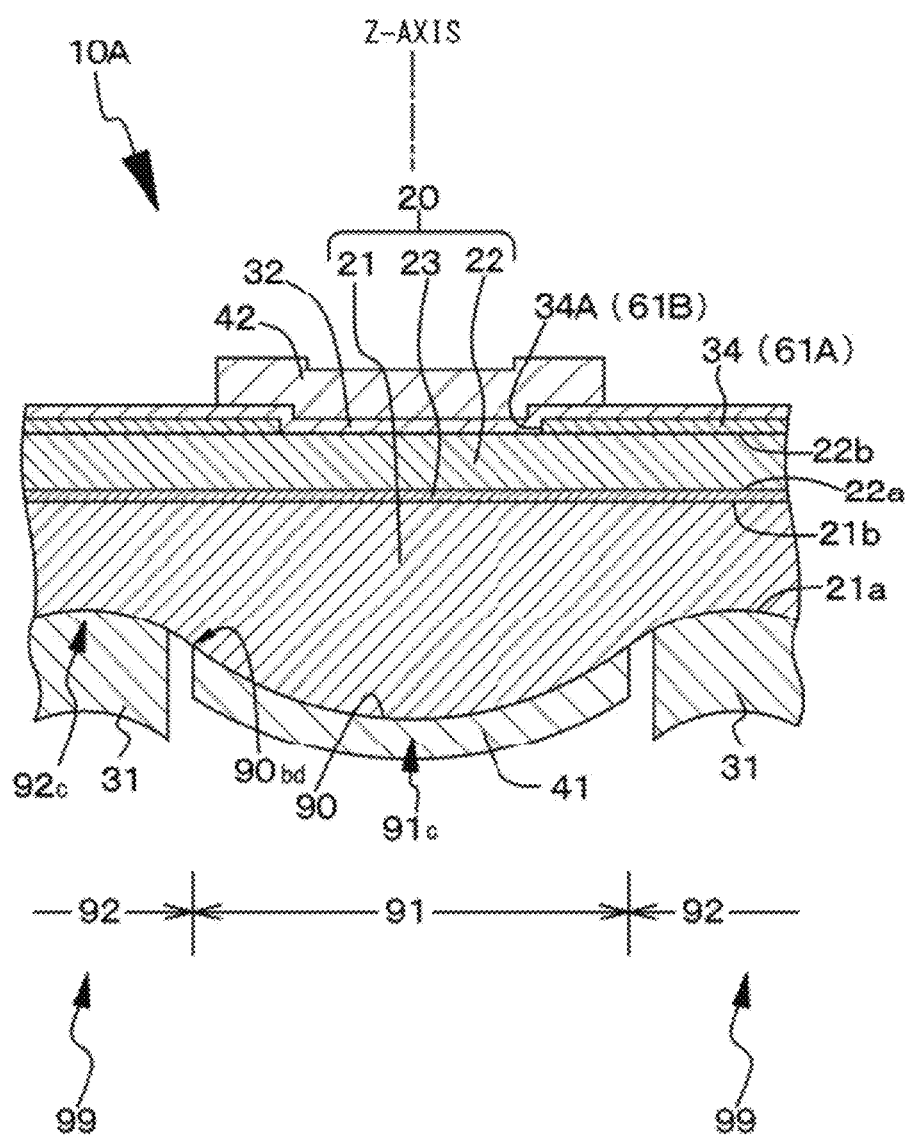
FIG. 1 is a schematic partial end view of a light emitting element of Example 1.

In the following, the present disclosure will be described on the basis of Examples with reference to the drawings. However, the present disclosure is not limited to Examples, and various numerical values and materials in Examples are illustrative. Note that the description will be given in the following order.

1. General Description of Light Emitting Element of Present Disclosure, Light Emitting Element Array of Present Disclosure, and Method of Manufacturing Light Emitting Element Array According to First Aspect and Second Aspect of Present Disclosure
2. Example 1 (Light Emitting Element According to First Aspect of Present Disclosure, Light Emitting Element Array According to First Aspect of Present Disclosure, Method of Manufacturing Light Emitting Element Array According to First Aspect of Present Disclosure, Light Emitting Element of First Configuration, Light Emitting Element of (1-A)th Configuration, and Light Emitting Element of Second Configuration)
3. Example 2 (Modification of Example 1, Light Emitting Element of (1-B)th Configuration)
4. Example 3 (Another Modification of Example 1, Light Emitting Element of (1-C)th Configuration)
5. Example 4 (Still Another Modification of Example 1)
6. Example 5 (Modification of Examples 1 to 4, Light Emitting Element of Third Configuration)
7. Example 6 (Modification of Examples 1 to 4, Light Emitting Element of Fourth Configuration)
8. Example 7 (Modification of Example 6)
9. Example 8 (Modification of Examples 1 to 7)
10. Example 9 (Method of Manufacturing Light Emitting Element Array According to Second Aspect of Present Disclosure)
11. Example 10 (Light Emitting Element According to Second Aspect of Present Disclosure, Light Emitting Element Array According to Second Aspect of Present Disclosure, Method of Manufacturing Light Emitting Element Array According Third Aspect of Present Disclosure, Light Emitting Element of Second Configuration, and Light Emitting Element of Second Configuration)
12. Example 11 (Modification of Example 10)
13. Example 12 (Modification of Examples 1 to 11, Light Emitting Element of Fifth Configuration)
14. Example 13 (Modification of Examples 1 to 12, Light Emitting Element of (6-A)th Configuration)
15. Example 14 (Modification of Example 13, Light Emitting Element of (6-B)th Configuration)
16. Example 15 (Modification of Examples 13 and 14, Light Emitting Element of (6-C)th Configuration)
17. Example 16 (Modification of Examples 13 to 15, Light Emitting Element of (6-D)th Configuration)
18. Example 17 (Modification of Examples 13 to 16)
19. Example 18 (Modification of Examples 1 to 17, Light Emitting Element of (7-A)th Configuration, Light Emitting Element of (7-B)th Configuration, Light Emitting Element of (7-C)th Configuration, and Light Emitting Element of (7-D)th Configuration)
20. Example 19 (Modification of Examples 1 to 18, Light Emitting Element of Eighth Configuration)
21. Example 20 (Modification of Example 19)
22. Example 21 (Another Modification of Example 19)
23. Example 22 (Modification of Examples 19 to 21)
24. Others <General Description of Light Emitting Element According to First Aspect and Second Aspect of Present Disclosure, Light Emitting Element Array According to First Aspect and Second Aspect of Present Disclosure, and Method of Manufacturing Light Emitting Element Array According to First to Third Aspects of Present Disclosure>

A light emitting element according to a first aspect of the present disclosure, a light emitting element included in a light emitting element array according to the first aspect of the present disclosure, and a light emitting element obtained by a method of manufacturing a light emitting element array according to each of the first and second aspects of the present disclosure may be collectively referred to as a "light emitting element or the like according to the first aspect of the present disclosure". Further, a light emitting element according to a second aspect of the present disclosure, a light emitting element included in a light emitting element array according to the second aspect of the present disclosure, and a light emitting element obtained by a method of manufacturing a light emitting element array according to a third aspect of the present disclosure may be collectively referred to as a "light emitting element or the like according to the second aspect of the present disclosure". Moreover, the light emitting elements or the like according to the first and second aspects of the present disclosure may be collectively referred to as a "light emitting element or the like of the present disclosure".

In the method of manufacturing a light emitting element array according to the third aspect of the present disclosure, the performing of formation of the first sacrificial layer on the first portion of the base part surface on which the first light reflection layer is to be formed and, in conjunction therewith, formation of the second sacrificial layer extending from the first sacrificial layer and thinner than the first sacrificial layer on the second portion of the base part surface may include
after forming a sacrificial layer or material layer on the base part surface, exposing the sacrificial layer or material layer to light by using an exposure apparatus, with a formation pitch of the first portion of the base part surface on which the first light reflection layer is to be formed being set to be smaller than a pattern formation limit width of the exposure apparatus being used. Examples of the exposure apparatus include a stepper, an aligner, and an electron beam drawing apparatus. Examples of a light source of the exposure apparatus include a g-ray (wavelength: 436 nm), an i-ray (wavelength: 465 nm), a KrF excimer laser (wavelength: 248 nm), and an AfF excimer laser (wavelength: 193 nm). By exposing the sacrificial layer or material layer to light using an exposure apparatus with the formation pitch of the first portion of the base part surface on which the first light reflection layer is to be formed being set to be smaller than the pattern formation limit width of the exposure apparatus being used, it is possible to finally form the second sacrificial layer thinner than the first sacrificial layer, as a result of a difference between an exposure condition for a region of the sacrificial layer or material layer in which the first sacrificial layer is to be formed and an exposure condition for a region of the sacrificial layer or material layer in which the second sacrificial layer is to be formed.

In the light emitting element or the like according to the first aspect of the present disclosure, the first light reflection layer is formed on the first portion of the base part surface. An extending part of the first light reflection layer may be formed on the second portion of the base part surface occupying a peripheral region, or no extending part of the first light reflection layer may be formed on the second portion.

In the light emitting element or the like according to the first aspect of the present disclosure, the base part surface may be smooth. In the light emitting element or the like according to each of the first and second aspects of the present disclosure, "smooth" is an analytical term. For example, if a real variable function f(x) is differentiable in a<x<b and f'(x) is continuous, it can be said to be, in a keyword-like expression, continuously differentiable, or is also expressed as being smooth.

In the light emitting element or the like according to the first aspect of the present disclosure including the preferable form described above, the first portion of the base part surface on which the first light reflection layer is formed may have an upwardly convex shape with respect to a second surface of a first compound semiconductor layer. The light emitting element or the like according to the first aspect of the present disclosure having such a configuration will be referred to as a "light emitting element of a first configuration".

In the light emitting element of the first configuration, a boundary between the first portion and the second portion is definable as:
(1) in a case where the first light reflection layer does not extend to the peripheral region, an outer peripheral part of the first light reflection layer; or
(2) in a case where the first light reflection layer extends to the peripheral region, a portion of the base part surface that lies astride the first portion and the second portion and in which an inflection point is present.

In the light emitting element of the first configuration, the second portion of the base part surface occupying the peripheral region may have a downwardly convex shape with respect to the second surface of the first compound semiconductor layer. The light emitting element or the like according to the first aspect of the present disclosure having such a configuration will be referred to as a "light emitting element of a (1-A)th configuration". In addition, in the light emitting element of the (1-A)th configuration, a center part of the first portion of the base part surface may be located on a vertex of a square lattice, or on a vertex of an equilateral triangular lattice. In the former case, a center part of the second portion of the base part surface may be located on a vertex of a square lattice. In the latter case, the center part of the second portion of the base part surface may be located on a vertex of an equilateral triangular lattice.

In the light emitting element of the (1-A)th configuration, examples of shapes of [the first portion/the second portion in a range from a peripheral part to a center part] include the following cases:
(A) [an upwardly convex shape/a downwardly convex shape];
(B) [an upwardly convex shape/a downwardly convex shape continuing to a line segment];
(C) [an upwardly convex shape/an upwardly convex shape continuing to a downwardly convex shape];
(D) [an upwardly convex shape/an upwardly convex shape continuing to a downwardly convex shape and to a line segment];
(E) [an upwardly convex shape/a line segment continuing to a downwardly convex shape]; and
(F) [an upwardly convex shape/a line segment continuing to a downwardly convex shape and to a line segment]. Note that in the light emitting element, there are also cases where the base part surface terminates at the center part of the second portion.

Alternatively, in the light emitting element of the first configuration, the second portion of the base part surface occupying the peripheral region may have a downwardly convex shape, and an upwardly convex shape extending from the downwardly convex shape, toward the center part of the peripheral region, with respect to the second surface of the first compound semiconductor layer. The light emitting element or the like according to the first aspect of the present disclosure having such a configuration will be referred to as a "light emitting element of a (1-B)th configuration". In addition, in the light emitting element of the (1-B)th configuration, $$L_2 > L_1$$

may be satisfied, where $L_1$ is a distance from the second surface of the first compound semiconductor layer to the center part of the first portion of the base part surface, and $L_2$ is a distance from the second surface of the first compound semiconductor layer to the center part of the second portion of the base part surface. In addition, $$R_1 > R_2$$

may be satisfied, where $R_1$ is a radius of curvature of the center part of the first portion of the base part surface (i.e., a radius of curvature of the first light reflection layer), and $R_2$ is a radius of curvature of the center part of the second portion of the base part. Note that examples of the value of $L_2/L_1$ include and are not limited to: $1 < L_2/L_1 \le 100$; and examples of the value of $R_1/R_2$ include and are not limited to:

$$1 < R_1/R_2 \le 100.$$

In the light emitting element of the (1-B)th configuration including the preferable configuration described above, the center part of the first portion of the base part surface may be located on a vertex of a square lattice. In this case, the center part of the second portion of the base part surface may be located on a vertex of a square lattice. Alternatively, the center part of the first portion of the base part surface may be located on a vertex of an equilateral triangular lattice. In this case, the center part of the second portion of the base part surface may be located on a vertex of an equilateral triangular lattice.

In the light emitting element of the (1-B)th configuration, examples of the shapes of [the first portion/the second portion in the range from the peripheral part to the center part] include the following cases:

(A) [an upwardly convex shape/a downwardly convex shape continuing to an upwardly convex shape];

(B) [an upwardly convex shape/an upwardly convex shape continuing to a downwardly convex shape, and to an upwardly convex shape]; and (C) [an upwardly convex shape/a line segment continuing to a downwardly convex shape, and to an upwardly convex shape].

Alternatively, in the light emitting element of the first configuration, the second portion of the base part surface occupying the peripheral region may have an annular convex shape surrounding the first portion of the base part surface and a downwardly convex shape extending from the annular convex shape toward the first portion of the base part surface, with respect to the second surface of the first compound semiconductor layer. The light emitting element or the like according to the first aspect of the present disclosure having such a configuration will be referred to as a "light emitting element of a (1-C)th configuration".

In the light emitting element of the (1-C)th configuration, $$L_2' > L_1$$

may be satisfied, where $L_1$ is the distance from the second surface of the first compound semiconductor layer to the center part of the first portion of the base part surface, and $L_2'$ is a distance from the second surface of the first compound semiconductor layer to an apex part of the annular convex shape of the second portion of the base part surface. In addition, $$R_1 > R_2'$$

may be satisfied, where $R_1$ is the radius of curvature of the center part of the first portion of the base part surface (i.e., the radius of curvature of the first light reflection layer), and $R_2'$ is a radius of curvature of the apex part of the annular convex shape of the second portion of the base part surface. Note that examples of the value of $L_2'/L_1$ include and are not limited to: $1 < L_2'/L_1 \leq 100$, and examples of the value of $R_1/R_2'$ include and are not limited to:

$$1 < R_1/R_2' \leq 100.$$

In the light emitting element of the (1-C)th configuration, examples of the shapes of [the first portion/the second portion in the range from the peripheral part to the center part] include the following cases:

(A) [an upwardly convex shape/a downwardly convex shape continuing to an upwardly convex shape, and to a downwardly convex shape];

(B) [an upwardly convex shape/a downwardly convex shape continuing to an upwardly convex shape, downwardly convex shape, and to a line segment];

(C) [an upwardly convex shape/an upwardly convex shape continuing to a downwardly convex shape, an upwardly convex shape, and to a downwardly convex shape];

(D) [an upwardly convex shape/an upwardly convex shape continuing to a downwardly convex shape, an upwardly convex shape, a downwardly convex shape, and to a line segment];

(E) [an upwardly convex shape/a line segment continuing to a downwardly convex shape, an upwardly convex shape, and to a downwardly convex shape]; and (F) [an upwardly convex shape/a line segment continuing to a downwardly convex shape, an upwardly convex shape, a downwardly convex shape, and to a line segment]. Note that in the light emitting element, there are also cases where the base part surface terminates at the center part of the second portion.

In the light emitting element of the (1-B)th configuration or the light emitting element of the (1-C)th configuration including the preferable configuration described above, a bump may be provided in a portion on the second surface side of the second compound semiconductor layer opposed to a convex-shaped portion in the second portion of the base part surface. Alternatively, in the light emitting element of the (1-A)th configuration including the preferable configuration described above, or in the light emitting element or the like according to the second aspect of the present disclosure, a bump may be provided in a portion on the second surface side of the second compound semiconductor layer opposed to the center part of the first portion of the base part surface. Examples of the bump include a gold (Au) bump, a solder bump, and an indium (In) bump. A method of providing the bump may be a well-known method. Specifically, the bump is provided on a second pad electrode (described later) provided on a second electrode, or on an extending part of the second pad electrode.

Alternatively, a brazing material may be used instead of the bump. Examples of the brazing material include: In (indium, melting point: 157° C.); an indium-gold-based low-melting-point alloy; a tin (Sn)-based high-temperature solder such as $Sn_{80}Ag_{20}$ (melting point: 220° C. to 370° C.) or $Sn_{95}Cu_5$ (melting point: 227° C. to 370° C.); a lead (Pb)-based high-temperature solder such as $Pb_{97.5}Ag_2$. (melting point: 304° C.), $Pb_{94.5}Ag_{5.5}$ (melting point: 304° C. to 365° C.), or $Pb_{97.5}Ag_{1.5}Sn_{1.0}$ (melting point: 309° C.); a zinc (Zn)-based high-temperature solder such as $Zn_{95}Al_5$ (melting point: 380° C.); a tin-lead-based standard solder such as $Sn_5Pb_5$ (melting point: 300° C. to 314° C.) or $Sn_2Pb_{95}$ (melting point: 316° C. to 322° C.); or a brazing material such as $Au_{88}Ga_{12}$ (melting point: 381° C.) (all the subscripts represent atomic %).

Further, in the light emitting element array according to each of the first aspect and the second aspect of the present disclosure including the preferable form or configuration described above, or in the light emitting element array obtained by the method of manufacturing a light emitting element array according to any of the first aspect to the third aspect of the present disclosure including the preferable form or configuration described above, it is desirable that a formation pitch of the light emitting elements be greater than or equal to 3 μm and smaller than or equal to 50 μm, preferably greater than or equal to 5 μm and smaller than or equal to 30 μm, and more preferably greater than or equal to 8 μm and smaller than or equal to 25 μm.

Furthermore, in the light emitting element or the like according to each of the first aspect and the second aspect of the present disclosure including the preferable form or configuration described above, it is desirable that the radius of curvature $R_1$ of the center part of the first portion of the base part surface be greater than or equal to $1 \times 10^{-5}$ m, preferably greater than or equal to $3 \times 10^{-5}$ m. Furthermore, it may be greater than or equal to $3\times10^{-4}$ m. Note that in any case, the value of $R_1$ is greater than the value of a resonator length $L_{OR}$.

Further, in the light emitting element or the like according to the first aspect of the present disclosure including the preferable form or configuration described above, it is desirable that the radius of curvature $R_2$ of the center part of the second portion of the base part surface be greater than or equal to $1\times10^{-6}$ m, preferably greater than or equal to $3\times10^{-6}$ m, and more preferably greater than or equal to $5\times10^{-6}$ m. It is desirable that the radius of curvature $R_2'$ of the apex part of the annular convex shape of the second portion of the base part surface be greater than or equal to $1\times10^{-6}$ m, preferably greater than or equal to $3\times10^{-6}$ m, and more preferably greater than or equal to $5\times10^{-6}$ m.

Furthermore, in the light emitting element or the like of the present disclosure including the preferable form or configuration described above, the stacked structure may include at least one kind of material selected from the group consisting of a GaN-based compound semiconductor, an InP-based compound semiconductor, and a GaAs-based compound semiconductor. Specifically, the stacked structure may have any of the following configurations:
 (a) a configuration including a GaN-based compound semiconductor;
 (b) a configuration including an InP-based compound semiconductor;
 (c) a configuration including a GaAs-based compound semiconductor;
 (d) a configuration including a GaN-based compound semiconductor and an InP-based compound semiconductor;
 (e) a configuration including a GaN-based compound semiconductor and a GaAs-based compound semiconductor;
 (f) a configuration including an InP-based compound semiconductor and a GaAs-based compound semiconductor; and
 (g) a configuration including a GaN-based compound semiconductor, an InP-based compound semiconductor, and a GaAs-based compound semiconductor.

In the light emitting element or the like according to the second aspect of the present disclosure inclusive of a light emitting element included in the light emitting element array manufactured on the basis of the preferable form described above, when a virtual plane that is parallel to a thickness direction of the stacked structure, that passes through a center of the first portion of the base part surface and that is orthogonal to a virtual $\eta\xi$ plane is referred to as a virtual $\zeta\xi$ plane, and when the first portion and the second portion of the base part surface are cut along the virtual $\zeta\xi$ plane, the first portion of the base part surface may have an upwardly convex shape, and have a downwardly convex shape at and near a boundary region with the second portion, and the second portion of the base part surface may have a downwardly convex shape at and near a boundary region with the first portion, with respect to the second surface of the first compound semiconductor layer. In addition, in this case, the base part surface at and near the boundary region between the first portion and the second portion may specifically have a saddle shape.

In the light emitting element or the like according to the second aspect of the present disclosure including the preferable form described above, the center part of the first portion of the base part surface may be located on a vertex of a square lattice, or on a vertex of an equilateral triangular lattice.

Examples of a method of forming a sacrificial layer for forming the first portion and the second portion of the base part surface include: various kinds of printing methods including a screen printing method, an ink jet printing method, and a metal mask printing method; a spin coating method; a transfer method using a mold or the like; a nanoimprint method; a 3D printing technique (e.g., a 3D printing technique using a stereolithographic 3D printer or a two-photon absorption micro 3D printer); a physical vapor deposition method (a PVD method including, for example, vacuum deposition method such as an electron beam deposition method or a thermal filament deposition method, a sputtering method, an ion plating method, and a laser ablation method); various kinds of chemical vapor deposition methods (CVD methods); a lift-off method; and a micro processing technique or the like with a pulsed laser, and also combinations of any of these methods and an etching method.

In the light emitting element or the like of the present disclosure including the preferable form or configuration described above, $1\times10^{-5}$ m$\leq L_{OR}$ is preferably satisfied, where $L_{OR}$ is the resonator length.

In the light emitting element or the like according to the first aspect of the present disclosure including the preferable form or configuration described above, a figure drawn by the first portion of the base part surface when the base part surface is cut along a virtual plane including a stacking direction of the stacked structure may be, and in the light emitting element or the like according to the second aspect of the present disclosure including the preferable form or configuration described above, a region having a convex shape in the first portion of the base part surface when the first portion of the base part surface is cut along the virtual $\zeta\xi$ plane may be, a part of a circle, a part of a parabola, a part of a sine curve, a part of an ellipse, or a part of a catenary curve. The figure may not strictly be a part of a circle, may not strictly be a part of a parabola, may not strictly be a part of a sine curve, may not strictly be a part of an ellipse, or may not strictly be a part of a catenary curve. That is, a case where the figure is roughly a part of a circle, a case where the figure is roughly a part of a parabola, a case where the figure is roughly a part of a sine curve, a case where the figure is roughly a part of an ellipse, and a case where the figure is roughly a part of a catenary curve are also encompassed by the case where "the figure is a part of a circle, a part of a parabola, a part of a sine curve, roughly a part of an ellipse, or roughly a part of a catenary curve." Portions of these curves may be replaced with line segments. That is, a configuration may be employed in which a figure drawn by an apex part of the first portion of the base part surface is a part of a circle, a part of a parabola, a part of a sine curve, a part of an ellipse, or a part of a catenary curve, while a figure drawn by a bottom portion of the first portion of the base part surface is a line segment. It is possible to determine the figure drawn by the base part surface by measuring the shape of the base part surface with a measuring instrument, and analyzing the obtained data by a least squares method.

Furthermore, in the light emitting element or the like of the present disclosure including the preferable form or configuration described above, the first surface of the first compound semiconductor layer may configure the base part surface. The light emitting element of such a configuration will be referred to as a "light emitting element of a second configuration" for the sake of convenience. Alternatively, a compound semiconductor substrate may be provided between the first surface of the first compound semiconductor layer and the first light reflection layer, and the base part surface may be configured by a surface of the compound semiconductor substrate. The light emitting element of such a configuration will be referred to as a "light emitting element of a third configuration" for the sake of convenience. In this case, for example, the compound semiconductor substrate may include a GaN substrate. As the GaN substrate, any of a polar substrate, a semipolar substrate, and a non-polar substrate may be used. A thickness of the compound semiconductor substrate may be, for example, $5 \times 10^{-5}$ m to $1 \times 10^{-4}$ m, but is not limited to such a value. Alternatively, a base may be provided between the first surface of the first compound semiconductor layer and the first light reflection layer. Alternatively, the compound semiconductor substrate and the base may be provided between the first surface of the first compound semiconductor layer and the first light reflection layer, and the base part surface may be configured by a surface of the base. The light emitting element of such a configuration will be referred to as a "light emitting element of a fourth configuration" for the sake of convenience. Examples of a material configuring the base include a transparent dielectric material such as $TiO_2$, $Ta_2O_5$, or $SiO_2$, a silicone-based resin, and an epoxy-based resin.

Furthermore, in the light emitting element or the like of the present disclosure including the preferable form or configuration described above, a value of a thermal conductivity of the stacked structure may be higher than a value of a thermal conductivity of the first light reflection layer. The thermal conductivity of a dielectric material configuring the first light reflection layer typically has a value of about 10 watts/(m·K) or less. Meanwhile, the thermal conductivity of the GaN-based compound semiconductor configuring the stacked structure has a value of about 50 watts/(m·K) to about 100 watts/(m·K).

In the light emitting element or the like of the present disclosure including the preferable form or configuration described above, materials of various compound semiconductor layers (including the compound semiconductor substrate) located between an active layer and the first light reflection layer are preferably free from a modulation in a refractive index of 10% or more (free from a difference in refractive index of 10% or more with respect to an average refractive index of the stacked structure). This makes it possible to suppress the occurrence of disturbance of a light field in a resonator.

With the light emitting element or the like of the present disclosure including the preferable form or configuration described above, it is possible to configure a surface emitting laser element (vertical resonator laser, VCSEL) that emits laser light through the first light reflection layer, or alternatively, a surface emitting laser element that emits laser light through the second light reflection layer. In some cases, a light-emitting-element manufacturing substrate (described later) may be removed.

In the light emitting element or the like of the present disclosure, the stacked structure may specifically include, for example, an AlInGaN-based compound semiconductor, as described above. Here, more specific examples of the AlInGaN-based compound semiconductor include GaN, AlGaN, InGaN, and AlInGaN. Furthermore, boron (B) atoms, thallium (Tl) atoms, arsenic (As) atoms, phosphorus (P) atoms, or antimony (Sb) atoms may be included in these compound semiconductors, as desired. The active layer desirably has a quantum well structure. Specifically, the active layer may have a single quantum well structure (SQW structure), or may have a multi-quantum well structure (MQW structure). While the active layer having the quantum well structure has a structure in which at least one well layer and at least one barrier layer are stacked, examples of the combination of (a compound semiconductor configuring the well layer, a compound semiconductor configuring the barrier layer) include $(In_yGa_{(1-y)}N, GaN)$, $(In_yGa_{(1-y)}N, In_zGa_{(1-z)}N)$ (where y>z), and $(In_yGa_{(1-y)}N, AlGaN)$. The first compound semiconductor layer may include a compound semiconductor of a first electrical conductivity type (e.g., n-type), and the second compound semiconductor layer may include a compound semiconductor of a second electrical conductivity type (e.g., p-type) different from the first electrical conductivity type. The first compound semiconductor layer and the second compound semiconductor layer are also referred to as a first cladding layer and a second cladding layer. The first compound semiconductor layer and the second compound semiconductor layer may each be a layer of a single structure, a layer of a multilayer structure, or a layer of a superlattice structure. Furthermore, the first compound semiconductor layer and the second compound semiconductor layer may each include a composition gradient layer or a concentration gradient layer.

Alternatively, examples of group III atoms configuring the stacked structure include gallium (Ga), indium (In), and aluminum (Al). Examples of group V atoms configuring the stacked structure include arsenic (As), phosphorus (P), antimony (Sb), and nitrogen (N). Specific examples include AlAs, GaAs, AlGaAs, AlP, GaP, GaInP, AlInP, AlGaInP, AlAsP, GaAsP, AlGaAsP, AlInAsP, GaInAsP, AlInAs, GaInAs, AlGaInAs, AlAsSb, GaAsSb, AlGaAsSb, AlN, GaN, InN, AlGaN, GaNAs, and GaInNAs. Examples of the compound semiconductor configuring the active layer include GaAs, AlGaAs, GaInAs, GaInAsP, GaInP, GaSb, GaAsSb, GaN, InN, GaInN, GaInNAs, and GaInNAsSb.

Examples of the quantum well structure include a two-dimensional quantum well structure, a one-dimensional quantum well structure (a quantum wire), and a zero-dimensional quantum well structure (a quantum dot). Examples of a material of a quantum well include, but are not limited to: Si; Se; chalcopyrite-based compounds including CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$; perovskite-based materials; group III-V compounds including GaAs, GaP, InP, AlGaAs, InGaP, AlGaInP, InGaAsP, GaN, InAs, InGaAs, GaInNAs, GaSb, and GaAsSb; CdSe, CdSeS, CdS, CdTe, $In_2Se_3$, $In_2S_3$, $Bi_2Se_3$, $Bi_2S_3$, ZnSe, ZnTe, ZnS, HgTe, HgS, PbSe, PbS, $TiO_2$, etc.

The stacked structure is formed on a second surface of the light-emitting-element manufacturing substrate, or on a second surface of the compound semiconductor substrate. Note that the second surface of the light-emitting-element manufacturing substrate is opposed to the first surface of the first compound semiconductor layer, and a first surface of the light-emitting-element manufacturing substrate is opposed to the second surface of the light-emitting-element manufacturing substrate. Further, the second surface of the compound semiconductor substrate is opposed to the first surface of the first compound semiconductor layer, and the first surface of the compound semiconductor substrate is opposed to the second surface of the compound semiconductor substrate. Examples of the light-emitting-element manufacturing substrate include a GaN substrate, a sapphire substrates, a GaAs substrate, a SiC substrate, an alumina substrates, a ZnS substrate, a ZnO substrate, an AlN substrate, a LiMgO substrate, a $LiGaO_2$ substrate, a $MgAl_2O_4$ substrate, an InP substrate, a Si substrates, and these substrates with an underlying layer or a buffer layer formed on a surface (a principal surface) thereof, among which the GaN substrate is preferably used owing to its low deficiency density. Further, examples of the compound semiconductor substrate include a GaN substrate. While the GaN substrate is known to vary in characteristic thereof among a polar characteristic, a nonpolar characteristic, and a semipolar characteristic depending on a growth surface, any principal surface (second surface) of the GaN substrate is usable for formation of the compound semiconductor layer. In addition, regarding the principal surface of the GaN substrate, crystal orientation planes that are generally called by such names as A plane, B plane, C plane, R plane, M plane, N plane, and S plane or planes provided by making these planes offset in a specific direction, and the like are also usable, depending on the crystal structure (e.g., a cubic type, a hexagonal type, or the like). Examples of a method of forming various compound semiconductor layers configuring the light emitting element include, and are not limited to, an organometallic chemical vapor deposition method (MOCVD method, Metal Organic-Chemical Vapor Deposition method, MOVPE method, Metal Organic-Vapor Phase Epitaxy method), a molecular beam epitaxy method (MBE method), a hydride vapor phase growth method (HVPE method) in which a halogen contributes to transportation or reaction, an atomic layer deposition method (ALD method, Atomic Layer Deposition method), a migration-enhanced epitaxy method (MEE method, Migration-Enhanced Epitaxy method), and a plasma-assisted physical vapor deposition method (PPD method).

GaAs and InP materials are the same in that they are of a zincblende structure. As principal planes of the compound semiconductor substrates including these materials, any of planes including a (100) plane, a (111) AB plane, a (211) AB plane, a (311) AB plane, and also planes provided by making these planes offset in a specific direction are usable. Note that "AB" means that offset directions are different by 90 degrees. Whether a principal material of the plane belongs to the group III or the group V depends on the offset direction. By controlling the crystal plane orientation and film formation conditions, unevenness in composition and dot shape are controllable. As a film formation method, one such as an MBE method, an MOCVD method, an MEE method, or an ALD method is typically used, as with the GaN-based materials; however, these methods are not limitative.

Here, examples of an organogallium source gas in the MOCVD method include trimethylgallium (TMG) gas and triethylgallium (TEG) gas, and examples of a nitrogen source gas include ammonium gas and hydrazine gas. In forming a GaN-based compound semiconductor layer having an n-type electrical conductivity, for example, it is sufficient that silicon (Si) is added as an n-type impurity (n-type dopant). In forming a GaN-based compound semiconductor layer having a p-type electrical conductivity, for example, it is sufficient that magnesium (Mg) is added as a p-type impurity (p-type dopant). In a case where aluminum (Al) or indium (In) is included as constituent atoms of the GaN-based compound semiconductor layer, it is sufficient that trimethylaluminum (TMA) gas is used as an Al source, or that trimethylindium (TMI) gas is used as an In source. Furthermore, it is sufficient that monosilane gas ($SiH_4$ gas) is used as a Si source, and that biscyclopentadienylmagnesium gas, methylcyclopentadienylmagnesium, or biscyclopentadienylmagnesium ($Cp_2Mg$) is used as a Mg source. Note that examples of the n-type impurity (n-type dopant) other than Si include Ge, Se, Sn, C, Te, S, O, Pd, and Po, and examples of the p-type impurity (p-type dopant) other than Mg include Zn, Cd, Be, Ca, Ba, C, Hg, and Sr.

In a case where an InP-based compound semiconductor or an GaAs-based compound semiconductor is employed to configure the stacked structure, in regard to a group III raw material, TMGa, TEGa, TMIn, or TMAl, i.e., an organometallic raw material, is typically used. Further, in regard to a group V raw material, arsine gas ($AsH_3$ gas), phosphine gas ($PH_3$ gas), ammonia ($NH_3$), or the like is used. Note that in regard to the group V raw material, an organometallic raw material is used in some cases, and examples thereof include tertiary butyl arsine (TBAs), tertiary butyl phosphine (TBP), dimethylhydrazine (DMHy), and trimethylantimony (TMSb). These materials decompose at low temperatures, and are therefore effective in low temperature growth. As an n-type dopant, monosilane ($SiH_4$) is used as a Si source, and hydrogen selenide ($H_2Se$) or the like is used as a Se source. Further, dimethylzinc (DMZn), biscyclopentadienylmagnesium ($Cp_2Mg$), or the like is used as a p-type dopant. Candidates for the dopant materials are materials similar to those in the case with the GaN-based compound semiconductor.

A support substrate for fixing the second light reflection layer thereon only has to be configured by, for example, any of the various substrates listed as examples of the light-emitting-element manufacturing substrate, or may be configured by an insulating substrate including AlN or the like, a semiconductor substrate including Si, SiC, Ge or the like, a metallic substrate, or an alloy-based substrate. It is preferable to use an electrically-conductive substrate, or it is preferable to use a metallic substrate or an alloy-based substrate, from the viewpoints of mechanical property, elastic deformation or plastic deformation property, heat dissipation property, and the like. An example of the thickness of the support substrate may be 0.05 mm to 1 mm. As a method of fixing the second light reflection layer onto the support substrate, any of known methods including a solder bonding method, a normal temperature bonding method, a bonding method using an adhesive tape, a bonding method using wax bonding, a method using an adhesive are usable; however, from the viewpoint of securing electrical conductivity, it is desirable to choose the solder bonding method or the normal temperature bonding method. For example, in a case where a silicon semiconductor substrate, which is an electrically-conductive substrate, is used as the support substrate, it is desirable, for suppressing warping resulting from a difference in thermal expansion coefficient, to employ a bonding method that allows for bonding at a low temperature of 400° C. or below. In a case where a GaN substrate is used as the support substrate, the bonding temperature may be 400° C. or above.

In manufacturing the light emitting element or the like of the present disclosure, the light-emitting-element manufacturing substrate may be left unremoved, or may be removed after forming the active layer, the second compound semiconductor layer, the second electrode, and the second light reflection layer sequentially on the first compound semiconductor layer. Specifically, after the active layer, the second compound semiconductor layer, the second electrode, and the second light reflection layer are formed sequentially on the first compound semiconductor layer and subsequently the second light reflection layer is fixed onto the support substrate, it is sufficient that the light-emitting-element manufacturing substrate is removed and thereby the first compound semiconductor layer (the first surface of the first compound semiconductor layer) is exposed. Removal of the light-emitting-element manufacturing substrate may be performed by a wet etching method using an aqueous alkali solution such as an aqueous sodium hydroxide solution or an aqueous potassium hydroxide solution, an ammonium solution+an aqueous hydrogen peroxide solution, a sulfuric acid solution+an aqueous hydrogen peroxide solution, a hydrochloric acid solution+an aqueous hydrogen peroxide solution, a phosphoric acid solution+an aqueous hydrogen peroxide solution or the like, a chemical mechanical polishing method (CMP method), a mechanical polishing method, a dry etching method such as a reactive ion etching (RIE) method, a lift-off method using a laser, or the like. Alternatively, a combination of any of these methods may be used to perform removal of the light-emitting-element manufacturing substrate.

The first electrode electrically coupled to the first compound semiconductor layer may be common among a plurality of light emitting elements, and the second electrode electrically coupled to the second compound semiconductor layer may be common among the plurality of light emitting elements, or may be provided individually in the plurality of light emitting elements.

In a case where the light-emitting-element manufacturing substrate remains, it is sufficient that the first electrode is formed on the first surface of the light-emitting-element manufacturing substrate opposed to the second surface thereof, or on the first surface of the compound semiconductor substrate opposed to the second surface thereof. Further, in a case where the light-emitting-element manufacturing substrate does not remain, it is sufficient that the first electrode is formed on the first surface of the first compound semiconductor layer configuring the stacked structure. Note that in this case, because the first light reflection layer is formed on the first surface of the first compound semiconductor layer, it is sufficient that the first electrode is formed in such a manner as to surround the first light reflection layer, for example. The first electrode desirably has a single-layer structure or a multilayer structure including, for example, at least one kind of metal (including alloy) selected from the group consisting of gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), and indium (In). Specific examples include Ti/Au, Ti/Al, Ti/Al/Au, Ti/Pt/Au, Ni/Au, Ni/Au/Pt, Ni/Pt, Pd/Pt, and Ag/Pd. Note that a layer preceding "/" more in the multilayer configuration is located closer to the active layer. This similarly applies also to the description given below. The first electrode may be formed as a film by, for example, a PVD method such as a vacuum deposition method or a sputtering method.

In a case of forming the first electrode in such a manner as to surround the first light reflection layer, the first light reflection layer and the first electrode may be in contact with each other. Alternatively, the first light reflection layer and the first electrode may be spaced apart from each other. In some cases, a state where the first electrode is formed to extend to a position on an edge part of the first light reflection layer, or a state where the first light reflection layer is formed to extend to a position on an edge part of the first electrode may be provided, for example.

The second electrode may include a transparent electrically-conductive material. Examples of the transparent electrically-conductive material configuring the second electrode include indium-based transparent electrically-conductive materials [specifically, for example, indium tin oxide (ITO, Indium Tin Oxide, inclusive of Sn-doped $In_2O_3$, crystalline ITO, and amorphous ITO), indium zinc oxide (IZO, Indium Zinc Oxide), indium gallium oxide (IGO), indium-doped gallium zinc oxide (IGZO, In—$GaZnO_4$), IFO (F-doped $In_2O_3$), ITiO (Ti-doped $In_2O_3$), InSn, and InSnZnO], tin-based transparent electrically-conductive materials [specifically, for example, tin oxide ($SnO_x$), ATO (Sb-doped $SnO_2$), and FTO (F-doped $SnO_2$)], zinc-based transparent electrically-conductive materials [specifically, for example, zinc oxide (ZnO, inclusive of Al-doped ZnO (AZO) and B-doped ZnO), gallium-doped zinc oxide (GZO), and AlMgZnO (aluminum oxide- and magnesium oxide-doped zinc oxide)], NiO, $TiO_x$, and graphene. Alternatively, the second electrode may include a transparent electrically-conductive film including gallium oxide, titanium oxide, niobium oxide, antimony oxide, nickel oxide, or the like as a base layer, or a transparent electrically-conductive material such as a spinel-type oxide or an oxide having a $YbFe_2O_4$ structure. Note that although depending on a layout state of the second light reflection layer and the second electrode, the material of the second electrode is not limited to a transparent electrically-conductive material, and a metal such as palladium (Pd), platinum (Pt), nickel (Ni), gold (Au), cobalt (Co), or rhodium (Rh) may be used. It is sufficient that the second electrode includes at least one of these materials. The second electrode may be formed as a film by, for example, a PVD method such as a vacuum deposition method or a sputtering method. Alternatively, a low-resistance semiconductor layer is usable as the transparent electrode layer, and in this case, specifically, an n-type GaN-based compound semiconductor layer is usable. Furthermore, in a case where a layer adjacent to the n-type GaN-based compound semiconductor layer is of the p-type, joining both layers through a tunnel junction makes it possible to reduce an electrical resistance at the interface. With the second electrode configured by the transparent electrically-conductive material, it is possible to spread a current in lateral directions (in-plane directions of the second compound semiconductor layer), and it is thus possible to supply the current efficiently to a current injection region (described later).

In order to establish electrical coupling to an external electrode or circuit (hereinafter, sometimes referred to as an "external circuit or the like"), a first pad electrode and a second pad electrode may be provided on the first electrode and the second electrode. The pad electrodes desirably have a single-layer configuration or a multilayer configuration including at least one kind of metal selected from the group consisting of Ti (titanium), aluminum (Al), Pt (platinum), Au (gold), Ni (nickel), and Pd (palladium). Alternatively, the pad electrodes may have a multilayer configuration, such as a multilayer configuration of Ti/Pt/Au, a multilayer configuration of Ti/Au, a multilayer configuration of Ti/Pd/Au, a multilayer configuration of Ti/Pd/Au, a multilayer configuration of Ti/Ni/Au, or a multilayer configuration of Ti/Ni/Au/Cr/Au. In a case where the first electrode includes an Ag layer or Ag/Pd layers, it is preferable to form a cover metal layer including, for example, Ni/TiW/Pd/TiW/Ni on a surface of the first electrode and to form the pad electrode having, for example, a multilayer configuration of Ti/Ni/Au or a multilayer configuration of Ti/Ni/Au/Cr/Au on the cover metal layer.

A light reflection layer (distributed Bragg reflector layer, Distributed Bragg Reflector layer, DBR layer) configuring the first light reflection layer and the second light reflection layer includes, for example, a semiconductor multilayer film or a dielectric multilayer film. Examples of the dielectric material include oxides of Si, Mg, Al, Hf, Nb, Zr, Sc, Ta, Ga, Zn, Y, B, Ti and the like, nitrides of these elements (e.g., $SiN_x$, $AlN_x$, $AlGaN_x$, $GaN_x$, $BN_x$, etc.), fluorides of these elements, and the like. Specific examples include $SiO_x$, $TiO_x$, $NbO_x$, $ZrO_x$, $TaO_x$, $ZnO_x$, $AlO_x$, $HfO_x$, $SiN_x$, $AlN_x$, and the like. It is possible to obtain the light reflection layer by alternately stacking two or more kinds of dielectric films including dielectric materials having different refractive indices, among these dielectric materials. For example, a multilayer film of $SiO_X/SiN_Y$, $SiO_X/TaO_X$, $SiO_X/NbO_Y$, $SiO_X/ZrO_Y$, $SiO_X/AlN_Y$, or the like is preferable. In order to obtain a desired light reflectance, it is sufficient that the material of each dielectric film, the film thickness, the number of films to be stacked, etc. are selected appropriately. The thickness of each dielectric film is adjustable appropriately by the material to be used or the like, and is determined by an oscillation wavelength (light emission wavelength) $\lambda_0$ and a refractive index n at the oscillation wavelength $\lambda_0$ of the material used. Specifically, the thickness is preferably an odd number of times $\lambda_0/(4n)$. For example, in a case of configuring the light reflection layer from $SiO_X/NbO_Y$ in a light emitting element having an oscillation wavelength $\lambda_0$ of 410 nm, the thickness may be, for example, about 40 nm to about 70 nm. The number of the films to be stacked may be, for example, two or more, preferably about five to about twenty. The thickness of the light reflection layer as a whole may be, for example, about 0.6 μm to about 1.7 μm. In addition, a light reflectance of the light reflection layer is desirably 95% or more.

It is possible for the light reflection layer to be formed by a known method. Specific examples of the method include: PVD methods including a vacuum deposition method, a sputtering method, a reactive sputtering method, an ECR plasma sputtering method, a magnetron sputtering method, an ion beam assisted deposition method, an ion plating method, and a laser ablation method; various CVD methods; coating methods including a spraying method, a spin coating method, and a dipping method; a method combining two or more of these methods; and a method combining any of these methods with one or more of total or partial pretreatment, irradiation with an inert gas (Ar, He, Xe or the like) or plasma, irradiation with oxygen gas, ozone gas, or plasma, an oxidation process (heat treatment), and an exposure process.

The light reflection layer is not limited to a particular size or shape, insofar as it covers a current injection region or an element region (description thereof will be given later). Specific examples of a plan-view shape of the first light reflection layer include, and are not limited to, a circular shape, an elliptical shape, a rectangular shape, and a polygonal shape (triangular shape, tetragonal shape, hexagonal shape, etc.) including a regular polygonal shape. In addition, the plan-view shape of the first portion of the base part surface may be similar or approximate to the plan-view shape of the first light reflection layer. Specific examples of a shape of a boundary between the current injection region and a current non-injection inside region, a shape of a boundary between the current non-injection inside region and a current non-injection outside region, and a plan-view shape of an opening provided in the element region and a current confinement region include a circular shape, an elliptical shape, a rectangular shape, and a polygonal shape (triangular shape, tetragonal shape, hexagonal shape, etc.) including a regular polygonal shape. The shape of the boundary between the current injection region and the current non-injection inside region, and the shape of the boundary between the current non-injection inside region and the current non-injection outside region are desirably similar shapes. Here, the "element region" refers to a region into which a confined current is injected, or a region in which light is confined due to a refractive index difference or the like, or a region which is within a region sandwiched between the first light reflection layer and the second light reflection layer and in which laser oscillation is generated, or a region which is within the region sandwiched between the first light reflection layer and the second light reflection layer and which actually contributes to laser oscillation.

Side surfaces and exposed surfaces of the stacked structure may be covered with a coating layer (insulating layer). Formation of the coating layer (insulating layer) is performable using a known method. The refractive index of a material configuring the coating layer (insulating layer) is preferably lower than the refractive index of the material configuring the stacked structure. Examples of the material configuring the coating layer (insulating layer) include $SiO_X$-based materials including $SiO_2$, $SiN_X$-based materials, $SiO_YN_Z$-based materials, $TaO_X$, $ZrO_X$, $AlN_X$, $AlO_X$, and $GaO_X$, and organic materials such as polyimide resin. Examples of a method of forming the coating layer (insulating layer) include PVD methods including a vacuum deposition method and a sputtering method, and CVD methods. Further, the coating layer (insulating layer) may also be formed by a coating method.

Example 1

Figure 2:
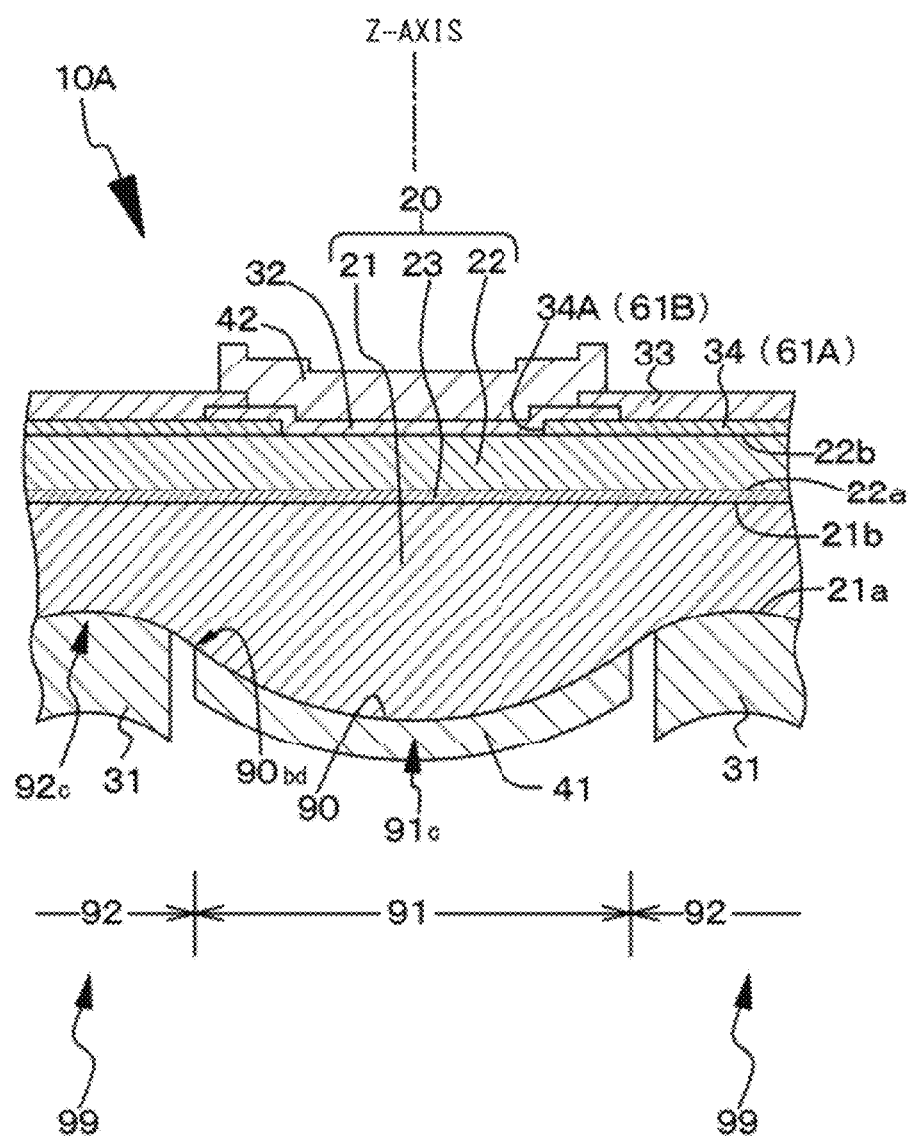
FIG. 2 is a schematic partial end view of a modification example (Modification Example-1) of the light emitting element of Example 1.
Figure 4:
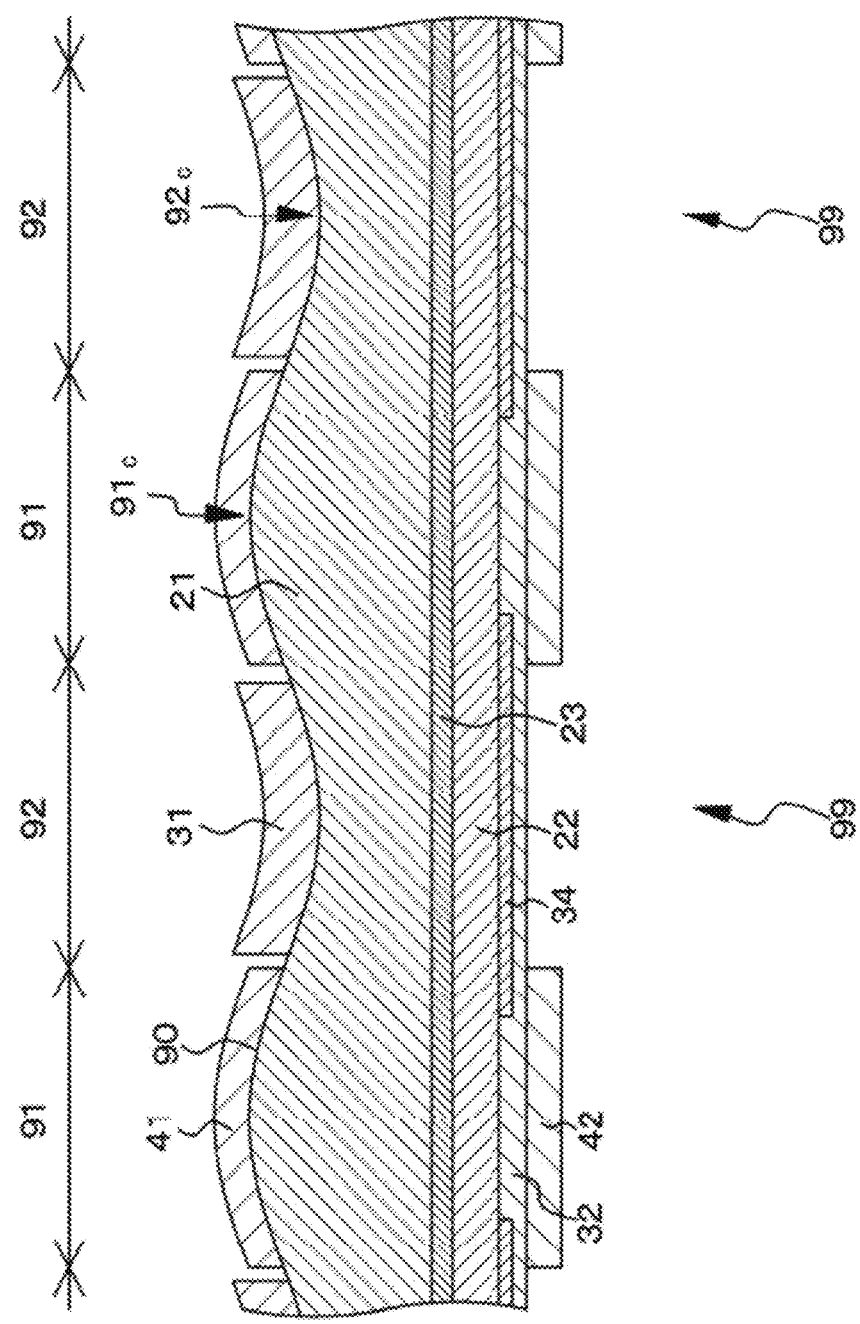
FIG. 4 is a schematic partial end view of a light emitting element array of Example 1.
Figure 5:
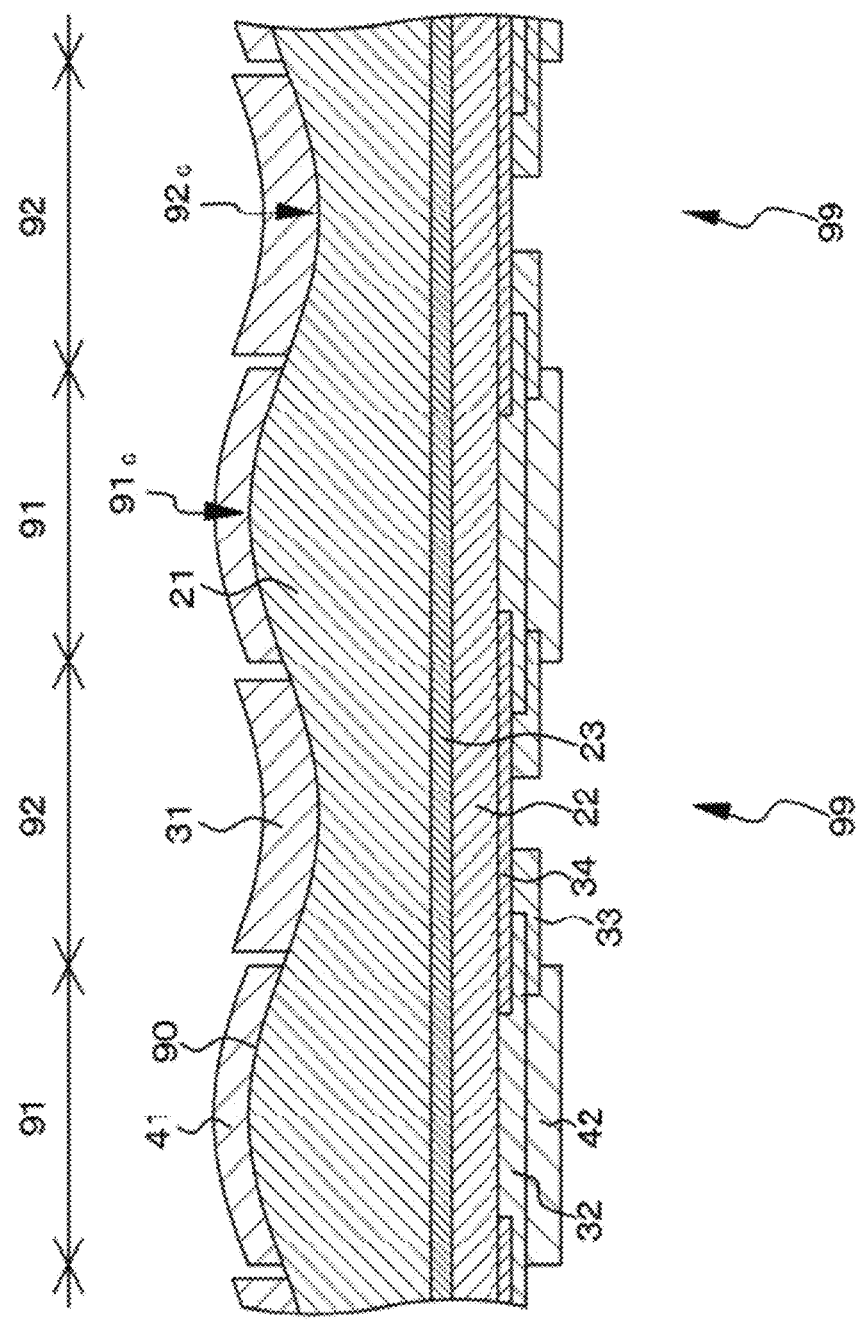
FIG. 5 is a schematic partial end view of the light emitting element array of Example 1.
Figure 6:
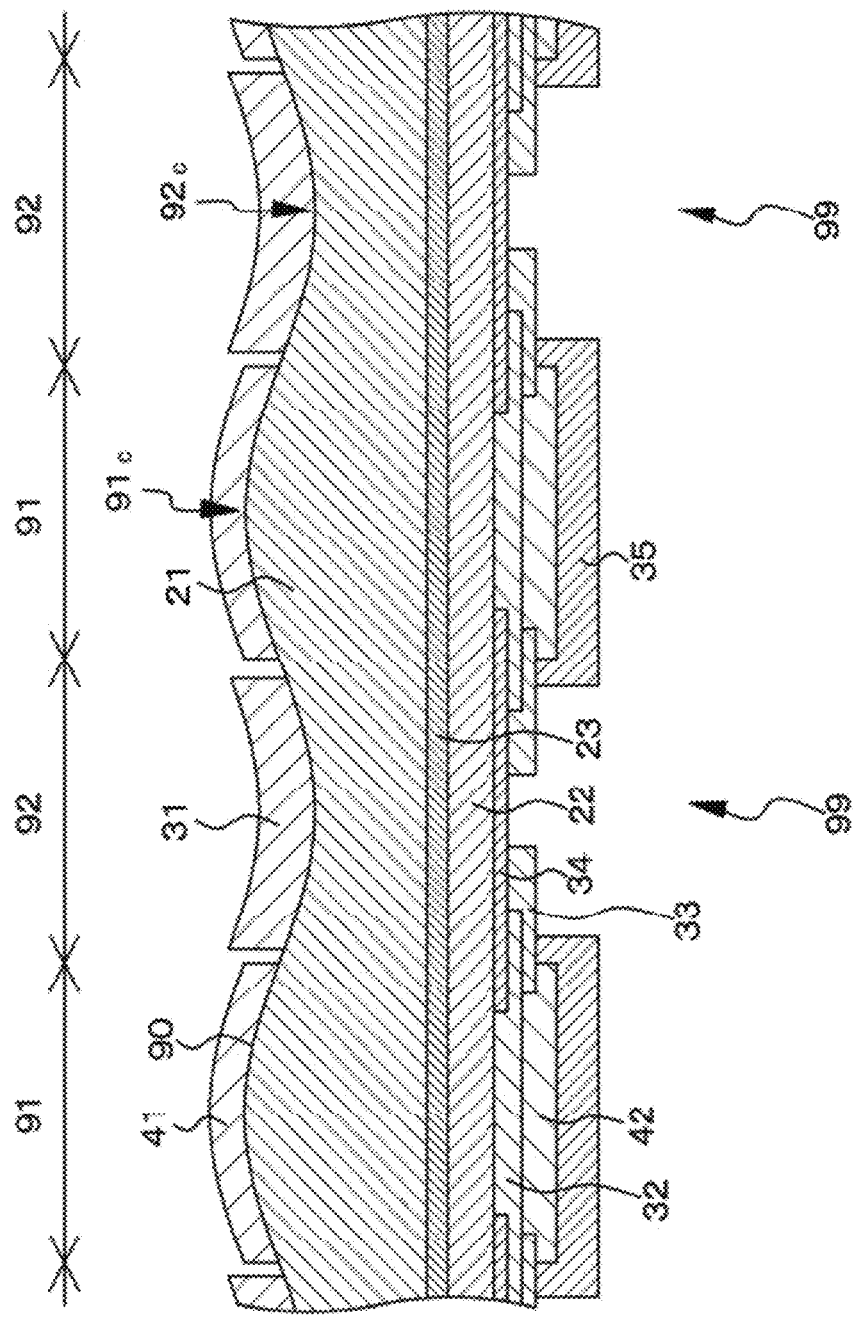
FIG. 6 is a schematic partial end view of the light emitting element array of Example 1.
Figure 7:
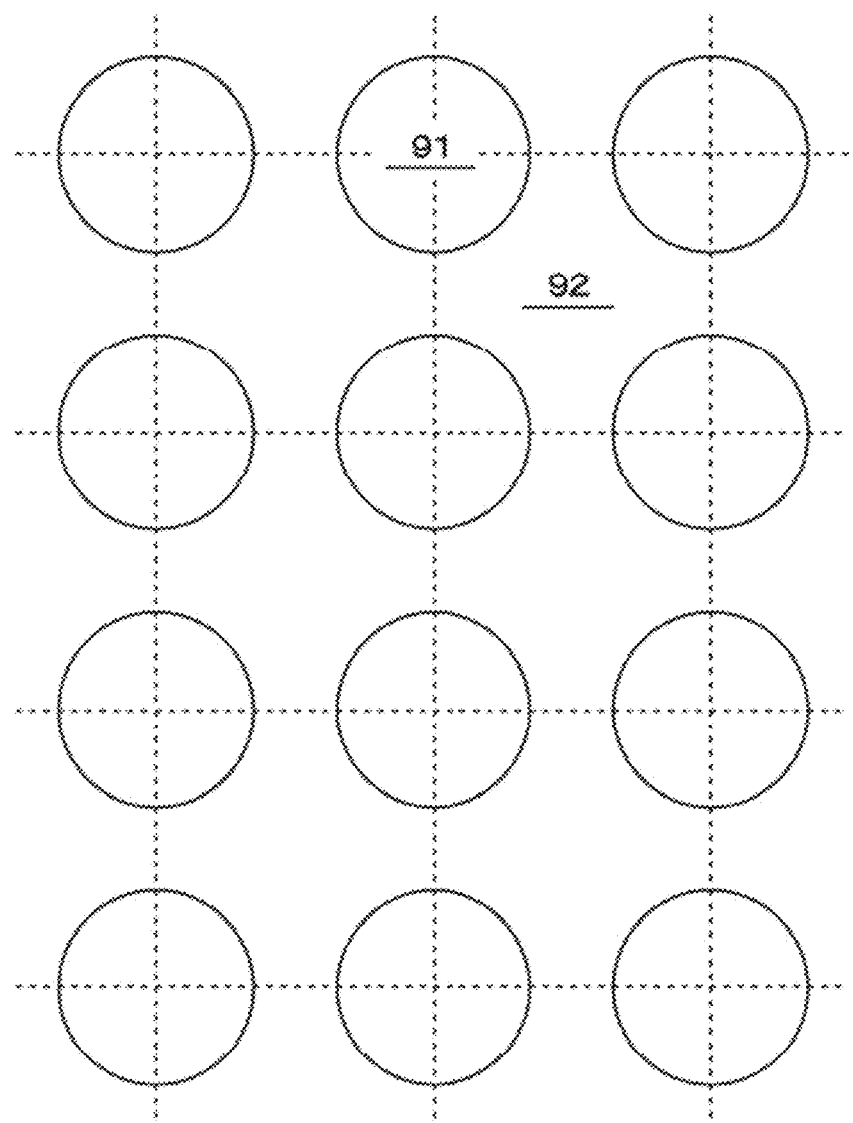
FIG. 7 is a schematic plan diagram illustrating a layout of a first portion and a second portion of a base part surface of the light emitting element array of Example 1.
Figure 8:
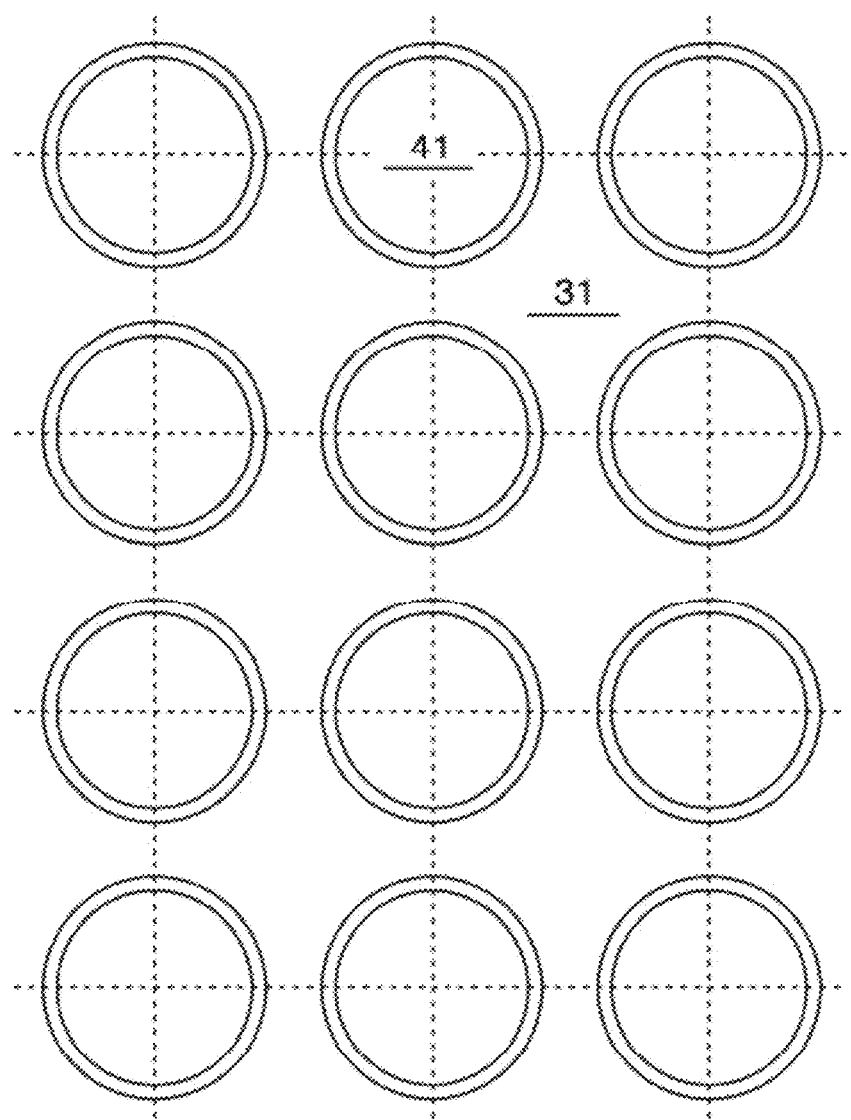
FIG. 8 is a schematic plan diagram illustrating a layout of a first light reflection layer and a first electrode in the light emitting element array of Example 1.
Figure 9:
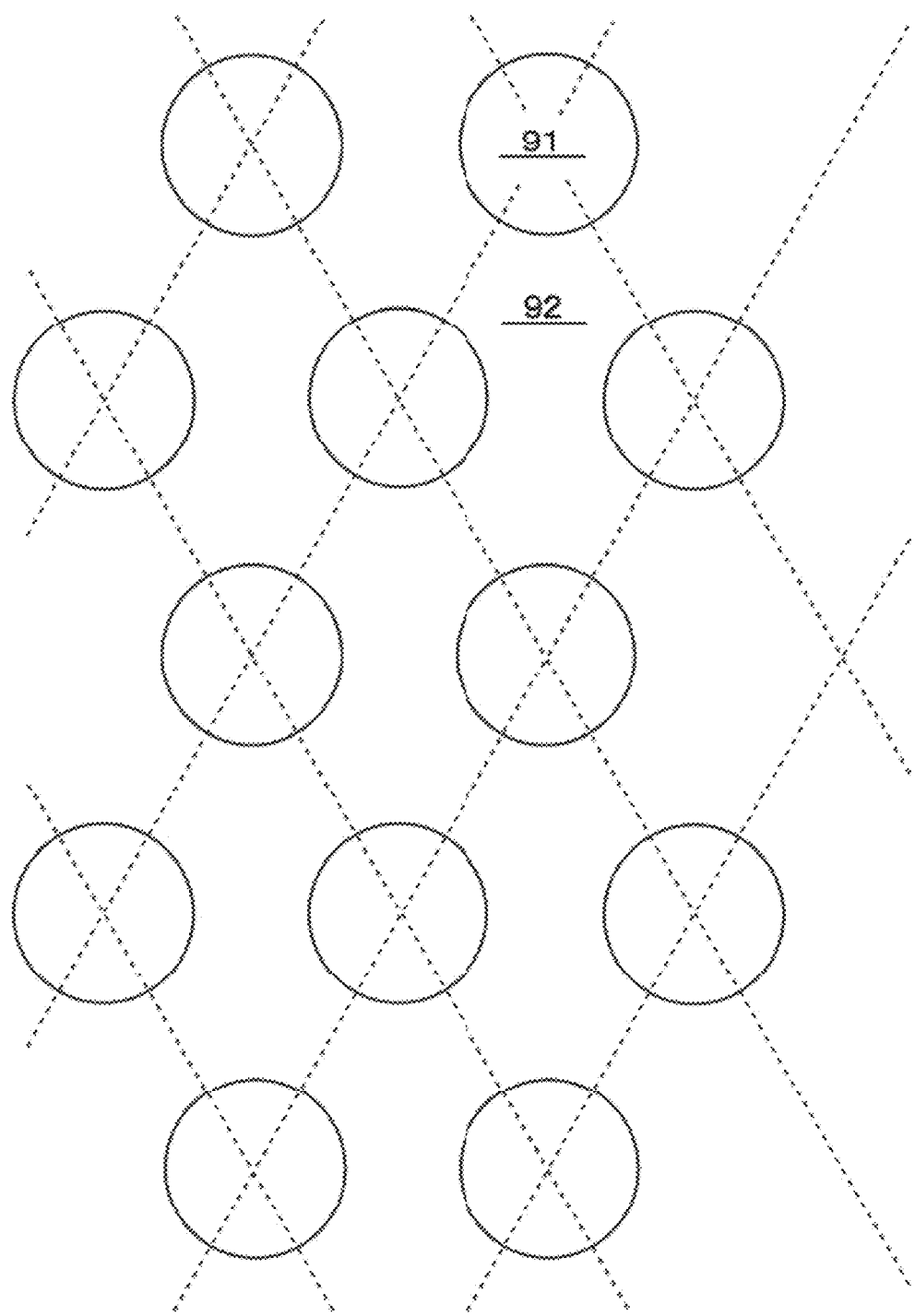
FIG. 9 is a schematic plan diagram illustrating a layout of the first portion and the second portion of the base part surface of the light emitting element array of Example 1.
Figure 10:
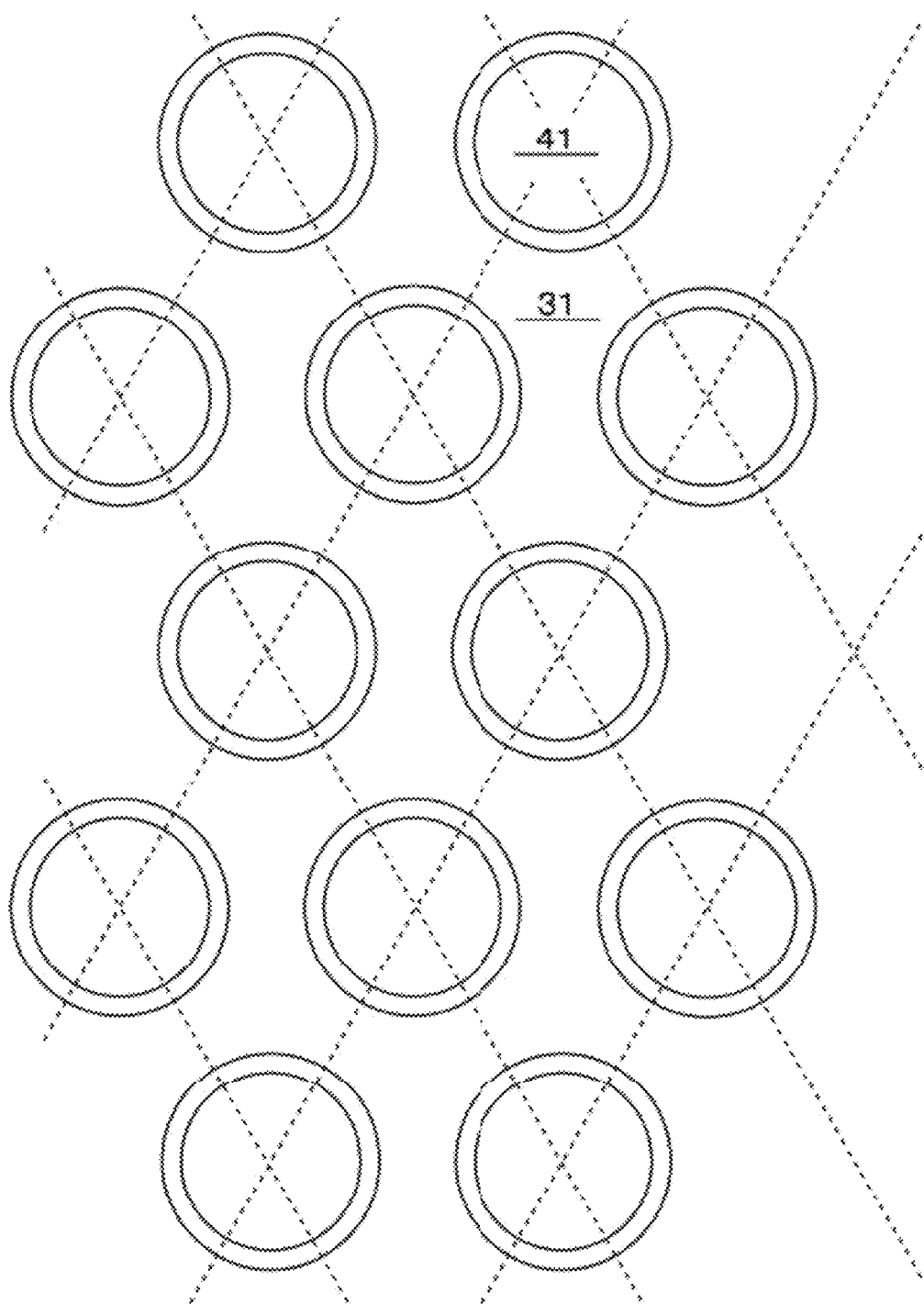
FIG. 10 is a schematic plan diagram illustrating a layout of the first light reflection layer and the first electrode in the light emitting element array of Example 1.
Figure 11A:
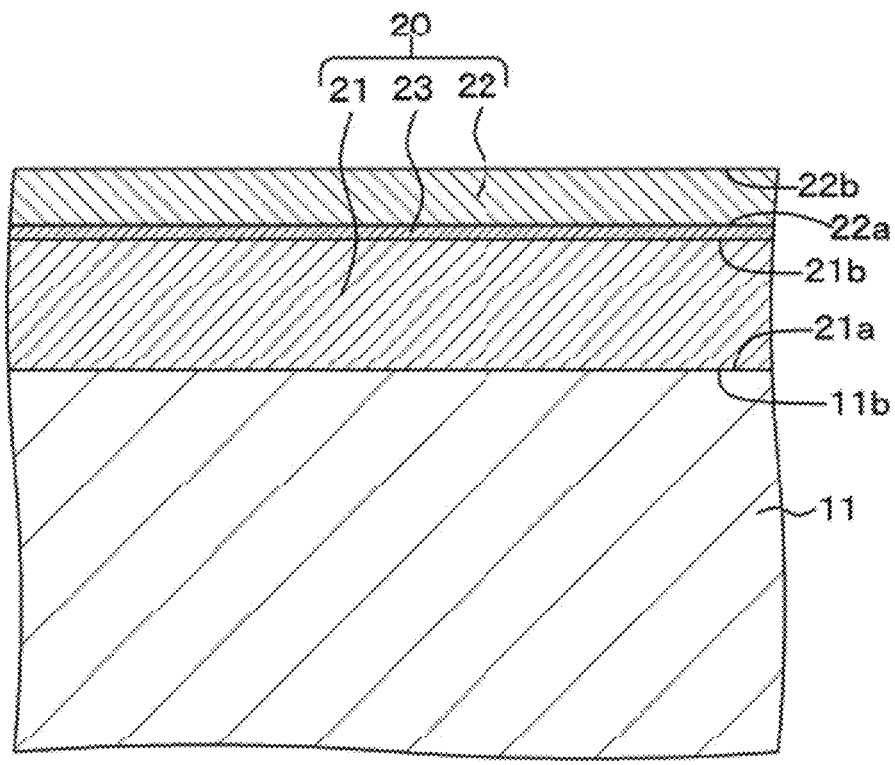
FIGS. 11A and 11B are schematic partial end views of a stacked structure and the like for describing a method of manufacturing the light emitting element of Example 1.
Figure 11B:
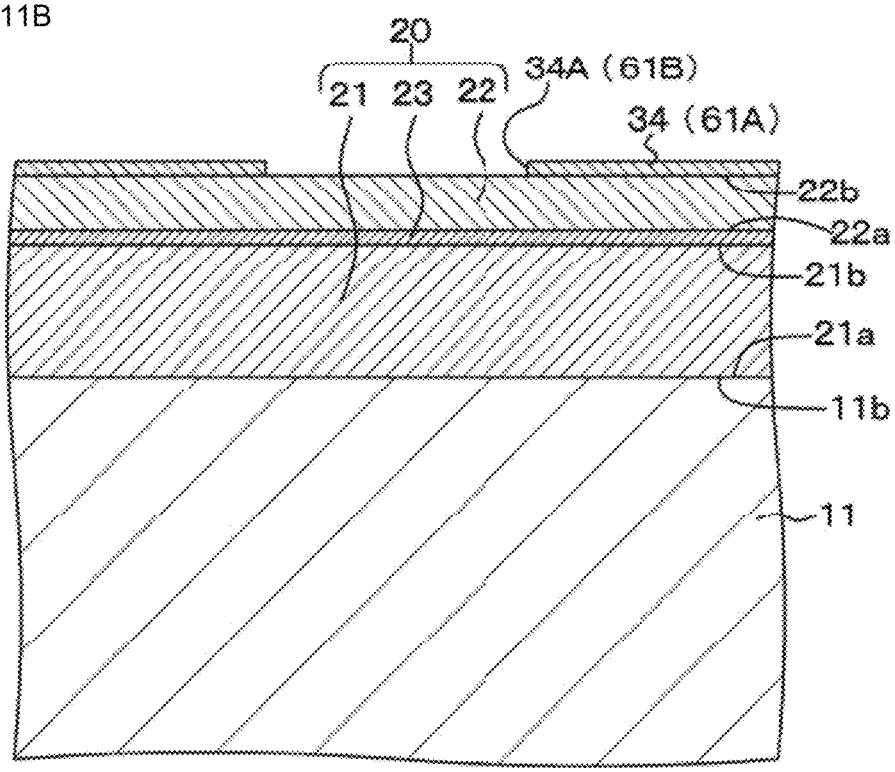
Figure 12:
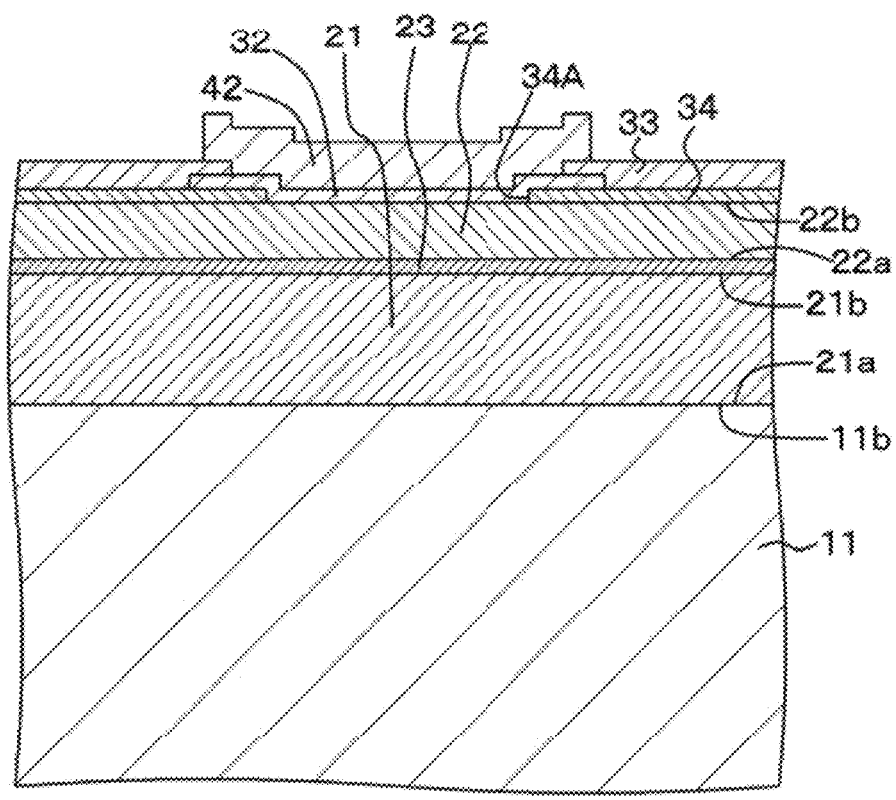
FIG. 12, subsequent to FIG. 11B, is a schematic partial end view of the stacked structure and the like for describing the method of manufacturing the light emitting element of Example 1.

Example 1 relates to the light emitting element according to the first aspect of the present disclosure, the light emitting element array according to the first aspect of the present disclosure, and the method of manufacturing the light emitting element array according to the first aspect of the present disclosure. Specifically, Example 1 relates to the light emitting element of the first configuration, the light emitting element of the (1-A)th configuration, and the light emitting element of the second configuration. Schematic partial end views of a light emitting element of Example 1, a light emitting element included in a light emitting element array of Example 1, and a light emitting element obtained by a method of manufacturing the light emitting element array of Example 1 (hereinafter, these light emitting elements are collectively referred to as a light emitting element 10A) are illustrated in FIG. 1, FIG. 2 (Modification Example-1), and FIG. 3 (Modification Example-2). Schematic partial end views of the light emitting element array of Example 1 are illustrated in FIGS. 4, 5 and 6. Further, layouts of the first portion and the second portion of the base part surface in the light emitting element array of Example 1 are illustrated in FIGS. 7 and 9, which are schematic plan diagrams. Layouts of the first light reflection layer and the first electrode in the light emitting element array of Example 1 are illustrated in FIGS. 8 and 10, which are schematic plan diagrams. Furthermore, schematic partial end views of the first compound semiconductor layer and the like for describing the method of manufacturing the light emitting element array of Example 1 are illustrated in FIGS. 11A, 11B, 12, 13, 14A, 14B, 15A, 15B, 15C, 16A, and 16B.

Note that illustrations of the active layer, the second compound semiconductor layer, the second light reflection layer, etc. are omitted in FIGS. 14A, 14B, 15A, 15B, 15C, 16A, 16B, 23A, 23B, 24A, 24B, 25A, 25B, 33A, 33B, 33C, 34A, 34B, and 34C. In addition, in FIGS. 7, 9, 19, 21, 28, 29A, and 29B, the first portion of the base part surface is indicated by a solid circle or ellipse for clarification, the center part of the second portion of the base part surface is indicated by a solid circle for clarification, and the apex part of the annular convex shape of the second portion of the base part surface is indicated by a solid ring for clarification.

The light emitting element of Example 1 includes:
a stacked structure 20 including a stack of
- a first compound semiconductor layer 21 having a first surface 21a, and a second surface 21b opposed to the first surface 21a,
- an active layer (light emitting layer) 23 facing the second surface 21b of the first compound semiconductor layer 21, and
- a second compound semiconductor layer 22 having a first surface 22a facing the active layer 23 and a second surface 22b opposed to the first surface 22a;
a first light reflection layer 41 formed on a base part surface 90 located on a first surface side of the first compound semiconductor layer 21; and
a second light reflection layer 42 formed on a second surface side of the second compound semiconductor layer 22 and having a flat shape.

The base part surface 90 extends to a peripheral region 99, and
the base part surface 90 has a concavo-convex shape, and is differentiable.

In Examples 1 to 22, the first compound semiconductor layer 21 is of a first electrical conductivity type (specifically, n-type), and the second compound semiconductor layer 22 is of a second electrical conductivity type (specifically, p-type) different from the first electrical conductivity type. In addition, the light emitting elements of Examples 1 to 22 each include a surface emitting laser element (vertical resonator laser, VCSEL) that emits laser light.

In addition, the light emitting element array of Example 1 includes a plurality of light emitting elements arranged. Each of the light emitting elements is configured by the light emitting element 10A of Example 1 described above. Note that the base part surface 90 extends to the peripheral region 99.

Alternatively, in the light emitting element 10A of Example 1, the base part surface 90 is analytically smooth.

Further, a first portion 91 of the base part surface 90 on which the first light reflection layer 41 is formed has an upwardly convex shape with respect to the second surface 21b of the first compound semiconductor layer 21. A second portion 92 of the base part surface 90 occupying the peripheral region 99 has a downwardly convex shape with respect to the second surface 21b of the first compound semiconductor layer 21. A center part $91_c$ of the first portion 91 of the base part surface 90 is located on a vertex of a square lattice (see FIG. 7), or on a vertex of an equilateral triangular lattice (see FIG. 9).

While the first light reflection layer 41 is formed on the first portion 91 of the base part surface 90, an extending part of the first light reflection layer 41 may be formed on the second portion 92 of the base part surface 90 occupying the peripheral region 99, or no extending part of the first light reflection layer 41 may be formed on the second portion 92. In Example 1, no extending part of the first light reflection layer 41 is formed on the second portion 92 of the base part surface 90 occupying the peripheral region 99.

In the light emitting element 10A of Example 1, a boundary $90_{bd}$ between the first portion 91 and the second portion 92 is definable as:
(1) in a case where the first light reflection layer 41 does not extend to the peripheral region 99, an outer peripheral part of the first light reflection layer 41; or
(2) in a case where the first light reflection layer 41 extends to the peripheral region 99, a portion of the base part surface 90 that lies astride the first portion and the second portion and in which an inflection point is present.

Here, the light emitting element 10A of Example 1 specifically corresponds to case (1).

Further, in the light emitting element 10A of Example 1, examples of the shapes of [the first portion 91/the second portion 92 in a range from the peripheral part to the center part] include the following cases:
(A) [an upwardly convex shape/a downwardly convex shape];
(B) [an upwardly convex shape/a downwardly convex shape continuing to a line segment];
(C) [an upwardly convex shape/an upwardly convex shape continuing to a downwardly convex shape];
(D) [an upwardly convex shape/an upwardly convex shape continuing to a downwardly convex shape and to a line segment];
(E) [an upwardly convex shape/a line segment continuing to a downwardly convex shape]; and
(F) [an upwardly convex shape/a line segment continuing to a downwardly convex shape and to a line segment].
The light emitting element 10A of Example 1 specifically corresponds to case (A).

In the light emitting element 10A of Example 1, the first surface 21a of the first compound semiconductor layer 21 configures the base part surface 90. A figure drawn by the first portion 91 of the base part surface 90 when the base part surface 90 is cut along a virtual plane including a stacking direction of the stacked structure 20 is differentiable, and more specifically, may be a part of a circle, a part of a parabola, a part of a sine curve, a part of an ellipse, a part of a catenary curve, or a combination of any of these curves. Portions of these curves may be replaced with a line segment. A figure drawn by the second portion 92 is also differentiable, and more specifically, may also be a part of a circle, a part of a parabola, a part of a sine curve, a part of an ellipse, a part of a catenary curve, or a combination of any of these curves. Portions of these curves may be replaced with a line segment. That is, a configuration is employable in which a figure drawn by an apex part of the first portion 91 of the base part surface 90 is a part of a circle, a part of a parabola, a part of a sine curve, a part of an ellipse, or a part of a catenary curve, and a figure drawn by a bottom portion of the first portion 91 of the base part surface 90 is a line segment. Further, a configuration is employable in which a figure drawn by a bottommost part of the second portion 92 of the base part surface 90 is a part of a circle, a part of a parabola, a part of a sine curve, a part of an ellipse, or a part of a catenary curve, and a figure drawn by a part above the bottommost part of the second portion 92 of the base part surface 90 is a line segment. A configuration is also employable in which a figure drawn by the bottommost part of the second portion 92 of the base part surface 90 is a line segment, and the part above the bottommost part of the second portion 92 of the base part surface 90 is a part of a circle, a part of a parabola, a part of a sine curve, a part of an ellipse, or a part of a catenary curve, and also a line segment. Furthermore, the boundary between the first portion 91 and the second portion 92 of the base part surface 90 is also differentiable.

In the light emitting element array, it is desirable that a formation pitch of the light emitting elements be greater than or equal to 3 μm and smaller than or equal to 50 μm, preferably greater than or equal to 5 μm and smaller than or equal to 30 μm, and more preferably greater than or equal to 8 μm and smaller than or equal to 25 μm. Further, a radius of curvature $R_1$ of the center part $91_c$ of the first portion 91 of the base part surface 90 is desirably greater than or equal to $1\times10^{-5}$ m. A resonator length $L_{OR}$ preferably satisfies $1\times10^{-5}$ m≤$L_{OR}$. In the light emitting element array of Example 1 illustrated in FIGS. 7 and 8 and FIGS. 9 and 10, parameters of the light emitting element 10A are as described in Table 1 below. Note that the diameter of the first light reflection layer 41 is denoted by $D_1$, the height of the first portion 91 of the base part surface 90 is denoted by $H_1$, and the radius of curvature of a center part 92c of the second portion 92 of the base part surface 90 is denoted by $R_2$. Here, the height $H_1$ of the first portion 91 is expressed by: $H_1=L_1-L_2$ where $L_1$ is the distance from the second surface 21b of the first compound semiconductor layer 21 to the center part $91_c$ of the first portion 91 of the base part surface 90, and $L_2$ is the distance from the second surface 21b of the first compound semiconductor layer 21 to the center part $92_c$ of the second portion 92 of the base part surface 90. Further, specifications of the light emitting element 10A of Example 1 illustrated in FIGS. 7 and 8 and FIGS. 9 and 10 are described in Tables 2 and 3 below. Note that "Number of light emitting elements" refers to the number of the light emitting elements included in a single light emitting element array.

The stacked structure 20 may include at least one kind of material selected from the group consisting of a GaN-based compound semiconductor, an InP-based compound semiconductor, and a GaAs-based compound semiconductor. In Example 1, specifically, the stacked structure 20 includes a GaN-based compound semiconductor.

The first compound semiconductor layer 21 includes an n-GaN layer, the active layer 23 includes a five-tiered quantum well structure in which $In_{0.4}Ga_{0.96}N$ layers (barrier layers) and $In_{0.16}Ga_{0.84}N$ layers (well layers) are stacked, and the second compound semiconductor layer 22 includes a p-GaN layer. A first electrode 31 including Ti/Pt/Au is electrically coupled to an external circuit or the like through a first pad electrode (not illustrated) including, for example, Ti/Pt/Au or V/Pt/Au. Meanwhile, a second electrode 32 is formed on the second compound semiconductor layer 22, and the second light reflection layer 42 is formed on the second electrode 32. The second light reflection layer 42 on the second electrode 32 has a flat shape. The second electrode 32 includes a transparent electrically-conductive material, specifically, ITO. On an edge part of the second electrode 32, a second pad electrode 33 including, for example, Pd/Ti/Pt/Au, Ti/Pd/Au, or Ti/Ni/Au for establishing electrical coupling to the external circuit or the like may be formed or coupled (see FIGS. 2 and 3). The first light reflection layer 41 and the second light reflection layer 42 include a stacked structure of a $Ta_2O_5$ layer and a $SiO_2$ layer, or a stacked structure of a SiN layer and a $SiO_2$ layer. Although the first light reflection layer 41 and the second light reflection layer 42 have such a multilayer structure, they are illustrated as a single layer for simplification of the drawings. Respective plan-view shapes of the first electrode 31, the first light reflection layer 41, the second light reflection layer 42, and an opening 34A provided in an insulating layer (current confinement layer) 34 are circular.

As illustrated in FIGS. 1 and 4, the second electrode 32 is common among the light emitting elements 10A included in the light emitting element array. The second electrode is coupled to an external circuit or the like through the first pad electrode (not illustrated). The first electrode 31 is also common among the light emitting elements 10A included in the light emitting element array, and is coupled to an external circuit or the like through the first pad electrode (not illustrated). In the light emitting element 10A illustrated in FIGS. 1 and 4, light may be emitted to the outside through the first light reflection layer 41, or light may be emitted to the outside through the second light reflection layer 42.

Alternatively, as illustrated in FIGS. 2 and 5, the second electrode 32 is individually formed in the light emitting elements 10A included in the light emitting element array, and is coupled to an external circuit or the like through the second pad electrode 33. The first electrode 31 is common among the light emitting elements 10A included in the light emitting element array, and is coupled to an external circuit or the like through the first pad electrode (not illustrated). In the light emitting element 10A illustrated in FIGS. 2 and 5, light may be emitted to the outside through the first light reflection layer 41, or light may be emitted to the outside through the second light reflection layer 42.

Figure 3:
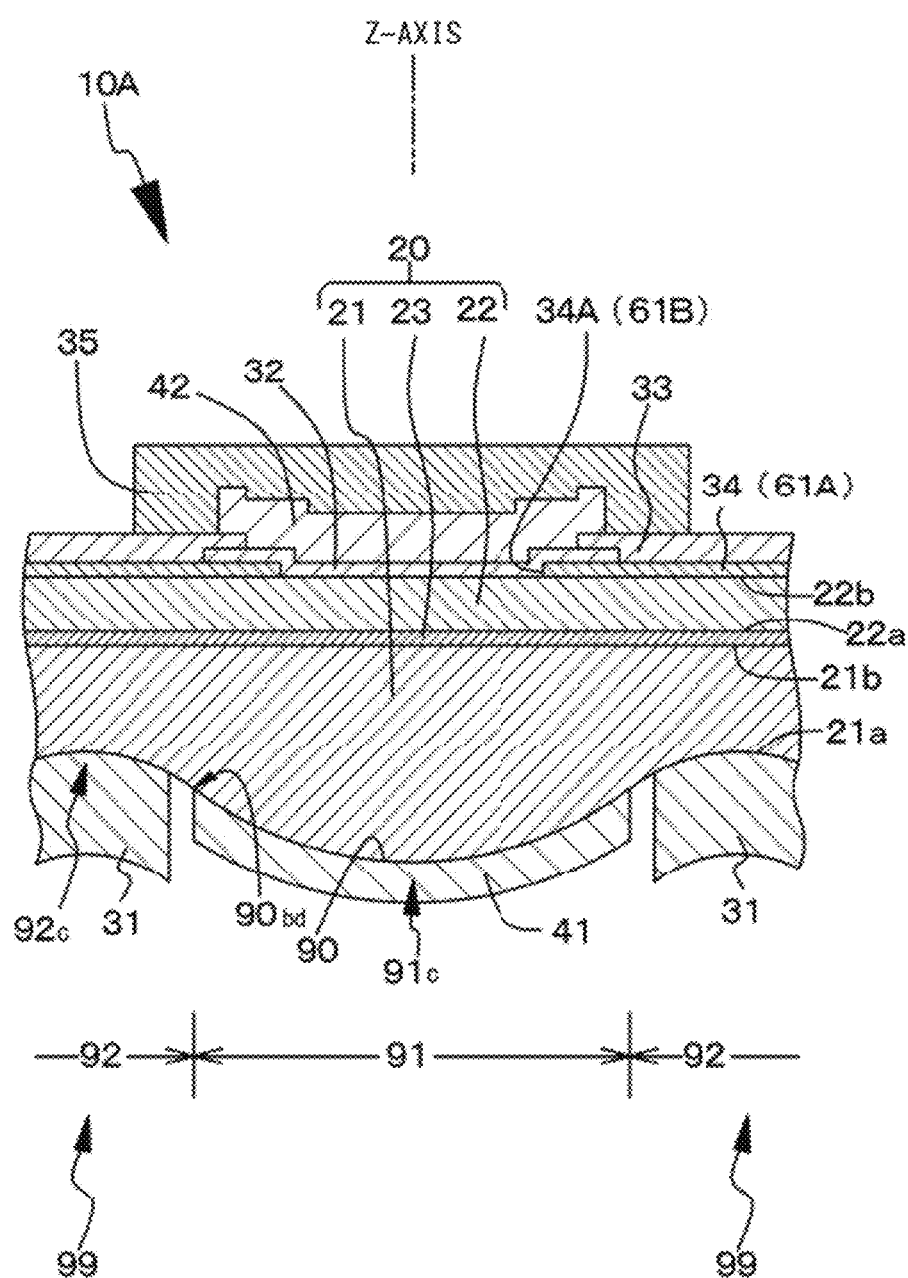
FIG. 3 is a schematic partial end view of a modification example (Modification Example-2) of the light emitting element of Example 1.

Alternatively, as illustrated in FIGS. 3 and 6, the second electrode 32 is individually formed in the light emitting elements 10A included in the light emitting element array. On the second pad electrode 33 formed on the second electrode 32, a bump 35 is formed and electrical coupling to an external circuit or the like is established through the bump 35. The first electrode 31 is common among the light emitting elements 10A included in the light emitting element array, and is coupled to an external circuit or the like through the first pad electrode (not illustrated). The bump 35 is provided in a portion on the second surface side of the second compound semiconductor layer 22 opposed to the center part $91_c$ of the first portion 91 of the base part surface 90, and covers the second light reflection layer 42. Examples of the bump 35 include a gold (Au) bump, a solder bump, and an indium (In) bump. A method of providing the bump 35 may be a well-known method. In the light emitting element 10A illustrated in FIGS. 3 and 6, light is emitted to the outside through the first light reflection layer 41. Note that the bump 35 may be provided in the light emitting element 10A illustrated in FIG. 1. Examples of the shape of the bump 35 include a cylindrical shape, an annular shape, and a hemispherical shape.

The value of the thermal conductivity of the stacked structure 20 is higher than the value of the thermal conductivity of the first light reflection layer 41. The thermal conductivity of the dielectric material configuring the first light reflection layer 41 has a value of about 10 watts/(m·K) or less. Meanwhile, the thermal conductivity of the GaN-based compound semiconductor configuring the stacked structure 20 has a value of about 50 watts/(m·K) to about 100 watts/(m·K).

TABLE 1

|  | See FIGS. 7 and 8 | See FIGS. 9 and 10 |
| --- | --- | --- |
| Formation pitch | 25 μm | 20 μm |
| Radius of curvature $R_1$ | 100 μm | 200 μm |
| Diameter $D_1$ | 20 μm | 15 μm |
| Height $H_1$ | 2 μm | 2 μm |
| Radius of curvature $R_2$ | 2 μm | 3 μm |

TABLE 2

| See FIGS. 7 and 8 | |
| --- | --- |
| Second light reflection layer 42 | $SiO_2/Ta_2O_5$ (11.5 pairs) |
| Second electrode 32 | ITO (thickness: 22 nm) |
| Second compound semiconductor layer 22 | p-GaN |

TABLE 2-continued

See FIGS. 7 and 8

| | |
|---|---|
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 445 nm |
| Number of light emitting elements | 100 × 100 |

TABLE 3

See FIGS. 9 and 10

| | |
|---|---|
| Second light reflection layer 42 | $SiO_2$/SiN (9 pairs) |
| Second electrode 32 | ITO (thickness: 22 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 488 nm |
| Number of light emitting elements | 1000 × 1000 |

In the following, a method of manufacturing the light emitting element array of Example 1 will be described with reference to FIGS. 11A, 11B, 12, 13, 14A, 14B, 15A, 15B, 15C, 16A, and 16B, which are schematic partial end views of the first compound semiconductor layer and the like.

First, after the stacked structure 20 is formed, the second light reflection layer 42 is formed on the second surface side of the second compound semiconductor layer 22.

[Step-100]

Specifically, on a second surface 11b of a compound semiconductor substrate 11 having a thickness of about 0.4 mm, formed is the stacked structure 20 including a GaN-based compound semiconductor and including a stack of the first compound semiconductor layer 21 having the first surface 21a, and the second surface 21b opposed to the first surface 21a, the active layer (light emitting layer) 23 facing the second surface 21b of the first compound semiconductor layer 21, and the second compound semiconductor layer 22 having the first surface 22a facing the active layer 23 and the second surface 22b opposed to the first surface 22a. More specifically, it is possible to obtain the stacked structure 20 (see FIG. 11A) by forming the first compound semiconductor layer 21, the active layer 23, and the second compound semiconductor layer 22 sequentially on the second surface 11b of the compound semiconductor substrate 11 by an epitaxial growth method using a well-known MOCVD method.

[Step-110]

Subsequently, the insulating layer (current confinement layer) 34 having the opening 34A and including $SiO_2$ is formed (see FIG. 11B) on the second surface 22b of the second compound semiconductor layer 22 by a combination of a film formation method, such as a CVD method, a sputtering method, or a vacuum deposition method, and a wet etching method or a dry etching method. A current confinement region (a current injection region 61A and a current non-injection region 61B) is defined by the insulating layer 34 having the opening 34A. That is, the current injection region 61A is defined by the opening 34A.

In order to obtain the current confinement region, an insulating layer (current confinement layer) including an insulating material (e.g., $SiO_X$ or $SiN_X$, $AlO_X$) may be formed between the second electrode 32 and the second compound semiconductor layer 22, or the second compound semiconductor layer 22 may be etched by an RIE method or the like to form a mesa structure. Alternatively, the current confinement region may be formed by partially oxidizing some layers of stacked second compound semiconductor layers 22 from a lateral direction, or a region with a reduced electrical conductivity may be formed by injecting impurities into the second compound semiconductor layer 22 by ion injection. Alternatively, any of them may be combined appropriately. Note that it is necessary for the second electrode 32 to be electrically coupled to a portion of the second compound semiconductor layer 22 through which a current flows due to current confinement.

[Step-120]

Thereafter, the second electrode 32 and the second light reflection layer 42 are formed on the second compound semiconductor layer 22. Specifically, the second electrode 32 is formed to extend from the second surface 22b of the second compound semiconductor layer 22 exposed at a bottom surface of the opening 34A (current injection region 61A) to a position on the insulating layer 34 by, for example, a lift-off method, and further, the second pad electrode 33 is formed by a combination of a film formation method such as a sputtering method or a vacuum deposition method and a patterning method such as a wet etching method or a dry etching method, as desired. Subsequently, the second light reflection layer 42 is formed to extend from a position on the second electrode 32 to a position on the second pad electrode 33 by a combination of a film formation method such as a sputtering method or a vacuum deposition method and a patterning method such as a wet etching method or a dry etching method. The second light reflection layer 42 on the second electrode 32 has a flat shape. In this way, it is possible to obtain the structure illustrated in FIG. 12. Thereafter, as desired, the bump 35 may be provided in a portion on the second surface side of the second compound semiconductor layer 22 opposed to the center part $91_c$ of the first portion 91 of the base part surface 90. Specifically, the bump 35 may be formed to cover the second light reflection layer 42 on the second pad electrode 33 (see FIGS. 3 and 4B) formed on the second electrode 32. The second electrode 32 is coupled to an external circuit or the like through the bump 35.

[Step-130]

Figure 13:
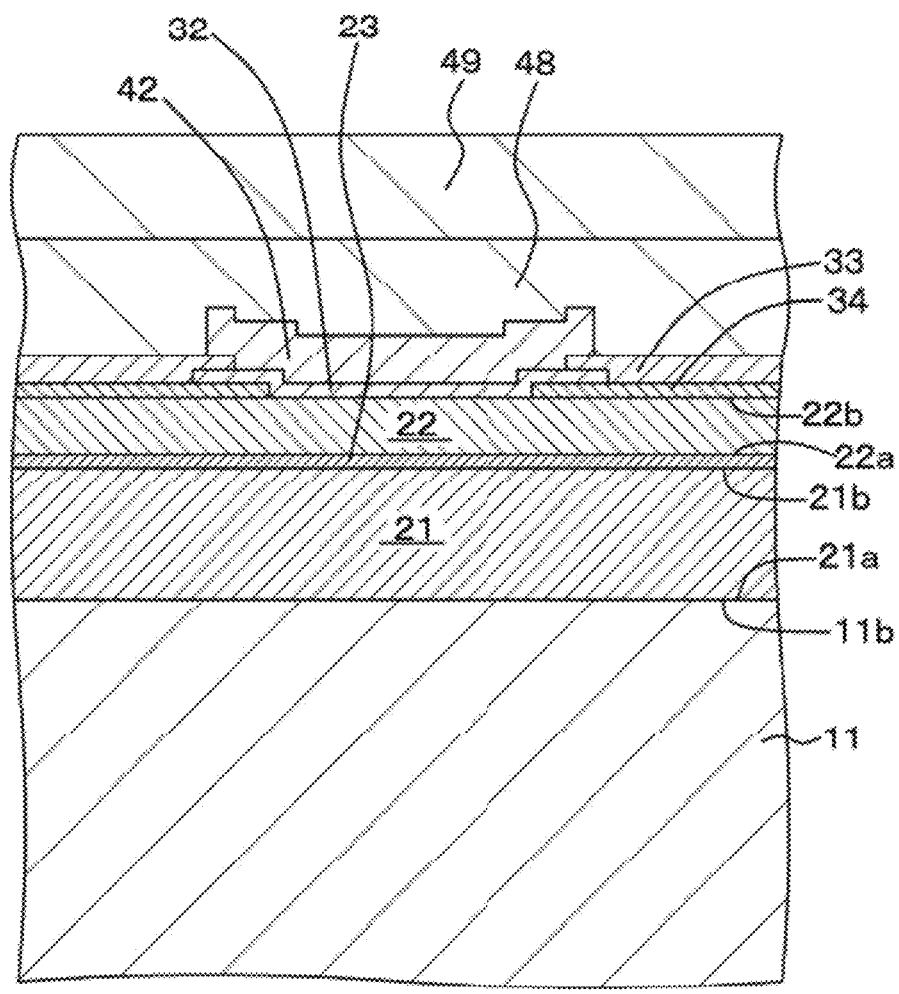
FIG. 13, subsequent to FIG. 12, is a schematic partial end view of the stacked structure and the like for describing the method of manufacturing the light emitting element of Example 1.

Subsequently, the second light reflection layer 42 is fixed to a support substrate 49 through a bonding layer 48 (see FIG. 13). Specifically, the second light reflection layer 42 (or the bump 35) is fixed to the support substrate 49 including a sapphire substrate by using the bonding layer 48 including an adhesive.

[Step-140]

Subsequently, the compound semiconductor substrate 11 is thinned by a mechanical polishing method or a CMP method, and further, etching is performed to remove the compound semiconductor substrate 11.

[Step-150]

Figure 14A:
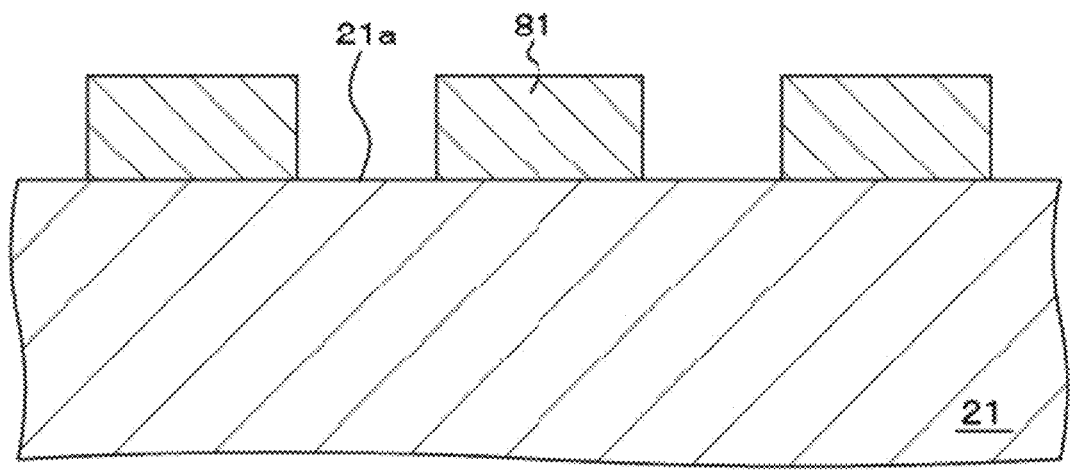
FIGS. 14A and 14B, subsequent to FIG. 13, are schematic partial end views of a first compound semiconductor layer and the like for describing a method of manufacturing the light emitting element array of Example 1.

Thereafter, a first sacrificial layer 81 is formed on the first portion 91 of the base part surface 90 (specifically, the first surface 21a of the first compound semiconductor layer 21) on which the first light reflection layer 41 is to be formed, and thereafter, a surface of the first sacrificial layer is made into a convex shape. Specifically, the first sacrificial layer 81 illustrated in FIG. 14A is obtained by forming a first resist material layer on the first surface 21a of the first compound semiconductor layer 21 and patterning the first resist material layer to allow the first resist material layer to remain on the first portion 91, and thereafter, heat treatment is performed on the first sacrificial layer 81. It is thus possible to obtain the structure illustrated in FIG. 14B. Subsequently, a surface of the first sacrificial layer 81' is subjected to an ashing process (plasma irradiation process) to modify the surface of the first sacrificial layer 81'. This prevents the first sacrificial layer 81' from suffering damage or deformation when a second sacrificial layer 82 is formed in a next step.

[Step-160]

Figure 15A:
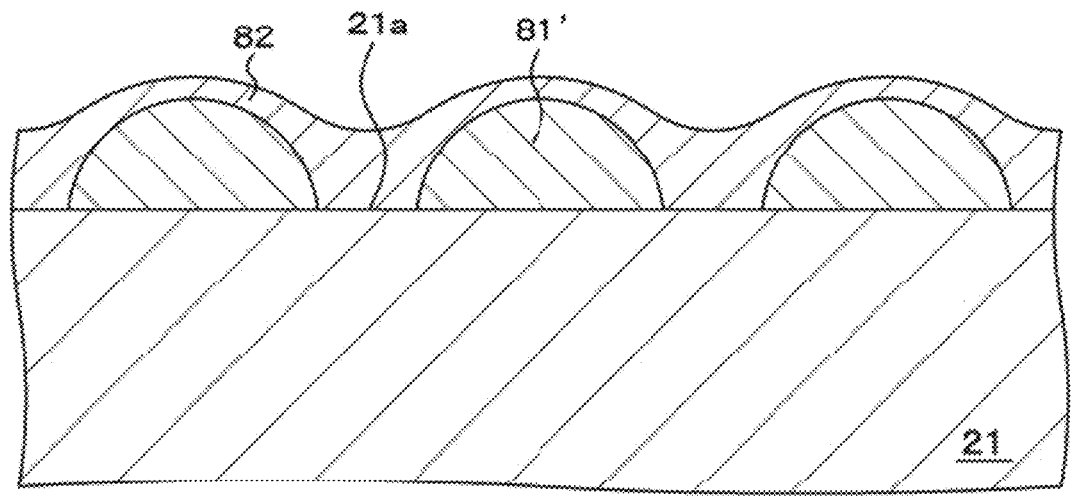
FIGS. 15A, 15B, and 15C, subsequent to FIG. 14B, are schematic partial end views of the first compound semiconductor layer and the like for describing the method of manufacturing the light emitting element array of Example 1.
Figure 15B:
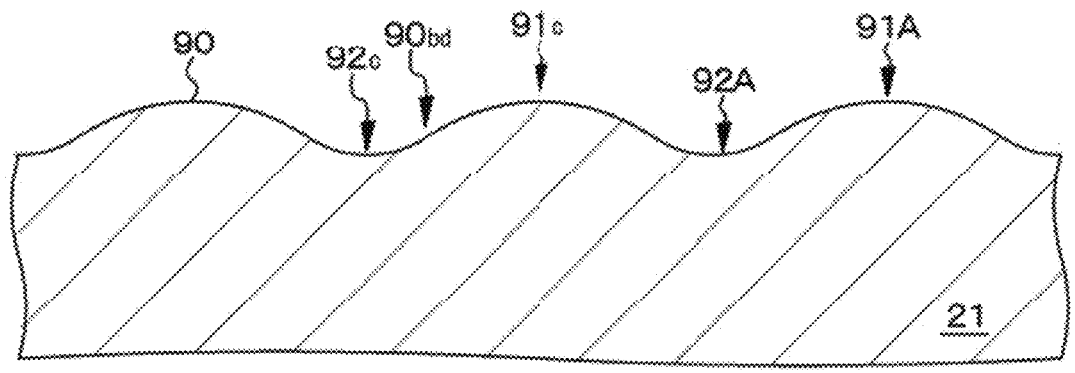
Figure 15C:
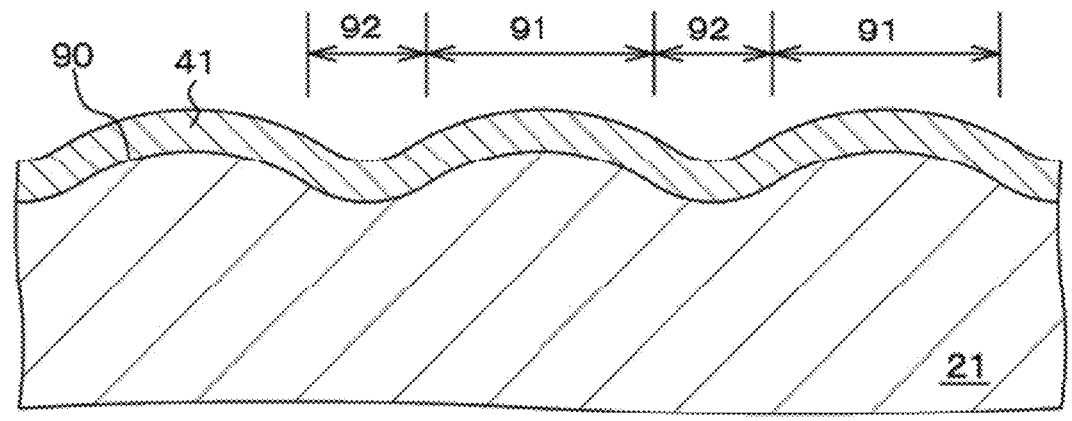
Figure 16A:
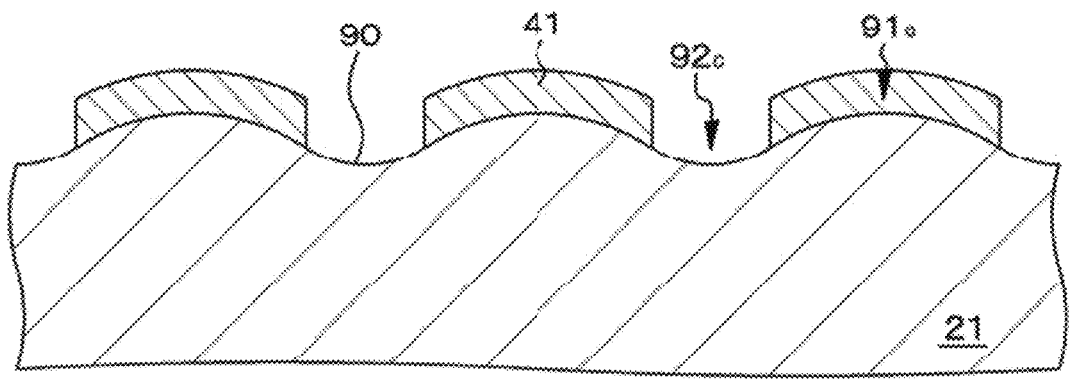
FIGS. 16A and 16B, subsequent to FIG. 15C, are schematic partial end views of the first compound semiconductor layer and the like for describing the method of manufacturing the light emitting element array of Example 1.
Figure 16B:
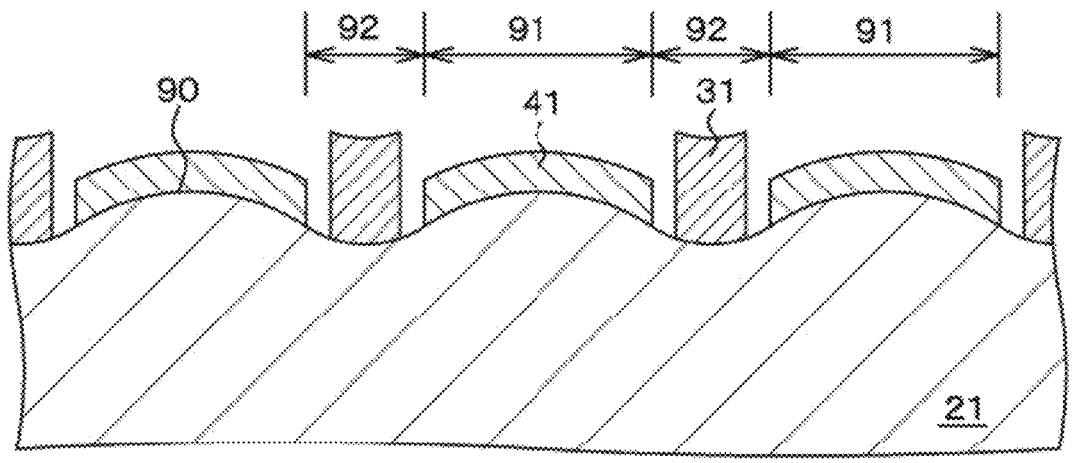

Subsequently, the second sacrificial layer 82 is formed on the second portion 92 of the base part surface 90 exposed between the first sacrificial layers 81' and on the first sacrificial layers 81' to make a surface of the second sacrificial layer 82 into a concavo-convex shape (see FIG. 15A). Specifically, the second sacrificial layer 82 including a second resist material layer having an appropriate thickness is formed over the entire surface. Note that in the example illustrated in FIG. 7, the second sacrificial layer 82 has an average film thickness of 2 μm, whereas in the example illustrated in FIG. 9, the second sacrificial layer 82 has an average film thickness of 5 μm.

In a case where it is necessary to further increase the radius of curvature $R_1$ of the first portion 91 of the base part surface 90, it is sufficient that [Step-150] and [Step-160] are repeated.

The materials of the first sacrificial layer 81 and the second sacrificial layer 82 are not limited to resist materials, and it is sufficient that a material appropriate in relation to the first compound semiconductor layer 21, such as an oxide material (e.g., $SiO_2$, SiN, $TiO_2$ or the like), a semiconductor material (e.g., Si, GaN, InP, GaAs, or the like), or a metal material (e.g., Ni, Au, Pt, Sn, Ga, In, Al, or the like) is selected. In addition, by using a resist material having an appropriate viscosity as the resist material configuring the first sacrificial layer 81 and the second sacrificial layer 82, and by appropriately setting and selecting the thickness of the first sacrificial layer 81, the thickness of the second sacrificial layer 82, the diameter of the first sacrificial layer 81', etc., it is possible to set the value of the radius of curvature of the base part surface 90 and the concavo-convex shape of the base part surface 90 (e.g., the diameter $D_1$ and the height $H_1$) to a desired value and a desired shape.

[Step-170]

Thereafter, by etching back the second sacrificial layer 82 and the first sacrificial layer 81' and further etching back inwardly from the base part surface 90 (i.e., from the first surface 21a of the first compound semiconductor layer 21 into the first compound semiconductor layer 21), a convex part 91A is formed in the first portion 91 of the base part surface 90, and at least a concave part (in Example 1, a concave part 92A) is formed in the second portion 92 of the base part surface 90, with respect to the second surface 21b of the first compound semiconductor layer 21. In this way, it is possible to obtain the structure illustrated in FIG. 15B. The etching back may be performed by a dry etching method such as an RIE method, or by a wet etching method using hydrochloric acid, nitric acid, hydrofluoric acid, phosphoric acid, a mixture of any of these, or the like.

[Step-180]

Next, the first light reflection layer 41 is formed on the first portion 91 of the base part surface 90. Specifically, the first light reflection layer 41 is formed over the entire surface of the base part surface 90 by a film formation method such as a sputtering method or a vacuum deposition method (see FIG. 15C), following which the first light reflection layer 41 is patterned. It is thereby possible to obtain the first light reflection layer 41 on the first portion 91 of the base part surface 90 (see FIG. 16A). Thereafter, the first electrode 31 common among the light emitting elements is formed on the second portion 92 of the base part surface 90 (see FIG. 16B). In the above-described manner, it is possible to obtain the light emitting element array or the light emitting element 10A of Example 1. By making the first electrode 31 protrude relative to the first light reflection layer 41, it is possible to protect the first light reflection layer 41.

[Step-190]

Thereafter, the support substrate 49 is removed and the light emitting element arrays are individually separated. Then, it is sufficient that electrical coupling to an external electrode or circuit (circuit for driving the light emitting element array) is established. Specifically, it is sufficient that the first compound semiconductor layer 21 is coupled to an external circuit or the like through the first electrode 31 and the unillustrated first pad electrode, and the second compound semiconductor layer 22 is coupled to an external circuit or the like through the second pad electrode 33 or the bump 35. Next, the light emitting element array of Example 1 is completed by performing packaging or sealing.

In the light emitting element of Example 1, the base part surface has a concavo-convex shape and is differentiable. By virtue of this, in a case where an external force is applied to the light emitting element due to some cause, a problem that would occur with the existing technology, such as a problem of stress concentrating on the rising portion of the convex part, is avoidable with reliability, and therefore no damage can occur to the first compound semiconductor layer and the like. The light emitting element array, in particular, is coupled or bonded to an external circuit or the like by using a bump, and it is necessary to apply a high load (e.g., about 50 MPa) to the light emitting element array at the time of bonding. With the light emitting element array of Example 1, no damage can occur to the light emitting element array even if such a high load is applied. Furthermore, because the base part surface has a concavo-convex shape, generation of stray light is suppressed, and therefore it is possible to prevent the occurrence of light crosstalk between the light emitting elements.

In a case of arranging light emitting elements at narrow pitches in a light emitting element array, it is not possible for the pitch to exceed the footprint diameter of the first sacrificial layer. Therefore, in order to reduce the pitch of the light emitting element array, it is necessary to reduce the footprint diameter. Incidentally, the radius of curvature $R_1$ of the center part of the first portion of the base part surface has a positive correlation with the footprint diameter. That is, a decrease in footprint diameter with decreasing pitch results in a tendency of the radius of curvature $R_1$ to become smaller. For example, at a footprint diameter of 24 μm, a radius of curvature $R_1$ of about 30 μm has been reported. Further, a radiation angle of light emitted from the light emitting element has a negative correlation with the footprint diameter. That is, a decrease in footprint diameter with decreasing pitch results in a tendency of the radius of curvature $R_1$ to become smaller to enlarge a FFP (Far Field Pattern). A radius of curvature $R_1$ of less than 30 μm can result in a radiation angle of several degrees or more. Depending on the application field of the light emitting element array, there may be cases where a narrow radiation angle of 2 to 3 degrees or less is demanded of light emitted from the light emitting element.

According to Example 1, the first portion is formed in the base part surface with use of the first sacrificial layer and the second sacrificial layer. This makes it possible to obtain the first light reflection layer that is free from distortion and has a large radius of curvature $R_1$ even in a case where the light emitting elements are arranged at narrow pitches. Accordingly, it is possible for light emitted from the light emitting elements to be at a narrow radiation angle of 2 to 3 degrees or less, or a radiation angle as narrow as possible. This makes it possible to provide a light emitting element with a narrow FFP, a light emitting element with high orientability, and a light emitting element with high beam quality. Furthermore, because a wide light emission region is obtainable, it is possible to achieve increased light output and improved light emission efficiency of the light emitting element, and to achieve increased light output and improved efficiency of the light emitting element.

Moreover, because it is possible to make the height (thickness) of the first portion lower (thinner), voids (empty spaces) are less likely to occur in the bump when the light emitting element is coupled or bonded to an external circuit or the like by using the bump. This makes it possible to achieve improved thermal conductivity, and facilitates mounting.

Further, in the light emitting element of Example 1, because the first light reflection layer also serves as a concave mirror, it is possible to cause light that spreads through diffraction with the active layer as a start point and enters the first light reflection layer to be reflected toward the active layer and condensed onto the active layer with reliability. It is thus possible to avoid an increase in diffraction loss and to perform laser oscillation with reliability. Owing to having a long resonator, it is also possible to avoid the problem of thermal saturation. Moreover, because it is possible to make the resonator length longer, allowance in the manufacturing process of the light emitting element is enhanced, resulting in that improved yield is achievable. Note that "diffraction loss" refers to a phenomenon in which laser light reciprocating in a resonator is gradually dissipated to the outside of the resonator, because light generally tends to spread due to a diffraction effect. In addition, it is possible to suppress stray light, and to suppress light crosstalk between the light emitting elements. Here, if light emitted from a certain light emitting element comes into an adjacent light emitting element and is absorbed by the active layer of the adjacent light emitting element, or is coupled to a resonance mode, the light emitting operation of the adjacent light emitting element is affected, and noise can be generated. Such a phenomenon is called light crosstalk. Moreover, the apex of the convex part is, for example, a spherical surface, and therefore exhibits the effect of confining light in a lateral direction with reliability.

Further, although a GaN substrate is used in the manufacturing process of the light emitting element except for Example 7 to be described later, no GaN-based compound semiconductor is formed by a method for lateral epitaxial growth, such as an ELO method. This makes it possible to use not only a polar GaN substrate but also a semipolar GaN substrate and a nonpolar GaN substrate, as the GaN substrate. While the use of the polar GaN substrate tends to lower the light emission efficiency due to a piezoelectric effect in the active layer, the use of the nonpolar GaN substrate or the semipolar GaN substrate makes it possible to solve or mitigate such a problem.

Example 2

Figure 17:
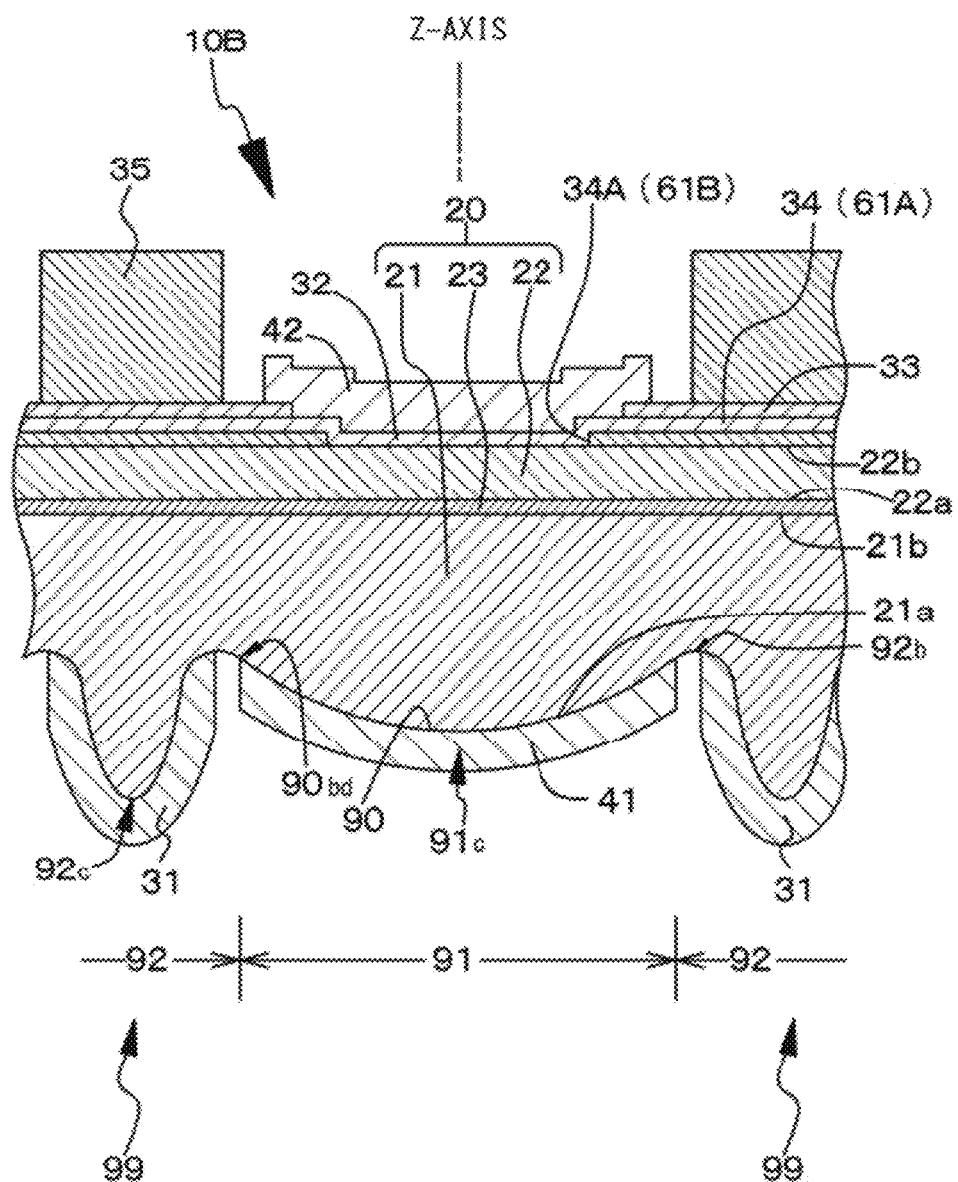
FIG. 17 is a schematic partial end view of a light emitting element of Example 2.
Figure 18:
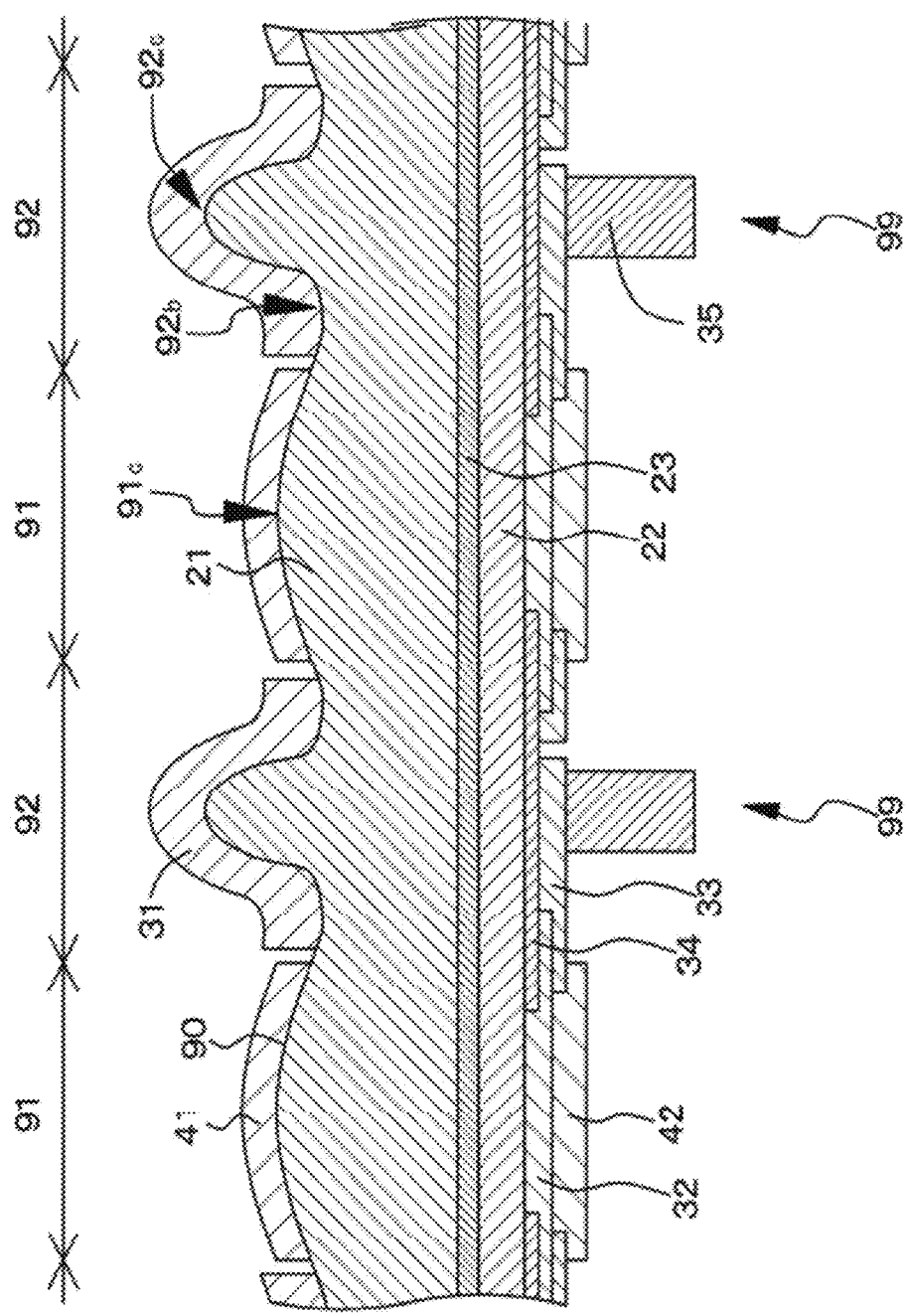
FIG. 18 is a schematic partial end view of a light emitting element array of Example 2.
Figure 19:
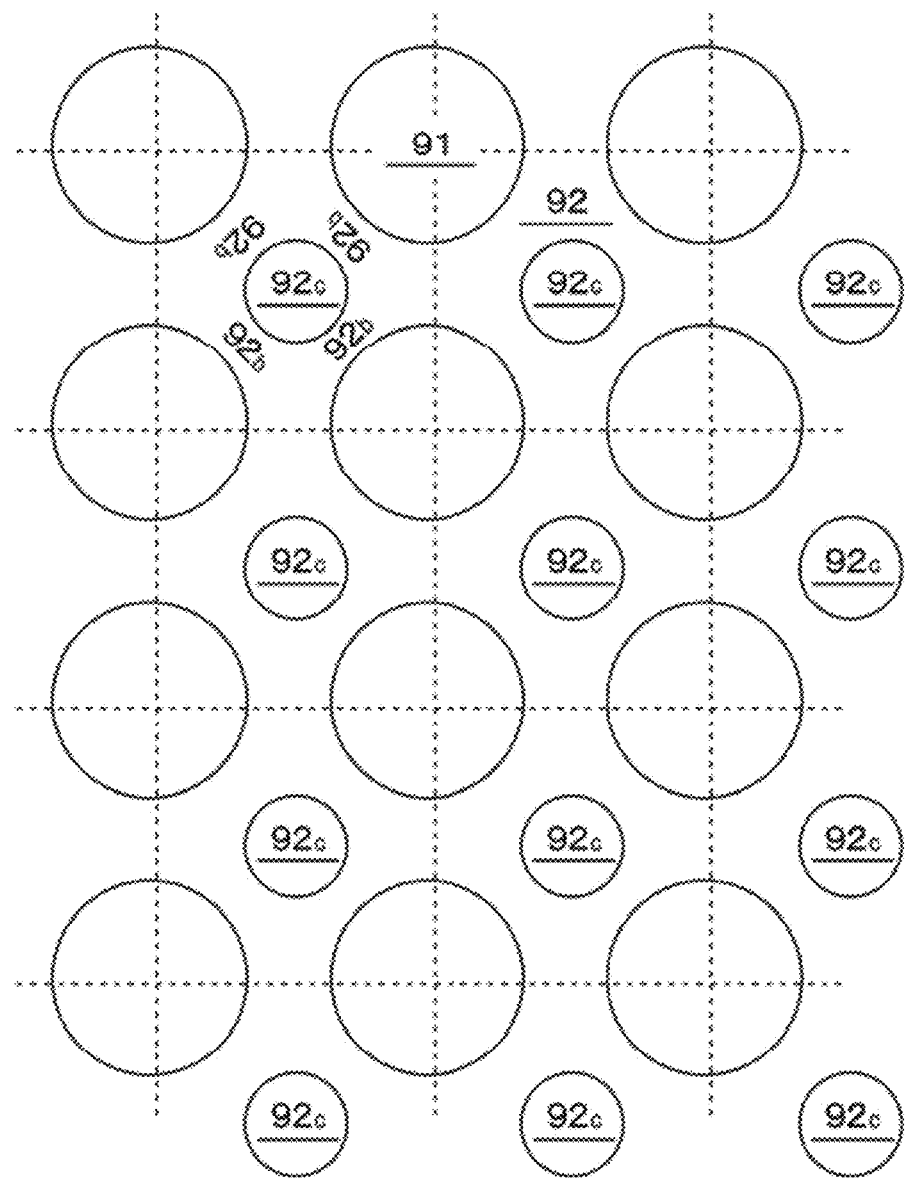
FIG. 19 is a schematic plan diagram illustrating a layout of the first portion and the second portion of the base part surface in the light emitting element array of Example 2.
Figure 20:
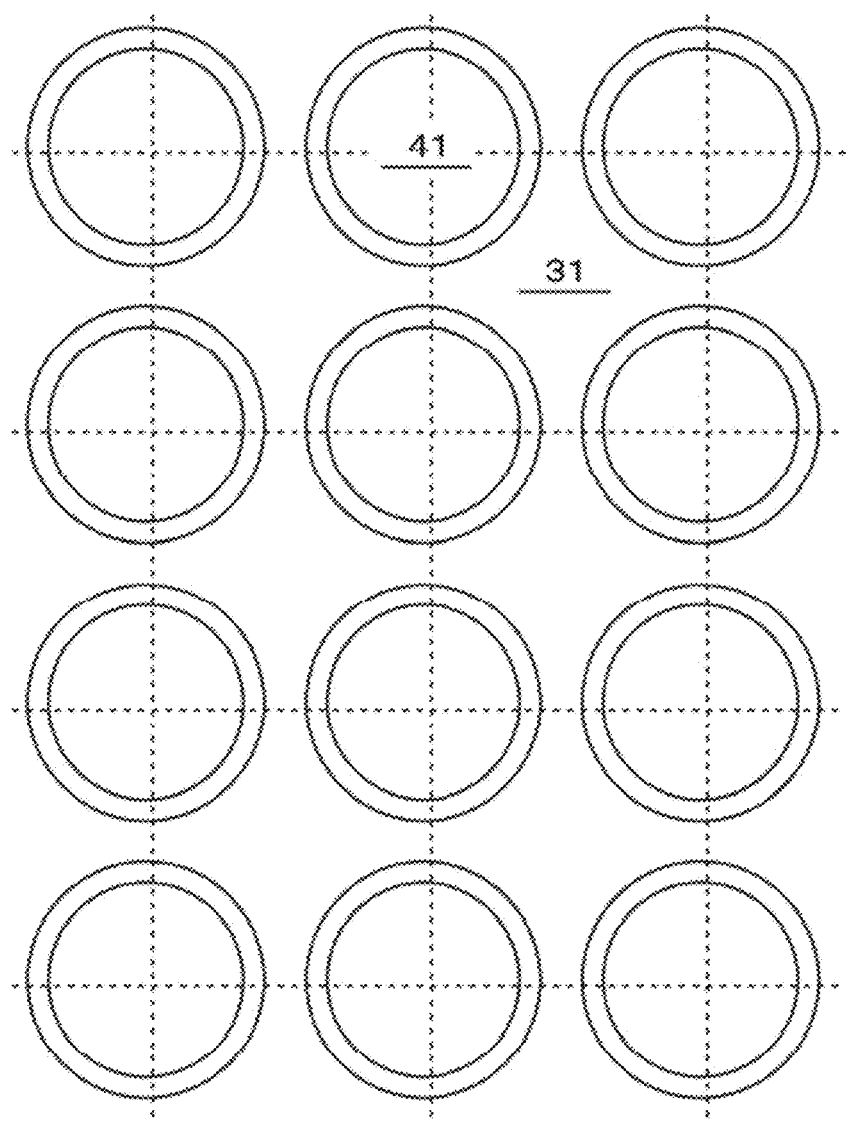
FIG. 20 is a schematic plan diagram illustrating a layout of the first light reflection layer and the first electrode in the light emitting element array of Example 2.
Figure 21:
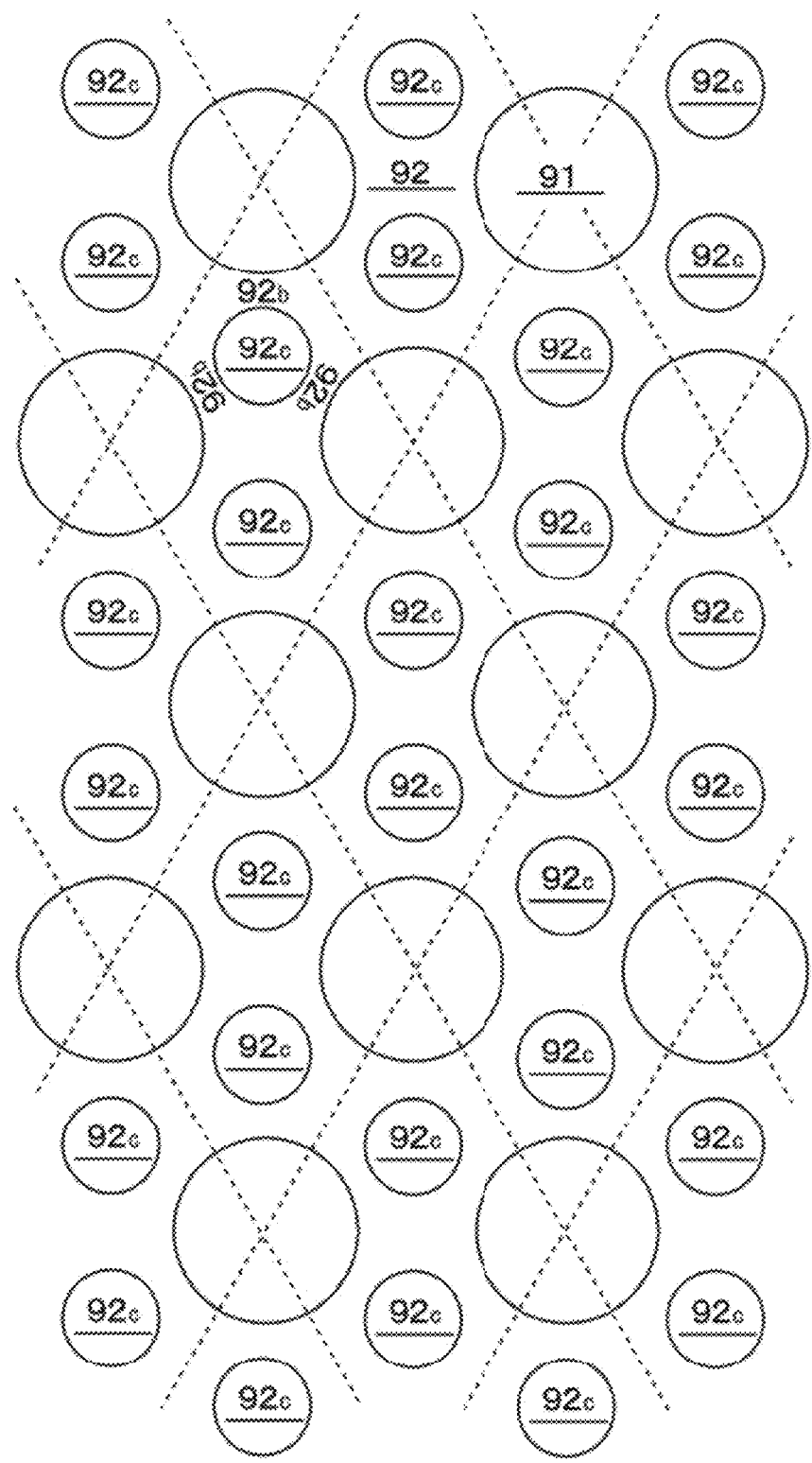
FIG. 21 is a schematic plan diagram illustrating a layout of the first portion and the second portion of the base part surface in the light emitting element array of Example 2.
Figure 22:
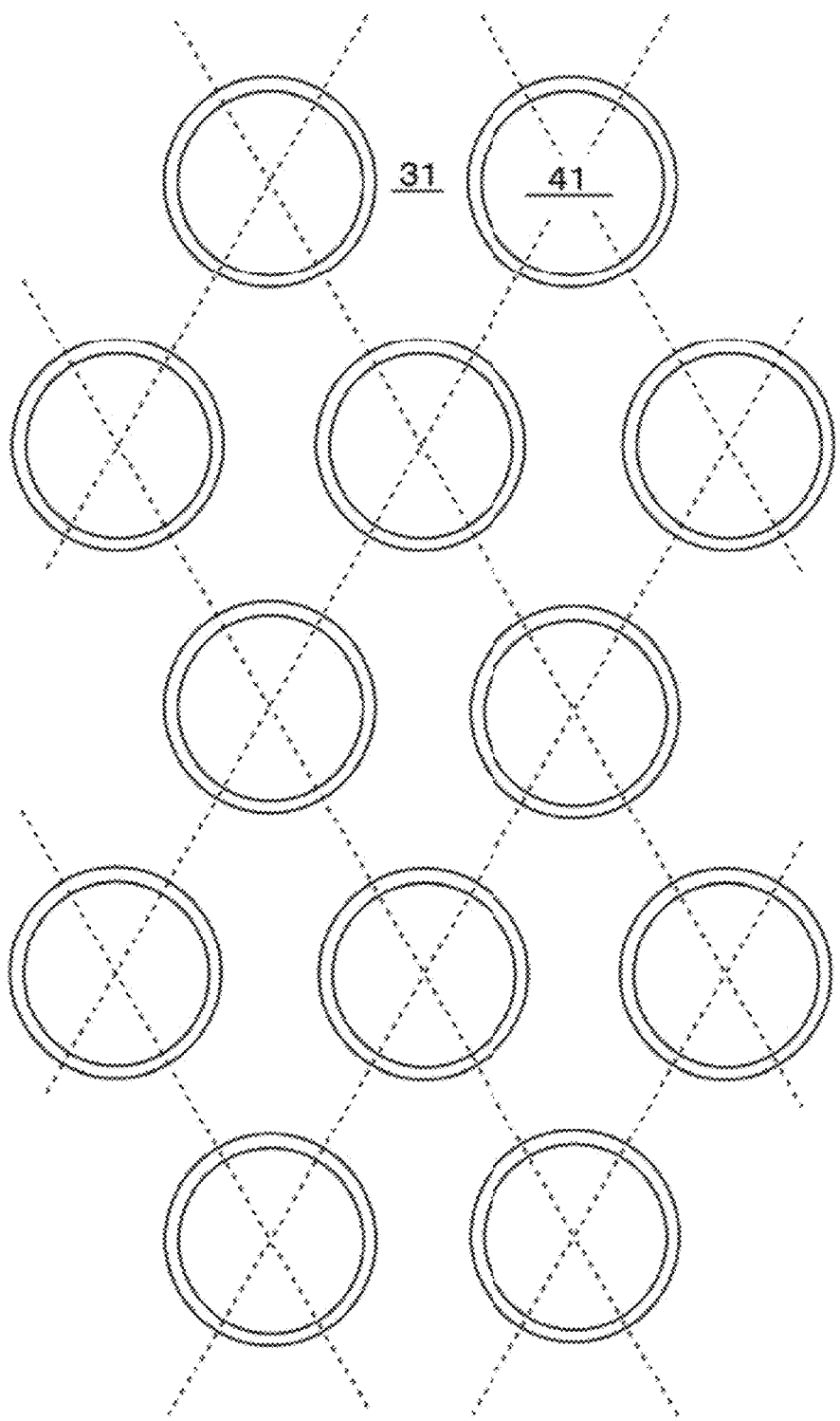
FIG. 22 is a schematic plan diagram illustrating a layout of the first light reflection layer and the first electrode in the light emitting element array of Example 2.

Example 2 is a modification of Example 1, and relates to the light emitting element of the (1-B)th configuration. A schematic partial end view of a light emitting element 10B of Example 2 is illustrated in FIG. 17, and a schematic partial end view of a light emitting element array of Example 2 is illustrated in FIG. 18. Further, schematic plan views of layouts of the first portion and the second portion of the base part surface in the light emitting element array of Example 2 are illustrated in FIGS. 19 and 21, and schematic plan views of layouts of the first light reflection layer and the first electrode in the light emitting element array of Example 2 are illustrated in FIGS. 20 and 22. Furthermore, schematic partial end views of the first compound semiconductor layer and the like for describing a method of manufacturing a light emitting element array of Example 2 are illustrated in FIGS. 23A, 23B, 24A, 24B, 25A, and 25B.

In the light emitting element 10B of Example 2, the second portion 92 of the base part surface 90 occupying the peripheral region 99 has, toward a center part of the peripheral region 99, a downwardly convex shape, and an upwardly convex shape extending from the downwardly convex shape, with respect to the second surface 21b of the first compound semiconductor layer 21. In addition, $$L_2 > L_1$$

is satisfied, where $L_1$ is the distance from the second surface 21b of the first compound semiconductor layer 21 to the center part $91_c$ of the first portion 91 of the base part surface 90, and $L_2$ is the distance from the second surface 21b of the first compound semiconductor layer 21 to the center part 92c of the second portion 92 of the base part surface 90. In addition, $$R_1 > R_2$$

is satisfied, where $R_1$ is the radius of curvature of the center part $91_c$ of the first portion 91 of the base part surface 90 (i.e., the radius of curvature of the first light reflection layer 41), and $R_2$ is the radius of curvature of the center part 92 of the second portion 92 of the base part surface 90. Note that examples of the value of $L_2/L_1$ include and are not limited to:

$$1 < L_2/L_1 \le 100,$$

and examples of the value of $R_1/R_2$ include and are not limited to:

$$1 < R_1/R_2 \le 100.\text{ Specifically, for example,}$$

$$L_2/L_1 = 1.05, \text{ and}$$

$$R_1/R_2 = 10.$$

In the light emitting element 10B of Example 2, the center part $91_c$ of the first portion 91 of the base part surface 90 is located on a vertex of a square lattice (see FIG. 19). In this case, the center part 92c (represented by a circular shape in FIG. 19) of the second portion 92 of the base part surface 90 is located on a vertex of a square lattice. Alternatively, the center part $91_c$ of the first portion 91 of the base part surface 90 is located on a vertex of an equilateral triangular lattice (see FIG. 21). In this case, the center part 92c (represented by a circular shape in FIG. 21) of the second portion 92 of the base part surface 90 is located on a vertex of an equilateral triangular lattice. Further, the second portion 92 of the base part surface 90 occupying the peripheral region 99 has a downwardly convex shape toward the center part of the peripheral region 99. Such a region is denoted by reference numeral $92_b$ in FIGS. 19 and 21.

In the light emitting element 10B of Example 2, examples of the shapes of [the first portion 91/the second portion 92 in the range from the peripheral part to the center part] include the following cases:

(A) [an upwardly convex shape/a downwardly convex shape continuing to an upwardly convex shape];

(B) [an upwardly convex shape/an upwardly convex shape continuing to a downwardly convex shape, and to an upwardly convex shape]; and (C) [an upwardly convex shape/a line segment continuing to a downwardly convex shape, and to an upwardly convex shape]. The light emitting element 10B of Example 2 specifically corresponds to case (A).

In the light emitting element 10B of Example 2, the bump 35 is provided in a portion on the second surface side of the second compound semiconductor layer 22 opposed to the convex-shaped portion in the second portion 92 of the base part surface 90.

As illustrated in FIG. 17, the second electrode 32 is common among the light emitting elements 10B included in the light emitting element array, or is individually formed as illustrated in FIG. 18, and is coupled to an external circuit or the like through the bump 35. The first electrode 31 is common among the light emitting elements 10B included in the light emitting element array, and is coupled to an external circuit or the like through the first pad electrode (not illustrated). The bump 35 is formed in the portion on the second surface side of the second compound semiconductor layer 22 opposed to the convex-shaped portion 92c in the second portion 92 of the base part surface 90. In the light emitting element 10B illustrated in FIGS. 17, 18A, and 18B, light may be emitted to the outside through the first light reflection layer 41, or light may be emitted to the outside through the second light reflection layer 42. Examples of the shape of the bump 35 may include a cylindrical shape, an annular shape, and a hemispherical shape.

Further, it is desirable that the radius of curvature $R_2$ of the center part 92c of the second portion 92 of the base part surface 90 be greater than or equal to $1 \times 10^{-6}$ m, preferably greater than or equal to $3 \times 10^{-6}$ m, and more preferably greater than or equal to $5 \times 10^{-6}$ m. Specifically, radius of curvature $R_2$=3 μm.

In the light emitting element array of Example 2 illustrated in FIGS. 19 and 20 and FIGS. 21 and 22, parameters of the light emitting element 10B are as described in Table 4 below. Further, specifications of the light emitting element 10B of Example 2 illustrated in FIGS. 19 and 20 and FIGS. 21 and 22 are described in Tables 5 and 6 below. Here, the height $H_1$ of the first portion 91 is expressed by:

$H_1 = L_1 - L_2''$, and the height $H_2$ of the center part 92c of the second portion 92 is expressed by:

$H_2 = L_2 - L_2''$, where $L_1$ is the distance from the second surface 21b of the first compound semiconductor layer 21 to the center part $91_c$ of the first portion 91 of the base part surface 90, and $L_2''$ is the distance from the second surface 21b of the first compound semiconductor layer 21 to a deepest concave portion $92_b$ in the second portion 92 of the base part surface 90.

TABLE 4

|  | See FIGS. 19 and 20 | See FIGS. 21 and 22 |
| --- | --- | --- |
| Formation pitch | 25 μm | 25 μm |
| Radius of curvature $R_1$ | 150 μm | 150 μm |

TABLE 4-continued

|  | See FIGS. 19 and 20 | See FIGS. 21 and 22 |
| --- | --- | --- |
| Diameter $D_1$ | 20 μm | 20 μm |
| Height $H_1$ | 2 μm | 2 μm |
| Radius of curvature $R_2$ | 2 μm | 2 μm |
| Height $H_2$ | 2.5 μm | 2.5 μm |

<Table 5> See FIGS. 19 and 20
Second light reflection layer 42 $SiO_2/Ta_2O_5$ (11.5 pairs)
Second electrode 32 ITO (thickness: 30 nm)
Second compound semiconductor layer 22 p-GaN
Active layer 23 InGaN (multi-quantum well structure)
First compound semiconductor layer 21 n-GaN
First light reflection layer 41 $SiO_2/Ta_2O_5$ (14 pairs)
Resonator length $L_{OR}$ 25 μm
Oscillation wavelength (light emission wavelength) $\lambda_0$ 445 nm
Number of light emitting elements 100×100

TABLE 6

| See FIGS. 21 and 22 | |
| --- | --- |
| Second light reflection layer 42 | $SiO_2/Ta_2O_5$ (11.5 pairs) |
| Second electrode 32 | ITO (thickness: 30 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 445 nm |
| Number of light emitting elements | 100 × 100 |

Figure 23A:
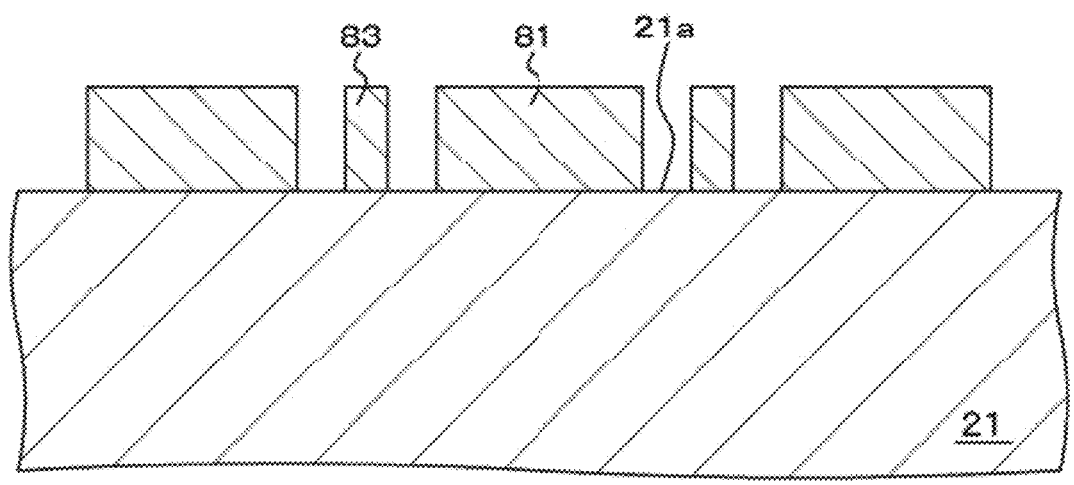
FIGS. 23A and 23B are schematic partial end views of the first compound semiconductor layer and the like for describing a method of manufacturing the light emitting element array of Example 2.
Figure 23B:
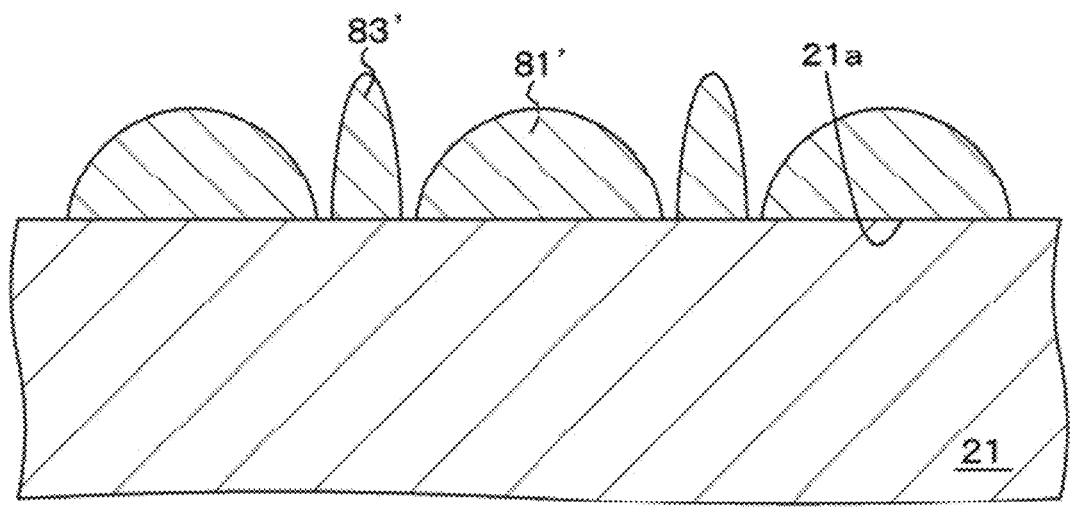
Figure 25A:
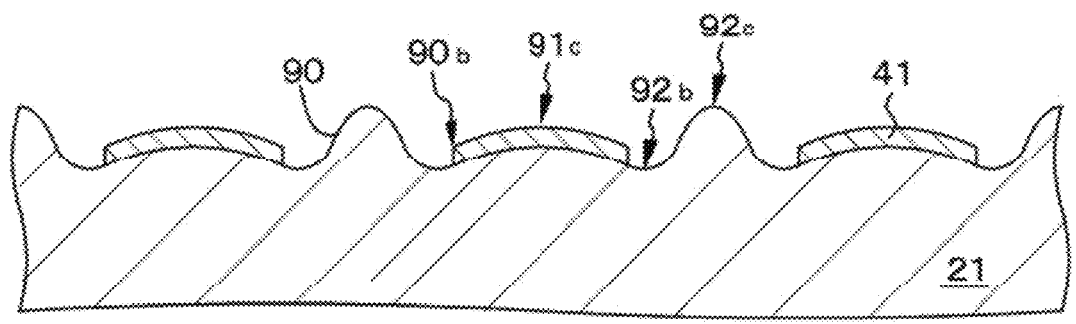
FIGS. 25A and 25B, subsequent to FIG. 24B, are schematic partial end views of the first compound semiconductor layer and the like for describing the method of manufacturing the light emitting element array of Example 2.
Figure 25B:
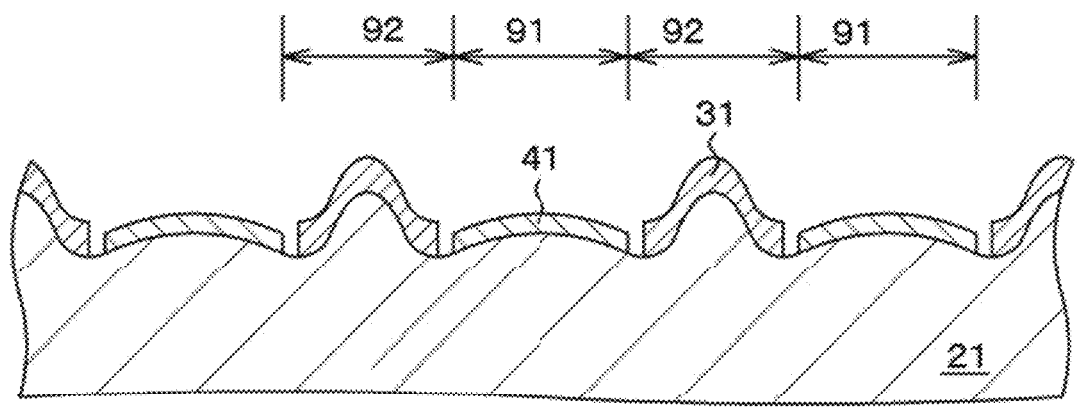

Schematic partial end views of the first compound semiconductor layer and the like for describing the method of manufacturing a light emitting element array of Example 2 are illustrated in FIGS. 23A, 23B, 24A, 24B, 25A, and 25B. It is possible for the method of manufacturing a light emitting element array of Example 2 to be substantially similar to the method of manufacturing a light emitting element array of Example 1, and therefore detailed descriptions thereof will be omitted. Note that reference numeral 83 in FIG. 23A and reference numeral 83' in FIGS. 23B and 24A represent portions of the first sacrificial layer for forming the center part 92 of the second portion 92. Note that as the size (diameter) of the first sacrificial layer decreases, the height of the first sacrificial layer after heat treatment increases.

In the light emitting element array of Example 2 or that of Example 3 to be described later also, it is necessary, in the case of coupling or bonding to an external circuit or the like by using the bump 35, to apply a high load (e.g., about 50 MPa) to the light emitting element array at the time of bonding. In the light emitting element array of Example 2, the bump 35 and the convex-shaped portion 92c in the second portion 92 of the base part surface 90 are arranged in alignment in a vertical direction. It is therefore possible to prevent, with reliability, the light emitting element array from being damaged even if such a high load is applied.

Example 3

Figure 26:
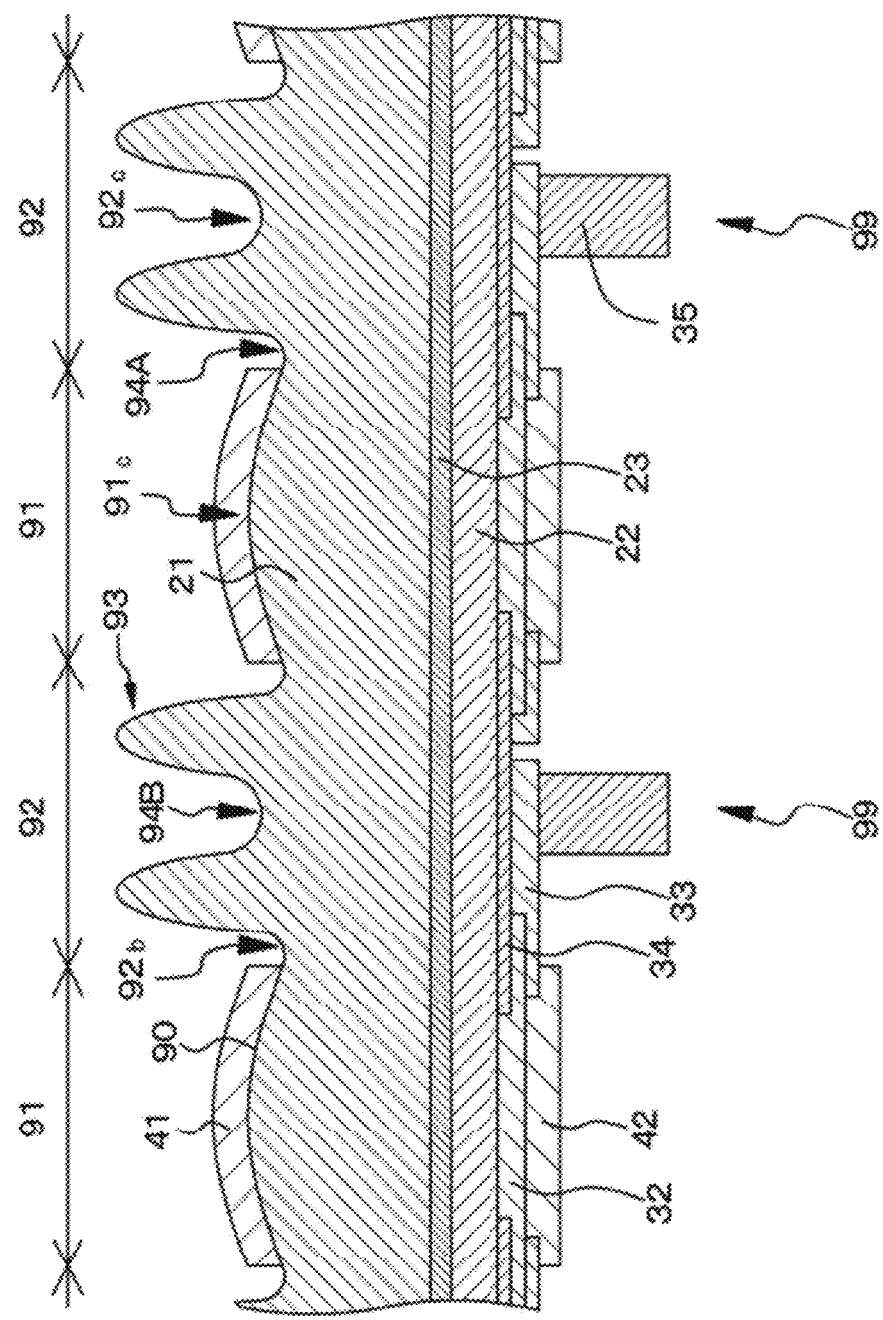
FIG. 26 is a schematic partial end view of a light emitting element array of Example 3.
Figure 27:
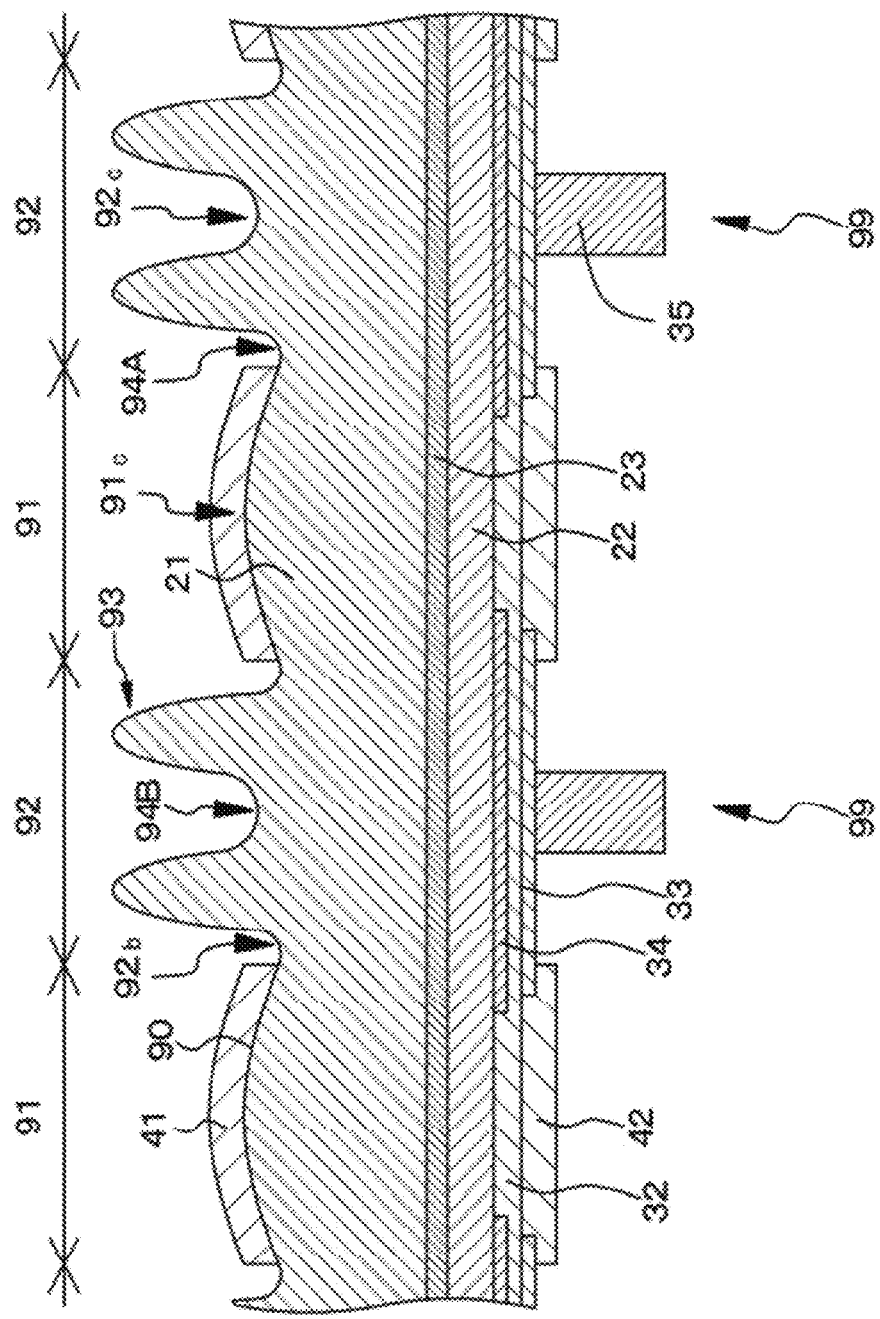
FIG. 27 is a schematic partial end view of the light emitting element array of Example 3.
Figure 28:
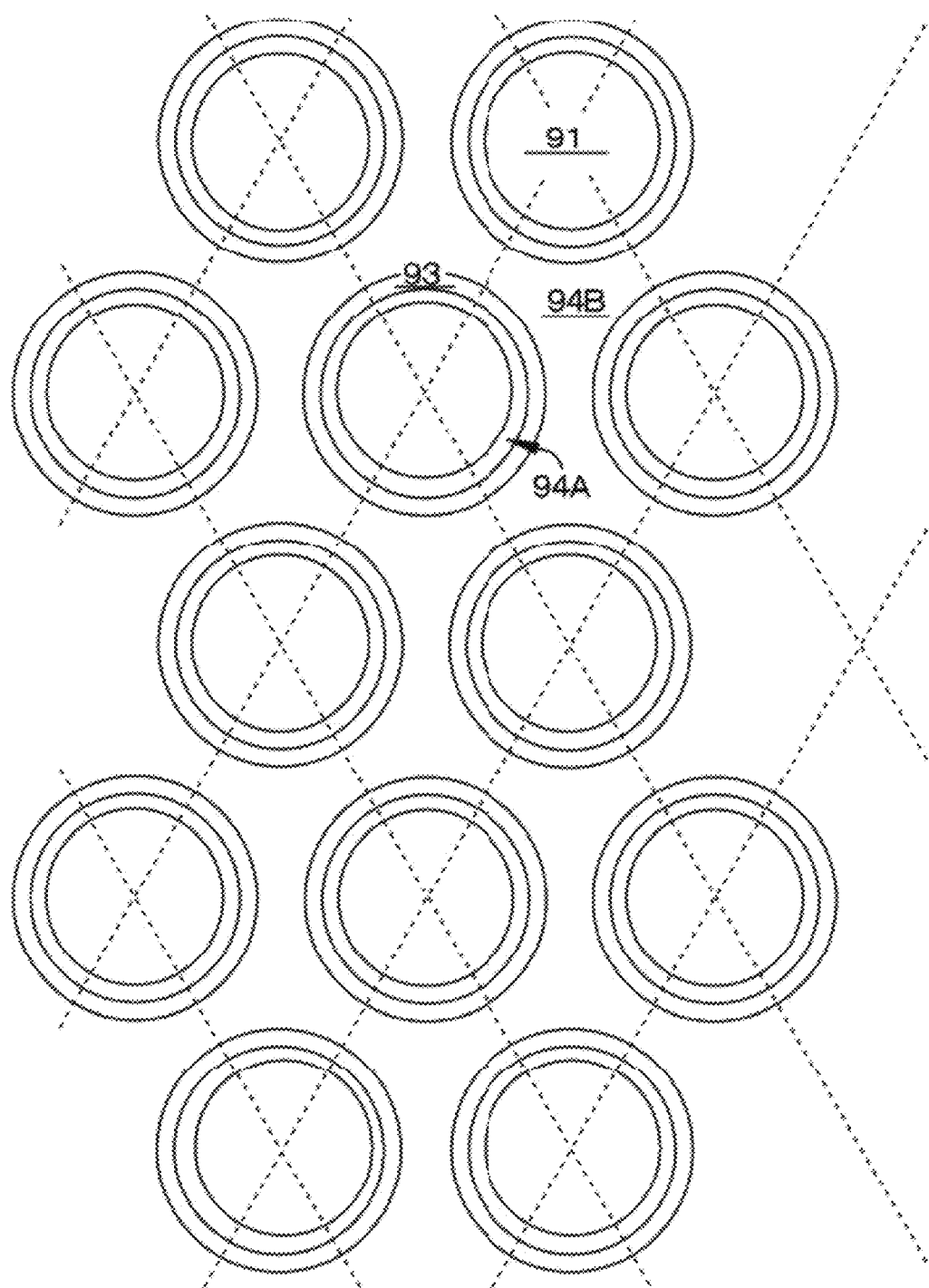
FIG. 28 is a schematic plan diagram illustrating a layout of the first portion and the second portion of the base part surface in the light emitting element array of Example 3.

Example 3 is also a modification of Example 1, and relates to the light emitting element of the (1-C)th configuration. Schematic partial end views of a light emitting element array of Example 3 are illustrated in FIGS. 26 and 27, and a schematic plan view of a layout of the first portion and the second portion of the base part surface in the light emitting element array of Example 3 is illustrated in FIG. 28. In the example illustrated in FIG. 26, the second electrode 32 is individually formed in each light emitting element. In the example illustrated in FIG. 27, the second electrode 32 is formed in common among the light emitting elements. Further, in FIGS. 26 and 27, illustration of the first electrode is omitted.

In a light emitting element 10C of Example 3, the second portion 92 of the base part surface 90 occupying the peripheral region 99 has an annular convex shape 93 surrounding the first portion 91 of the base part surface 90 and a downwardly convex shape 94A extending from the annular convex shape 93 toward the first portion 91 of the base part surface 90. In the second portion 92 of the base part surface 90 occupying the peripheral region 99, a region surrounded by the annular convex shape 93 is represented by reference numeral 94B.

In the light emitting element 10C of Example 3, $$L_2' > L_1$$

is satisfied, where $L_1$ is the distance from the second surface 21b of the first compound semiconductor layer 21 to the center part $91_c$ of the first portion 91 of the base part surface 90, and $L_2'$ is the distance from the second surface 21b of the first compound semiconductor layer 21 to the apex part of the annular convex shape 93 of the second portion 92 of the base part surface 90. In addition, $$R_1 > R_2'$$

is satisfied, where $R_1$ is the radius of curvature of the center part $91_c$ of the first portion 91 of the base part surface 90 (i.e., the radius of curvature of the first light reflection layer), and $R_2'$ is the radius of curvature of the apex part of the annular convex shape 93 of the second portion 92 of the base part surface 90. Note that examples of the value of $L_2'/L_1$ include and are not limited to:

$1 < L_2'/L_1 \leq 100$. Specifically, for example, $L_2'/L_1 = 1.1$.

In addition, examples of the value of $R_1/R_2'$ include and are not limited to:

$1 < R_1/R_2' \leq 100$. Specifically, for example, $R_1/R_2' = 50$.

In the light emitting element 10C of Example 3, examples of the shapes of [the first portion 91/the second portion 92 in the range from the peripheral part to the center part] include the following cases:

(A) [an upwardly convex shape/a downwardly convex shape continuing to an upwardly convex shape, and to a downwardly convex shape];
(B) [an upwardly convex shape/a downwardly convex shape continuing to an upwardly convex shape, a downwardly convex shape, and to a line segment];
(C) [an upwardly convex shape/an upwardly convex shape continuing to a downwardly convex shape, an upwardly convex shape, and to a downwardly convex shape];
(D) [an upwardly convex shape/an upwardly convex shape continuing to a downwardly convex shape, an upwardly convex shape, a downwardly convex shape, and to a line segment];
(E) [an upwardly convex shape/a line segment continuing to a downwardly convex shape, an upwardly convex shape, and to a downwardly convex shape]; and
(F) [an upwardly convex shape/a line segment continuing to a downwardly convex shape, an upwardly convex shape, a downwardly convex shape, and to a line segment]. The light emitting element 10C of Example 3 specifically corresponds to case (A).

Further, in the light emitting element 10C of Example 3, the bump 35 is provided in the portion on the second surface side of the second compound semiconductor layer 22 opposed to the portion having the annular convex shape 93 in the second portion 92 of the base part surface 90. The bump 35 preferably has an annular shape opposed to the annular convex shape 93. Examples may include a cylindrical shape, an annular shape, and a hemispherical shape. The bump 35 is formed in the portion on the second surface side of the second compound semiconductor layer 22 opposed to the convex-shaped portion 92c of the second portion 92 of the base part surface 90.

As illustrated in FIG. 26, the second electrode 32 is individually formed in the light emitting elements 10C included in the light emitting element array, and is coupled to an external circuit or the like through the bump 35. The first electrode 31 is common among the light emitting elements 10C included in the light emitting element array, and is coupled to an external circuit or the like through the first pad electrode (not illustrated). Alternatively, as illustrated in FIG. 27, the second electrode 32 is common among the light emitting elements 10C included in the light emitting element array, and is coupled to an external circuit or the like through the bump 35. The first electrode 31 is common among the light emitting elements 10C included in the light emitting element array, and is coupled to an external circuit or the like through the first pad electrode (not illustrated). In the light emitting element 10C illustrated in FIGS. 26 and 27, light may be emitted to the outside through the first light reflection layer 41, or light may be emitted to the outside through the second light reflection layer 42.

Further, it is desirable that the radius of curvature $R_2'$ of the annular convex shape 93 of the second portion 92 of the base part surface 90 be greater than or equal to $1 \times 10^{-6}$ m, preferably greater than or equal to $3 \times 10^{-6}$ m, and more preferably greater than or equal to $5 \times 10^{-6}$ m. Specifically, the radius of curvature $R_2' = 5$ μm.

In the light emitting element array of Example 3 illustrated in FIG. 28, parameters of the light emitting element 10C are as described in Table 7 below. Further, specifications of the light emitting element 10C of Example 3 illustrated in FIG. 28 are described in Table 8 below. Here, the height $H_1$ of the first portion 91 is expressed by:

$$H_1 = L_1 - L_2'',$$

where $L_1$ is the distance from the second surface 21b of the first compound semiconductor layer 21 to the center part $91_c$ of the first portion 91 of the base part surface 90, and $L_2''$ is the distance from the second surface 21b of the first compound semiconductor layer 21 to the deepest concave portion $92_b$ in the second portion 92 of the base part surface 90. The height $H_2$ of the annular convex shape 93 of the second portion 92 is expressed by:

$$H_2 = L_2 - L_2''.$$

Further, diameter $D_2$ represents a diameter of the annular convex shape 93.

TABLE 7

See FIG. 28

| | |
|---|---|
| Formation pitch | 25 μm |
| Radius of curvature $R_1$ | 150 μm |
| Diameter $D_1$ | 15 μm |
| Height $H_1$ | 2 μm |
| Radius of curvature $R_2$ | 3 μm |
| Diameter $D_2$ | 19 μm (inner diameter 18 μm, outer diameter 20 μm) |
| Height $H_2$ | 3 μm |

TABLE 8

See FIG. 28

| | |
|---|---|
| Second light reflection layer 42 | $SiO_2/Ta_2O_5$ (7 pairs) |
| Second electrode 32 | ITO (thickness: 25 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length $L_{OR}$ | 20 μm |
| Oscillation wavelength (light emission wavelength) $\lambda_0$ | 405 nm |
| Number of light emitting elements | 1000 × 1000 |

It is possible for a method of manufacturing a light emitting element array of Example 3 to be substantially similar to the method of manufacturing a light emitting element array of Example 1 or Example 2, and therefore detailed descriptions thereof will be omitted.

Example 4

Figure 29A:
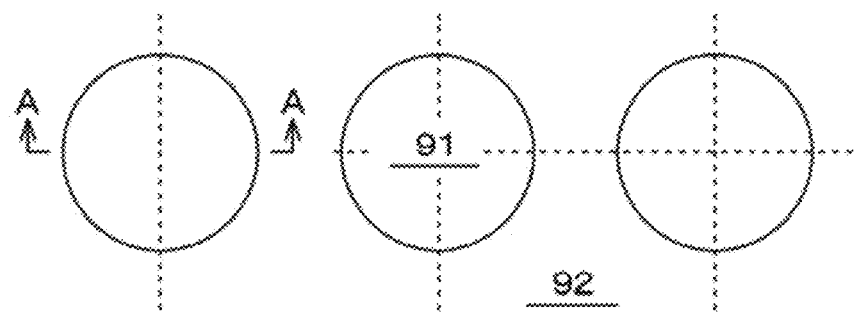
FIGS. 29A and 29B are schematic plan diagrams illustrating a layout of the first portion and the second portion of the base part surface in a light emitting element array of Example 4.
Figure 29B:
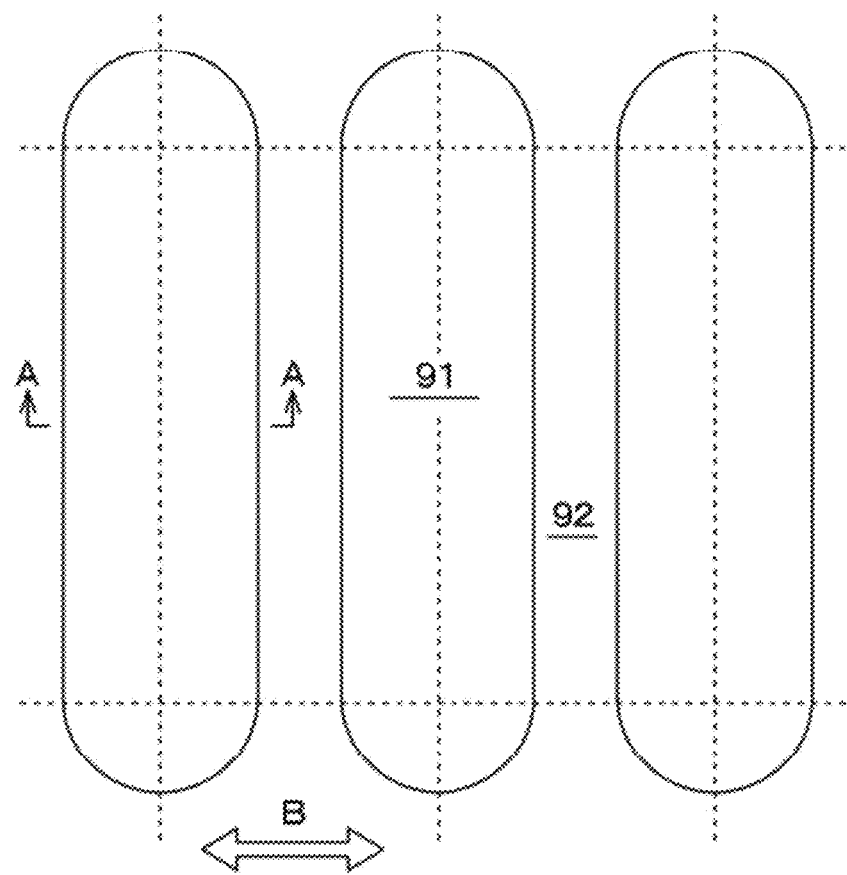

Example 4 is a modification of Example 1. A layout of the first portion and the second portion of the base part surface in a light emitting element array of Example 4 is illustrated in schematic plan diagrams in FIGS. 29A and 29B. In the example illustrated in FIG. 29A, the light emitting element array includes the light emitting elements of Example 1 arranged in a row. The schematic partial end view along arrow A-A in FIG. 29A is similar to that illustrated in FIG. 1. In the example illustrated in FIG. 29B, the light emitting element array includes, for example, light emitting elements narrower and longer in plan-view shape than the light emitting elements of Example 1 arranged in a row. The schematic partial end view along arrow A-A in FIG. 29B is similar to that illustrated in FIG. 1. In the light emitting element array of Example 4 illustrated in FIG. 29A, parameters of the light emitting element are as described in Table 9 below. Specifications of the light emitting element are described in Table 10 below. Further, in the light emitting element array of Example 4 illustrated in FIG. 29B, parameters of the light emitting element are as described in Table 11 below. Specifications of the light emitting element are described in Table 12 below. Note that the shape of the base part surface illustrated in FIG. 29B is a part of a cylindrical shape or a part of a semi-cylindrical shape.

TABLE 9

See FIG. 29A

| | |
|---|---|
| Formation pitch | 25 μm |
| Radius of curvature $R_1$ | 100 μm |
| Diameter $D_1$ | 20 μm |
| Height $H_1$ | 2 μm |

TABLE 10

See FIG. 29A

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 445 nm |
| Number of light emitting elements | 1000 × 1 |

TABLE 11

See FIG. 29B

| | |
|---|---|
| Formation pitch | 25 μm (pitch along arrow B in FIG. 29B) |
| Radius of curvature $R_1$ | 100 μm (radius of curvature in a direction of arrow B of FIG. 29B) |
| Size of first portion | 400 μm in length × 20 μm in width |
| Height $H_1$ | 2 μm |

TABLE 12

See FIG. 29B

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 445 nm |
| Number of light emitting elements | 512 × 1 |

Example 5

Figure 30:
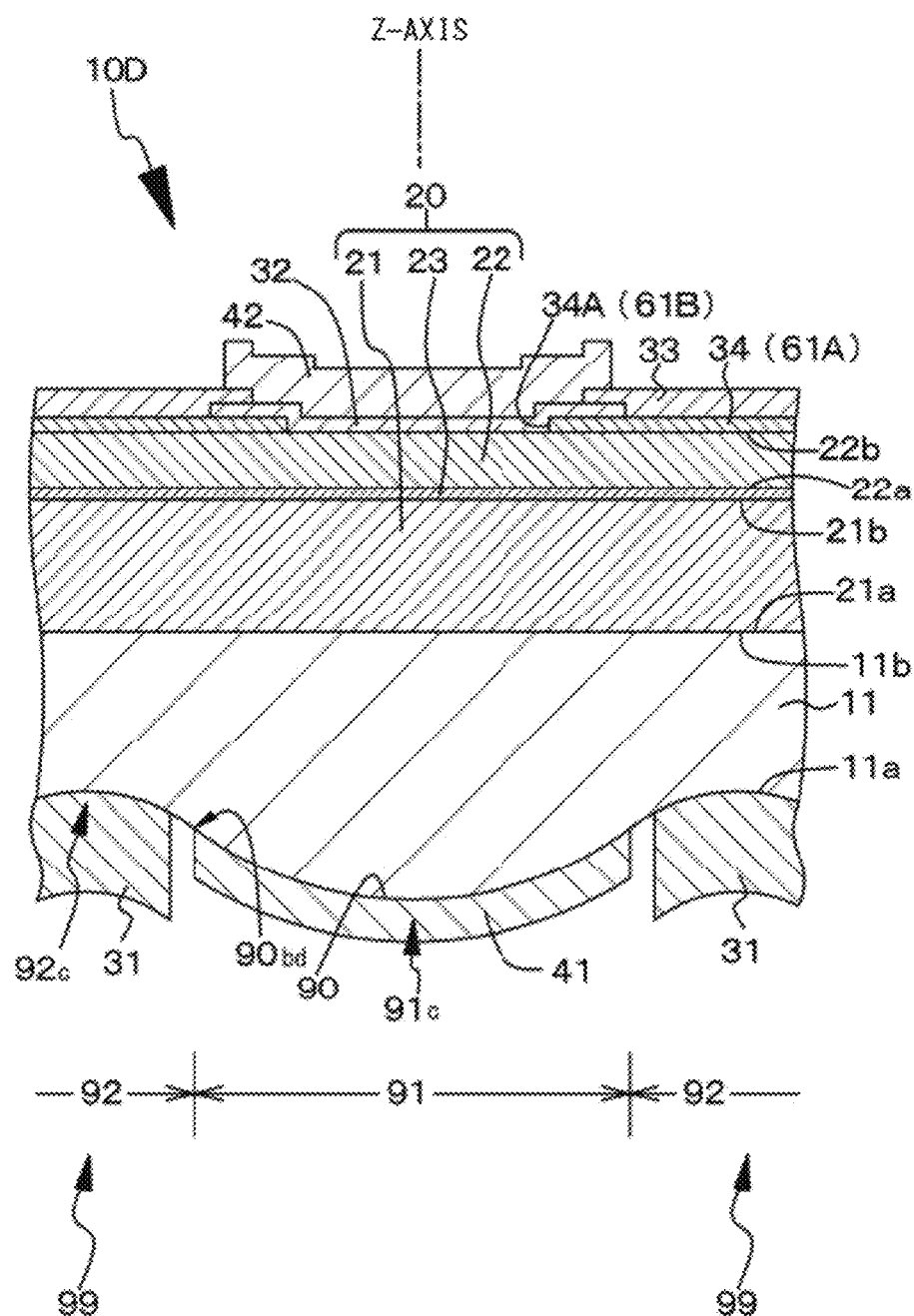
FIG. 30 is a schematic partial end view of a light emitting element of Example 5.

Example 5 is a modification of Examples 1 to 4, and relates to the light emitting element of the third configuration. In a light emitting element 10D of Example 5, a schematic partial end view of which is illustrated in FIG. 30, the compound semiconductor substrate 11 is provided (left unremoved) between the first surface 21a of the first compound semiconductor layer 21 and the first light reflection layer 41. The base part surface 90 is configured by a surface (first surface 11a) of the compound semiconductor substrate 11.

For the light emitting element 10D of Example 5, the compound semiconductor substrate 11 is thinned and subjected to mirror finishing in a step similar to [Step-140] of Example 1. A surface roughness Ra of the first surface 11a of the compound semiconductor substrate 11 preferably has a value of 10 nm or less. The surface roughness Ra is defined in JIS B-610: 2001 and specifically, is measurable on the basis of observations with an AFM or a section TEM. Thereafter, it is sufficient that the first sacrificial layer 81 in [Step-150] of Example 1 is formed on the exposed surface (first surface 11a) of the compound semiconductor substrate 11 and steps similar to [Step-150] and subsequent steps of Example 1 are performed to provide the base part surface 90 including the first portion 91 and the second portion 92 in the compound semiconductor substrate 11, in place of the first compound semiconductor layer 21 of Example 1, to thereby complete the light emitting element or the light emitting element array.

Except for the above points, it is possible for the configuration or structure of the light emitting element of Example 5 to be similar to that of the light emitting elements of Examples 1 to 4, and therefore detailed descriptions thereof will be omitted.

Example 6

Figure 31:
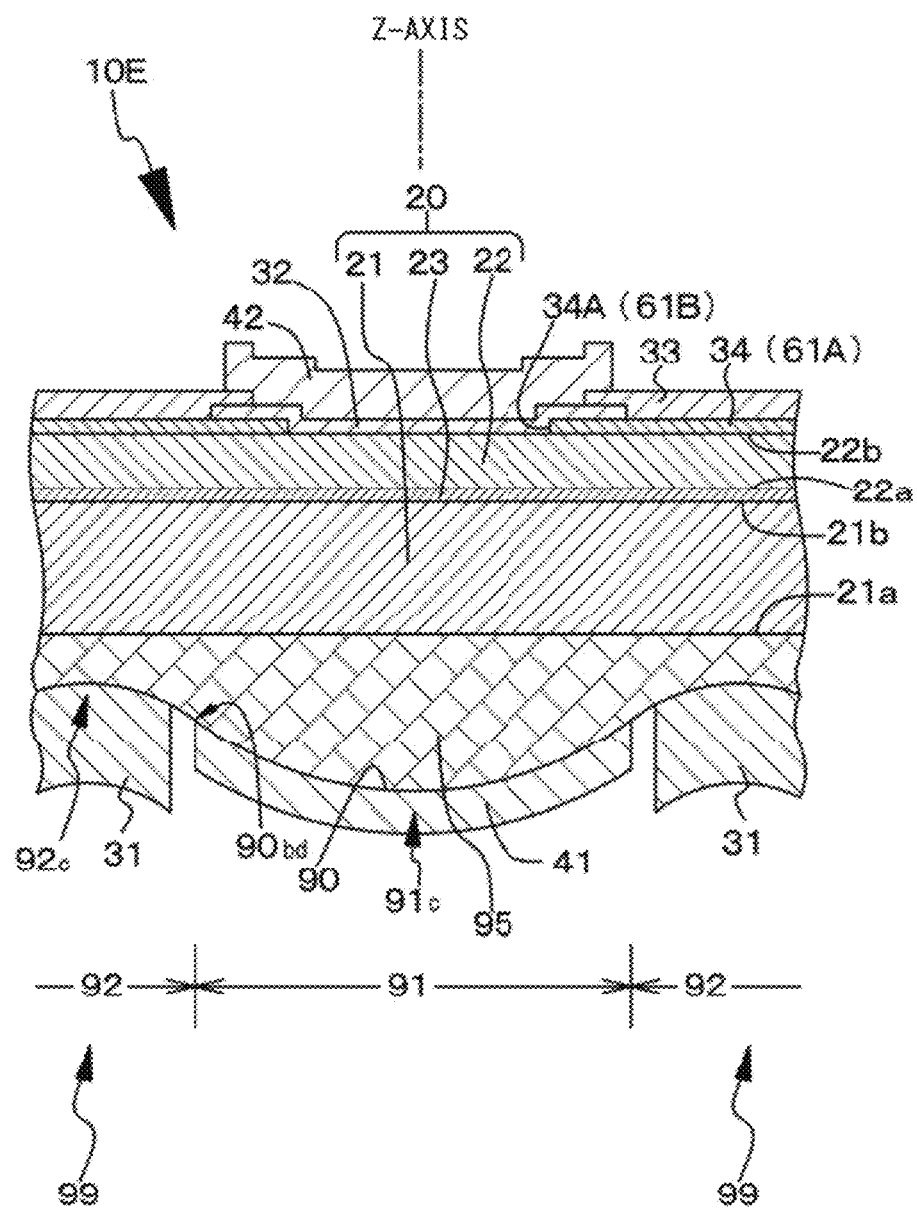
FIG. 31 is a schematic partial end view of a light emitting element of Example 6.
Figure 32:
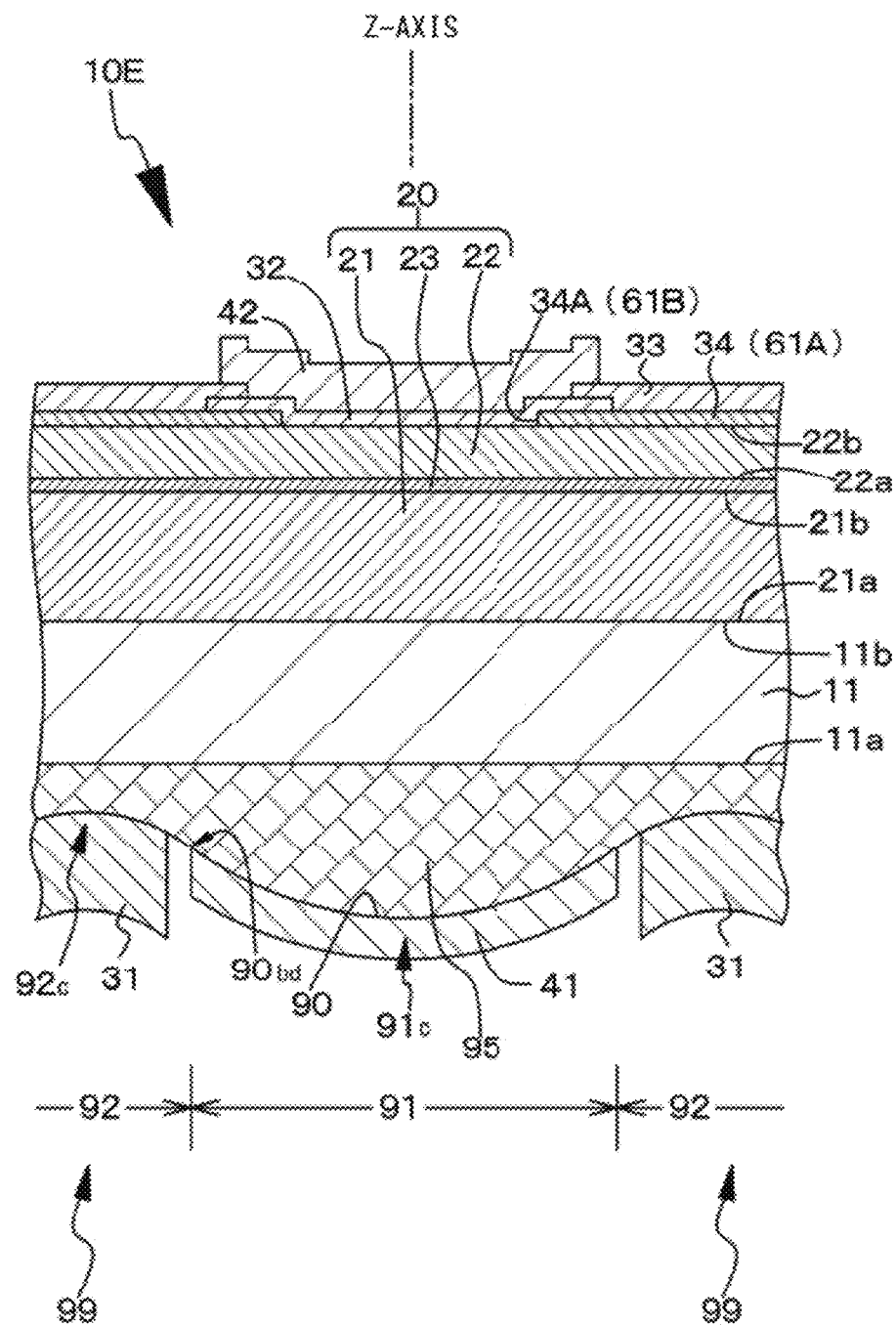
FIG. 32 is a schematic partial end view of a modification example of the light emitting element of Example 6.

Example 6 is also a modification of Examples 1 to 4, and relates to the light emitting element of the fourth configuration. In a light emitting element 10E of Example 6, a schematic partial end view of which is illustrated in FIG. 31, a base 95 is provided between the first surface 21a of the first compound semiconductor layer 21 and the first light reflection layer 41, and the base part surface 90 is configured by a surface of the base 95. Alternatively, in a modification example of the light emitting element 10E of Example 6, a schematic partial end view of which is illustrated in FIG. 32, the compound semiconductor substrate 11 and the base 95 are provided between the first surface 21a of the first compound semiconductor layer 21 and the first light reflection layer 41, and the base part surface 90 is configured by the surface of the base 95. Examples of the material of the base 95 include a transparent dielectric material such as $TiO_2$, $Ta_2O_5$, or $SiO_2$, a silicone-based resin, and an epoxy-based resin.

For the light emitting element 10E of Example 6 illustrated in FIG. 31, in a step similar to [Step-140] of Example 1, the compound semiconductor substrate 11 is removed and the base 95 having the base part surface 90 is formed on the first surface 21a of the first compound semiconductor layer 21. Specifically, for example, a $TiO_2$ layer or a $Ta_2O_5$ layer is formed on the first surface 21a of the first compound semiconductor layer 21, following which a patterned resist layer is formed on the $TiO_2$ layer or the $Ta_2O_5$ layer in which the first portion 91 is to be formed, and the resist layer is heated to cause the resist layer to reflow to thereby obtain a resist pattern. The resist pattern is given a shape the same as (or a shape similar to) the shape of the first portion. Then, by etching back the resist pattern and the $TiO_2$ layer or the $Ta_2O_5$ layer, it is possible to obtain the base 95 provided with the first portion 91 and the second portion 92 on the first surface 21a of the first compound semiconductor layer 21. Subsequently, it is sufficient that the first light reflection layer 41 is formed on a desired region of the base 95 by a well-known method.

Alternatively, for the light emitting element 10E of Example 6 illustrated in FIG. 32, after the compound semiconductor substrate 11 is thinned and subjected to mirror finishing in a step similar to [Step 140] of Example 1, the base 95 having the base part surface 90 is formed on the exposed surface (first surface 11a) of the compound semiconductor substrate 11. Specifically, for example, a $TiO_2$ layer or a $Ta_2O_5$ layer is formed on the exposed surface (first surface 11a) of the compound semiconductor substrate 11, following which a patterned resist layer is formed on the $TiO_2$ layer or the $Ta_2O_5$ layer in which the first portion 91 is to be formed, and the resist layer is heated to cause the resist layer to reflow to thereby obtain a resist pattern. The resist pattern is given a shape the same as (or a shape similar to) the shape of the first portion. Then, by etching back the resist pattern and the $TiO_2$ layer or the $Ta_2O_5$ layer, it is possible to obtain the base 95 provided with the first portion 91 and the second portion 92 on the exposed surface (first surface 11a) of the compound semiconductor substrate 11. Subsequently, it is sufficient that the first light reflection layer 41 is formed on a desired region of the base 95 by a well-known method.

Except for the above points, it is possible for the configuration or structure of the light emitting element of Example 6 to be similar to that of the light emitting elements of Examples 1 to 4, and therefore detailed descriptions thereof will be omitted.

Example 7

Example 7 is a modification of Example 6. A schematic partial end view of a light emitting element of Example 7 is substantially similar to FIG. 32, and it is possible for the configuration or structure of the light emitting element of Example 7 to be substantially similar to that of the light emitting element of Example 6. Detailed descriptions thereof will thus be omitted.

Figure 33A:
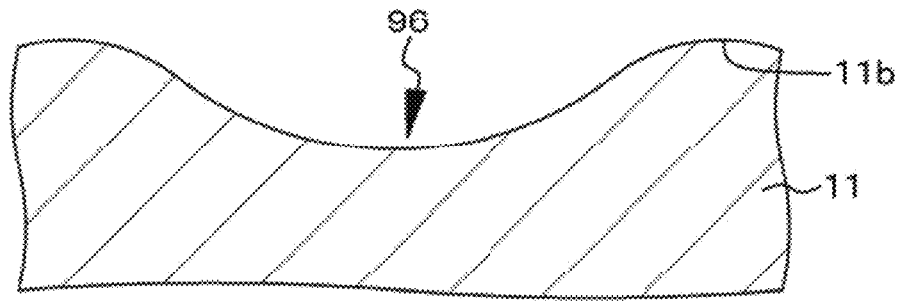
FIGS. 33A, 33B, and 33C are schematic partial end views of the stacked structure and the like for describing a method of manufacturing a light emitting element of Example 7.
Figure 33B:
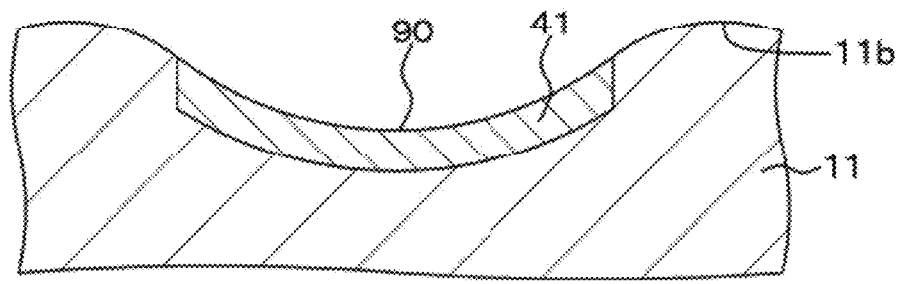
Figure 33C:
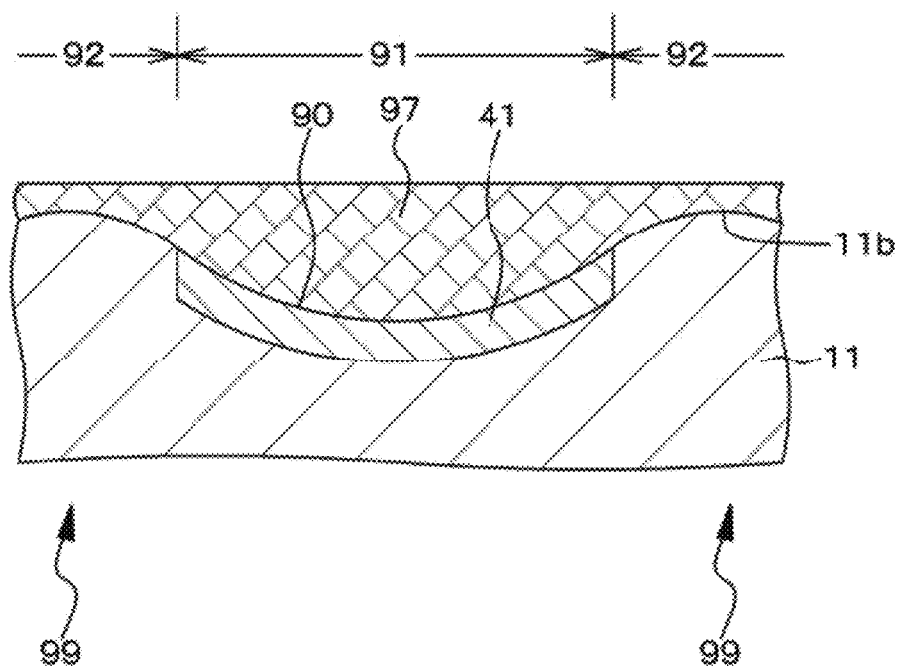
Figure 34A:
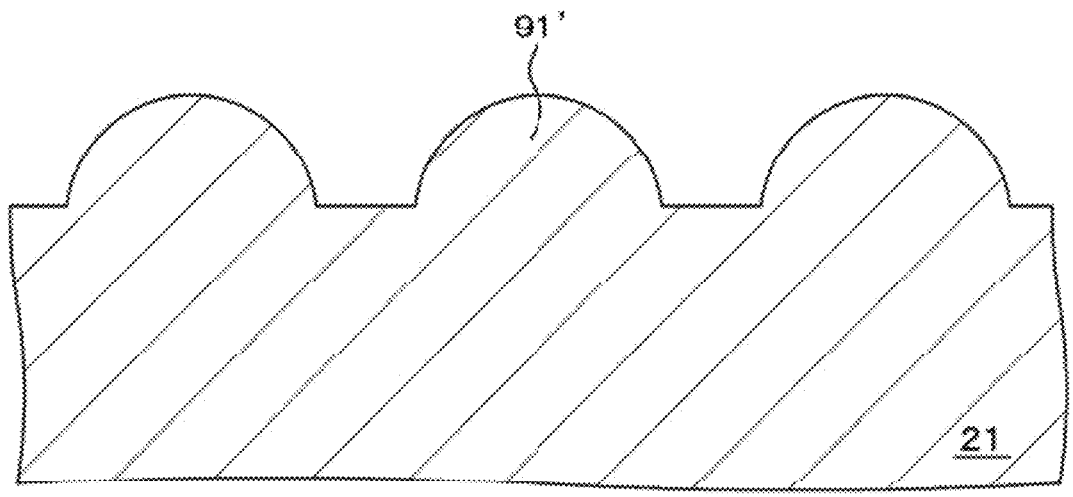
FIGS. 34A, 34B, and 34C are schematic partial end views of the stacked structure and the like for describing a method of manufacturing a light emitting element of Example 9.
Figure 34B:
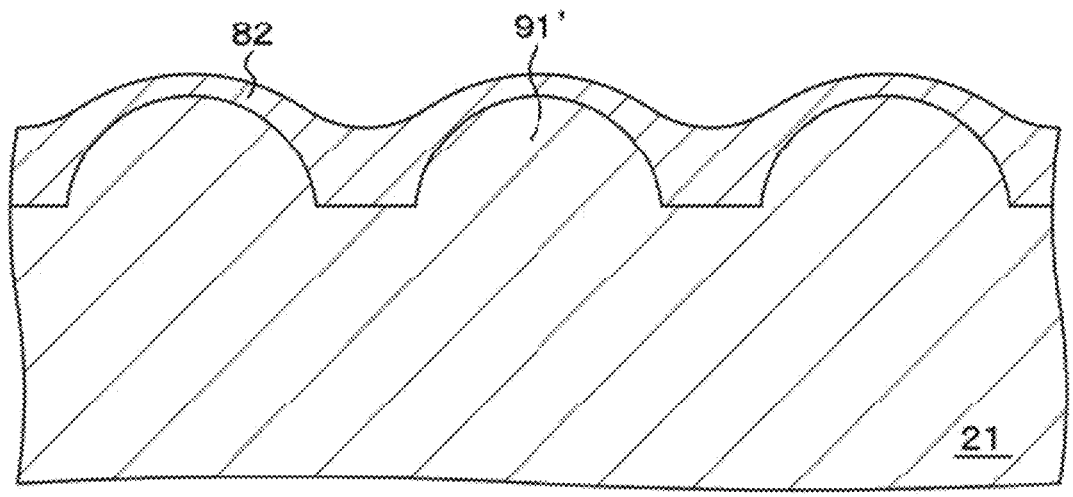
Figure 34C:
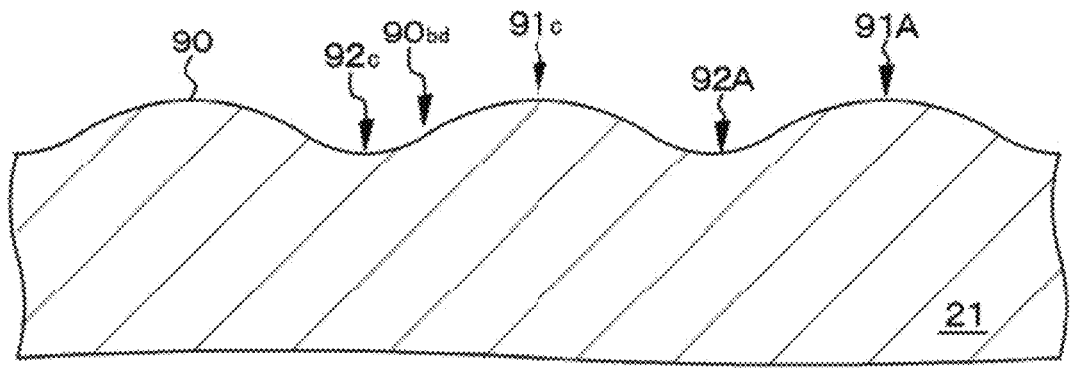

In Example 7, first, a convexo-concave part 96 for forming the base part surface 90 is formed in the second surface 11b of the light-emitting-element manufacturing substrate 11 (see FIGS. 33A, 33B and 33C). Then, the first light reflection layer 41 including a multilayered film is formed on the second surface 11b of the light-emitting-element manufacturing substrate 11 (see FIG. 33B), following which a planarization film 97 is formed on the first light reflection layer 41 and the second surface 11b, and the planarization film 97 is subjected to a planarization process (see FIG. 33C).

Next, on the planarization film 97 of the light-emitting-element manufacturing substrate 11 including the first light reflection layer 41, the stacked structure 20 is formed by lateral growth using a method for lateral epitaxial growth such as an ELO method. Thereafter, [Step-110] and [Step-120] of Example 1 are performed. Then, the light-emitting-element manufacturing substrate 11 is removed, and the first electrode 31 is formed on the planarization film 97 exposed. Alternatively, the first electrode 31 is formed on the first surface 11a of the light-emitting-element manufacturing substrate 11 without removing the light-emitting-element manufacturing substrate 11.

Example 8

Example 8 is a modification of Examples 1 to 7. In Examples 1 to 7, the stacked structure 20 includes a GaN-based compound semiconductor. In contrast, in Example 8, the stacked structure 20 includes an InP-based compound semiconductor or a GaAs-based compound semiconductor.

Parameters of a light emitting element in a light emitting element array of Example 8 having a configuration or structure similar to that illustrated in FIGS. 7 and 8 and FIGS. 9 and 10 (except that the stacked structure 20 includes an InP-based compound semiconductor) are as described in Table 13 below. Specifications of the light emitting element are described in Tables 14 and 15 below.

TABLE 13

|  | See FIGS. 7 and 8 | See FIGS. 9 and 10 |
| --- | --- | --- |
| Formation pitch | 25 μm | 20 μm |
| Radius of curvature $R_1$ | 100 μm | 200 μm |
| Diameter $D_1$ | 20 μm | 15 μm |
| Height $H_1$ | 2 μm | 2 μm |
| Radius of curvature $R_2$ | 4 μm | 5 μm |

TABLE 14

See FIGS. 7 and 8

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-InP |
| Active layer 23 | InGaAs (multi-quantum well structure) or AlInGaAsP (multi-quantum well structure) or InAs quantum dot |
| First compound semiconductor layer 21 | n-InP |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 1.6 μm |
| Number of light emitting elements | 100 × 100 |

TABLE 15

See FIGS. 9 and 10

| | |
|---|---|
| Second light reflection layer 42 | $SiO_2/SiN$ (9 pairs) |
| Second electrode 32 | ITO (thickness: 22 nm) |
| Second compound semiconductor layer 22 | p-InP |
| Active layer 23 | InGaAs (multi-quantum well structure) or AlInGaAsP (multi-quantum well structure) or InAs quantum dot |
| First compound semiconductor layer 21 | n-InP |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 1.6 μm |
| Number of light emitting elements | 1000 × 1000 |

Further, parameters of the light emitting element in the light emitting element array of Example 8 having a configuration or structure similar to that illustrated in FIGS. 7 and 8 and FIGS. 9 and 10 (except that the stacked structure 20 includes a GaAs-based compound semiconductor) are as described in Table 16 below. Specifications of the light emitting element are described in Tables 17 and 18 below.

TABLE 16

| | See FIGS. 7 and 8 | See FIGS. 9 and 10 |
|---|---|---|
| Formation pitch | 25 μm | 20 μm |
| Radius of curvature $R_1$ | 100 μm | 200 μm |
| Diameter $D_1$ | 20 μm | 15 μm |
| Height $H_1$ | 2 μm | 2 μm |
| Radius of curvature $R_2$ | 5 μm | 10 μm |

TABLE 17

See FIGS. 7 and 8

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-GaAs |
| Active layer 23 | InGaAs (multi-quantum well structure) or GaInNAs (multi-quantum well structure) or InAs quantum dot |
| First compound semiconductor layer 21 | n-GaAs |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 0.94 μm |
| Number of light emitting elements | 100 × 100 |

TABLE 18

See FIGS. 9 and 10

| | |
|---|---|
| Second light reflection layer 42 | $SiO_2/SiN$ (9 pairs) |
| Second electrode 32 | ITO (thickness: 22 nm) |
| Second compoound semiconductor layer 22 | p-GaAs |
| Active layer 23 | InGaAs (multi-quantum well structure) or GaInNAs (multi-quantum well structure) or InAs quantum dot |
| First compound semiconductor layer 21 | n-GaAs |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 0.94 μm |
| Number of light emitting elements | 1000 × 1000 |

Parameters of the light emitting element in the light emitting element array of Example 8 having a configuration or structure similar to that illustrated in FIGS. 19 and 20 and FIGS. 21 and 22 (except that the stacked structure 20 includes an InP-based compound semiconductor) are as described in Table 19 below. Specifications of the light emitting element are described in Tables 20 and 21 below.

TABLE 19

| | See FIGS. 19 and 20 | See FIGS. 21 and 22 |
|---|---|---|
| Formation pitch | 25 μm | 25 μm |
| Radius of curvature $R_1$ | 150 μm | 150 μm |
| Diameter $D_1$ | 20 μm | 20 μm |
| Height $H_1$ | 2 μm | 2 μm |
| Radius of curvature $R_2$ | 2 μm | 8 μm |
| Height $H_2$ | 2.5 μm | 2.5 μm |

TABLE 20

See FIGS. 19 and 20

| | |
|---|---|
| Second light reflection layer 42 | $SiO_2/Ta_2O_5$ (11.5 pairs) |
| Second electrode 32 | ITO (thickness: 30 nm) |
| Second compound semiconductor layer 22 | p-InP |
| Active layer 23 | InGaAs (multi-quantum well structure) or AlInGaAsP (multi-quantum well structure) or InAs quantum dot |
| First compound semiconductor layer 21 | n-InP |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 1.6 μm |
| Number of light emitting elements | 100 × 100 |

TABLE 21

See FIGS. 21 and 22

| | |
|---|---|
| Second light reflection layer 42 | $SiO_2/Ta_2O_5$ (11.5 pairs) |
| Second electrode 32 | ITO (thickness: 30 nm) |
| Second compound semiconductor layer 22 | p-InP |
| Active layer 23 | InGaAs (multi-quantum well structure) or AlInGaAsP (multi-quantum well structure) or InAs quantum dot |
| First compound semiconductor layer 21 | n-InP |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 1.6 μm |
| Number of light emitting elements | 100 × 100 |

Parameters of the light emitting element in the light emitting element array of Example 8 having a configuration or structure similar to that illustrated in FIGS. 19 and 20 and FIGS. 21 and 22 (except that the stacked structure 20 includes a GaAs-based compound semiconductor) are as described in Table 22 below. Specifications of the light emitting element are described in Tables 23 and 24 below.

TABLE 22

|  | See FIGS. 19 and 20 | See FIGS. 21 and 22 |
|---|---|---|
| Formation pitch | 25 μm | 25 μm |
| Radius of curvature $R_1$ | 150 μm | 150 μm |
| Diameter $D_1$ | 20 μm | 20 μm |
| Height $H_1$ | 2 μm | 2 μm |
| Radius of curvature $R_2$ | 6 μm | 4 μm |
| Height $H_2$ | 2.5 μm | 2.5 μm |

TABLE 23

| See FIGS. 19 and 20 | |
|---|---|
| Second light reflection layer 42 | $SiO_2/Ta_2O_5$ (11.5 pairs) |
| Second electrode 32 | ITO (thickness: 30 nm) |
| Second compound semiconductor layer 22 | p-GaAs |
| Active layer 23 | InGaAs (multi-quantum well structure) or GaInNAs (multi-quantum well structure) or InAs quantum dot |
| First compound semiconductor layer 21 | n-GaAs |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 0.94 μm |
| Number of light emitting elements | 100 × 100 |

TABLE 24

| See FIGS. 21 and 22 | |
|---|---|
| Second light reflection layer 42 | $SiO_2/Ta_2O_5$ (11.5 pairs) |
| Second electrode 32 | ITO (thickness: 30 nm) |
| Second compound semiconductor layer 22 | p-GaAs |
| Active layer 23 | InGaAs (multi-quantum well structure) or GaInNAs (multi-quantum well structure) or InAs quantum dot |
| First compound semiconductor layer 21 | n-GaAs |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 0.94 μm |
| Number of light emitting elements | 100 × 100 |

Parameters of the light emitting element in the light emitting element array of Example 8 having a configuration or structure similar to that illustrated in FIG. 28 (except that the stacked structure 20 includes an InP-based compound semiconductor) are as described in Table 25 below. Specifications of the light emitting element are described in Table 26 below.

TABLE 25

| See FIG. 28 | |
|---|---|
| Formation pitch | 25 μm |
| Radius of curvature $R_1$ | 150 μm |
| Diameter $D_1$ | 15 μm |
| Height $H_1$ | 2 μm |
| Radius of curvature $R_2$ | 3 μm |
| Diameter $D_2$ | 19 μm (18 μm in inner diameter, 20 μm in outer diameter) |
| Height $H_2$ | 3 μm |

TABLE 26

| See FIG. 28 | |
|---|---|
| Second light reflection layer 42 | $SiO_2/Ta_2O_5$ (7 pairs) |
| Second electrode 32 | ITO (thickness: 25 nm) |
| Second compound semiconductor layer 22 | p-InP |
| Active layer 23 | InGaAs (multi-quantum well structure) or AlInGaAsP (multi-quantum well structure) or InAs quantum dot |
| First compound semiconductor layer 21 | n-InP |
| First light reflection layer 41 | $SiO_2/Ta_2O_5$ (14 pairs) |
| Resonator length $L_{OR}$ | 20 μm |
| Oscillation wavelength (light emission wavelength) $\lambda_0$ | 1.6 μm |
| Number of light emitting elements | 1000 × 1000 |

Parameters of the light emitting element in the light emitting element array of Example 8 having a configuration or structure similar to that illustrated in FIG. 28 (except that the stacked structure 20 includes a GaAs-based compound semiconductor) are as described in Table 27 below. Specifications of the light emitting element are described in Table 28 below.

TABLE 27

See FIG. 28

| | |
|---|---|
| Formation pitch | 25 μm |
| Radius of curvature $R_1$ | 150 μm |
| Diameter $D_1$ | 15 μm |
| Height $H_1$ | 2 μm |
| Radius of curvature $R_2$ | 3 μm |
| Diameter $D_2$ | 19 μm (18 μm in inner diameter, 20 μm in outer diameter) |
| Height $H_2$ | 3 μm |

TABLE 28

See FIG. 28

| | |
|---|---|
| Second light reflection layer 42 | $SiO_2/Ta_2O_5$ (7 pairs) |
| Second electrode 32 | ITO (thickness: 25 nm) |
| Second compound semiconductor layer 22 | p-GaAs |
| Active layer 23 | InGaAs (multi-quantum well structure) or GaInNAs (multi-quantum well structure) or InAs quantum dot |
| First compound semiconductor layer 21 | n-GaAs |
| First light reflection layer 41 | $SiO_2/Ta_2O_5$ (14 pairs) |
| Resonator length $L_{OR}$ | 20 μm |
| Oscillation wavelength (light emission wavelength) $\lambda_0$ | 0.94 μm |
| Number of light emitting elements | 1000 × 1000 |

Parameters of the light emitting element in the light emitting element array of Example 8 having a configuration or structure similar to that illustrated in FIGS. 29A and 29B (except that the stacked structure 20 includes an InP-based compound semiconductor) are as described in Tables 29 and 31 below. Specifications of the light emitting element are described in Tables 30 and 32 below.

TABLE 29

See FIG. 29A

| | |
|---|---|
| Formation pitch | 25 μm |
| Radius of curvature $R_1$ | 100 μm |

TABLE 29-continued

See FIG. 29A

| | |
|---|---|
| Diameter $D_1$ | 20 μm |
| Height $H_1$ | 2 μm |

TABLE 30

See FIG. 29A

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-InP |
| Active layer 23 | InGaAs (multi-quantum well structure) |
| First compound semiconductor layer 21 | n-InP |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 1.6 μm |
| Number of light emitting elements | 1000 × 1 |

TABLE 31

See FIG. 29B

| | |
|---|---|
| Formation pitch | 25 μm (pitch along arrow B in FIG. 29B) |
| Radius of curvature $R_1$ | 100 μm (radius of curvature in a direction of arrow B in FIG. 29B) |
| Size of first portion | 400 μm in length × 20 μm in width |
| Height $H_1$ | 2 μm |

TABLE 32

See FIG. 29B

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-InP |
| Active layer 23 | InGaAs (multi-quantum well structure) or AlInGaAsP (multi-quantum well structure) or InAs quantum dot |
| First compound semiconductor layer 21 | n-InP |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 1.6 μm |
| Number of light emitting elements | 512 × 1 |

Parameters of the light emitting element in the light emitting element array of Example 8 having a configuration or structure similar to that illustrated in FIGS. 29A and 29B (except that the stacked structure 20 includes a GaAs-based compound semiconductor) are as described in Tables 33 and 35 below. Specifications of the light emitting element are described in Tables 34 and 36 below.

TABLE 33

See FIG. 29A

| | |
|---|---|
| Formation pitch | 25 μm |
| Radius of curvature $R_1$ | 100 μm |
| Diameter $D_1$ | 20 μm |
| Height $H_1$ | 2 μm |

TABLE 34

See FIG. 29A

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-GaAs |
| Active layer 23 | InGaAs (multi-quantum well structure) or GaInNAs (multi-quantum well structure) or InAs quantum dot |
| First compound semiconductor layer 21 | n-GaAs |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 0.94 μm |
| Number of light emitting elements | 1000 × 1 |

TABLE 35

See FIG. 29B

| | |
|---|---|
| Formation pitch | 25 μm (pitch along arrow B in FIG. 29B) |
| Radius of curvature $R_1$ | 100 μm (radius of curvature in a direction of arrow B in FIG. 29B) |
| Size of first portion | 400 μm in length × 20 μm in width |
| Height $H_1$ | 2 μm |

TABLE 36

See FIG. 29B

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-GaAs |
| Active layer 23 | InGaAs (multi-quantum well structure) or GaInNAs (multi-quantum well structure) or InAs quantum dot |
| First compound semiconductor layer 21 | n-GaAs |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 0.94 μm |
| Number of light emitting elements | 512 × 1 |

Example 9

Example 9 is a method of manufacturing a light emitting element array according to the second aspect of the present disclosure.

[Step-900]

In the method of manufacturing a light emitting element array of Example 9, after the stacked structure 20 is formed, the second light reflection layer 42 is formed on the second surface side of the second compound semiconductor layer 22. Specifically, first, steps similar to [Step-100] to [Step-140] of Example 1 are performed.

[Step-910]

Figure 14B:
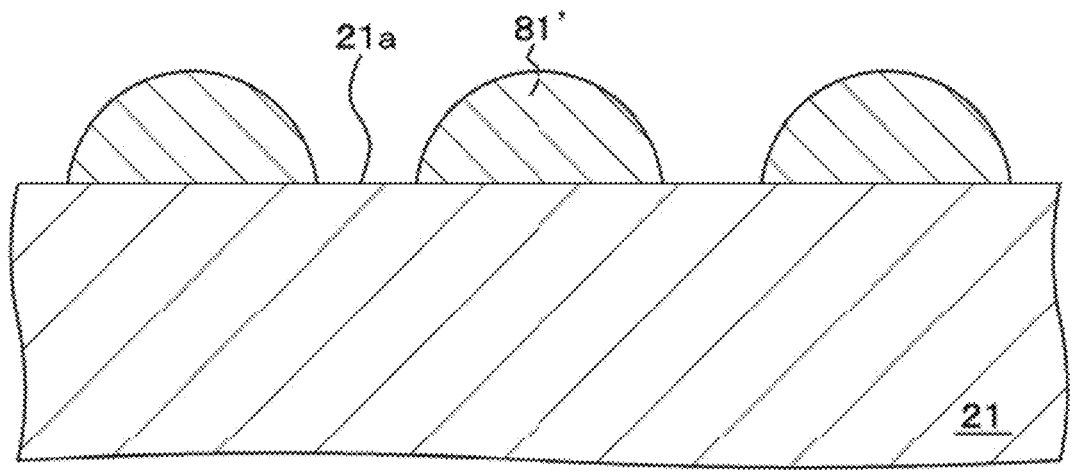

Subsequently, after the first sacrificial layer 81 is formed on the first surface 21a of the first compound semiconductor layer 21, the surface of the first sacrificial layer 81 is made into a convex shape (see FIGS. 14A and 14B). Thereafter, by etching back the first sacrificial layer 81' and further etching back the first compound semiconductor layer 21 inwardly from the first surface 21a, a convex part 91' is formed with respect to the second surface 21b of the first compound semiconductor layer 21. In this way, it is possible to obtain the structure illustrated in FIG. 34A.

[Step-920]

Thereafter, after the second sacrificial layer 82 is formed over the entire surface (see FIG. 34B), the second sacrificial layer 82 is etched back and further, the first compound semiconductor layer 21 is etched back inwardly, whereby a convex part is formed in the first portion 91 of the base part surface 90 and at least a concave part is formed in the second portion 92 of the base part surface 90 (see FIG. 34C), with respect to the second surface 21b of the first compound semiconductor layer 21.

If it is necessary to further increase the radius of curvature $R_1$ of the first portion 91 of the base part surface 90, it is sufficient that [Step-920] is repeated.

[Step-930]

Thereafter, it is sufficient that steps similar to [Step-180] to [Step-190] of Example 1 are performed.

In the following, descriptions will be given of various modification examples of the light emitting elements of Examples 1 to 9 and the light emitting element or the like of the present disclosure including the preferable form or configuration described above, and thereafter, Examples 10 to 22 will be described.

In the light emitting element or the like of the present disclosure including the preferable form or configuration described above, the second compound semiconductor layer may be provided with a current injection region, and a current non-injection region surrounding the current injection region, and a shortest distance $D_{CI}$ from an area centroid point of the current injection region to a boundary between the current injection region and the current non-injection region may satisfy the following expression. Here, the light emitting element of such a configuration will be referred to as a "light emitting element of a fifth configuration" for the sake of convenience. Note that, for derivation of the following expression, reference is to be made to, for example, H. Kogelnik and T. Li, "Laser Beams and Resonators," Applied Optics/Vol. 5, No. 10/October 1966. In addition, $\omega_0$ is also referred to as a beam waist radius.

$$D_{CI} \geq \omega_0/2 \tag{1-1}$$

provided that $$\omega_0^2 \equiv (\lambda_0/\pi)\{L_{OR}(R_1 - L_{OR})\}^{1/2} \tag{1-2}$$

where $\lambda_0$: wavelength (oscillation wavelength) of desired light mainly emitted from the light emitting element;
$L_{OR}$: resonator length; and
$R_1$: radius of curvature of the center part of the first portion of the base part surface (i.e., radius of curvature of the first light reflection layer).

Figure 62:
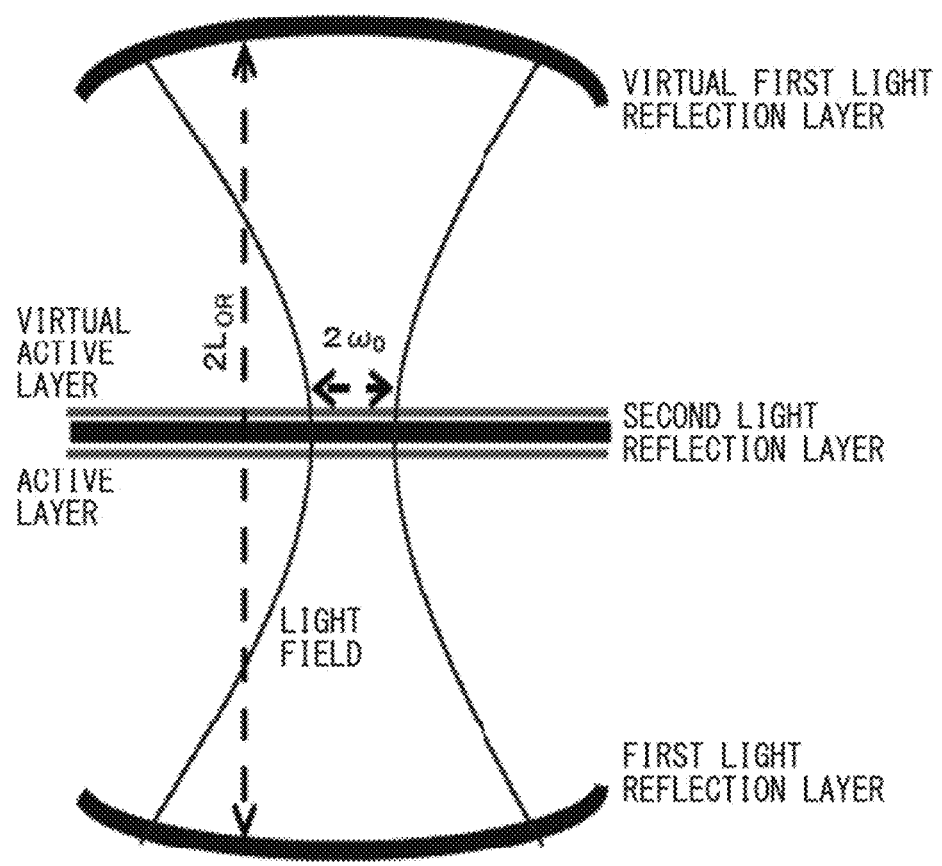
FIG. 62 is a conceptual diagram when a Fabry-Perot resonator interposed between two concave mirror parts having the same radius of curvature is assumed.
Figure 63:
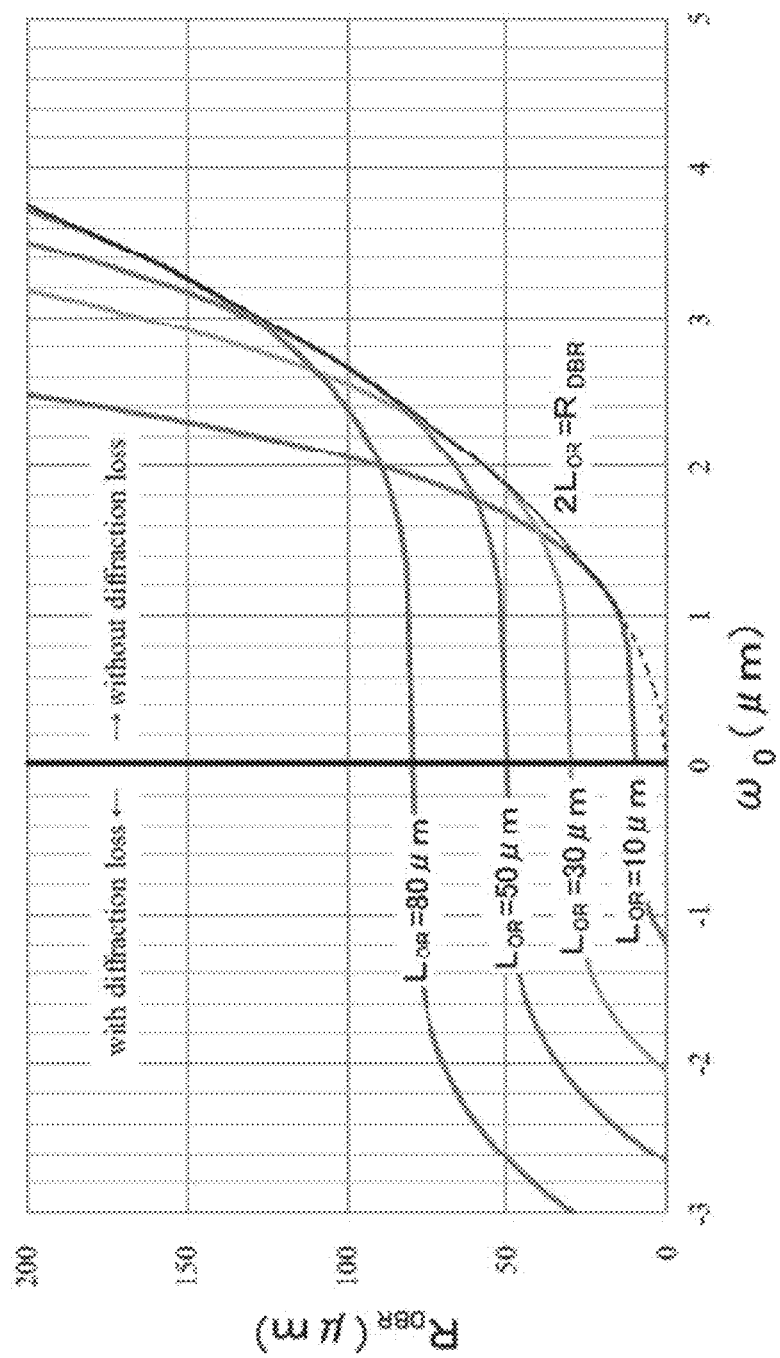
FIG. 63 is a graph representing a relationship between a value of $\omega_0$, a value of a resonator length LOR, and a value of a radius of curvature R1 of a concave mirror part of the first light reflection layer.
Figure 64:
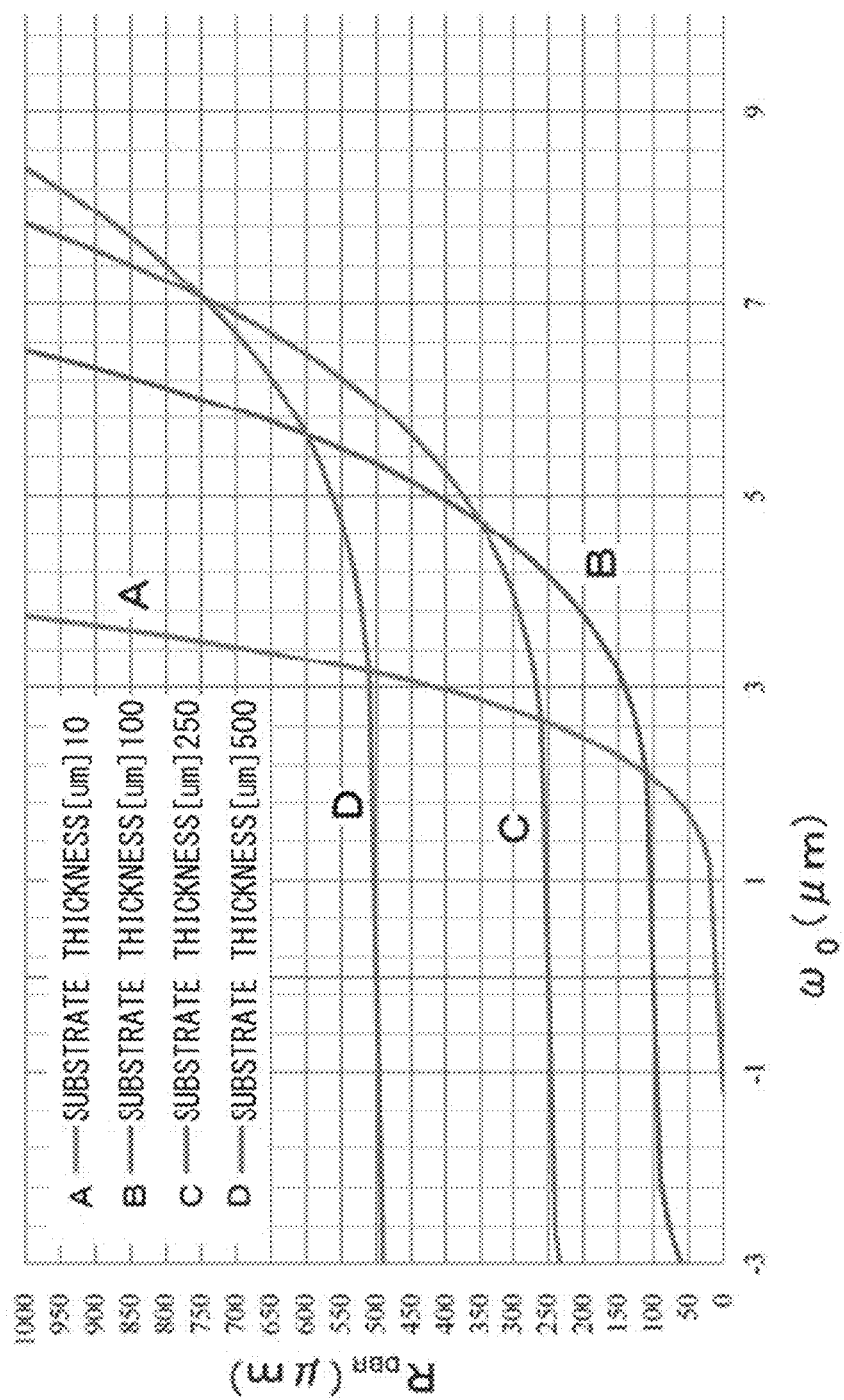
FIG. 64 is a graph representing a relationship between a value of $\omega_0$, a value of the resonator length LOR, and a value of the radius of curvature R1 of the concave mirror part of the first light reflection layer.
Figure 65A:
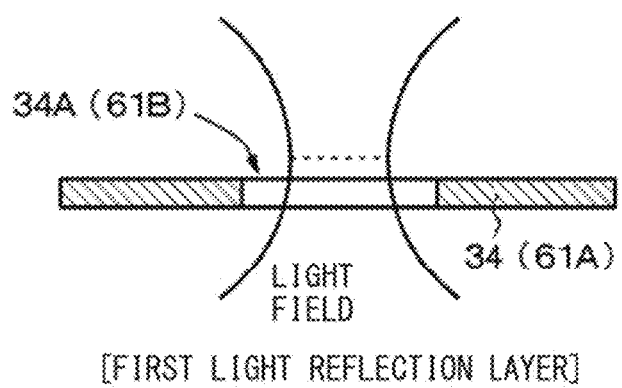
FIGS. 65A and 65B are diagrams schematically illustrating a condensed state of laser light when the value of $\omega_0$ is "positive", and a diagram schematically illustrating a condensed state of the laser light when the value of $\omega_0$ is "negative", respectively.
Figure 65B:
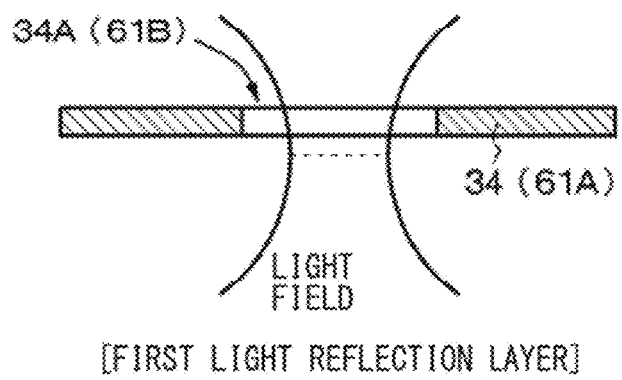

Here, in the light emitting element or the like of the present disclosure, only the first light reflection layer has a concave mirror shape; however, in view of a symmetry of the second light reflection layer with respect to a flat mirror, it is possible for the resonator to be expanded to a Fabry-Perot resonator interposed between two concave mirror parts having the same radius of curvature (see the schematic diagram of FIG. 62). In this instance, the resonator length of the virtual Fabry-Perot resonator is twice the resonator length $L_{OR}$. Graphs representing relationships between the value of $\omega_0$, the value of the resonator length $L_{OR}$, and the value of the radius of curvature $R_1$ of the first light reflection layer are illustrated in FIGS. 63 and 64. Note that $\omega_0$ having a "positive" value means that the laser light is schematically in a state of FIG. 65A, and that $\omega_0$ having a "negative" value means that the laser light is schematically in a state of FIG. 65B. The laser light may be in the state illustrated in FIG. 65A or may be in the state illustrated in FIG. 65B. It is to be noted, however, that if the radius of curvature $R_1$ is smaller than the resonator length $L_{OR}$, the virtual Fabry-Perot resonator having the two concave mirror parts comes into the state illustrated in FIG. 65B, and confinement thus becomes excessive to generate diffraction loss. Therefore, the state illustrated in FIG. 65A is preferable in which the radius of curvature $R_1$ is larger than the resonator length $L_{OR}$. Note that if the active layer is disposed close to a flat light reflection layer of the two light reflection layers, specifically, to the second light reflection layer, the light field is more concentrated in the active layer. That is, confinement of the light field in the active layer is enhanced, and laser oscillation is facilitated. The position of the active layer, that is, the distance from the surface of the second light reflection layer facing the second compound semiconductor layer to the active layer may be, and is not limited to, $\lambda_0/2$ to $10\lambda_0$, for example.

Incidentally, in a case where a region onto which light reflected by the first light reflection layer is to be condensed is not included in the current injection region corresponding to a region in which the active layer has a gain due to current injection, induced emission of light from carriers can be hindered, possibly leading to hindrance of laser oscillation. Satisfying the foregoing expressions (1-1) and (1-2) makes it possible to ensure that the region onto which the light reflected by the first light reflection layer is to be condensed is included in the current injection region, thus making it possible to accomplish laser oscillation with reliability.

Then, the light emitting element of the fifth configuration may further include:
- a mode loss action site that is provided on the second surface of the second compound semiconductor layer and configures a mode loss action region acting on increase and decrease in oscillation mode loss;
- a second electrode formed to extend from a position on the second surface of the second compound semiconductor layer to a position on the mode loss action site; and
- a first electrode electrically coupled to the first compound semiconductor layer.

The second light reflection layer may be formed on the second electrode,
- a current injection region, a current non-injection inside region surrounding the current injection region, and a current non-injection outside region surrounding the current non-injection inside region may be formed in the stacked structure, and
- an orthogonal projection image of the mode loss action region and an orthogonal projection image of the current non-injection outside region may overlap each other.

In addition, in the light emitting element of the fifth configuration including such a preferable configuration, a radius $r_1$ ($=D_1/2$) of the first light reflection layer may satisfy $\omega_0 \leq r_1 \leq 20\cdot\omega_0$, preferably $\omega_0 \leq r_1 \leq 10\cdot\omega_0$. Alternatively, the value of $r_1$ may be, for example, $r_1 \leq 1\times10^{-4}$ in, preferably $r_1 \leq 5\times10^{-5}$ m. Further, the height of the base part surface (the thickness or height of the first portion of the base part surface) $h_1$ may be, for example, $h_1 \leq 5\times10^{-5}$ m. Furthermore, in the light emitting element of the fifth configuration including such a preferable configuration, $D_{CI} \geq \omega_0$ may be satisfied. Furthermore, in the light emitting element of the fifth configuration including such a preferable configuration, the following may be satisfied: $R_1 \leq 1\times10^{-3}$ m, preferably $1\times10^{-5}$ m $\leq R_1 \leq 1\times10^{-3}$ m, and more preferably, $1\times10^{-5}$ m $\leq R_1 \leq 1\times10^{-4}$ m.

In addition, the light emitting element or the like of the present disclosure including the preferable form or configuration described above may further include:
- a mode loss action site that is provided on the second surface of the second compound semiconductor layer and configures a mode loss action region acting on increase and decrease in oscillation mode loss;
- a second electrode formed to extend from a position on the second surface of the second compound semiconductor layer to a position on the mode loss action site; and
- a first electrode electrically coupled to the first compound semiconductor layer.

The second light reflection layer may be formed on the second electrode,
- a current injection region, a current non-injection inside region surrounding the current injection region, and a current non-injection outside region surrounding the current non-injection inside region may be formed in the stacked structure, and
- an orthogonal projection image of the mode loss action region and an orthogonal projection image of the current non-injection outside region may overlap each other. Here, the light emitting element of such a configuration will be referred to as a "light emitting element of a sixth configuration" for the sake of convenience.

Alternatively, the light emitting element or the like of the present disclosure including the preferable form or configuration described above may further include:
- a second electrode formed on the second surface of the second compound semiconductor layer;
- a second light reflection layer formed on the second electrode;
- a mode loss action site that is provided on the first surface of the first compound semiconductor layer and configures a mode loss action region acting on increase and decrease in oscillation mode loss; and
- a first electrode electrically coupled to the first compound semiconductor layer.

The first light reflection layer may be formed to extend from a position on the first surface of the first compound semiconductor layer to a position on the mode loss action site,
- a current injection region, a current non-injection inside region surrounding the current injection region, and a current non-injection outside region surrounding the current non-injection inside region may be formed in the stacked structure, and
- an orthogonal projection image of the mode loss action region and an orthogonal projection image of the current non-injection outside region may overlap each other. Here, the light emitting element of such a configuration will be referred to as a "light emitting element of a seventh configuration" for the sake of convenience. Note that the definition of the light emitting element of the seventh configuration is applicable to the light emitting element of the fifth configuration.

In the light emitting element of the sixth configuration or the light emitting element of the seventh configuration, the current non-injection region (a collective term for the current non-injection inside region and the current non-injection outside region) is formed in the stacked structure; in this case, specifically, the current non-injection region may be formed in a region on the second electrode side of the second compound semiconductor layer in the thickness direction, may be formed in the entire second compound semiconductor layer, may be formed in the second compound semiconductor layer and the active layer, or may be formed to extend from the second compound semiconductor layer to a part of the first compound semiconductor layer. While the orthogonal projection image of the mode loss action region and the orthogonal projection image of the current non-injection outside region overlap each other, the orthogonal projection image of the mode loss action region and the orthogonal projection image of the current non-injection outside region do not have to overlap each other in a region sufficiently away from the current injection region.

In the light emitting element of the sixth configuration, the current non-injection outside region may be located below the mode loss action region.

In the light emitting element of the sixth configuration including the preferable configuration described above, $$0.01 \leq S_1/(S_1+S_2) \leq 0.7$$

may be satisfied, where $S_1$ is an area of an orthogonal projection image of the current injection region, and $S_2$ is an area of an orthogonal projection image of the current non-injection inside region. Further, in the light emitting element of the seventh configuration, $$0.01 \leq S_1'/(S_1'+S_2') \leq 0.7$$

may be satisfied, where $S_1'$ is the area of the orthogonal projection image of the current injection region, and $S_2'$ is the area of the orthogonal projection image of the current non-injection inside region. It is to be noted, however, that neither the range of $S_1/(S_1+S_2)$ nor the range of $S_1'/(S_1'+S_2')$ is limited or restricted to the above-described ranges.

In the light emitting element of the sixth configuration or the light emitting element of the seventh configuration including the preferable configuration described above, the current non-injection inside region and the current non-injection outside region may be formed by ion injection into the stacked structure. The light emitting element of such a configuration will be referred to as a "light emitting element of a (6-A)th configuration" or a "light emitting element of a (7-A)th configuration" for the sake of convenience. In addition, in this case, ion species may be at least one kind of ion (that is, one kind of ion or two or more kinds of ions) selected from the group consisting of boron, proton, phosphorus, arsenic, carbon, nitrogen, fluorine, oxygen, germanium, zinc, and silicon.

Alternatively, in the light emitting element of the sixth configuration or the light emitting element of the seventh configuration including the preferable configuration described above, the current non-injection inside region and the current non-injection outside region may be formed by irradiation of the second surface of the second compound semiconductor layer with plasma, an ashing process on the second surface of the second compound semiconductor layer, or a reactive ion etching process on the second surface of the second compound semiconductor layer. The light emitting element of such a configuration will be referred to as a "light emitting element of a (6-B)th configuration" or a "light emitting element of a (7-B)th configuration" for the sake of convenience. In these processes, the current non-injection inside region and the current non-injection outside region are exposed to plasma particles, and this degrades electrical conductivity of the second compound semiconductor layer, bringing the current non-injection inside region and the current non-injection outside region into a high resistance state. That is, the current non-injection inside region and the current non-injection outside region may be formed by exposure of the second surface of the second compound semiconductor layer to the plasma particles. Specific examples of the plasma particles include argon, oxygen, and nitrogen.

Alternatively, in the light emitting element of the sixth configuration or the light emitting element of the seventh configuration including the preferable configuration described above, the second light reflection layer may include a region that causes light from the first light reflection layer to be reflected or scattered toward the outside of a resonator structure configured by the first light reflection layer and the second light reflection layer. The light emitting element of such a configuration will be referred to as a "light emitting element of a (6-C)th configuration" or a "light emitting element of a (7-C)th configuration" for the sake of convenience. Specifically, a region of the second light reflection layer located above a sidewall of the mode loss action site (a sidewall of an opening provided in the mode loss action site) has a normal tapered inclination or has a region curved in a convex shape toward the first light reflection layer. Alternatively, in the light emitting element of the sixth configuration or the light emitting element of the seventh configuration including the preferable configuration described above, the first light reflection layer may include a region that causes light from the second light reflection layer to be reflected or scattered toward the outside of the resonator structure configured by the first light reflection layer and the second light reflection layer. Specifically, it is sufficient that in a region of a part of the first light reflection layer, a normal tapered inclination is formed or a curved part having a convex shape toward the second light reflection layer is formed. Alternatively, it is sufficient that a region of the first light reflection layer located above the sidewall of the mode loss action site (the sidewall of the opening provided in the mode loss action site) is configured to have a normal tapered inclination or have a region curved in a convex shape toward the second light reflection layer. In addition, a configuration is also employable in which light is scattered at a boundary (a sidewall edge part) between a top surface of the mode loss action site and the sidewall of the opening provided in the mode loss action site to thereby cause the light to be scattered toward the outside of the resonator structure configured by the first light reflection layer and the second light reflection layer.

In the light emitting element of the (6-A)th configuration, the light emitting element of the (6-B)th configuration, or the light-emitting element of the (6-C)th configuration described above, $$OL_0 > OL_2$$

may be satisfied, where $OL_2$ is an optical distance from the active layer to the second surface of the second compound semiconductor layer in the current injection region, and $OL_0$ is an optical distance from the active layer to the top surface of the mode loss action site in the mode loss action region.

Furthermore, in the light emitting element of the (6-A)th configuration, the light emitting element of the (7-A)th configuration, the light emitting element of the (6-B)th configuration, the light emitting element of the (7-B)th configuration, the light emitting element of the (6-C)th configuration, or the light emitting element of the (7-C)th configuration that are described above and include these configurations, light having a higher order mode generated may be scattered and lost by the mode loss action region toward the outside of the resonator structure configured by the first light reflection layer and the second light reflection layer to thereby cause an increase in oscillation mode loss. That is, due to the presence of the mode loss action region that acts on increase and decrease in oscillation mode loss, light field intensities in a fundamental mode and a higher order mode to be generated decrease with increasing distance from a Z-axis in the orthogonal projection image of the mode loss action region; however, the mode loss in the higher order mode is larger than the decrease in the light field intensity in the fundamental mode, and therefore it is possible to further stabilize the fundamental mode. In addition, a reduction in threshold current is achievable because it is possible to reduce the mode loss as compared with a case where the current injection inside region is not present. Note that an axial line passing through the center of the resonator formed by the two light reflection layers is taken as the Z-axis, and a virtual plane orthogonal to the Z-axis is referred to as an XY plane, for the sake of convenience.

Further, in the light emitting element of the (6-A)th configuration, the light emitting element of the (7-A)th configuration, the light emitting element of the (6-B)th configuration, the light emitting element of the (7-B)th configuration, the light emitting element of the (6-C)th configuration, or the light emitting element of the (7-C)th configuration described above, the mode loss action site may include a dielectric material, a metal material, or an alloy material. Examples of the dielectric material include $SiO_X$, $SiN_X$, $AlN_X$, $AlO_X$, $TaO_X$, and $ZrO_X$, and examples of the metal material and alloy material include titanium, gold, platinum, and alloys thereof; however, these materials are not limitative. It is possible to cause light to be absorbed by the mode loss action site including any of these materials to thereby cause an increase in mode loss. Alternatively, it is possible to control mode loss by disturbing the phase of light, without direct absorption of the light. In this case, the mode loss action site may include a dielectric material, and an optical thickness $t_0$ of the mode loss action site may be of a value other than an integer multiple of ¼ of a wavelength $\lambda_0$ of light generated in the light emitting element. That is, by causing the phase of light that orbits inside the resonator and forms a standing wave to be disturbed in the mode loss action site and thereby breaking the standing wave, it is possible to impart corresponding mode loss. Alternatively, the mode loss action site may include a dielectric material, and the optical thickness $t_0$ of the mode loss action site (having a refractive index no) may be an integer multiple of ¼ of the wavelength $\lambda_0$ of the light generated in the light emitting element. That is, the optical thickness $t_0$ of the mode loss action site may be a thickness that neither causes the phase of light generated in the light emitting element to be disturbed, nor causes the standing wave to be broken. However, the optical thickness to does not have to be exactly an integer multiple of ¼, and only has to satisfy:

$$(\lambda_0/4n_0) \times m - (\lambda_0/8n_0) \leq t_0 \leq (\lambda_0/4n_0) \times 2m + (\lambda_0/8n_0).$$

Alternatively, by configuring the mode loss action site with use of a dielectric material, a metal material, or an alloy material, it is possible to cause light passing through the mode loss action site to be subjected to disturbance of the phase or to be absorbed by the mode loss action site. Further, by employing any of these configurations, it is possible to perform control of the oscillation mode loss with a higher degree of flexibility, and to further increase the degree of flexibility in designing the light emitting element.

Alternatively, in the light emitting element of the sixth configuration including the preferable configuration described above, a convex part may be formed on the second surface side of the second compound semiconductor layer, and the mode loss action site may be formed on a region of the second surface of the second compound semiconductor layer surrounding the convex part. The light emitting element of such a configuration will be referred to as a "light emitting element of a (6-D)th configuration" for the sake of convenience. The convex part occupies the current injection region and the current non-injection inside region. In addition, in this case, $$OL_0 < OL_2$$

may be satisfied, where $OL_2$ is an optical distance from the active layer to the second surface of the second compound semiconductor layer in the current injection region, and $OL_0$ is an optical distance from the active layer to the top surface of the mode loss action site in the mode loss action region. Furthermore, in these cases, a configuration is employable in which light having a higher order mode generated is confined in the current injection region and the current non-injection inside region by the mode loss action region to thereby cause a decrease in oscillation mode loss. That is, due to the presence of the mode loss action region that acts on increase and decrease in oscillation mode loss, light field intensities in the fundamental mode and the higher order mode to be generated increase in an orthogonal projection image of the current injection region and the current non-injection inside region. Furthermore, in these cases, the mode loss action site may include a dielectric material, a metal material, or an alloy material. Here, examples of the dielectric material, the metal material, or the alloy material may include various materials described above.

Alternatively, in the light emitting element of the seventh configuration including the preferable configuration described above, a convex part may be formed on the first surface side of the first compound semiconductor layer, and the mode loss action site may be formed on a region of the first surface of the first compound semiconductor layer surrounding the convex part, or the mode loss action site may be configured by the region of the first compound semiconductor layer surrounding the convex part. The light emitting element of such a configuration will be referred to as a "light emitting element of a (7-D)th configuration" for the sake of convenience. The convex part coincides with the orthogonal projection image of the current injection region and the current non-injection inside region. In addition, in this case, $$OL_0' < OL_1'$$

may be satisfied, where $OL_1'$ is an optical distance from the active layer to the first surface of the first compound semiconductor layer in the current injection region, and $OL_0'$ is an optical distance from the active layer to the top surface of the mode loss action site in the mode loss action region. Furthermore, in these cases, a configuration is employable in which light having a higher order mode generated is confined in the current injection region and the current non-injection inside region by the mode loss action region to thereby cause a decrease in oscillation mode loss. Further, in these cases, the mode loss action site may include a dielectric material, a metal material, or an alloy material. Here, examples of the dielectric material, the metal material, or the alloy material may include various materials described above.

Furthermore, in the light emitting element or the like of the present disclosure including the preferable form or configuration described above, at least two light absorbing material layers may be formed in parallel with a virtual plane occupied by the active layer in the stacked structure including the second electrode. Here, the light emitting element of such a configuration will be referred to as a "light emitting element of an eighth configuration" for the sake of convenience.

In the light emitting element of the eighth configuration, at least four light absorbing material layers are preferably formed.

In the light emitting element of the eighth configuration including the preferable configuration described above, $$0.9 \times \{(m \cdot \lambda_0)/(2 \cdot n_{ep})\} \leq L_{Abs} \leq 1.1 \times \{(m \cdot k)/(2 \cdot n_{ep})\}$$

is preferably satisfied, where $\lambda_0$ is an oscillation wavelength (which is a wavelength of light mainly emitted from the light emitting element, and is a desired oscillation wavelength), $n_{ep}$ is an equivalent refractive index of two light absorbing material layers and a part of the stacked structure located between the light absorbing material layers as a whole, and $L_{Abs}$ is a distance between the light absorbing material layers. Here, m is 1, or any of two or more integers inclusive of 1. The equivalent refractive index $n_{eq}$ is expressed by $$n_{eq} = \Sigma(t_i \times n_i)/\Sigma(t_i)$$

where $t_1$ and $n_i$ are a thickness and a refractive index, respectively, of each of the two light absorbing material layers and each layer configuring the part of the stacked structure located between the light absorbing material layers. Note that i=1, 2, 3, ..., I; "I" represents the total number of layers including the two light absorbing material layers and the layers configuring the part of the stacked structure located between the light absorbing material layers; and "Σ" represents summation from i=1 to i=I. It is sufficient that the equivalent refractive index $n_{eq}$ is calculated on the basis of a thickness obtained for each of constituent materials from a known refractive index and observation, by observing the constituent materials through the electron microscope observation or the like of a cross section of the light emitting element. In a case where m is 1, a distance between the adjacent light absorbing material layers satisfies $$0.9 \times \{\lambda_0/(2 \cdot n_{eq})\} \leq L_{Abs} \leq 1.1 \times \{\lambda_0/(2 \cdot n_{eq})\}$$

in all the plurality of light absorbing material layers. Further, assuming that, as one example, m=1 or 2 when m is any of two or more integers inclusive of 1, the distance between adjacent light absorbing material layers satisfies $$0.9 \times \{\lambda_0/(2 \cdot n_{eq})\} \leq L_{Abs} \leq 1.1 \times \{\lambda_0/(2 \cdot n_{eq})\}$$

in some of the light absorbing material layers, and the distance between adjacent light absorbing material layers satisfies $$0.9 \times \{(2 \cdot \lambda_0)/(2 \cdot n_{eq})\} \leq L_{Abs} \leq 1.1 \times \{(2 \cdot \lambda_0)/(2 \cdot n_{eq})\}$$

in the remaining light absorbing material layers. In a broader sense, the distance between adjacent light absorbing material layers satisfies $$0.9 \times \{\lambda_0/(2 \cdot n_{eq})\} \leq L_{Abs} \leq 1.1 \times \{\lambda_0/(2 \cdot n_{eq})\}$$

in some of the light absorbing material layers, and the distance between adjacent light absorbing material layers satisfies $$0.9 \times \{(m' \cdot \lambda_0)/(2 \cdot n_{eq})\} \leq L_{Abs} \leq 1.1 \times \{(m' \cdot \lambda_0)/(2 \cdot n_{eq})\}$$

in the remaining various light absorbing material layers. Here, m' is any integer of 2 or more. Further, the distance between adjacent light absorbing material layers is a distance between respective gravities of the adjacent light absorbing material layers. That is, the distance between adjacent light absorbing material layers is actually a distance between respective centers of the light absorbing material layers when cut at a virtual plane along the thickness direction of the active layer.

Furthermore, in the light emitting element of the eighth configuration including the various preferable configurations described above, the thickness of the light absorbing material layer is preferably smaller than or equal to $\lambda_0/(4 \cdot n_{eq})$. A lower limit value of the thickness of the light absorbing material layer may be 1 nm, for example.

Furthermore, in the light emitting element of the eighth configuration including the various preferable configurations described above, the light absorbing material layers may be located at a minimum amplitude portion occurring in a standing wave of light formed inside the stacked structure.

Furthermore, in the light emitting element of the eighth configuration including the various preferable configurations described above, the active layer may be located at a maximum amplitude portion occurring in the standing wave of light formed inside the stacked structure.

Furthermore, in the light emitting element of the eighth configuration including the various preferable configurations described above, the light absorbing material layer may have a light absorption coefficient twice or more a light absorption coefficient of the compound semiconductor configuring the stacked structure. Here, it is possible to determine the light absorption coefficient of the light absorbing material layer and the light absorption coefficient of the compound semiconductor configuring the stacked structure by observing constituent materials through electron microscope observation or the like of a cross section of the light emitting element and making analogy from known evaluation results observed for each of the constituent materials.

Furthermore, in the light emitting element of the eighth configuration including the various preferable configurations described above, the light absorbing material layer may include at least one kind of material selected from the group consisting of a compound semiconductor material having a band gap narrower than that of the compound semiconductor configuring the stacked structure, a compound semiconductor material doped with an impurity, a transparent electrically-conductive material, and a light-reflection-layer constituent material having a light absorbing property. Here, examples of the compound semiconductor material having a band gap narrower than that of the compound semiconductor configuring the stacked structure include InGaN in a case where the compound semiconductor configuring the stacked structure is GaN; examples of the compound semiconductor material doped with an impurity include n-GaN doped with Si and n-GaN doped with B; examples of the transparent electrically-conductive material include a transparent electrically-conductive material configuring an electrode to be described later; and examples of the light-reflection-layer constituent material having a light absorbing property include a material configuring the light reflection layers to be described later (e.g., $SiO_x$, $SiN_x$, $TaO_x$, and the like). All the light absorbing material layers may each include one kind of material among these materials. Alternatively, the light absorbing material layers may each include various kinds of materials selected from these materials; however, it is preferable, in terms of simplification of formation of the light absorbing material layers, that each single light absorbing material layer include a single kind of material. The light absorbing material layers may be formed within the first compound semiconductor layer, may be formed within the second compound semiconductor layer, may be formed within the first light reflection layer, or may be formed within the second light reflection layer, or any combination of these may be employed. Alternatively, the light absorbing material layer may also serve as an electrode including a transparent electrically-conductive material to be described later.

Example 10

Example 10 relates to the light emitting element according to the second aspect of the present disclosure, the light emitting element array according to the second aspect of the present disclosure, and the method of manufacturing a light emitting element array according to the third aspect of the present disclosure, and specifically relates to the light emitting elements of the first configuration and the second configuration.

Figure 35:
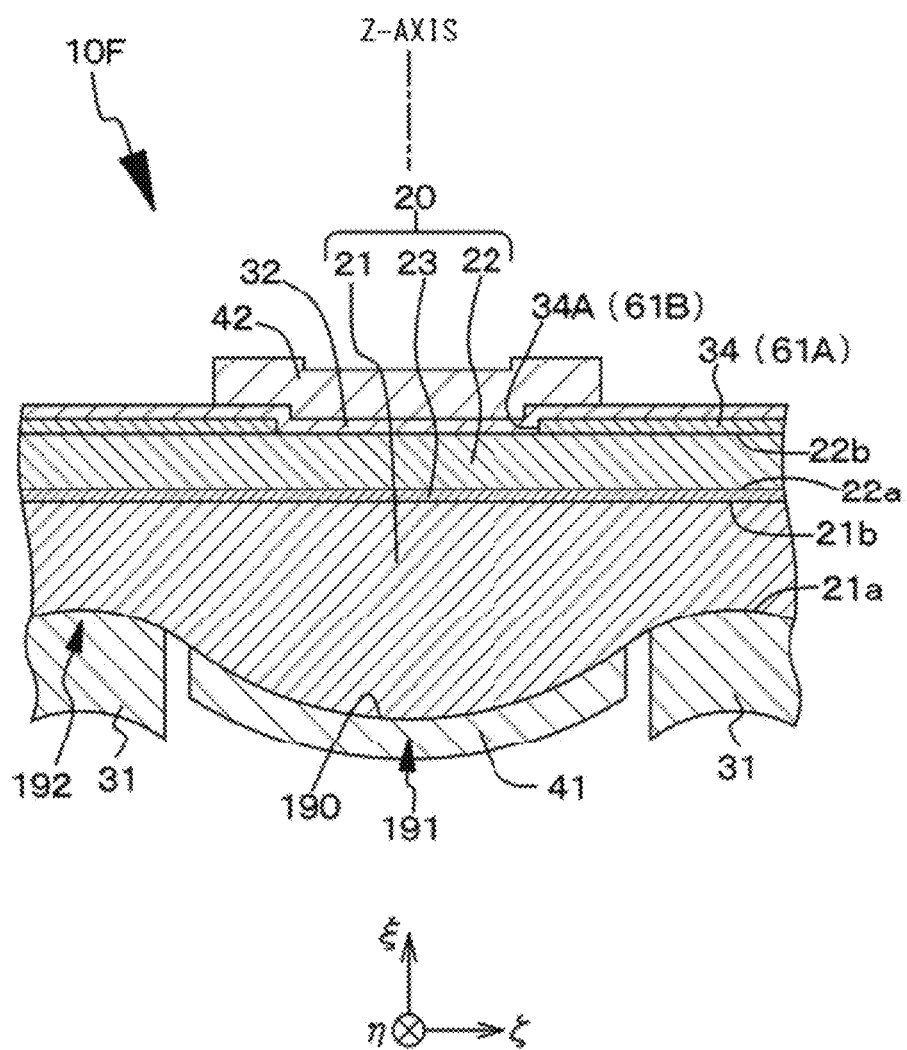
FIG. 35 is a schematic partial end view of a light emitting element of Example 10.
Figure 36:
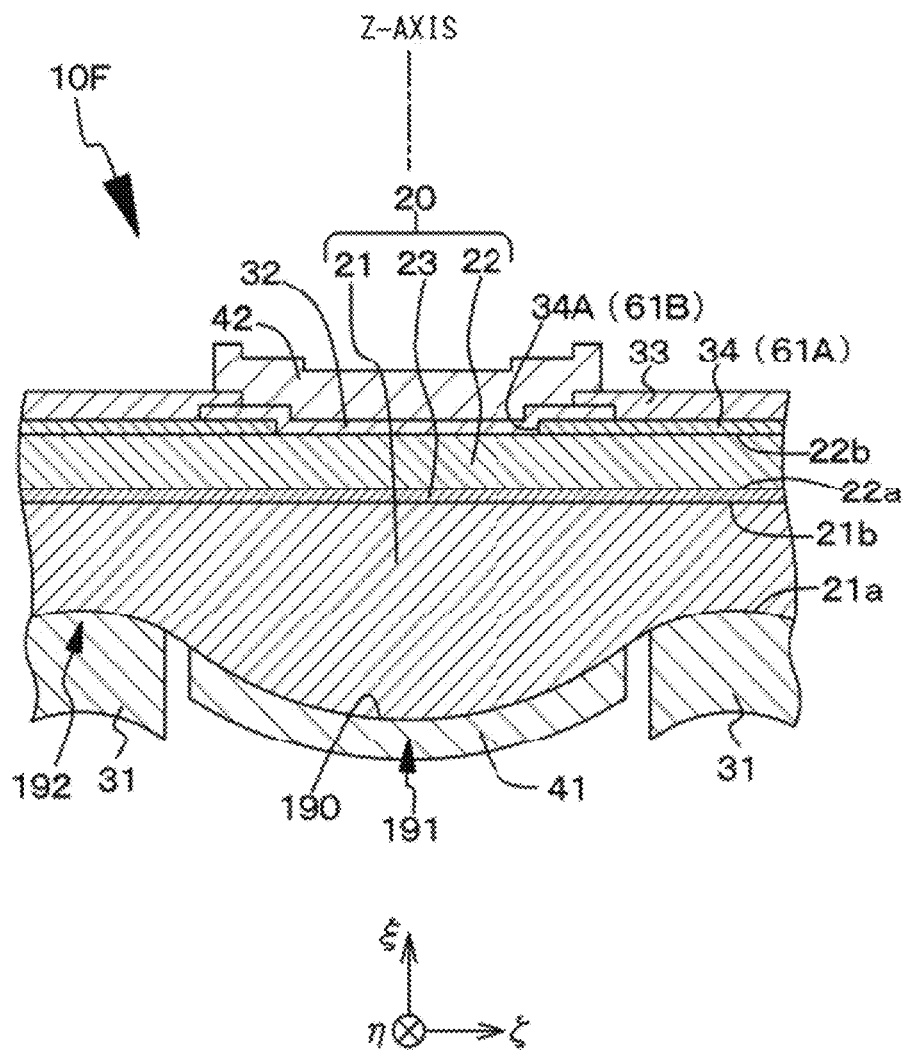
FIG. 36 is a schematic partial end view of the light emitting element of Example 10.
Figure 37:
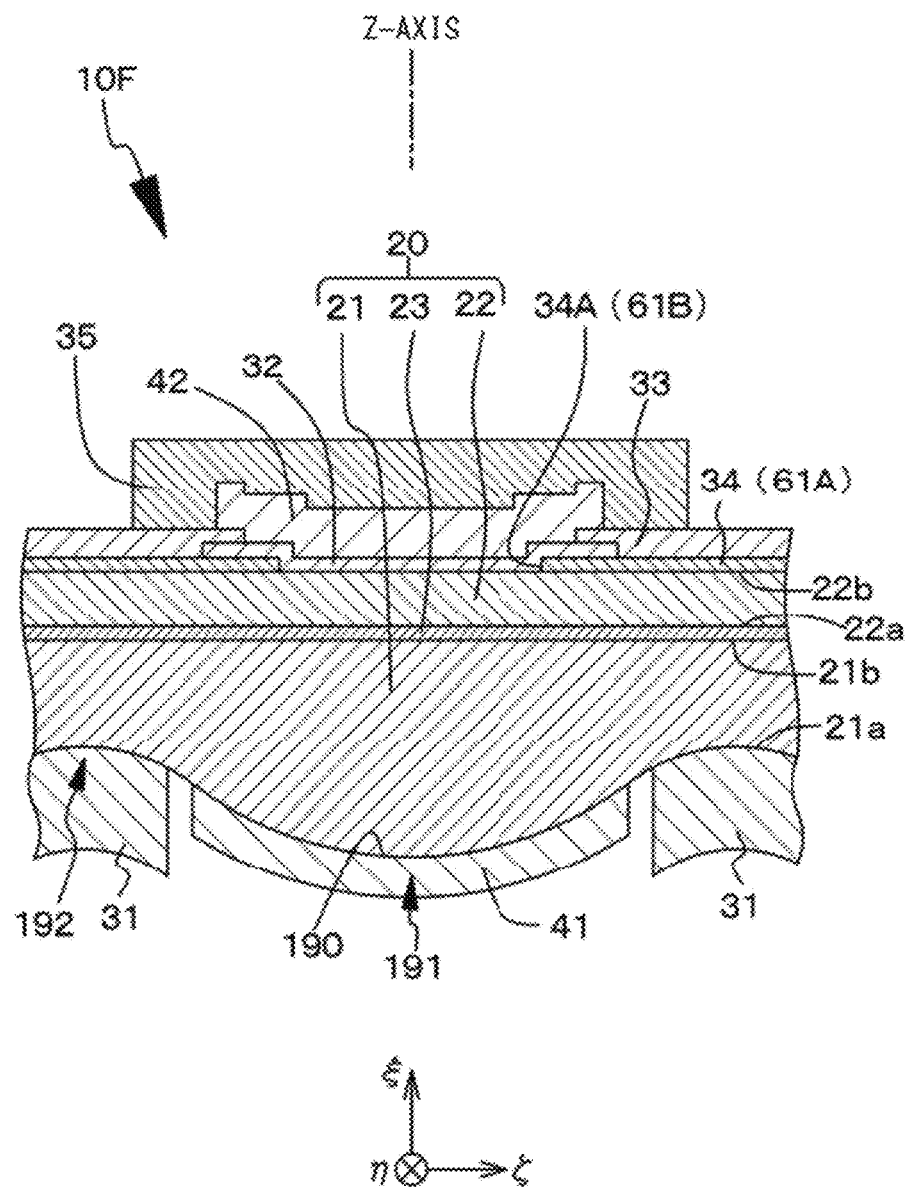
FIG. 37 is a schematic partial end view of the light emitting element of Example 10.
Figure 38:
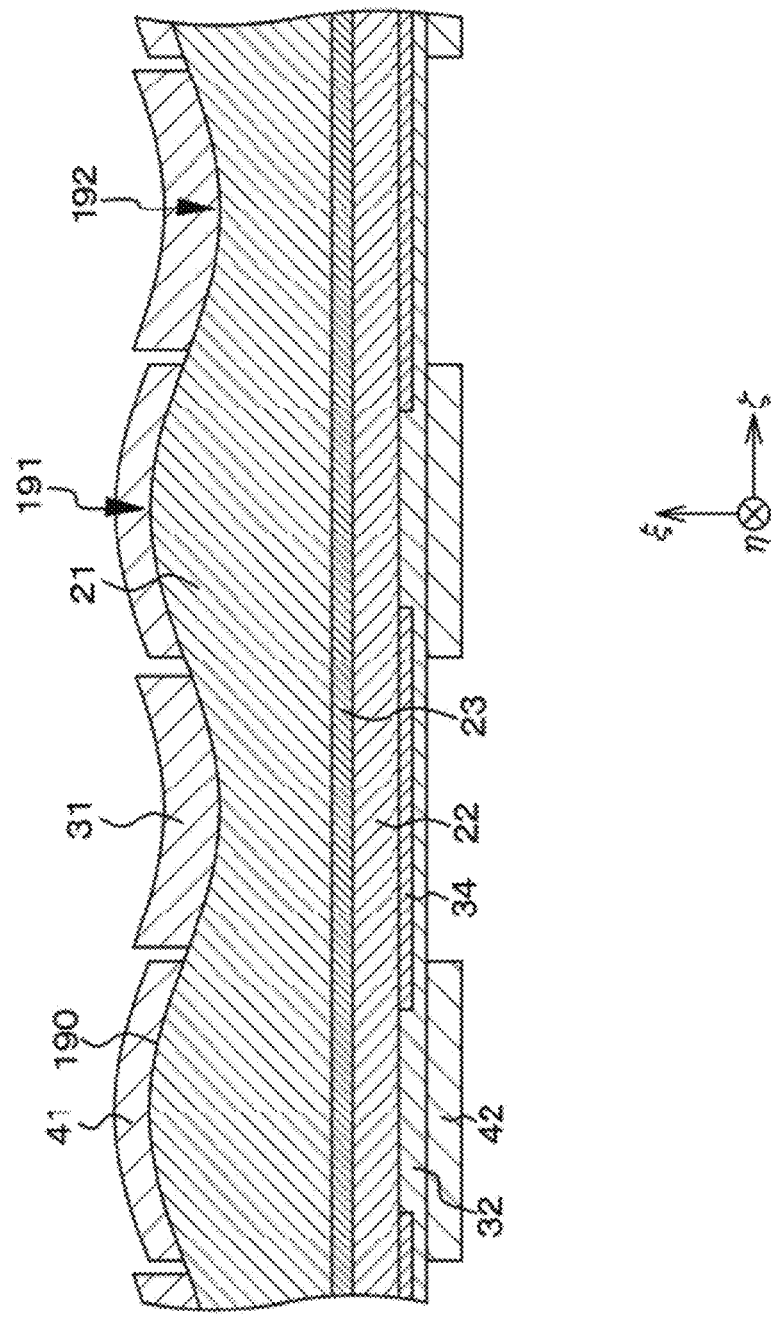
FIG. 38 is a schematic partial end view of a light emitting element array of Example 10.
Figure 39:
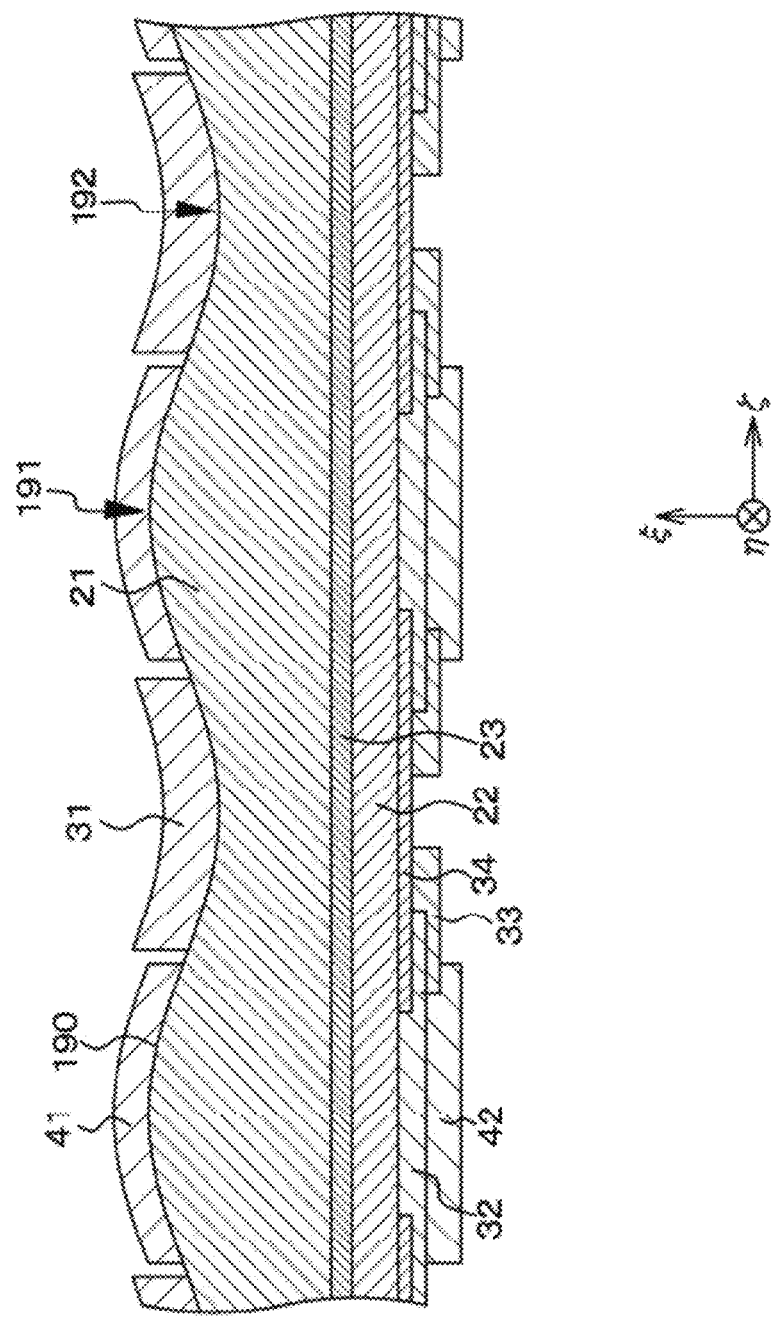
FIG. 39 is a schematic partial end view of the light emitting element array of Example 10.
Figure 40:
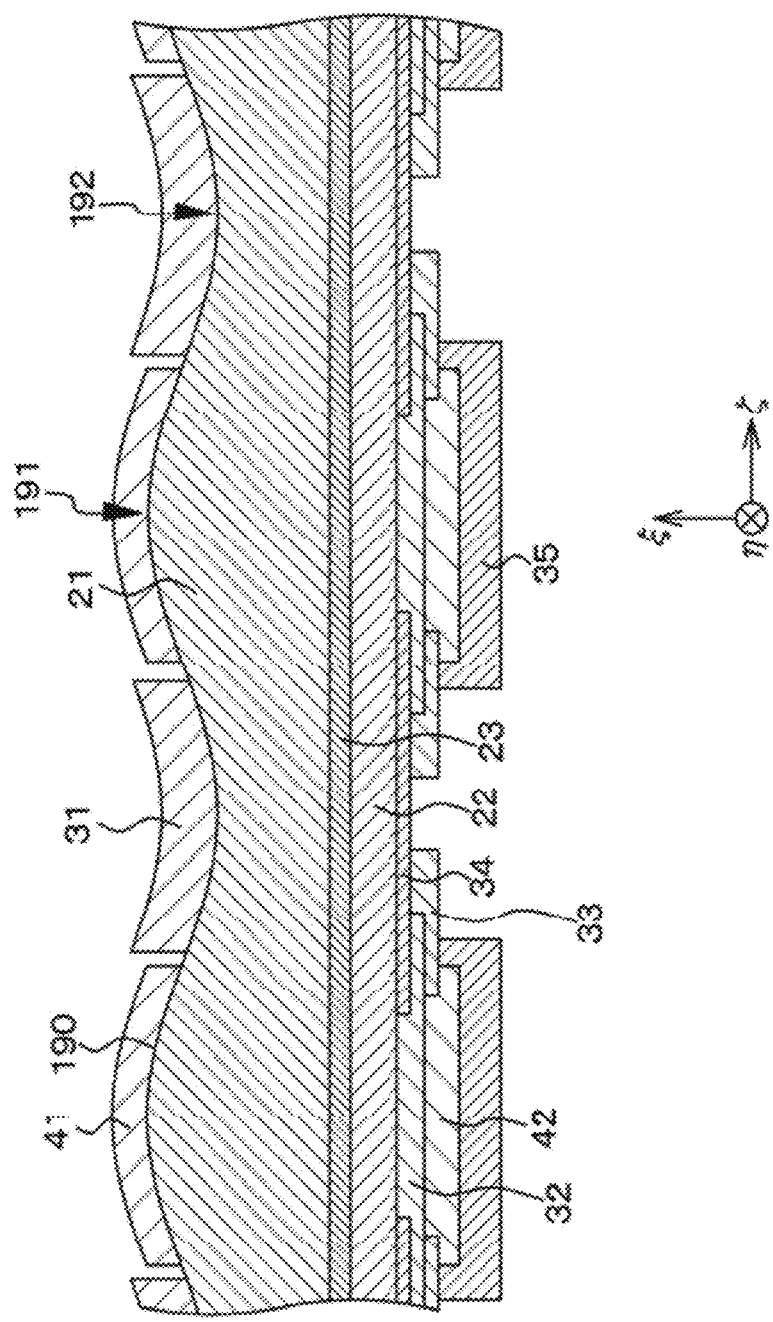
FIG. 40 is a schematic partial end view of the light emitting element array of Example 10.

Schematic partial end views of a light emitting element of Example 10, a light emitting element included in a light emitting element array of Example 10, and a light emitting element obtained by a method of manufacturing a light emitting element array of Example 10 (hereinafter, these light emitting elements will collectively be referred to as a "light emitting element 10F") when cut along the virtual $\zeta\xi$ plane described above are illustrated in FIGS. 35, 36, and 37. Schematic partial end views of the light emitting element array of Example 10 when cut along the virtual $\zeta\xi$ plane described above are illustrated in FIGS. 38, 39, and 40. Note that the configuration of the light emitting element illustrated in FIGS. 35, 36, and 37 is substantially the same as the configuration of the light emitting element of Example 1 illustrated in FIGS. 1, 2, and 3. The configuration of the light emitting element array illustrated in FIGS. 38, 39, and 40 is substantially the same as the configuration of the light emitting element array of Example 1 illustrated in FIGS. 4, 5, and 6.

Figure 41:
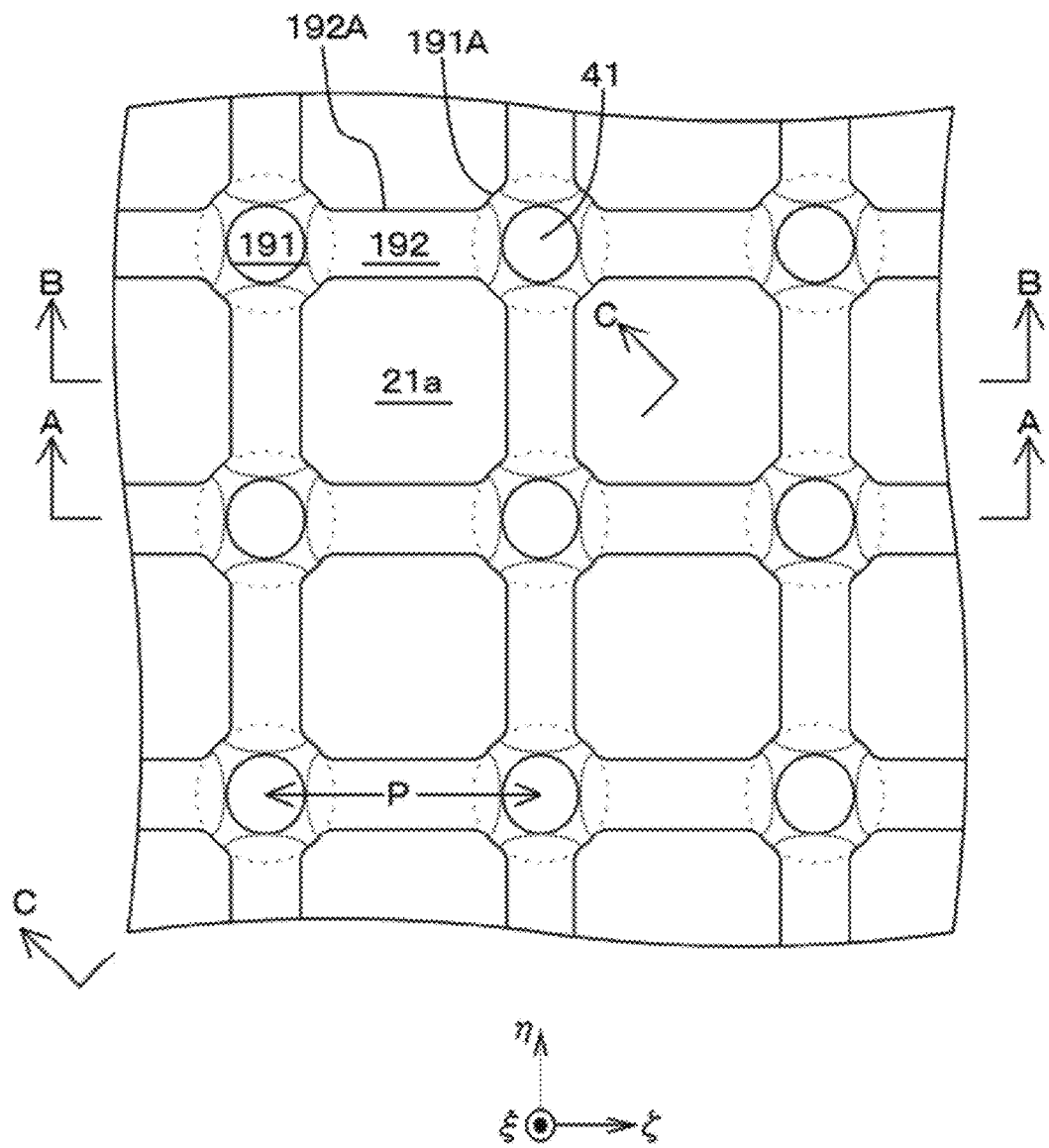
FIG. 41 is a diagram illustrating a layout state of the first portion and the second portion of the base part surface in the light emitting element array of Example 10.
Figure 42A:
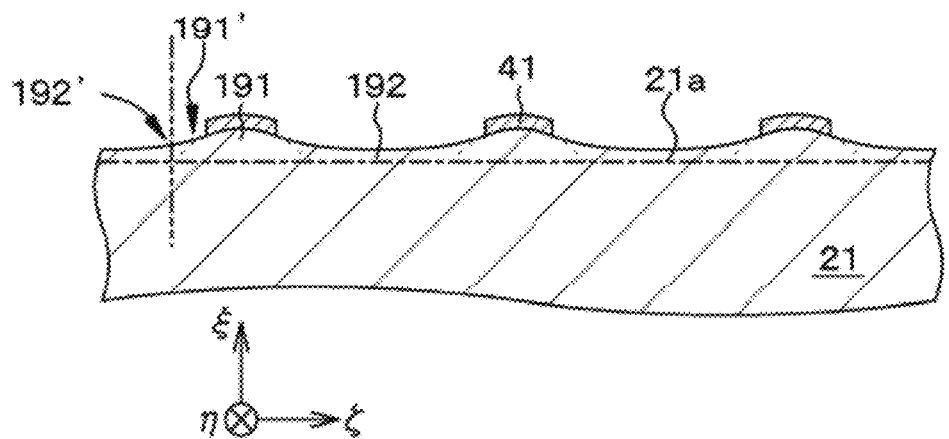
FIGS. 42A, 42B, and 42C are schematic partial end views of the first compound semiconductor layer and the like along arrows A-A, B-B, and C-C in FIG. 41, respectively.
Figure 42B:
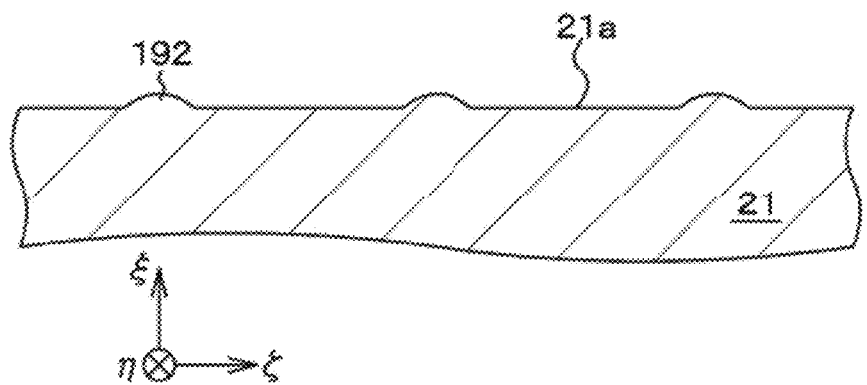
Figure 42C:
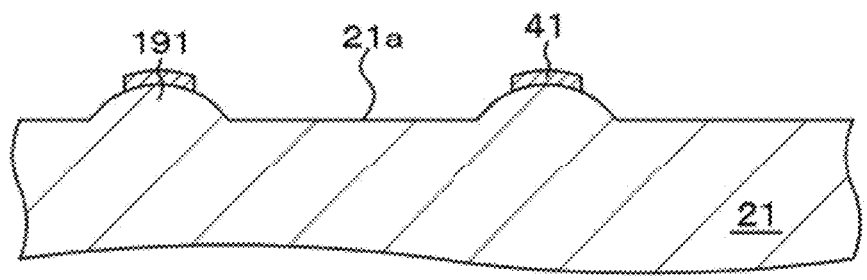
Figure 43:
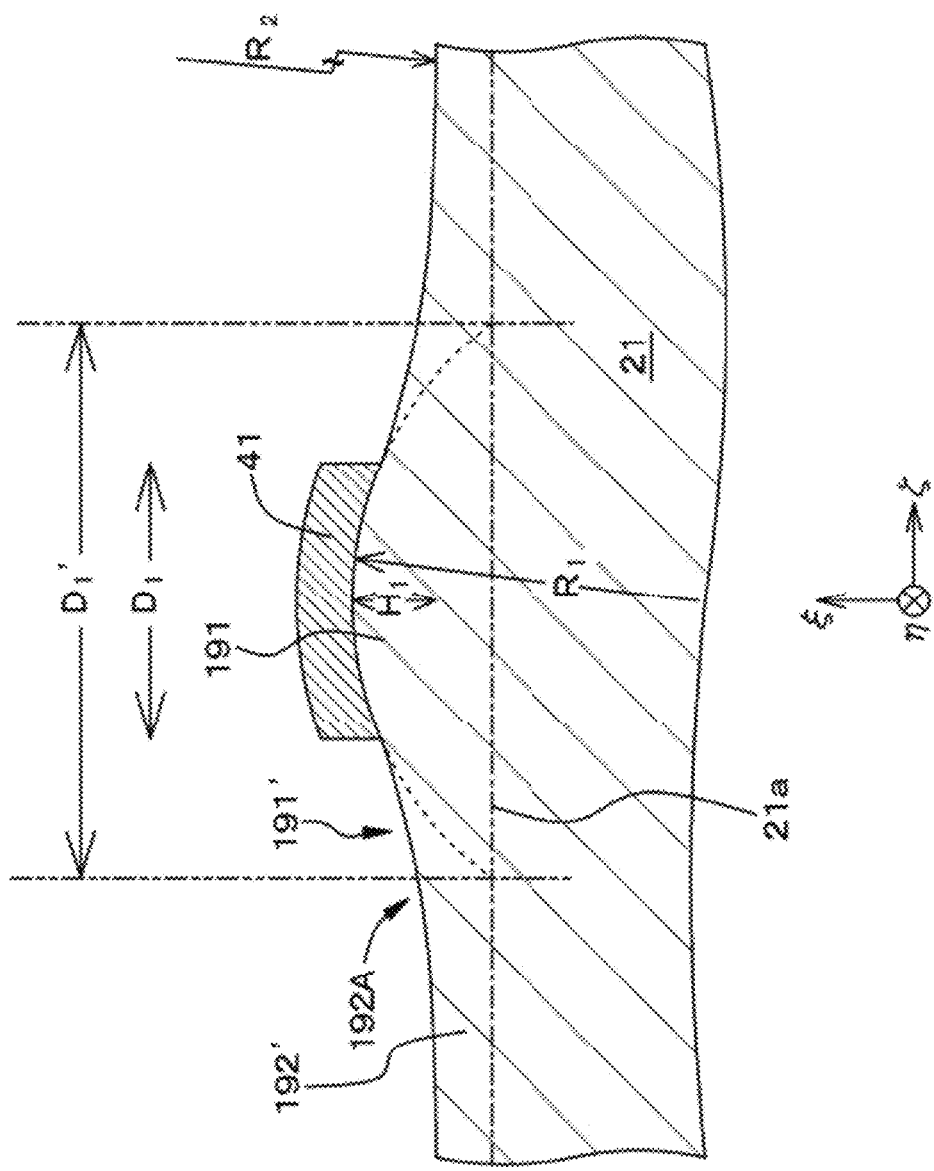
FIG. 43 is a schematic partial end diagram that enlarges a portion of FIG. 42A.

In addition, the layout state of the first portion and the second portion of the base part surface in the light emitting element array of Example 10 is illustrated in FIG. 41; schematic partial end views of the first compound semiconductor layer and the like along arrows A-A, B-B, and C-C in FIG. 41 are illustrated in FIGS. 42A, 42B, and 42C; and furthermore, a schematic partial end view enlarging a portion of FIG. 42A is illustrated in FIG. 43. In addition, the layout state of the first sacrificial layer and the second sacrificial layer for forming the first portion and the second portion of the base part surface in the light emitting element array of Example 10 is illustrated in FIGS. 44, 45, 46A, and 47, and schematic partial end views of the first compound semiconductor layer and the like for describing the method of manufacturing the light emitting element array of Example 10 are illustrated in FIGS. 48A, 48B, and 48C, and in 46B.

The light emitting element 10F of Example 10 includes:
a stacked structure 20 including a stack of a first compound semiconductor layer 21 having a first surface 21a, and a second surface 21b opposed to the first surface 21a,
an active layer (light emitting layer) 23 facing the second surface 21b of the first compound semiconductor layer 21, and
a second compound semiconductor layer 22 having a first surface 22a facing the active layer 23 and a second surface 22b opposed to the first surface 22a;
a first light reflection layer 41 formed on a base part surface 190 located on a first surface side of the first compound semiconductor layer 21; and
a second light reflection layer 42 formed on a second surface side of the second compound semiconductor layer 22 and having a flat shape.

In addition, when a portion of the base part surface 190 on which the first light reflection layer 41 is formed is referred to as a first portion 191 of the base part surface and a portion of the base part surface extending from a part of the first portion 191 of the base part surface is referred to as a second portion 192 of the base part surface, and
when a virtual plane that is orthogonal to an orthogonal projection image (e.g., an orthogonal projection image extending in $\zeta$ direction) of a line segment connecting a center of the first portion 191 of the base part surface and a center of the second portion 192 of the base part surface onto the first surface of the first compound semiconductor layer, that passes through the center of the first portion 191 of the base part surface and that is parallel to a thickness direction of the stacked structure 20 is referred to as a virtual $\eta\xi$ plane,
a height of the first portion 191 of the base part surface is higher than a height of the second portion 192 of the base part surface,
when cut along a virtual plane parallel to the virtual $\eta\xi$ plane, the first portion 191 of the base part surface has a cross-sectional shape that is an upwardly convex shape and is differentiable, and the second portion 192 of the base part surface has a cross-sectional shape that is an upwardly convex shape and is differentiable, with respect to the second surface 21b of the first compound semiconductor layer 21, and
the first portion 191 of the base part surface and the second portion 192 of the base part surface are continuous smoothly.

Note that in a case where a plan-view shape of the first portion 191 of the base part surface is a circular shape, an elliptical shape, a rectangular shape, or a regular polygonal shape, the center of the first portion 191 of the base part surface refers to a center of each of these shapes, and in a case where the plan-view shape of the first portion 191 of the base part surface is an odd shape other than the above shapes, the center of the first portion 191 of the base part surface refers to an area centroid point of the first portion 191 of the base part surface. In addition, the center of the second portion 192 of the base part surface refers to a center of the cross-sectional shape of the second portion 192 of the base part surface when the second portion 192 is cut along a virtual plane parallel to the virtual $\eta\xi$ plane. In addition, in FIGS. 42A and 43, a part of the first portion 191 of the base part surface is indicated by a dotted line, the first surface 21a of the first compound semiconductor layer 21 is indicated by a dot-and-dash line, and the boundary between the first portion 191 and the second portion 192 of the base part surface is indicated by a chain double dashed-line.

The light emitting element array of Example 10 includes a plurality of light emitting elements arranged. Each of the light emitting elements is configured by the light emitting element 10F of Example 10 described above.

When a virtual plane that is parallel to the thickness direction of the stacked structure 20, that passes through the center of the first portion 191 of the base part surface and that is orthogonal to the virtual ηξ plane is referred to as a virtual ζξ plane, and when the first portion 191 and the second portion 192 of the base part surface are cut along the virtual ζξ plane, the center part (apex part) of the first portion 191 of the base part surface may have an upwardly convex shape, and have a downwardly convex shape at and near a boundary region 191' with the second portion 192, and the second portion 192 of the base part surface may have a downwardly convex shape at and near a boundary region 192' with the first portion 191, with respect to the second surface 21b of the first compound semiconductor layer 21. More specifically, the base part surface 190 at and near the boundary region between the first portion 191 and the second portion 192 has a saddle shape. In addition, in a region sufficiently away from the boundary region 192', the second portion 192 of the base part surface has a downwardly convex shape in the example illustrated in FIG. 42A, or has a flat shape, when the second portion 192 of the base part surface is cut along the virtual ζξ plane.

Figure 47:
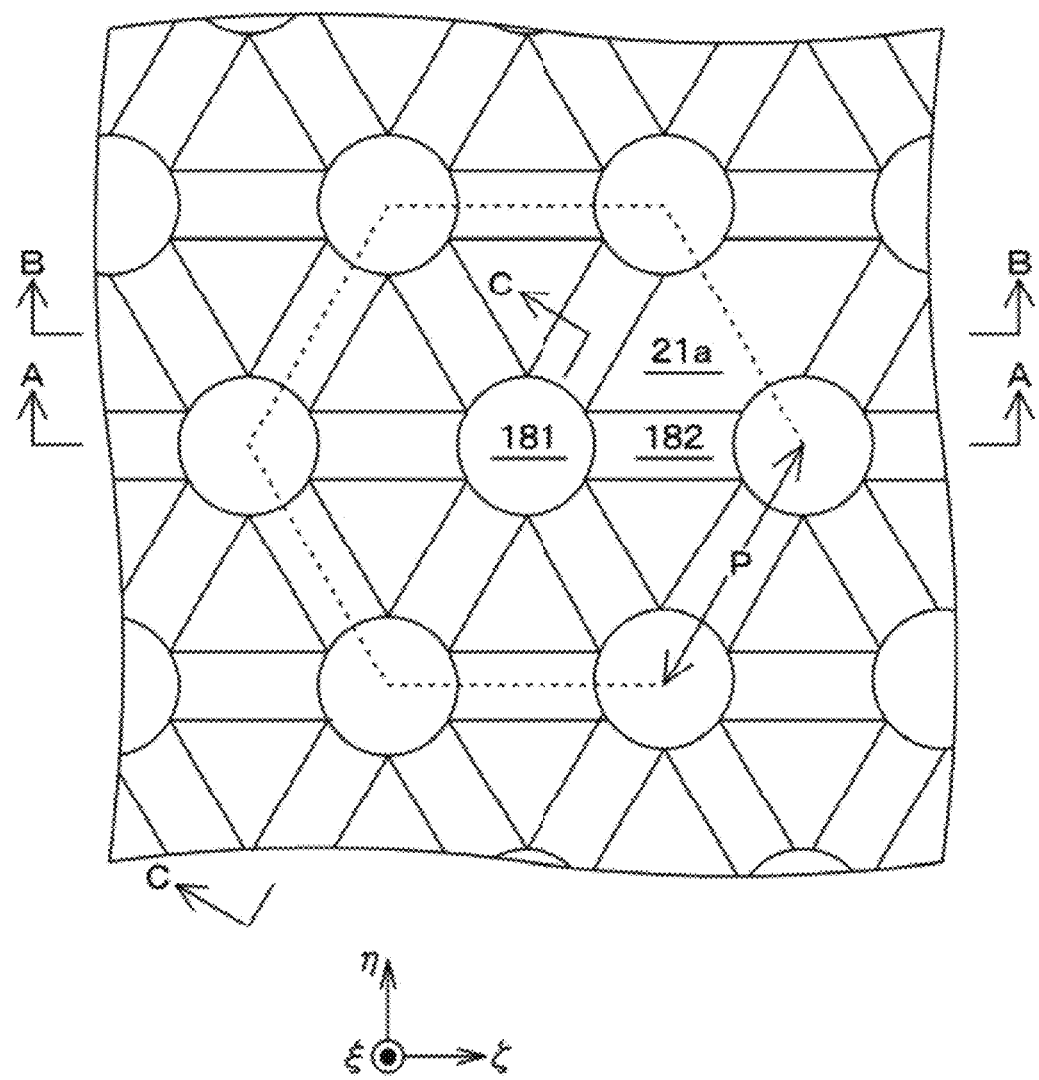
FIG. 47 is a layout state of the first sacrificial layer and the second sacrificial layer for forming the first portion and the second portion of the base part surface in the light emitting element array of Example 10.
Figure 48A:
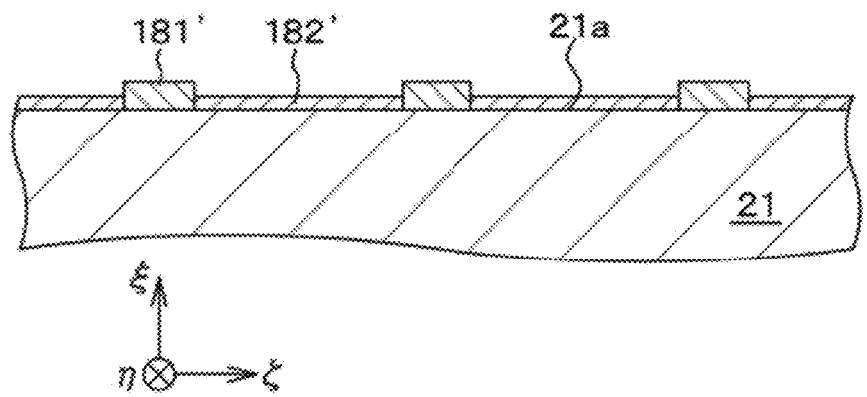
FIGS. 48A, 48B, and 48C are schematic partial end views of the first compound semiconductor layer and the like along the arrows A-A, B-B, and C-C in FIG. 44, for describing a method of manufacturing the light emitting element array of Example 10.
Figure 48B:
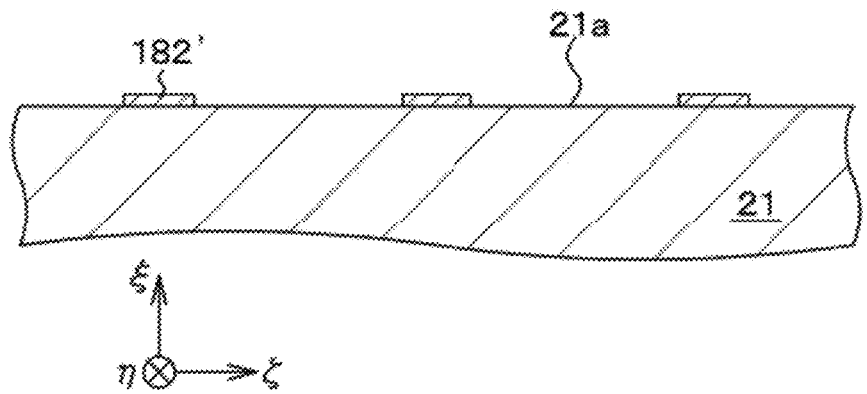
Figure 48C:
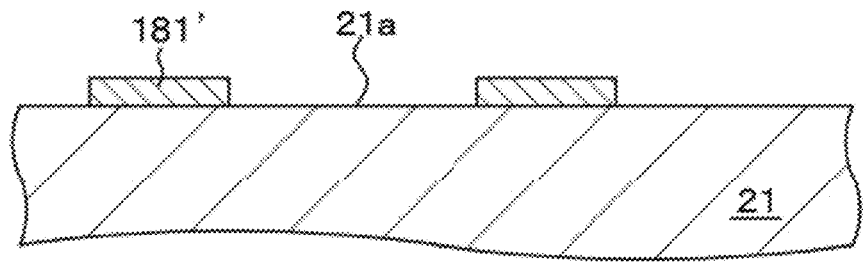

Further, the center part of the first portion 191 of the base part surface is located on a vertex of a square lattice (see FIG. 41), or located on a vertex of an equilateral triangular lattice (see the center part of the first portion 191 of the base part surface obtained from FIG. 47). The first light reflection layer 41 is formed on at least a part of the first portion 191 of the base part surface, and is not formed on the second portion 192 of the base part surface. However, this is not limitative.

The first surface 21a of the first compound semiconductor layer 21 is exposed in a region where neither of the first portion 191 of the base part surface and the second portion 192 of the base part surface is formed. A boundary region 191A between the first portion 191 of the base part surface and the exposed surface of the first surface 21a of the first compound semiconductor layer 21 is, in a keyword-like expression, continuously indifferentiable, or is also expressed as being not smooth. Similarly, a boundary region 192A between the second portion 192 of the base part surface and the exposed surface of the first surface 21a of the first compound semiconductor layer 21 is, in a keyword-like expression, continuously indifferentiable, or is also expressed as being not smooth.

In the light emitting element 10F of Example 10, a figure drawn by a region having a convex shape at the center part (apex part) of the first portion 191 of the base part surface when the first portion 191 of the base part surface is cut along the virtual ζξ plane is differentiable, and more specifically, may be a part of a circle, a part of a parabola, a part of a sine curve, a part of an ellipse, a part of a catenary curve, or any of combinations of these curves. Portions of these curves may be replaced with a line segment. In addition, a figure drawn by the boundary region 191' with the second portion 192 and a figure drawn by the boundary region 192' with the first portion 191 are each also differentiable, and more specifically, may each also be a part of a circle, a part of a parabola, a part of a sine curve, a part of an ellipse, a part of a catenary curve, or any of combinations of these curves. Portions of these curves may be replaced with a line segment. Furthermore, the boundary between the first portion 191 and the second portion 192 of the base part surface is also differentiable.

In the light emitting element 10F of Example 10, the plan-view shape of the first portion 191 of the base part surface is circular, but this is not limitative; and the plan-view shape of the second portion 192 of the base part surface is generally rectangular (band-shaped), but this is not limitative.

Figure 46A:
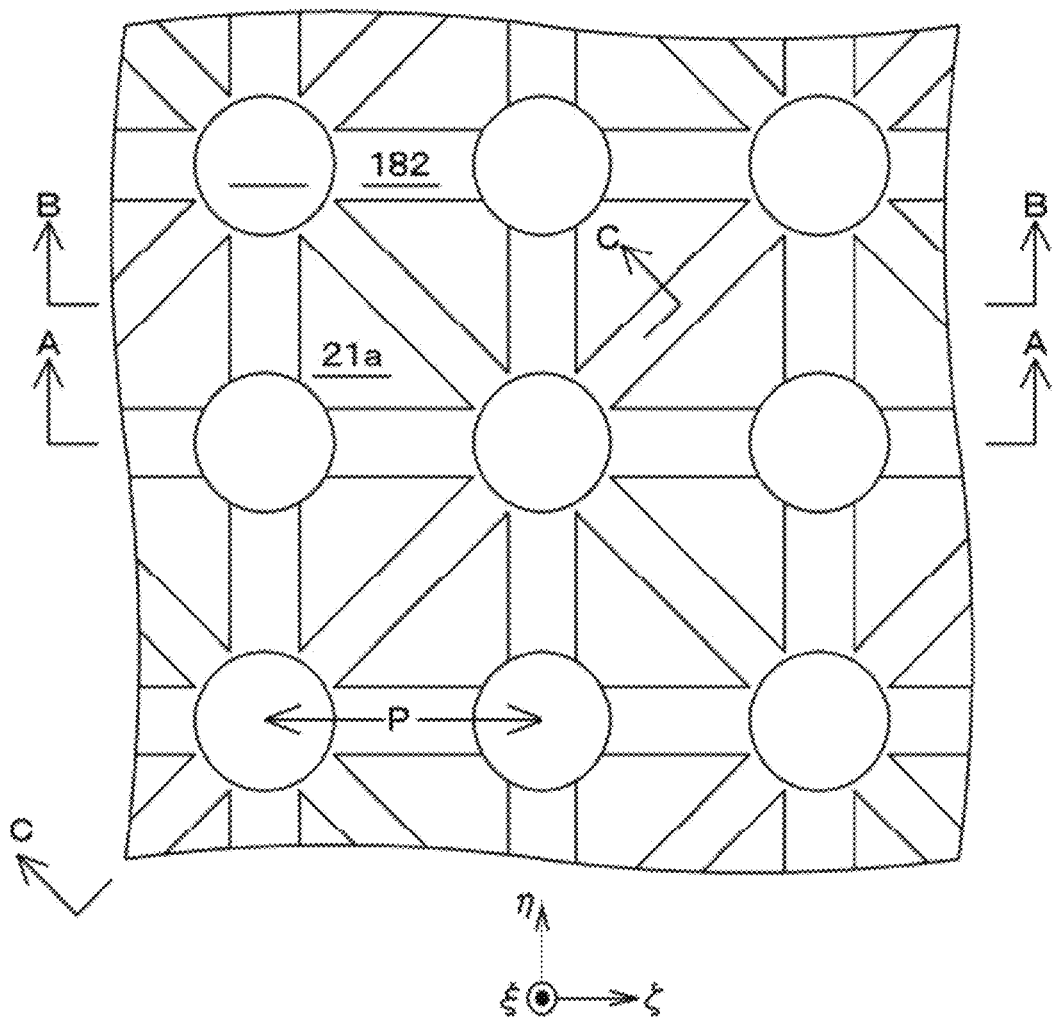
FIGS. 46A and 46B are a layout state of the first sacrificial layer and the second sacrificial layer for forming the first portion and the second portion of the base part surface in the light emitting element array of Example 10, and a schematic partial end view of the first compound semiconductor layer and the like along the arrow B-B in FIG. 46A, respectively.

In the light emitting element array, it is desirable that a formation pitch P (see FIGS. 41, 46A, and 47) of the light emitting elements be greater than or equal to 3 μm and smaller than or equal to 50 μm, preferably greater than or equal to 5 μm and smaller than or equal to 30 μm, and more preferably greater than or equal to 8 μm and smaller than or equal to 25 μm. Further, the radius of curvature $R_1$ (see FIG. 43) of the center part (apex part) of the first portion 191 of the base part surface is desirably greater than or equal to $1 \times 10^{-5}$ m. The resonator length $L_{OR}$ preferably satisfies $1 \times 10^{-5}$ m ≤ $L_{OR}$. In the light emitting element array of Example 10 illustrated in FIG. 41, or in the light emitting element array of Example 10 to be finally obtained from the layout state of the first sacrificial layer 181 and the second sacrificial layer 182 illustrated in FIGS. 46A and 47, parameters of the light emitting element 10F are as described in Table 37 below. Note that as illustrated in FIG. 43, the diameter of the first light reflection layer 41 is denoted by $D_1$, the diameter of the first portion 191 is denoted by $D_1'$, the height of the first portion 191 is denoted by $H_1$, and the radius of curvature of the center of the second portion 192 in a center portion of the second portion 192 (a portion dividing the second portion 192 equally) of the base part surface connecting two light emitting elements is denoted by $R_2$. Here, the height $H_1$ of the first portion 191 is expressed by:

$$H_1 = L_1 - L_2$$

where $L_1$ is a distance from the second surface 21b of the first compound semiconductor layer 21 to the center part of the first portion 191 of the base part surface 190, and $L_2$ is a distance from the second surface 21b of the first compound semiconductor layer 21 to the center part of the second portion 192 of the base part surface 190. Further, specifications of the light emitting element 10F of Example 10 illustrated in FIGS. 41, 46A, and 47 are described in Tables 38, 39, and 40 below. Note that "Number of light emitting elements" refers to the number of the light emitting elements included in a single light emitting element array.

The stacked structure 20 may include at least one kind of material selected from the group consisting of a GaN-based compound semiconductor, an InP-based compound semiconductor, and a GaAs-based compound semiconductor. In Example 10, specifically, the stacked structure 20 similar to that of Example 1 includes a GaN-based compound semiconductor. That is, the first compound semiconductor layer 21 includes an n-GaN layer, the active layer 23 includes a five-tiered quantum well structure in which $In_{0.4}Ga_{0.96}N$ layers (barrier layers) and $In_{0.16}Ga_{0.84}N$ layers (well layers) are stacked, and the second compound semiconductor layer 22 includes a p-GaN layer. The configurations or structures of the first electrode 31, the first pad electrode, the second electrode 32, the second pad electrode 33, and the insulating layer (current confinement layer) 34 may be similar to those described in Example 1.

As illustrated in FIGS. 35 and 38, the second electrode 32 is common among the light emitting elements 10F included in the light emitting element array. The second electrode is coupled to an external circuit or the like through the first pad electrode (not illustrated). The first electrode 31 is also common among the light emitting elements 10F included in the light emitting element array, and is coupled to an external circuit or the like through the first pad electrode (not illustrated). In the light emitting element 10F illustrated in FIGS. 35 and 38, light may be emitted to the outside through the first light reflection layer 41, or light may be emitted to the outside through the second light reflection layer 42.

Alternatively, as illustrated in FIGS. 36 and 39, the second electrode 32 is individually formed in the light emitting elements 10F included in the light emitting element array, and is coupled to an external circuit or the like through the second pad electrode 33. The first electrode 31 is common among the light emitting elements 10F included in the light emitting element array, and is coupled to an external circuit or the like through the first pad electrode (not illustrated). In the light emitting element 10F illustrated in FIGS. 36 and 39, light may be emitted to the outside through the first light reflection layer 41, or light may be emitted to the outside through the second light reflection layer 42.

Alternatively, as illustrated in FIGS. 37 and 40, the second electrode 32 is individually formed in the light emitting elements 10F included in the light emitting element array. On the second pad electrode 33 formed on the second electrode 32, a bump 35 is formed and an electrical coupling to an external circuit or the like is established through the bump 35. The first electrode 31 is common among the light emitting elements 10F included in the light emitting element array, and is coupled to an external circuit or the like through the first pad electrode (not illustrated). The bump 35 is provided in a portion on the second surface side of the second compound semiconductor layer 22 opposed to the center part of the first portion 191 of the base part surface, and covers the second light reflection layer 42. Examples of the bump 35 include a gold (Au) bump, a solder bump, and an indium (In) bump. A method of providing the bump 35 may be a well-known method. In the light emitting element 10F illustrated in FIGS. 37 and 40, light is emitted to the outside through the first light reflection layer 41. Note that the bump 35 may be provided in the light emitting element 10F illustrated in FIG. 35. Examples of the shape of the bump 35 include a cylindrical shape, an annular shape, and a hemispherical shape.

TABLE 38

See FIG. 41

| | |
|---|---|
| Second light reflection layer 42 | $SiO_2/Ta_2O_5$ (11.5 pairs) |
| Second electrode 32 | ITO (thickness: 22 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 445 nm |
| Number of light emitting elements | 100 × 100 |

TABLE 39

See FIG. 46A

| | |
|---|---|
| Second light reflection layer 42 | $SiO_2/SiN$ (9 pairs) |
| Second electrode 32 | ITO (thickness: 22 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 488 nm |
| Number of light emitting elements | 1000 × 1000 |

TABLE 40

See FIG. 47

| | |
|---|---|
| Second light reflection layer 42 | $SiO_2/SiN$ (9 pairs) |
| Second electrode 32 | ITO (thickness: 22 nm) |
| Second compound semiconductor layer 22 | p-GaN |
| Active layer 23 | InGaN (multi-quantum well structure) |
| First compound semiconductor layer 21 | n-GaN |
| First light reflection layer 41 | $SiO_2/Ta_2O_5$ (14 pairs) |
| Resonator length $L_{OR}$ | 25 μm |
| Oscillation wavelength (light emission wavelength) $\lambda_0$ | 488 nm |
| Number of light emitting elements | 1000 × 1000 |

TABLE 37

| | | Figure Number to be referred to | | |
|---|---|---|---|---|
| | | 41 | 46A | 47 |
| Formation pitch P | μm | 20 | 20 | 20 |
| Radius of curvature $R_1$ | μm | 46 | 57 | 76 |
| Diameter $D_1$ | μm | 18 | 18 | 18 |
| Diameter $D_{1'}$ | μm | 19 | 19 | 19 |
| Height $H_1$ | μm | 2.3 | 0.8 | 0.6 |
| Radius of curvature $R_2$ | mm | 0.1 | 0.7 | 0.9 |

The method of manufacturing the light emitting element array of Example 10 will be described below with reference to: FIGS. 44, 45, 46A, and 47 illustrating the layout state of a first sacrificial layer and a second sacrificial layer for forming the first portion and the second portion of the base part surface; FIGS. 48A, 48B, 48C, 49A, 49B, and 49C, which are schematic partial end views of the first compound semiconductor layer and the like along arrows A-A, B-B, and C-C in FIG. 44; and FIG. 46B, which is a schematic partial end view of the first compound semiconductor layer and the like along the arrow B-B in FIG. 46A.

Figure 49A:
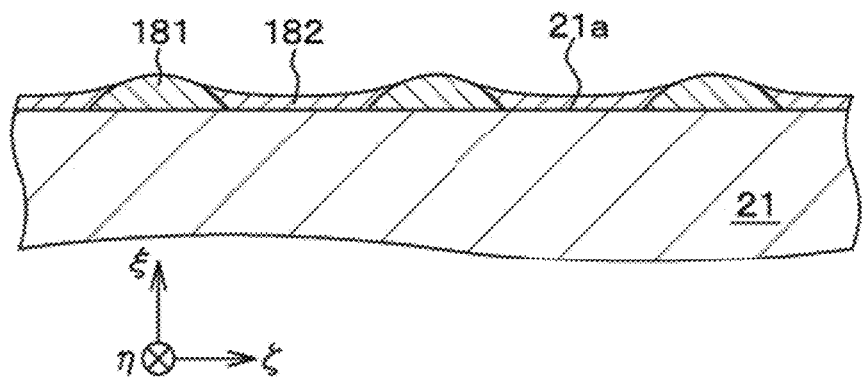
FIGS. 49A, 49B, and 49C, subsequent to FIGS. 48A, 48B, and 48C, are schematic partial end views of the first compound semiconductor layer and the like along the arrows A-A, B-B, and C-C in FIG. 44, for describing the method of manufacturing the light emitting element array of Example 10.
Figure 49B:
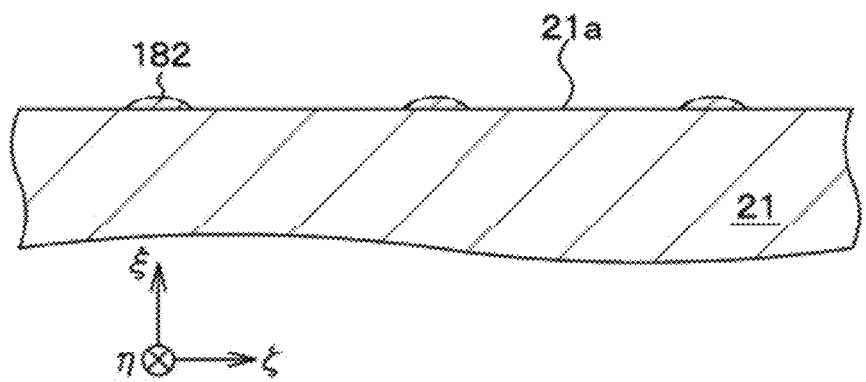
Figure 49C:
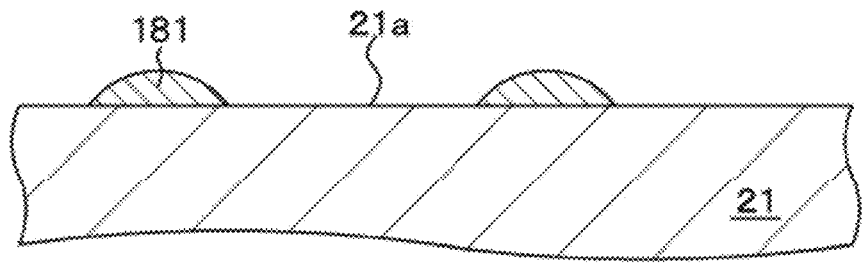

It is to be noted that the schematic partial end view of the first compound semiconductor layer and the like along the arrow A-A in FIG. 46A is generally similar to FIGS. 48A and 49A, and the schematic partial end view of the first compound semiconductor layer and the like along the arrow C-C in FIG. 46A is generally similar to FIGS. 48C and 49C. Further, the schematic partial end view of the first compound semiconductor layer and the like along the arrow A-A in FIG. 47 is generally similar to FIGS. 48A and 49A, the schematic partial end view of the first compound semiconductor layer and the like along the arrow B-B in FIG. 47 is generally similar to FIGS. 48B and 49B, and the schematic partial end view of the first compound semiconductor layer and the like along the arrow C-C in FIG. 47 is generally similar to FIGS. 48C and 49C.

First, after forming the stacked structure 20, the second light reflection layer 42 is formed on the second surface side of the second compound semiconductor layer 22 in a manner similar to [Step-100] to [Step-140] of Example 1.

Thereafter, a first sacrificial layer 181 is formed on the first portion 191 of the base part surface on which the first light reflection layer 41 is to be formed, and a second sacrificial layer 182 extending from the first sacrificial layer 181 and thinner than the first sacrificial layer 181 is formed on the second portion 192 of the base part surface (see FIGS. 44, 45, 46A, and 47).

Figure 44:
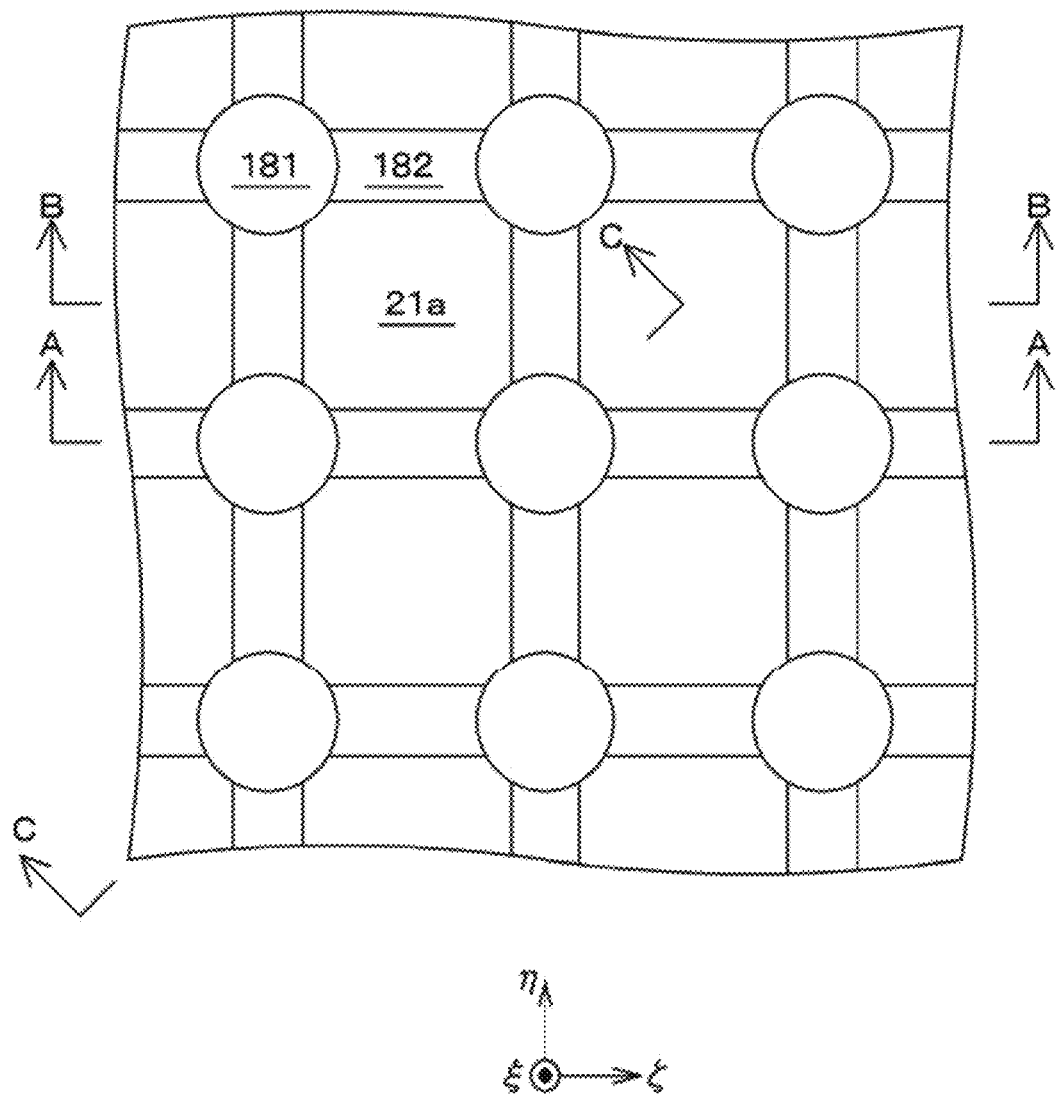
FIG. 44 is a layout state of a first sacrificial layer and a second sacrificial layer for forming the first portion and the second portion of the base part surface in the light emitting element array of Example 10.
Figure 45:
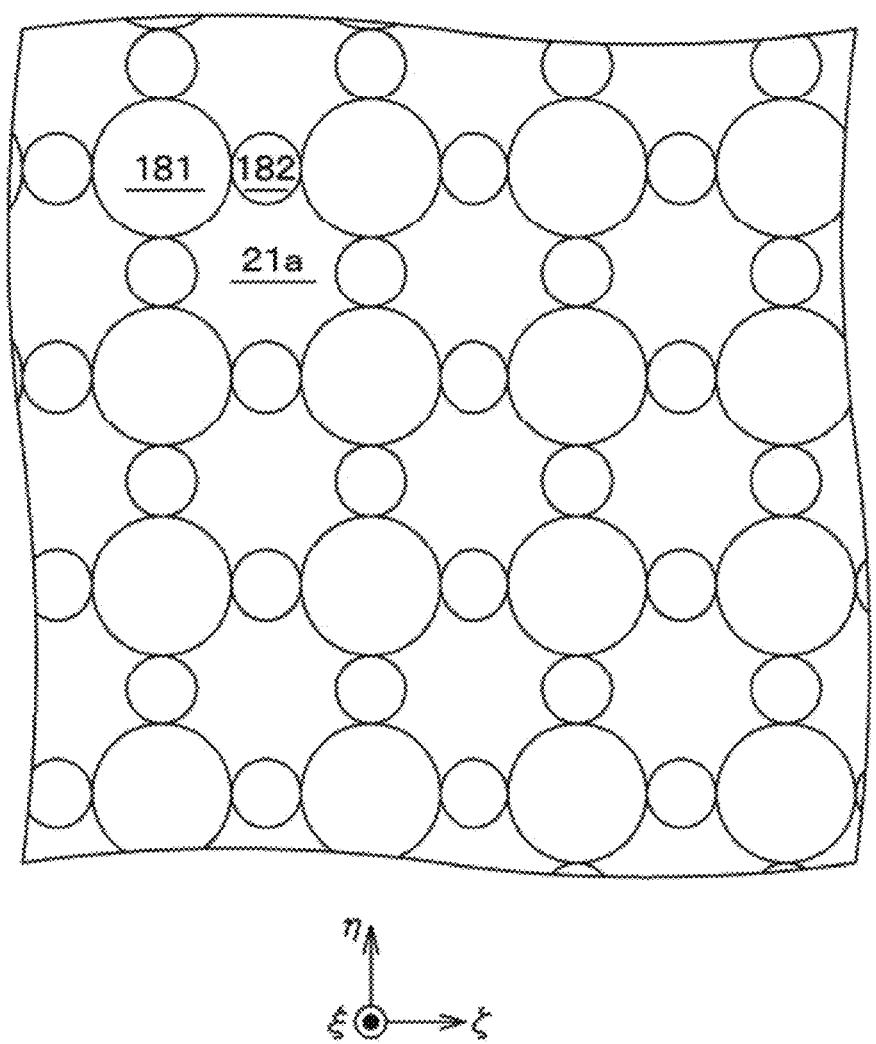
FIG. 45 is a layout state of the first sacrificial layer and the second sacrificial layer for forming the first portion and the second portion of the base part surface in the light emitting element array of Example 10.
Figure 46B:
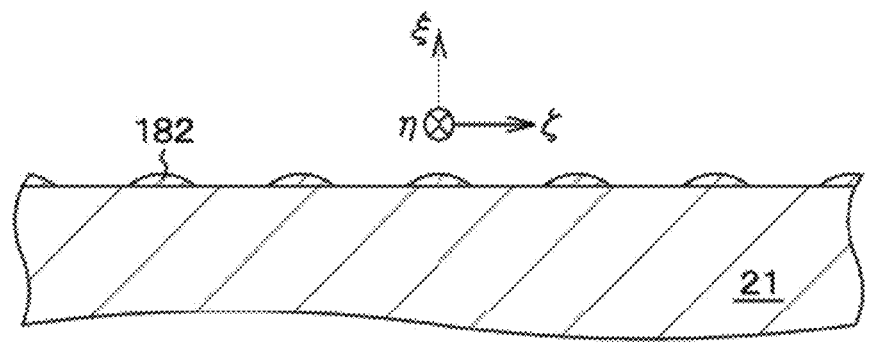

The first sacrificial layer 181' is circular in plan-view shape; however, this is not limitative. The second sacrificial layer 182' has a generally rectangular shape (see FIGS. 44, 46A, and 47) or has a rounded shape (see FIG. 45); however, these are not limitative, and a polygonal shape, an elliptical shape, or the like is also possible. Note that schematic partial end views of the first compound semiconductor layer and the like along arrows A-A, B-B, and C-C in FIG. 44 are illustrated in FIGS. 48A, 48B, 48C, 49A, 49B, and 49C, and a schematic partial end view of the first compound semiconductor layer and the like along the arrow B-B in FIG. 46A is illustrated in FIG. 46B.

Specifically, for example, a sacrificial layer or material layer including a resist material is formed over the entire surface by a spin coating method. Then, the sacrificial layer or material layer is exposed to light through the use of an exposure mask. Assuming that an exposure energy on a region of the sacrificial layer or material layer in which the first sacrificial layer 181' is to be formed is 1.00, it is sufficient that an exposure energy on a region of the sacrificial layer or material layer in which the second sacrificial layer 182' is to be formed is 0.3, for example. Alternatively, assuming that a development time for the region of the sacrificial layer or material layer in which the first sacrificial layer 181' is to be formed is 1.00, it is sufficient that a development time for the region of the sacrificial layer or material layer in which the second sacrificial layer 182' is to be formed is 0.5, for example. Note that the exposure mask only has to be designed to allow such conditions to be obtained. In such a manner, the sacrificial layer or material layer is exposed to light, and subsequently developed. In this way, it is possible to obtain the structure illustrated in FIGS. 48A, 48B, and 48C. Then, the sacrificial layer or material layer is thereafter subjected to a heat treatment at a temperature higher than or equal to the melting point of the resist material (e.g., a heat treatment or reflow process at 160° C.), for example. In this way, it is possible to finally obtain the second sacrificial layer 182 thinner than the first sacrificial layer 181 (see FIGS. 49A, 49B, 49C, and 46B).

Alternatively, a halftone mask or gray tone mask may specifically be used as the exposure mask to expose the sacrificial layer or material layer to light. The halftone mask or gray tone mask only has to be designed to cause the exposure of the region of the sacrificial layer or material layer in which the first sacrificial layer 18' is to be formed and the exposure of the region of the sacrificial layer or material layer in which the second sacrificial layer 182' is to be formed to be different from each other. Then, by exposing the sacrificial layer or material layer to light and subsequently performing development, it is possible to obtain the structure illustrated in FIGS. 48A, 48B, and 48C.

Alternatively, specifically, for example, the second sacrificial layer 182' including a resist material is formed over the entire surface by a spin coating method. Then, a surface of the second sacrificial layer 182' is subjected to an ashing process (plasma irradiation process) to modify the surface of the second sacrificial layer 182', thereby preventing the second sacrificial layer 182' from suffering damage, deformation, or the like when the first sacrificial layer 181' is formed in a next step. Subsequently, a first sacrificial layer or formation layer including a resist material is formed on the second sacrificial layer 182' by a spin-coating method, and the first sacrificial layer or formation layer is patterned by a well-known method, whereby it is possible to obtain the first sacrificial layer 181' and the second sacrificial layer 182' (see FIGS. 48A, 48B, and 48C). Then, the first sacrificial layer 181' and the second sacrificial layer 182' are thereafter subjected to a heat treatment at a temperature higher than or equal to the melting point of the resist material (e.g., a heat treatment or reflow process at 160° C.), for example. In this way, it is possible to finally obtain the second sacrificial layer 182 thinner than the first sacrificial layer 181 (see FIGS. 49A, 49B, 49C, and 46B).

Alternatively, for example, it is also possible to form the first sacrificial layer 181' and the second sacrificial layer 182' by a nanoimprint method, or to form the first sacrificial layer 181' and the second sacrificial layer 182' by using a 3D printer.

Note that, even if the second sacrificial layer 182' is unintentionally formed on the exposed first surface 21a of the first compound semiconductor layer 21 illustrated in FIGS. 44, 45, 46A, and 47 by the heat treatment, such a second sacrificial layer 182' is absorbed, in a way, into the second sacrificial layer 182 by its surface tension, and the first surface 21a of the first compound semiconductor layer 21 is thereby exposed.

In a case of using a resist material to configure the first sacrificial layer 181 and the second sacrificial layer 182, the resist material may be of a negative type or a positive type, and the exposure mask only has to be designed appropriately in accordance with the resist material to be used. Note that the material to configure the first sacrificial layer 181 and the second sacrificial layer 182 is not limited to a resist material, and it is sufficient that a material appropriate in relation to the first compound semiconductor layer 21, such as an oxide material (e.g., $SiO_2$, SiN, $TiO_2$, or the like), a semiconductor material (e.g., Si, GaN, InP, GaAs, or the like), or a metal material (e.g., Ni, Au, Pt, Sn, Ga, In, Al, or the like) is selected. In addition, by using a resist material having an appropriate viscosity as the resist material to configure the first sacrificial layer 181 and the second sacrificial layer 182, and by appropriately setting and selecting the thickness of the first sacrificial layer 181, the thickness of the second sacrificial layer 182, the diameter of the first sacrificial layer 181, etc., it is possible to set the value of the radius of curvature of the base part surface 190 and the concavo-convex shape of the base part surface 90 (e.g., the radii of curvature $R_1$ and $R_2$, the diameter $D_1'$, and the height $H_1$) to a desired value and a desired shape.

Thereafter, by etching back the first sacrificial layer 181 and the second sacrificial layer 182 and further etching back inwardly from the base part surface 190 (i.e., from the first surface 21a of the first compound semiconductor layer 21 into the first compound semiconductor layer 21), it is possible to obtain the first portion 191 and the second portion 192 of the base part surface, with respect to the second surface 21b of the first compound semiconductor layer 21. Specifically, it is possible to obtain the base part surface 190 in which, when cut along a virtual plane parallel to the virtual ηξ plane, the first portion 191 of the base part surface has a cross-sectional shape that is an upwardly convex shape and is differentiable, and the second portion 192 of the base part surface has a cross-sectional shape that is an upwardly convex shape and is differentiable, with respect to the second surface 21a of the first compound semiconductor layer 21, and in which the first portion 191 of the base part surface and the second portion 192 of the base part surface are continuous smoothly. The etching back may be performed by a dry etching method such as an RIE method, or may be performed by a wet etching method using hydrochloric acid, nitric acid, hydrofluoric acid, phosphoric acid, a mixture thereof, or the like. An etching rate of the first sacrificial layer 181 and the second sacrificial layer 182 and an etching rate of the first compound semiconductor layer 21 are preferably equal. That is, a value (etching selectivity) of (etching rate of the first compound semiconductor layer 21)/(etching rate of the first sacrificial layer 181 and the second sacrificial layer 182) during etching back is preferably 1.

Next, the first light reflection layer 41 is formed on the first portion 191 of the base part surface. Specifically, steps similar to [Step-180] to [Step-190] of Example 1 are performed. In this way, the light emitting element array of Example 10 is completed.

In the light emitting element of Example 10 also, the boundary region between the first portion and the second portion of the base part surface has a concavo-convex shape and is differentiable, and the base part surface is smooth. Accordingly, even in a case where an external force is applied to the light emitting element due to some cause, the problem that would occur with the existing technology, such as the problem of stress concentrating on the rising portion of the convex part, is avoidable with reliability, and therefore no damage can occur to the first compound semiconductor layer and the like. The light emitting element array, in particular, is coupled or bonded to an external circuit or the like by using the bump, and it is necessary to apply a high load (e.g., about 50 MPa) to the light emitting element array at the time of bonding. With the light emitting element array of Example 10, no damage can occur to the light emitting element array even if such a high load is applied.

Figure 68A:
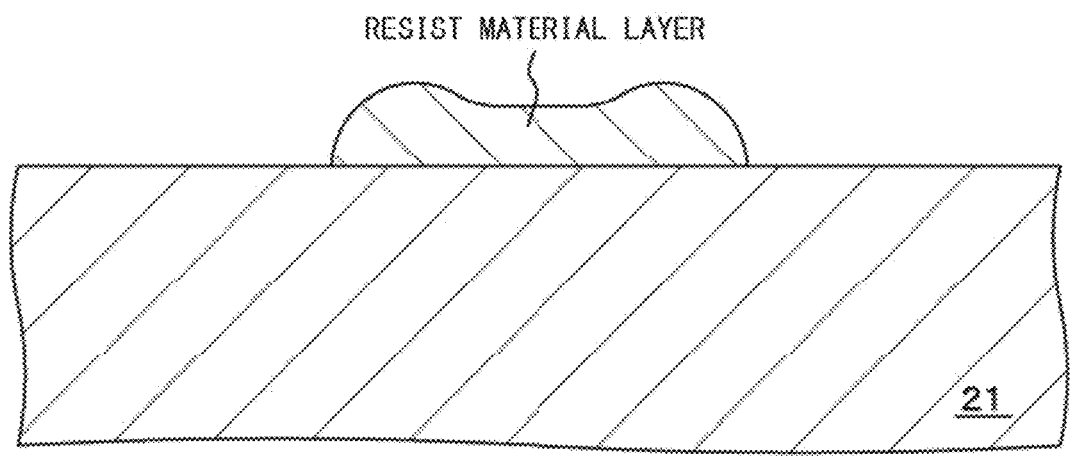
FIGS. 68A and 68B are diagrams illustrating schematic cross-sectional shapes of a resist material layer (corresponding to a sacrificial layer) to be obtained with an existing technique.
Figure 68B:
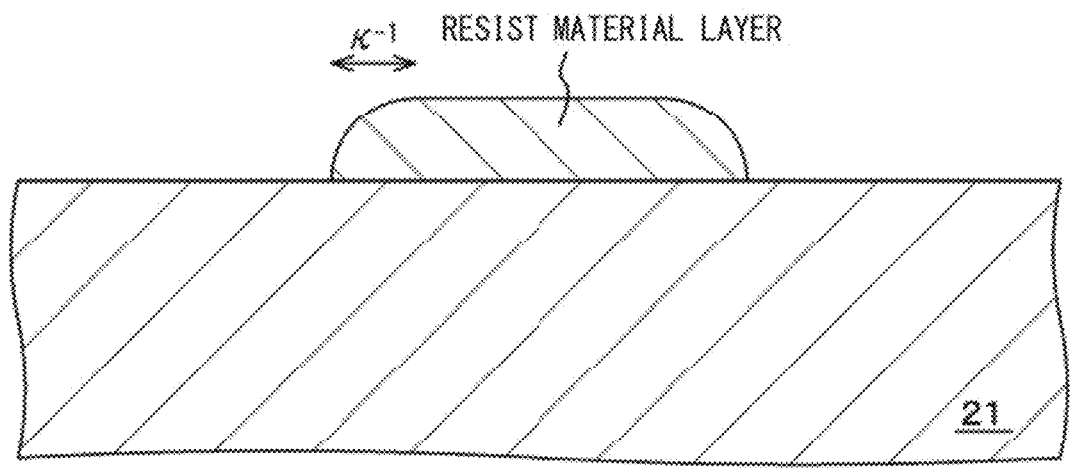

Incidentally, due to an influence or the like of wettability, surface tension, or gravity between the first compound semiconductor layer 21 and the resist material layer configuring the sacrificial layer, or depending on specifications required of the first light reflection layer 41, the resist material layer can fail to have a desired cross-sectional shape, resulting in that it becomes difficult to obtain the first light reflection layer having a desired cross-sectional shape. Specifically, for example, as illustrated in schematic partial cross-sectional diagrams in FIGS. 68A and 68B, an edge part of the resist material layer can rise to bring a center part into a recessed state (concave shape), or a top surface of the resist material layer can become flat. For example, in the state illustrated in FIG. 68B, the value of $\kappa^{-1}$ (capillary length) is determinable by $$\kappa^{-1} = \{(\gamma/(\Delta\rho \cdot g)\}^{1/2}.$$

Here, γ is a surface tension (N/m) of an interface, Δρ is a density difference (kg/m³) between a density of the resist material and a density of the first compound semiconductor layer, and g is the gravitational acceleration (m/s²). Then, the top surface of the resist material layer becomes flat in a case where $$r_{Resist} > \kappa^{-1}$$

where $r_{Resist}$ is a radius of the resist material layer.

Further, in a case where the resist material layer is thinned, there is a limit to an obtainable contact angle due to the influence of the surface tension between the surface of the first compound semiconductor layer 21 and the resist material layer. It is thus difficult to obtain a small contact angle, resulting in the resist material layer becoming a flat or concave shape. In order to manufacture a light emitting element of a high output, it is necessary to achieve a higher optical output of a single light emitting element and to achieve a higher-density array. To achieve a higher optical output of a single light emitting element, expanding an optical output region is sufficient. To achieve this, increasing the radius of curvature of the first light reflection layer is sufficient. Further, to achieve a higher-density array, arranging a large number of light emitting elements densely in a small region is sufficient. That is, it is necessary that the light emitting elements having the first light reflection layer with a small diameter value and a large radius of curvature be arranged at narrow formation pitches. With an existing technique, however, there is a theoretical limit to the fabrication of the first light reflection layer, as described above. For example, in a case of attempting to form a resist material layer having a shape with a diameter of 20 μm and a radius of curvature of 400 μm through the use of the existing technique, the height of the resist material layer becomes 124 nm from the following equation, assuming that the volumes of the resist material layer before and after heat treatment are equal. Then, in this case, the contact angle between the first compound semiconductor layer 21 and the resist material layer is 0.7 degrees.

$$(\pi/4) \times D^2 \times t = \{(\pi \cdot s)/24\}(3D^2 + 4s^2)$$

Here,

D: diameter of the resist material layer before heat treatment (=diameter of the resist material layer after heat treatment);

t: thickness of the resist material layer before heat treatment; and s: thickness of the resist material layer after heat treatment.

However, it is extremely difficult to obtain a material for obtaining a resist material layer having such a shape. This is theoretically achievable only with limited systems under a condition with perfect wettability or in the vicinity of a boundary between the condition with perfect wettability and a condition with imperfect wettability. In the latter case, in particular, in order to satisfy a contact angle of 0.7 degrees from Young-Dupre law, it is necessary for a relationship between tensions in three directions including a relationship between the first compound semiconductor layer, the resist material layer, and air to satisfy an extremely limited condition that:

$$(\gamma_{so} - \gamma_{sl})/\gamma = \cos(\theta_E) = 0.9999.$$

Here, $\gamma_{so}$: surface tension of the first compound semiconductor layer (force to expand the resist material layer);

γ: surface tension between the first compound semiconductor layer and the resist material layer (force to hinder the interface between the first compound semiconductor layer and the resist material layer from expanding and thereby increasing in energy);

γ: surface tension of the resist material layer; and $θ_E$: contact angle.

Accordingly, in many material systems, the shape after a reflow fails to become spherical, and thus becomes flat or concave. For example, a contact angle between the resist material layer used and the first compound semiconductor layer is typically about 15 degrees, which largely deviates from the desired contact angle of 0.7 degrees.

There is a technique of increasing the radius of curvature of the first compound semiconductor layer after etching back by setting the value (etching selectivity) of (etching rate of the first compound semiconductor layer)/(etching rate of the resist material layer) during etching back to less than 1. However, this technique has a disadvantage that the resist material layer serving as an etching mask is etched faster to increase an exposure time for the etchant of the first compound semiconductor layer during etching back, resulting in an increase in the value of the surface roughness of the first compound semiconductor layer after the etching back. An increase in the value of the surface roughness results in an increase in optical loss, causing the light emitting element to suffer an increase in threshold current, a reduction in light emission efficiency, a reduction in output, etc., and is thus undesirable. Table 41 below presents the results of determining etching selectivities and the values of the surface roughness Rq of the first compound semiconductor layer after etching back. By making the value of the surface roughness Rq of the first compound semiconductor layer smaller, it is possible to suppress scattering loss of the light emitting element and to improve the performance of the resonator, and consequently, it is possible to achieve reduction in threshold of the light emitting element, reduction in power consumption, improvement in optical output, improvement in light emission efficiency, and enhancement in reliability of the light emitting element.

TABLE 41

| Etching selectivity | Rq |
|---|---|
| 0.56 | 1.7 nm |
| 0.91 | 0.47 nm |

Further, in a case of arranging the light emitting elements in the light emitting element array, it is not possible for a footprint diameter of the first sacrificial layer to exceed the formation pitch of the light emitting elements. Therefore, in order to achieve a narrower formation pitch of the light emitting element array, it is necessary to reduce the footprint diameter, as described in Example 1. In Example 10, the specifications of the first portion 191 and the second portion 192 of the base part surface are as described in Table 37.

A relationship between the diameter $D_1'$ and the radius of curvature $R_1$ in the first portion 91 of the base part surface was examined. The results thereof are presented in Table 42 below. The results indicate that it is possible to obtain a larger radius of curvature $R_1$ than that in a light emitting element obtained by existing techniques (i.e., the cross-sectional shape of the first portion 191 of the base part surface on which the first light reflection layer is to be formed has an upwardly convex shape, no second portion 192 is provided in the base part surface, and regions of the base part surface other than the first portion 191 are flat).

TABLE 42

| | Diameter $D_1'$ | Radius of curvature $R_1$ |
|---|---|---|
| Example 10 | 19 μm | 46 μm |
| Existing technique (1) | 16 μm | 19 μm |
| Existing technique (2) | 20 μm | 20 μm |

In Example 10, or Example 11 described below, a projection (first portion 191) is formed in the base part surface with use of the first sacrificial layer and the second sacrificial layer, and therefore it is possible to form the projection (first portion 191 of the base part surface) to have a small diameter $D_1'$, a low height $H_1$, and a large radius of curvature $R_1$. As a result, it is possible to obtain a first light reflection layer having a small diameter, a low height, and a large radius of curvature without distortion, and it is possible to obtain a light emitting element array in which the light emitting elements are arranged at high density. In addition, it is possible to achieve various effects described in Example 1.

Note that the configuration or structure of the light emitting element or the light emitting element array of any of Examples 1, 4, and 5 to 8, and the modification examples of these Examples is applicable to a light emitting element or a light emitting element array of Example 11 to be described below.

Example 11

A method of manufacturing a light emitting element array of Example 11 is a modification of the method of manufacturing a light emitting element array of Example 10.

In the method of manufacturing a light emitting element array of Example 11, performing of formation of a first sacrificial layer 281' on the first portion 191 of the base part surface on which the first light reflection layer 41 is to be formed and, in conjunction therewith, formation of a second sacrificial layer 282' extending from the first sacrificial layer 281' and thinner than the first sacrificial layer 281' on the second portion 192 of the base part surface includes after forming the sacrificial layer or material layer on the base part surface, exposing the sacrificial layer or material layer to light by using an exposure apparatus, with a formation pitch of the first portion 191 of the base part surface on which the first light reflection layer 41 is to be formed being set to be smaller than a pattern formation limit width of the exposure apparatus being used.

Specific examples of the exposure apparatus include an aligner. Further, by exposing the sacrificial layer or material layer to light by using the exposure apparatus, with the formation pitch of the first portion 191 of the base part surface on which the first light reflection layer 41 is to be formed being set to be smaller than the pattern formation limit width of the exposure apparatus being used, it is possible to finally obtain the second sacrificial layer 182 thinner than the first sacrificial layer 181, as a result of the difference between the exposure condition for a region of the sacrificial layer or material layer in which the first sacrificial layer 281' is to be formed and the exposure condition for a region of the sacrificial layer or material layer in which the second sacrificial layer 282' is to be formed. The pattern formation limit width (a gap between the first portion 191 of the base part surface on which the first light reflection layer 41 is to be formed and the adjacent first portion 191 of the base part surface) may be 1 µm or 2 µm, for example.

Figure 50A:
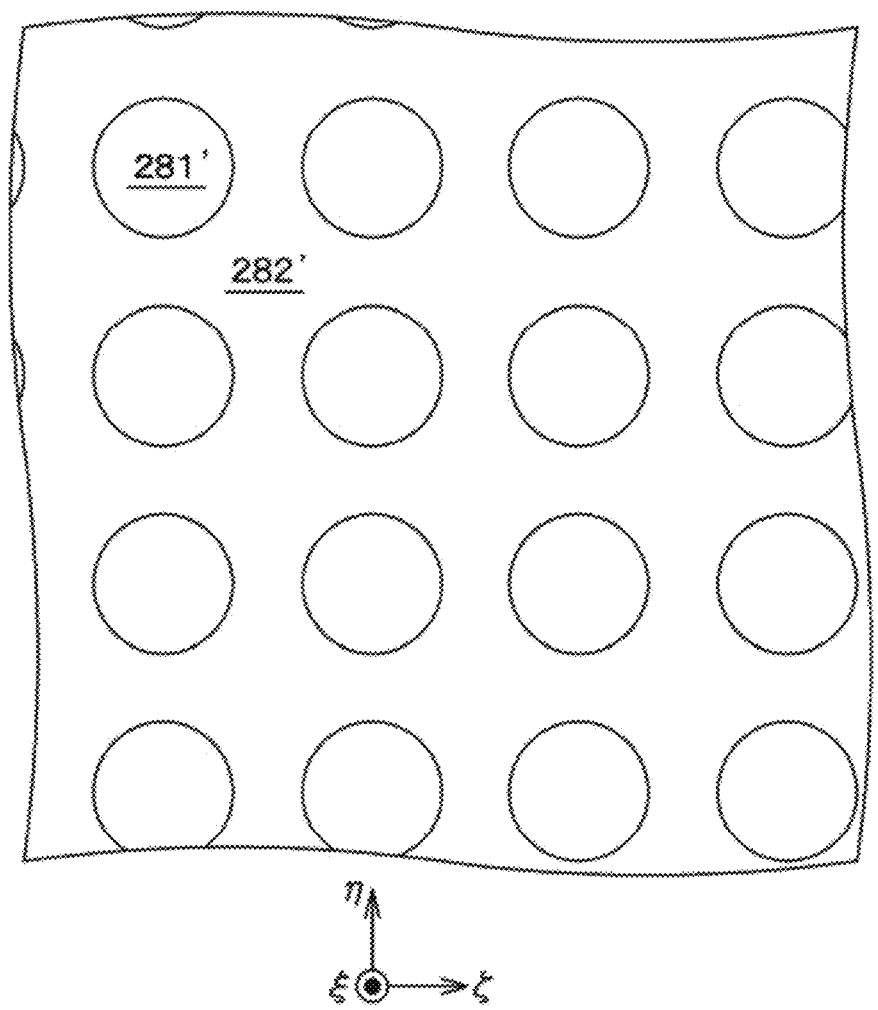
Figure 50B:
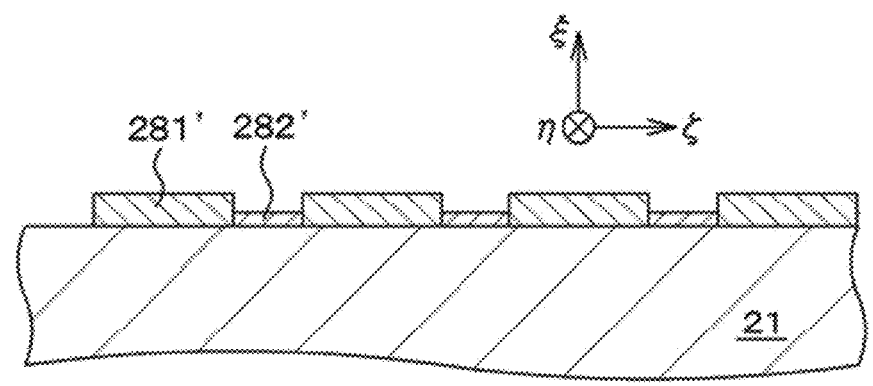

A layout state of the first sacrificial layer 281' and the second sacrificial layer 282' obtained by this step is illustrated in FIG. 50A. That is, the region between the first sacrificial layers 281' is different from that in Example 10, and is in a state illustrated in FIGS. 50A and 50B. Subsequently, by subjecting the first sacrificial layer 281' and the second sacrificial layer 282' to a heat treatment, the first sacrificial layer 281' and the second sacrificial layer 282' are made into a convex shape. Schematic partial end views of the first sacrificial layer 281' and the second sacrificial layer 282' at this time are substantially similar to the schematic partial end views illustrated in FIGS. 49A, 49B, and 49C in Example 10. It is thus possible to obtain the first sacrificial layer 181 and the second sacrificial layer 182. By the heat treatment, the second sacrificial layer 282' (see FIG. 50B) formed on the exposed first surface 21a of the first compound semiconductor layer 21 is absorbed, in a way, into the second sacrificial layer 182 by its surface tension, and the layout state of the first sacrificial layer and the second sacrificial layer similar to that illustrated in FIG. 44 is obtained to allow the first surface 21a of the first compound semiconductor layer 21 to be exposed.

Except for the above points, it is possible for the method of manufacturing a light emitting element array of Example 11 to be similar to the method of manufacturing a light emitting element array of Example 10, and therefore detailed descriptions thereof will be omitted. The light emitting element and the light emitting element array obtained by the method of manufacturing a light emitting element array of Example 11 have configurations or structures similar to those of the light emitting element and the light emitting element array obtained by the method of manufacturing a light emitting element array of Example 10, and therefore detailed descriptions thereof will be omitted.

Example 12

Example 12 is a modification of Examples 1 to 11, and relates to the light emitting element of the fifth configuration. As described above, the current confinement region (the current injection region 61A and the current non-injection region 61B) is defined by the insulating layer 34 having the opening 34A. That is, the current injection region 61A is defined by the opening 34A. That is, in the light emitting element of Example 12, the second compound semiconductor layer 22 is provided with the current injection region 61A and the current non-injection region 61B surrounding the current injection region 61A, and the shortest distance $D_{CI}$ from the area centroid point of the current injection region 61A to the boundary between the current injection region 61A and the current non-injection region 61B satisfies the foregoing expressions (1-1) and (1-2).

In the light emitting element of Example 12, the radius $r_1$ of the first portion 91 of the base part surface 90 satisfies $$\omega_0 \leq r_1 \leq 20 \cdot \omega_0.$$

Further, $D_{CI} \geq \omega_0$ is satisfied. Furthermore, $R_1 \leq 1 \times 10^{-3}$ m is satisfied. Specifically, for example, $D_{CI}$=4 µm;
$\omega_0$=1.5 µm;
$L_{OR}$=50 µm;
$R_1$=60 µm; and
$\lambda_0$=525 nm.

Further, the diameter of the opening 34A may be 8 µm, for example. As the GaN substrate, a substrate having, as a principal plane, a plane tilted from the c-plane by about 75 degrees in an m-axis direction is used. That is, the GaN substrate has a {20-21} plane, which is a semipolar plane, as the principal plane. Note that such a GaN substrate is also usable in other Examples.

Misalignment between a center axis of the first portion 91 of the base part surface 90 (Z-axis) and the current injection region 61A in an XY plane direction causes degradation of a characteristic of the light emitting element. While a lithography technique is often used in both of patterning for forming the first portion 91 and patterning for forming the opening 34A, the positional relationship between the two in this case often becomes out of alignment in the XY plane, depending on the performance of the exposure apparatus. The opening 34A (current injection region 61A) is positioned by performing alignment from side of the second compound semiconductor layer 22, in particular. Meanwhile, the first portion 91 is positioned by performing alignment from side of the compound semiconductor substrate 11. In view of this, in the light emitting element of Example 12, the opening 34A (current injection region 61) is formed to be larger than a region into which light is converged by the first portion 91. This implements a structure in which an oscillation characteristic is not affected even if misalignment occurs between the center axis of the first portion 91 (Z-axis) and the current injection region 61A in the XY plane direction.

That is, in a case where the region onto which light reflected by the first light reflection layer is to be condensed is not included in the current injection region corresponding to a region in which the active layer has a gain due to current injection, induced emission of light from carriers can be hindered, possibly leading to hindrance of laser oscillation. However, satisfying the foregoing expressions (1-1) and (1-2) makes it possible to ensure that the region onto which the light reflected by the first light reflection layer is to be condensed is included in the current injection region, thus making it possible to accomplish laser oscillation with reliability.

Example 13

Figure 51:
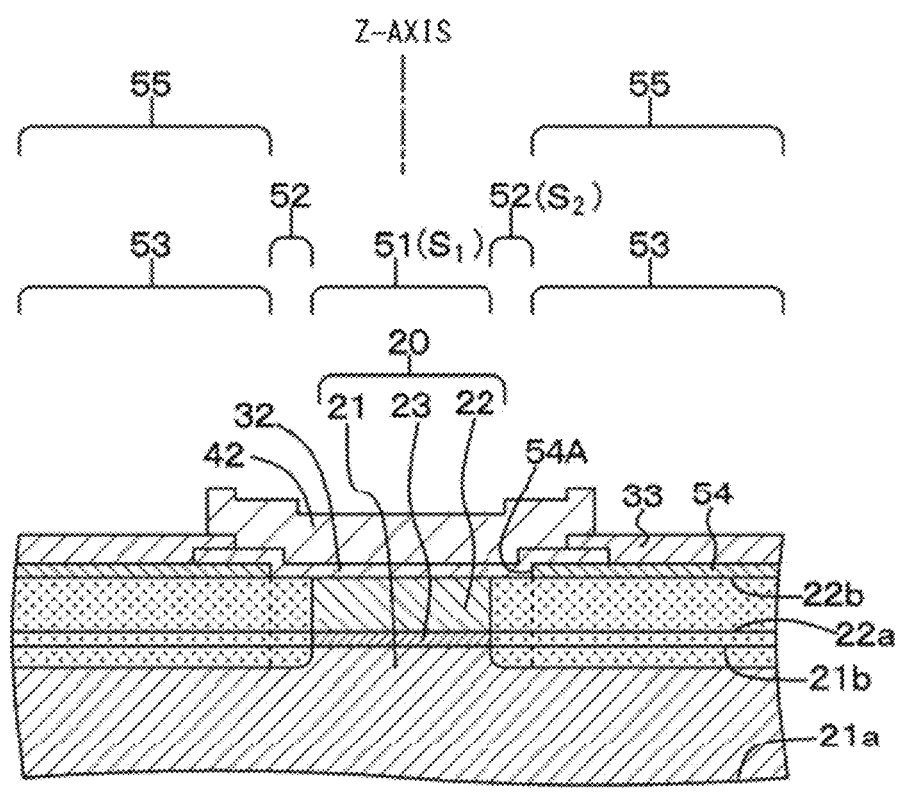
FIG. 51 is a schematic partial end view of a light emitting element of Example 13.

Example 13 is a modification of Examples 1 to 12, and relates to the light emitting element of the sixth configuration, specifically, the light emitting element of the (6-A)th configuration. A schematic partial end view of a light emitting element of Example 13 is illustrated in FIG. 51.

Incidentally, in order to control a flow path of a current (current injection region) flowing between the first electrode and the second electrode, the current non-injection region is formed to surround the current injection region. In a GaAs-based surface emitting laser element (a surface emitting laser element including a GaAs-based compound semiconductor), it is possible to form the current non-injection region surrounding the current injection region by oxidizing the active layer from the outside along the XY plane. The oxidized region of the active layer (current non-injection region) decreases in refractive index as compared with the non-oxidized region (current injection region). As a result, an optical path length (represented by the product of a refractive index and a physical distance) of the resonator is shorter in the current non-injection region than in the current injection region. Then, this generates a kind of "lens effect", producing an action to confine laser light into a center part of the surface emitting laser element. In general, light tends to spread due to a diffraction effect; therefore, laser light reciprocating in the resonator is gradually dissipated to the outside of the resonator (diffraction loss), producing an adverse effect such as an increase in threshold current. However, the lens effect compensates for the diffraction loss, thus making it possible to suppress an increase in threshold current or the like.

However, in the light emitting element including a GaN-based compound semiconductor, it is difficult, because of a characteristic of the material, to oxidize the active layer from the outside (in a lateral direction) along the XY plane. Thus, as has been described in Examples 1 to 12, the insulating layer 34 including $SiO_2$ and having an opening is formed on the second compound semiconductor layer 22, then the second electrode 32 including a transparent electrically-conductive material is formed to extend from the second compound semiconductor layer 22 exposed at a bottom part of the opening 34A to a position on the insulating layer 34, and then the second light reflection layer 42 including a stacked structure of insulating materials is formed on the second electrode 32. With the insulating layer 34 thus formed, the current non-injection region 61B is formed. Then, the part of the second compound semiconductor layer 22 located in the opening 34A provided in the insulating layer 34 becomes the current injection region 61A.

In the case where the insulating layer 34 is formed on the second compound semiconductor layer 22, the resonator length in the region where the insulating layer 34 is formed (current non-injection region 61B) is longer, by an optical thickness of the insulating layer 34, than the resonator length in the region where the insulating layer 34 is not formed (current injection region 61A). This generates an action by which the laser light reciprocating in the resonator formed by the two light reflection layers 41 and 42 of the surface emitting laser element (light emitting element) is dispersed and cipated to the outside of the resonator. Such an action is referred to as a "reverse lens effect" for the sake of convenience. Then, as a result, an oscillation mode loss occurs in the laser light, resulting in a possibility of an increase in threshold current or degradation in slope efficiency. Here, the "oscillation mode loss" is a physical quantity that imparts increase or decrease in light field intensities in the fundamental mode and higher order mode in the laser light oscillated, and different oscillation mode losses are defined for the individual modes. Note that the "light field intensity" is a light field intensity where a distance L from the Z-axis in the XY plane is a function. In general, in the fundamental mode, the light field intensity decreases monotonously as the distance L increases, whereas in the higher order mode, the light field intensity finally decreases while repeating an increase and decrease once or a plural of times as the distance L increases (see a conceptual diagram of (A) of FIG. 53A). Note that in FIGS. 53A, 53B and 53C, a solid line represents a light field intensity distribution in the fundamental mode, while a broken line represents a light field intensity distribution in the higher order mode. In addition, while the first light reflection layer 41 is represented in a flat state in FIGS. 53A, 53B and 53C for the sake of convenience, it actually has the shape of a concave mirror.

The light emitting element of Example 13, or a light emitting element of each of Examples 14 to 17 to be described later includes:

(A) a stacked structure 20 including a GaN-based compound semiconductor, and including a stack of a first compound semiconductor layer 21 having a first surface 21a, and a second surface 21b opposed to the first surface 21a, an active layer (light emitting layer) 23 facing the second surface 21b of the first compound semiconductor layer 21, and a second compound semiconductor layer 22 having a first surface 22a facing the active layer 23 and a second surface 22b opposed to the first surface 22a;

(B) a mode loss action site (mode loss action layer) 54 that is provided on the second surface 22b of the second compound semiconductor layer 22 and configures a mode loss action region 55 acting on increase and decrease in oscillation mode loss;

(C) a second electrode 32 formed to extend from a position on the second surface 22b of the second compound semiconductor layer 22 to a position on the mode loss action site 54;

(D) a second light reflection layer 42 formed on the second electrode 32;

(E) a first light reflection layer 41 provided on a first surface 21a side of the first compound semiconductor layer 21; and (F) a first electrode 31 electrically coupled to the first compound semiconductor layer 21.

In addition, a current injection region 51, a current non-injection inside region 52 surrounding the current injection region 51, a the current non-injection outside region 53 surrounding the current non-injection inside region 52 are formed in the stacked structure 20. An orthogonal projection image of the mode loss action region 55 and an orthogonal projection image of the current non-injection outside region 53 overlap each other. That is, the current non-injection outside region 53 is located below the mode loss action region 55. Note that the orthogonal projection image of the mode loss action region 55 and the orthogonal projection image of the current non-injection outside region 53 do not have to overlap each other in a region sufficiently away from the current injection region 51 into which a current is to be injected. Here, the current non-injection regions 52 and 53 into which no current is to be injected are formed in the stacked structure 20, and in the illustrated example, these regions are formed to extend from the second compound semiconductor layer 22 to a part of the first compound semiconductor layer 21 in the thickness direction. It is to be noted that the current non-injection regions 52 and 53 may be formed in a region on the second electrode side of the second compound semiconductor layer 22, may be formed in the entire second compound semiconductor layer 22, or may be formed in the second compound semiconductor layer 22 and the active layer 23, in the thickness direction.

The mode loss action site (mode loss action layer) 54 includes a dielectric material such as $SiO_2$ and is, in the light emitting element of Example 13 or each of Examples 14 to 17 to be described later, formed between the second electrode 32 and the second compound semiconductor layer 22. The optical thickness of the mode loss action site 54 may be of a value other than an integer multiple of ¼ of the wavelength $\lambda_0$ of light generated in the light emitting element. Alternatively, the optical thickness $t_0$ of the mode loss action site 54 may be an integer multiple of ¼ of the wavelength $\lambda_0$ of the light generated in the light emitting element. That is, the optical thickness $t_0$ of the mode loss action site may be a thickness that neither causes the phase of light generated in the light emitting element to be disturbed, nor causes the standing wave to be broken. However, the optical thickness to does not have to be exactly an integer multiple of ¼, and only has to satisfy:

$$(\lambda_0/4n_0) \times m - (\lambda_0/8n_0) \leq t_0 \leq (\lambda_0/4n_0) \times 2m + (\lambda_0/8n_0).$$

Specifically, the optical thickness $t_0$ of the mode loss action site 54 is preferably from about 25 to about 250 when the value of ¼ of the wavelength of light generated in the light emitting element is assumed to be "100". Then, by employing these configurations, it is possible to change a phase difference (control the phase difference) between laser light passing through the mode loss action site 54 and laser light passing through the current injection region 51. This makes it possible to perform control of the oscillation mode loss with a higher degree of flexibility, and to further increase the degree of flexibility in designing the light emitting element.

In Example 13, the boundary between the current injection region 51 and the current non-injection inside region 52 has a circular shape (diameter: 8 μm), and the boundary between the current non-injection inside region 52 and the current non-injection outside region 53 has a circular shape (diameter: 12 μm). That is, $$0.01 \leq S_1/(S_1+S_2) \leq 0.7$$

is satisfied, where $S_1$ is the area of an orthogonal projection image of the current injection region 51, and $S_2$ is the area of an orthogonal projection image of the current non-injection inside region 52. Specifically, $$S_1/(S_1+S_2) = 8^2/12^2 = 0.44.$$

In the light emitting element of Example 13, or the light emitting element of each of Examples 14, 15, and 17 to be described later, $$OL0 > OL2$$

is satisfied, where OL2 is an optical distance from the active layer 23 to the second surface of the second compound semiconductor layer 22 in the current injection region 51, and OL0 is an optical distance from the active layer 23 to the top surface (the surface facing the second electrode 32) of the mode loss action site 54 in the mode loss action region 55. Specifically, $$OL0/OL2 = 1.5.$$

Then, laser light having a higher order mode generated is scattered and lost by the mode loss action region 55 toward the outside of the resonator structure configured by the first light reflection layer 41 and the second light reflection layer 42 to thereby cause an increase in oscillation mode loss. That is, due to the presence of the mode loss action region 55 that acts on increase and decrease in oscillation mode loss, light field intensities in the fundamental mode and the higher order mode to be generated decrease with increasing distance from the Z-axis in an orthogonal projection image of the mode loss action region 55 (see the conceptual diagram of (B) of FIG. 53B). However, because a decrease in light field intensity in the higher order mode is greater than a decrease in the light field intensity in the fundamental mode. This makes it possible to further stabilize the fundamental mode, makes it possible to achieve a reduction in the threshold current, and makes it possible to increase a relative light field intensity in the fundamental mode. Furthermore, a bottom portion of the light field intensity in the higher order mode is located farther away from the current injection region than in an existing light emitting element (see FIG. 53A), and therefore it is possible to achieve a reduction in the influence of the reverse lens effect. Note that in a case where the mode loss action site 54 including SiO2 is not originally provided at all, mixing of oscillation mode would occur.

The first compound semiconductor layer 21 includes an n-GaN layer, the active layer 23 includes a five-tiered quantum well structure in which $In_{0.4}Ga_{0.96}N$ layers (barrier layers) and $In_{0.16}Ga_{0.84}N$ layers (well layers) are stacked, and the second compound semiconductor layer 22 includes a p-GaN layer. Further, the first electrode 31 includes Ti/Pt/Au, and the second electrode 32 includes a transparent electrically-conductive material, specifically, ITO. The mode loss action site 54 has an opening 54A of a circular shape, and the second compound semiconductor layer 22 is exposed at a bottom part of the opening 54A. On the edge part of the first electrode 31, the first pad electrode (not illustrated) including, for example, Ti/Pt/Au or V/Pt/Au for establishing electrical coupling to an external circuit or the like is formed or coupled. On the edge part of the second electrode 32, the second pad electrode 33 including, for example, Ti/Pd/Au or Ti/Ni/Au for establishing electrical coupling to an external circuit or the like is formed or coupled. The first light reflection layer 41 and the second light reflection layer 42 include a stacked structure of SiN layers and $SiO_2$ layers (the total number of dielectric films stacked: twenty layers).

In the light emitting element of Example 13, the current non-injection inside region 52 and the current non-injection outside region 53 are formed by ion injection into the stacked structure 20. As the ion species, boron is selected, for example; however, the boron ion is not limitative.

An outline of a method of manufacturing a light emitting element of Example 13 will be described below.

[Step-1300]

In manufacturing the light emitting element of Example 13, first, a step similar to [Step-100] of Example 1 is performed.

[Step-1310]

Subsequently, the current non-injection inside region 52 and the current non-injection outside region 53 are formed in the stacked structure 20 by an ion injection method using boron ions.

[Step-1320]

Figure 52A:
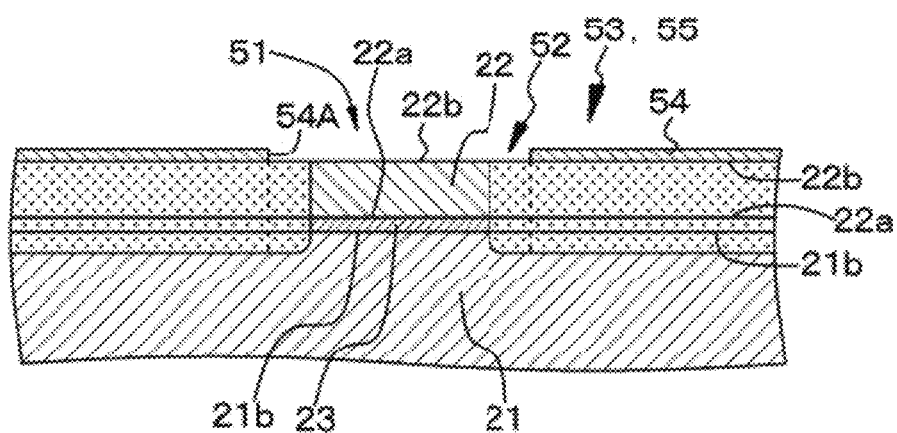
FIGS. 52A and 52B are schematic partial end views of the stacked structure and the like for describing a method of manufacturing the light emitting element of Example 13.

Thereafter, in a step similar to [Step-110] of Example 1, the mode loss action site (mode loss action layer) 54 having the opening 54A and including $SiO_2$ is formed on the second surface 22b of the second compound semiconductor layer 22 by a well-known method (see FIG. 52A).

[Step-1330]

Figure 52B:
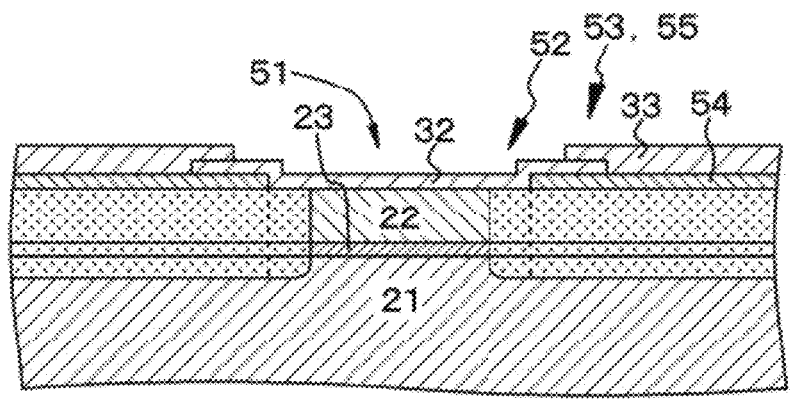

Thereafter, steps similar to [Step-120] and subsequent steps of Example 1 are performed, whereby it is possible to obtain the light emitting element of Example 13. Note that a structure obtained in the course of the step similar to [Step-120] is illustrated in FIG. 52B.

In the light emitting element of Example 13, the current injection region, the current non-injection inside region surrounding the current injection region, and the current non-injection outside region surrounding the current non-injection inside region are formed in the stacked structure, and the orthogonal projection image of the mode loss action region and the orthogonal projection image of the current non-injection outside region overlap each other. That is, the current injection region and the mode loss action region are partitioned (separated) from each other by the current non-injection inside region. Therefore, as a conceptual diagram is illustrated in FIG. 53B, it is possible to bring an increase or decrease (in Example 13, specifically, an increase) in oscillation mode loss into a desired state. Alternatively, appropriately determining the positional relationship between the current injection region and the mode loss action region, the thickness of the mode loss action site configuring the mode loss action region, etc. makes it possible to bring the increase or decrease in oscillation mode loss into a desired state. Then, as a result, it is possible to solve the problem with the existing light emitting element, such as an increase in threshold current or degradation of slope efficiency, for example. By decreasing the oscillation mode loss in the fundamental mode, for example, it is possible to achieve a reduction in threshold current. Moreover, a region to which an oscillation mode loss is to be given and a region into which a current is to be injected and which contributes to light emission are controllable independently, that is, control of the oscillation mode loss and control of a light emission state of the light emitting element are independently performable. This makes it possible to increase the degree of flexibility of control and the degree of flexibility in designing the light emitting element. Specifically, arranging the current injection region, the current non-injection region, and the mode loss action region in the predetermined positional relationship described above makes it possible to control the magnitude relationship of the oscillation mode losses to be given by the mode loss action region to the fundamental mode and the higher order mode, and, making the oscillation mode loss to be given to the higher order mode relatively large with respect to the oscillation mode loss to be given to the fundamental mode makes it possible to further stabilize the fundamental mode. Furthermore, because the light emitting element of Example 13 includes the first portion 91, it is possible to suppress the occurrence of diffraction loss with higher reliability.

Example 14

Figure 54:
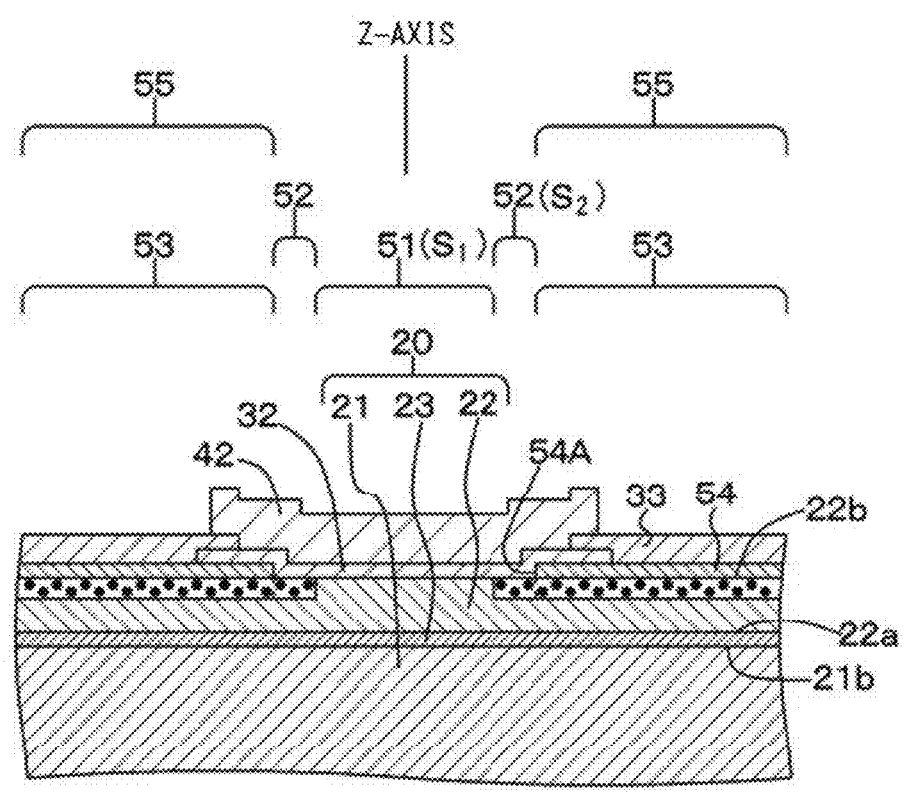
FIG. 54 is a schematic partial end view of a light emitting element of Example 14.

Example 14 is a modification of Example 13 and relates to the light emitting element of the (6-B)th configuration. As a schematic partial cross-sectional view thereof is illustrated in FIG. 54, in a light emitting element of Example 14, the current non-injection inside region 52 and the current non-injection outside region 53 are formed by irradiation of the second surface of the second compound semiconductor layer 22 with plasma, an ashing process on the second surface of the second compound semiconductor layer 22, or a reactive ion etching (RIE) process on the second surface of the second compound semiconductor layer 22. Then, due to the exposure of the current non-injection inside region 52 and the current non-injection outside region 53 to plasma particles (specifically, argon, oxygen, nitrogen, or the like) in this way, electrical conductivity of the second compound semiconductor layer 22 is degraded, and the current non-injection inside region 52 and the current non-injection outside region 53 are thus brought into a high-resistance state. That is, the current non-injection inside region 52 and the current non-injection outside region 53 are formed by exposure of the second surface 22b of the second compound semiconductor layer 22 to the plasma particles. Note that in FIGS. 54, 55, 56A, and 56B, illustration of the first light reflection layer 41 is omitted.

In Example 14 also, the boundary between the current injection region 51 and the current non-injection inside region 52 has a circular shape (diameter: 10 μm), and the boundary between the current non-injection inside region 52 and the current non-injection outside region 53 has a circular shape (diameter: 15 μm). That is, $$0.01 \leq S_1/(S_1+S_2) \leq 0.7$$

is satisfied, where $S_1$ is the area of an orthogonal projection image of the current injection region 51, and $S_2$ is the area of an orthogonal projection image of the current non-injection inside region 52. Specifically, $$S_1/(S_1+S_2) = 10^2/15^2 = 0.44.$$

In Example 14, it is sufficient that the current non-injection inside region 52 and the current non-injection outside region 53 are formed in the stacked structure 20 by irradiation of the second surface of the second compound semiconductor layer 22 with plasma, an ashing process on the second surface of the second compound semiconductor layer 22, or a reactive ion etching process on the second surface of the second compound semiconductor layer 22, instead of [Step-1310] in Example 13.

Except for the above point, it is possible for the configuration or structure of the light emitting element of Example 14 to be similar to that of the light emitting element of Example 13, and therefore detailed descriptions thereof will be omitted.

Also in the light emitting element of Example 14 or a light emitting element of Example 15 to be described later, arranging the current injection region, the current non-injection region, and the mode loss action region in the predetermined positional relationship described above makes it possible to control the magnitude relationship of the oscillation mode losses to be given by the mode loss action region to the fundamental mode and the higher order mode, and, making the oscillation mode loss to be given to the higher order mode relatively large with respect to the oscillation mode loss to be given to the fundamental mode makes it possible to further stabilize the fundamental mode.

Example 15

Figure 55:
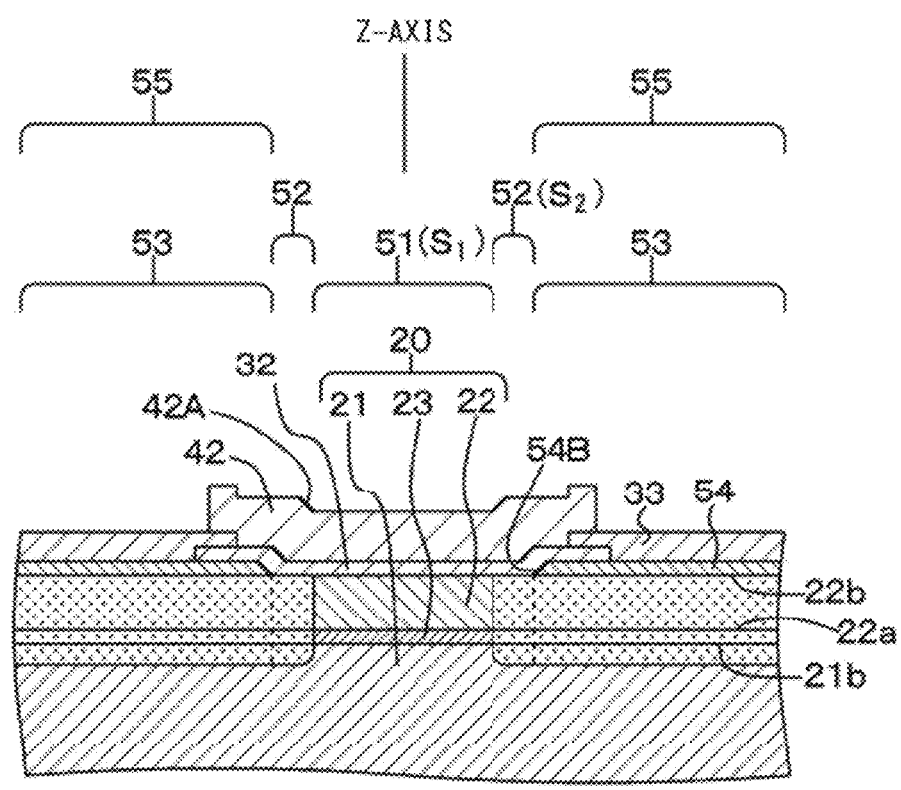
FIG. 55 is a schematic partial end view of a light emitting element of Example 15.

Example 15 is a modification of Examples 13 and 14, and relates to the light emitting element of the (6-C)th configuration. In a light emitting element of Example 15, as a schematic partial cross-sectional view thereof is illustrated in FIG. 55, the second light reflection layer 42 has a region that causes light from the first light reflection layer 41 to be reflected or scattered toward the outside of the resonator structure configured by the first light reflection layer 41 and the second light reflection layer 42 (i.e., toward the mode loss action region 55). Specifically, a portion of the second light reflection layer 42 located above a sidewall (sidewall of an opening 54B) of the mode loss action site (mode loss action layer) 54 has an inclined part 42A of a normal tapered shape, or has a region curved in a convex shape toward the first light reflection layer 41.

In Example 15, the boundary between the current injection region 51 and the current non-injection inside region 52 has a circular shape (diameter: 8 μm), and the boundary between the current non-injection inside region 52 and the current non-injection outside region 53 has a circular shape (diameter: 10 μm to 20 μm).

In Example 15, it is sufficient that the opening 54B having a sidewall of a normal tapered shape is formed when the mode loss action site (mode loss action layer) 54 having the opening 54B and including $SiO_2$ is formed in a step similar to [Step-1320] of Example 13. Specifically, a resist layer is formed on the mode loss action layer formed on the second surface 22b of the second compound semiconductor layer 22, and an opening is provided by a photolithography technique in a portion of the resist layer where the opening 54B is to be formed. A sidewall of this opening is formed into a normal tapered shape by a well-known method. Then, etching back is performed, whereby it is possible to form the opening 54B having a sidewall of a normal tapered shape in the mode loss action site (mode loss action layer) 54. Furthermore, by forming the second electrode 32 and the second light reflection layer 42 on such a mode loss action site (mode loss action layer) 54, it is possible to provide the second light reflection layer 42 with the inclined part 42A of a normal tapered shape.

Except for the above points, it is possible for the configuration or structure of the light emitting element of Example 15 to be similar to that of the light emitting elements of Examples 13 and 14, and therefore detailed descriptions thereof will be omitted.

Example 16

Figure 56A:
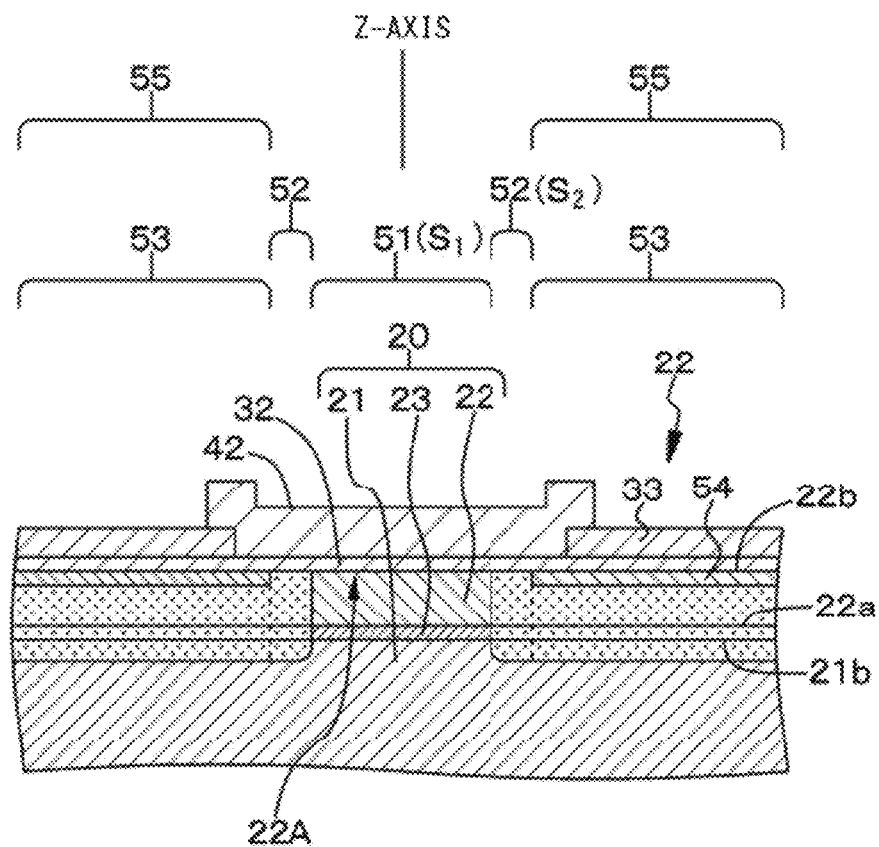
FIGS. 56A and 56B are a schematic partial end view of a light emitting element of Example 16 and a schematic partial cross-sectional view of a cut-out main part of the light emitting element of Example 16.
Figure 56B:
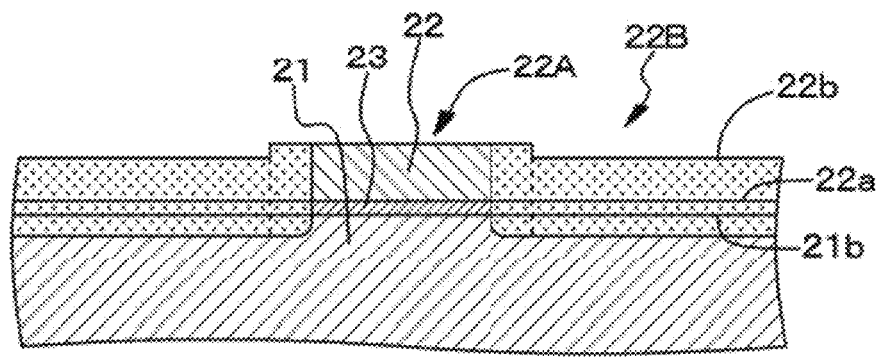

Example 16 is a modification of Examples 13 to 15, and relates to the light emitting element of the (6-D)th configuration. As a schematic partial cross-sectional view of a light emitting element of Example 16 is illustrated in FIG. 56A and a schematic partial cross-sectional view of a cut-out main part thereof is illustrated in FIG. 56B, a convex part 22A is formed on the second surface 22b side of the second compound semiconductor layer 22. Further, as illustrated in FIGS. 56A and 56B, the mode loss action site (mode loss action layer) 54 is formed on a region 22B of the second surface 22b of the second compound semiconductor layer 22 surrounding the convex part 22A. The convex part 22A occupies the current injection region 51, the current injection region 51 and the current non-injection inside region 52. The mode loss action site (mode loss action layer) 54 includes, for example, a dielectric material such as $SiO_2$, similarly to Example 13. The region 22B is provided with the current non-injection outside region 53.

$OL_0 < OL_2$ is satisfied, where $OL_2$ is the optical distance from the active layer 23 to the second surface of the second compound semiconductor layer 22 in the current injection region 51, and $OL_0$ is the optical distance from the active layer 23 to the top surface (the surface facing the second electrode 32) of the mode loss action site 54 in the mode loss action region 55. Specifically, $OL_2/OL_0 = 1.5$.

As a result, a lens effect occurs in the light emitting element.

In the light emitting element of Example 16, laser light having a higher order mode generated is confined in the current injection region 51 and the current non-injection inside region 52 by the mode loss action region 55 to thereby cause a decrease in oscillation mode loss. That is, due to the presence of the mode loss action region 55 that acts on increase and decrease in oscillation mode loss, light field intensities in the fundamental mode and the higher order mode to be generated increase in the orthogonal projection image of the current injection region 51 and the current non-injection inside region 52.

In Example 16, the boundary between the current injection region 51 and the current non-injection inside region 52 has a circular shape (diameter: 8 μm), and the boundary between the current non-injection inside region 52 and the current non-injection outside region 53 has a circular shape (diameter: 30 μm).

In Example 16, it is sufficient that, between [Step-1310] and [Step-1320] in Example 13, the convex part 22A is formed by removing a part of the second compound semiconductor layer 22 from the second surface 22b side.

Except for the above points, it is possible for the configuration or structure of the light emitting element of Example 16 to be similar to that of the light emitting element of Example 13, and therefore detailed descriptions thereof will be omitted. In the light emitting element of Example 16, it is possible not only to suppress oscillation mode losses to be given by the mode loss action region to various modes to thereby put a transverse mode into multi-mode oscillation but also to decrease a threshold of laser oscillation. In addition, as the conceptual diagram is illustrated in FIG. 53C, the presence of the mode loss action region that acts on increase and decrease (specifically, in Example 16, a decrease) in oscillation mode loss makes it possible to increase, in the orthogonal projection image of the current injection region and the current non-injection inside region, light field intensities in the fundamental mode and the higher order mode to be generated.

Example 17

Example 17 is a modification of Examples 13 to 16. A light emitting element of Example 17 or that of Example 18 to be described later includes, more specifically, a surface emitting laser element (light emitting element) (vertical resonator laser, VCSEL) that emits laser light from the top surface of the first compound semiconductor layer 21 through the first light reflection layer 41.

Figure 57:
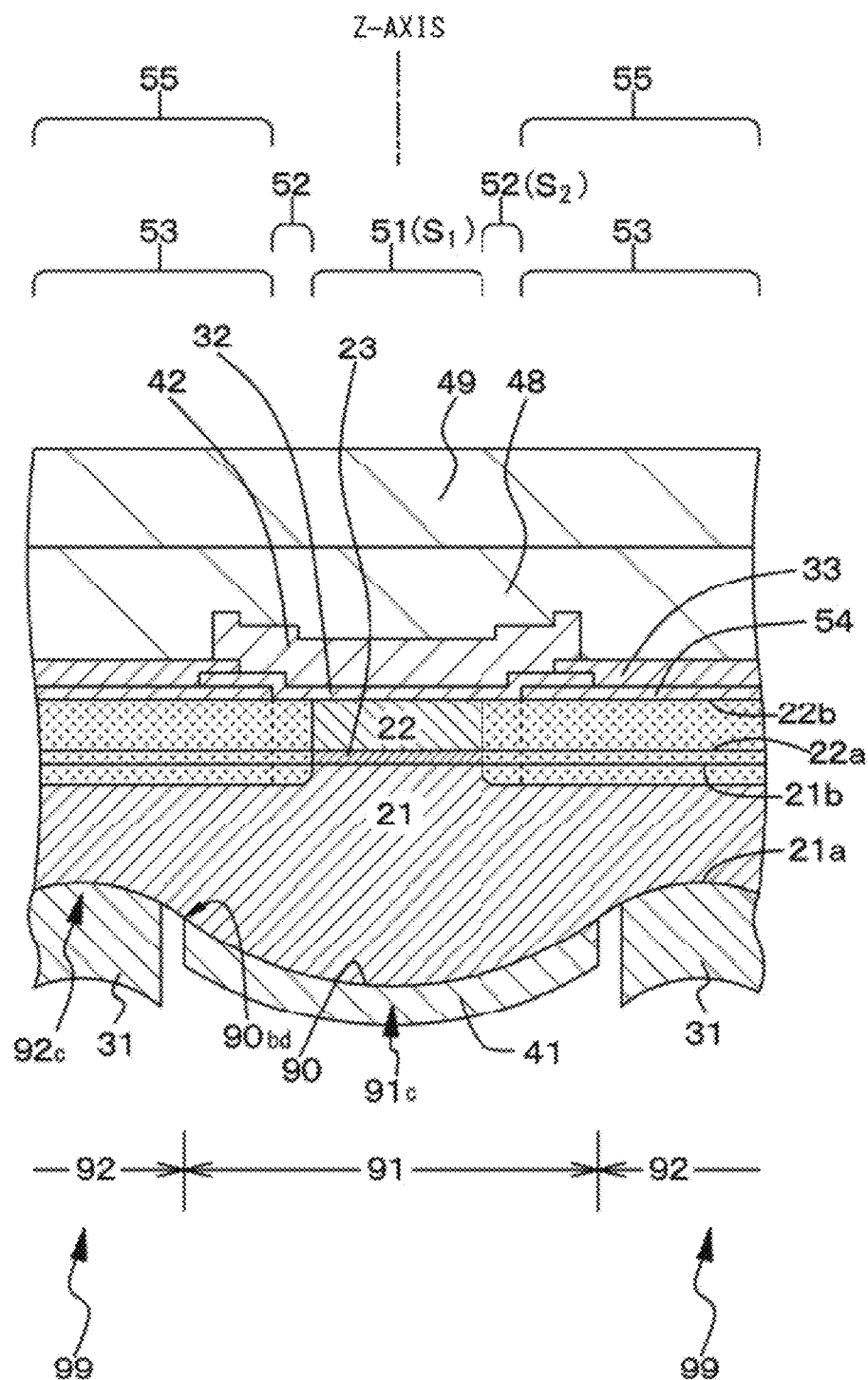
FIG. 57 is a schematic partial end view of a light emitting element of Example 17.

In the light emitting element of Example 17, as a schematic partial cross-sectional view thereof is illustrated in FIG. 57, the second light reflection layer 42 is fixed, by a solder bonding method, onto the support substrate 49 including a silicon semiconductor substrate through the bonding layer 48 that includes a gold (Au) layer or a solder layer including tin (Sn). In manufacturing the light emitting element of Example 17, for example, it is sufficient that steps similar to [Step-1300] to [Step-1330] in Example 13 are performed, except for the removal of the support substrate 49, i.e., without removing the support substrate 49.

In the light emitting element of Example 17 also, arranging the current injection region, the current non-injection region, and the mode loss action region in the predetermined positional relationship described above makes it possible to control the magnitude relationship of the oscillation mode losses to be given by the mode loss action region to the fundamental mode and the higher order mode, and, making the oscillation mode loss to be given to the higher order mode relatively large with respect to the oscillation mode loss to be given to the fundamental mode makes it possible to further stabilize the fundamental mode.

Regarding the foregoing, in the example of the light emitting element illustrated in FIG. 57, an end part of the first electrode 31 is spaced from the first light reflection layer 41. However, such a structure is not limitative, and the end part of the first electrode 31 may be in contact with the first light reflection layer 41, or the end part of the first electrode 31 may be formed to extend to a position on the edge part of the first light reflection layer 41.

Further, for example, after steps similar to [Step-1300] to [Step-1330] of Example 13 are performed, the first surface 21a of the first compound semiconductor layer 21 may be exposed by removing the light-emitting-element manufacturing substrate 11, and subsequently, the first light reflection layer 41 and the first electrode 31 may be formed on the first surface 21a of the first compound semiconductor layer 21.

Example 18

Example 18 is a modification of Examples 1 to 17, and relates to the light emitting element of the seventh configuration, specifically, the light emitting element of the (7-A)th configuration. A light emitting element of Example 18 includes, more specifically, a surface emitting laser element (light emitting element) (vertical resonator laser, VCSEL) that emits laser light from the top surface of the first compound semiconductor layer 21 through the first light reflection layer 41.

Figure 58:
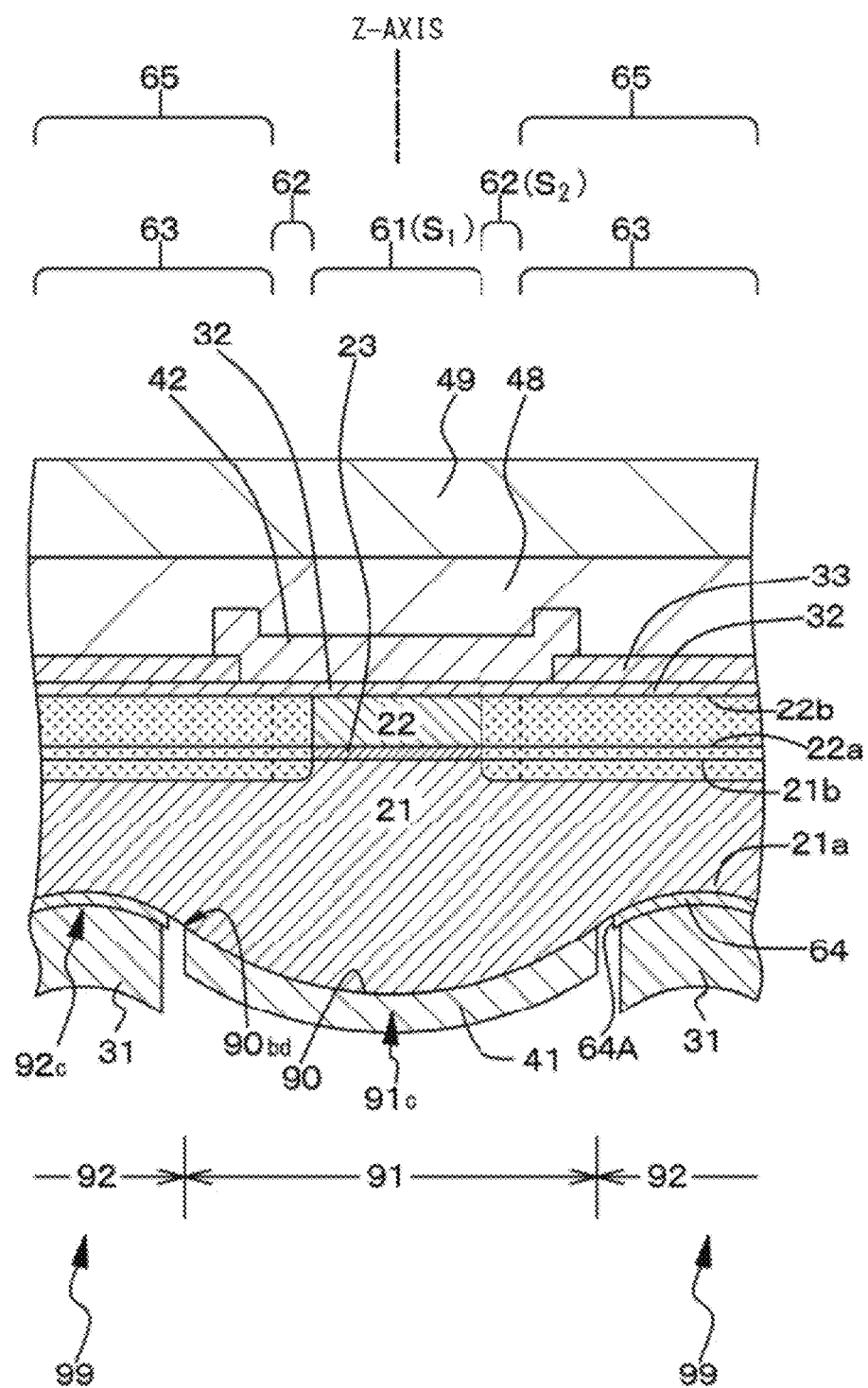
FIG. 58 is a schematic partial end view of the light emitting element of Example 18.

The light emitting element of Example 18, a schematic partial end view of which is illustrated in FIG. 58, includes:
(a) a stacked structure 20 including a stack of
   a first compound semiconductor layer 21 including a GaN-based compound semiconductor, and having a first surface 21a, and a second surface 21b opposed to the first surface 21a,
   an active layer (light emitting layer) 23 including a GaN-based compound semiconductor and in contact with the second surface 21b of the first compound semiconductor layer 21, and
   a second compound semiconductor layer 22 including a GaN-based compound semiconductor, and having a first surface 22a, and a second surface 22b opposed to the first surface 22a, the first surface 22a being in contact with the active layer 23;
(b) a second electrode 32 formed on the second surface 22b of the second compound semiconductor layer 22;
(c) a second light reflection layer 42 formed on the second electrode 32;
(d) a mode loss action site 64 that is provided on the first surface 21a of the first compound semiconductor layer 21 and configures a mode loss action region 65 acting on increase and decrease in oscillation mode loss;
(e) a first light reflection layer 41 formed to extend from a position on the first surface 21a of the first compound semiconductor layer 21 to a position on the mode loss action site 64; and
(f) a first electrode 31 electrically coupled to the first compound semiconductor layer 21. Note that in the light emitting element of Example 18, the first electrode 31 is formed on the first surface 21a of the first compound semiconductor layer 21.

In addition, a current injection region 61, a current non-injection inside region 62 surrounding the current injection region 61, and a current non-injection outside region 63 surrounding the current non-injection inside region 62 are formed in the stacked structure 20. An orthogonal projection image of the mode loss action region 65 and an orthogonal projection image of the current non-injection outside region 63 overlap each other. Here, the current non-injection regions 62 and 63 are formed in the stacked structure 20, and in the illustrated example, these regions are formed to extend from the second compound semiconductor layer 22 to a part of the first compound semiconductor layer 21 in the thickness direction. It is to be noted that the current non-injection regions 62 and 63 may be formed in a region on the second electrode side of the second compound semiconductor layer 22, may be formed in the entire second compound semiconductor layer 22, or may be formed in the second compound semiconductor layer 22 and the active layer 23, in the thickness direction.

The stacked structure 20, the second pad electrode 33, the first light reflection layer 41, and the second light reflection layer 42 may have configurations similar to those in Example 13. The bonding layer 48 and the support substrate 49 may have configurations similar to those in Example 17. An opening 64A of a circular shape is formed in the mode loss action site 64, and the first surface 21a of the first compound semiconductor layer 21 is exposed at a bottom part of the opening 64A.

The mode loss action site (mode loss action layer) 64 includes a dielectric material such as $SiO_2$, and is formed on the first surface 21a of the first compound semiconductor layer 21. The optical thickness $t_0$ of the mode loss action site 64 may be of a value other than an integer multiple of ¼ of the wavelength $\lambda_0$ of light generated in the light emitting element. Alternatively, the optical thickness $t_0$ of the mode loss action site 64 may be an integer multiple of ¼ of the wavelength $\lambda_0$ of the light generated in the light emitting element. That is, the optical thickness to of the mode loss action site 64 may be a thickness that neither causes the phase of light generated in the light emitting element to be disturbed, nor causes the standing wave to be broken. However, the optical thickness to does not have to be exactly an integral multiple of ¼, and only has to satisfy:

$$(\lambda_0/4n_0) \times m - (\lambda_0/8n_0) \le t_0 \le (\lambda_0/4n_0) \times 2m + (\lambda_0/8n_0).$$

Specifically, the optical thickness $t_0$ of the mode loss action site 64 is preferably from about 25 to about 250 when the value of ¼ of the wavelength $\lambda_0$ of the light generated in the light emitting element is assumed to be "100". Further, by employing these configurations, it is possible to change the phase difference (control the phase difference) between laser light passing through the mode loss action site 64 and laser light passing through the current injection region 61. This makes it possible to perform control of the oscillation mode loss with a higher degree of flexibility, and to further increase the degree of flexibility in designing the light emitting element.

In Example 18, the boundary between the current injection region 61 and the current non-injection inside region 62 has a circular shape (diameter: 8 μm), and the boundary between the current non-injection inside region 62 and the current non-injection outside region 63 has a circular shape (diameter: 15 μm). That is, $$0.01 \le S_1'/(S_1'+S_2') \le 0.7$$

is satisfied, where $S_1'$ is an area of an orthogonal projection image of the current injection region 61, and $S_2'$ is an area of an orthogonal projection image of the current non-injection inside region 62. Specifically, $$S_1'/(S_1'+S_2') = 8^2/15^2 = 0.28.$$

In the light emitting element of Example 18, $$OL0' > OL1'$$

is satisfied, where OL1' is an optical distance from the active layer 23 to the first surface of the first compound semiconductor layer 21 in the current injection region 61, and OL0' is an optical distance from the active layer 23 to a top surface (the surface opposed to the first electrode 31) of the mode loss action site 64 in the mode loss action region 65. Specifically, $$OL0'/OL1' = 1.01.$$

Then, laser light having a higher order mode generated is scattered and lost by the mode loss action region 65 toward the outside of the resonator structure configured by the first light reflection layer 41 and the second light reflection layer 42 to thereby cause an increase in oscillation mode loss. That is, due to the presence of the mode loss action region 65 that acts on increase and decrease in oscillation mode loss, light field intensities in the fundamental mode and the higher order mode to be generated decrease with increasing distance from the Z-axis in the orthogonal projection image of the mode loss action region 65 (see the conceptual diagram of FIG. 53B). However, a decrease in light field intensity in the higher order mode is greater than a decrease in the light field intensity in the fundamental mode. This makes it possible to further stabilize the fundamental mode, makes it possible to achieve a reduction in the threshold current, and makes it possible to increase a relative light field intensity in the fundamental mode.

In the light emitting element of Example 18, the current non-injection inside region 62 and the current non-injection outside region 63 are formed by ion injection into the stacked structure 20, similarly to Example 13. As the ion species, boron is selected, for example; however, the boron ion is not limitative.

A method of manufacturing a light emitting element of Example 18 will be described below.

[Step-1800]

First, a step similar to [Step-1300] of Example 13 is performed, whereby it is possible to obtain the stacked structure 20. Subsequently, a step similar to [Step-1310] of Example 13 is performed, whereby it is possible to form the current non-injection inside region 62 and the current non-injection outside region 63 in the stacked structure 20.

[Step-1810]

Subsequently, the second electrode 32 is formed on the second surface 22b of the second compound semiconductor layer 22 by a lift-off method, and further, the second pad electrode 33 is formed by a well-known method. Thereafter, the second light reflection layer 42 is formed to extend from a position on the second electrode 32 to a position on the second pad electrode 33 by a well-known method.

[Step-1820]

Thereafter, the second light reflection layer 42 is fixed onto the support substrate 49 through the bonding layer 48.

[Step-1830]

Subsequently, the light-emitting-element manufacturing substrate 11 is removed to expose the first surface 21a of the first compound semiconductor layer 21. Specifically, first, the light-emitting-element manufacturing substrate 11 is reduced in thickness by a mechanical polishing method, and subsequently, the remainder of the light-emitting-element manufacturing substrate 11 is removed by a CMP method. In this way, the first surface 21a of the first compound semiconductor layer 21 is exposed, and subsequently, the base part surface 90 including the first portion 91 and the second portion 92 is formed in the first surface 21a of the first compound semiconductor layer 21.

[Step-1840]

Thereafter, on the first surface 21a of the first compound semiconductor layer 21 (specifically, on the second portion 92 of the base part surface 90), the mode loss action site (mode loss action layer) 64 having the opening 64A and including $SiO_2$ is formed by a well-known method.

[Step-1850]

Next, the first light reflection layer 41 is formed on the first portion 91 of the first surface 21a of the first compound semiconductor layer 21 exposed at the bottom part of the opening 64A of the mode loss action site 64, and further, the first electrode 31 is formed. Note that, in a region that is not illustrated, a part of the first electrode 31 penetrates the mode loss action site (mode loss action layer) 64 and reaches the first compound semiconductor layer 21. In this way, it is possible to obtain the light emitting element of Example 18 having the structure illustrated in FIG. 58.

In the light emitting element of Example 18 also, the current injection region, the current non-injection inside region surrounding the current injection region, and the current non-injection outside region surrounding the current non-injection inside region are formed in the stacked structure, and the orthogonal projection image of the mode loss action region and the orthogonal projection image of the current non-injection outside region overlap each other. Therefore, as the conceptual diagram is illustrated in FIG. 53B, it is possible to bring an increase or decrease (in Example 18, specifically, an increase) in oscillation mode loss into a desired state. Moreover, control of the oscillation mode loss and control of the light emission state of the light emitting element are independently performable, and therefore it is possible to increase the degree of flexibility of control and the degree of flexibility in designing the light emitting element. Specifically, arranging the current injection region, the current non-injection region, and the mode loss action region in the predetermined positional relationship described above makes it possible to control the magnitude relationship of the oscillation mode losses to be given by the mode loss action region to the fundamental mode and the higher order mode, and, making the oscillation mode loss to be given to the higher order mode relatively large with respect to the oscillation mode loss to be given to the fundamental mode makes it possible to further stabilize the fundamental mode. Further, it is also possible to achieve a reduction in the influence of the reverse lens effect. Moreover, because the light emitting element of Example 18 includes the first portion 91, it is possible to suppress the occurrence of diffraction loss with higher reliability.

In Example 18 also, similarly to Example 14, it is possible to form the current non-injection inside region 62 and the current non-injection outside region 63 by irradiation of the second surface of the second compound semiconductor layer 22 with plasma, an ashing process on the second surface of the second compound semiconductor layer 22, or a reactive ion etching (RIE) process on the second surface of the second compound semiconductor layer 22 (the light emitting element of the (7-B)th configuration). By exposing the current non-injection inside region 62 and the current non-injection outside region 63 to plasma particles in such a manner, electrical conductivity of the second compound semiconductor layer 22 is degraded to bring the current non-injection inside region 62 and the current non-injection outside region 63 into a high-resistance state. That is, the current non-injection inside region 62 and the current non-injection outside region 63 are formed by exposure of the second surface 22b of the second compound semiconductor layer 22 to the plasma particles.

In addition, similarly to Example 15, the second light reflection layer 42 may be configured to have a region that causes light from the first light reflection layer 41 to be reflected or scattered toward the outside of the resonator structure configured by the first light reflection layer 41 and the second light reflection layer 42 (i.e., toward the mode loss action region 65) (the light emitting element of the (7-C)th configuration).

In addition, the mode loss action site (mode loss action layer) 64 may be formed similarly to Example 16 (the light emitting element of the (7-D)th configuration). It is sufficient that the mode loss action site (mode loss action layer) 64 is formed on a region of the first surface 21a of the first compound semiconductor layer 21 that surrounds the convex part. The convex part occupies the current injection region 61, the current injection region 61 and the current non-injection inside region 62. Then, as a result, laser light having a higher order mode generated is confined in the current injection region 61 and the current non-injection inside region 62 by the mode loss action region 65 to thereby cause a decrease in oscillation mode loss. That is, due to the presence of the mode loss action region 65 that acts on increase and decrease in oscillation mode loss, light field intensities in the fundamental mode and the higher order mode to be generated increase in the orthogonal projection image of the current injection region 61 and the current non-injection inside region 62. Also in a modification example of the light emitting element of Example 18 having such a configuration, it is possible not only to suppress oscillation mode losses to be given by the mode loss action region 65 to various modes to thereby put a transverse mode into multi-mode oscillation but also to decrease a threshold of laser oscillation. In addition, as the conceptual diagram is illustrated in (C) of FIG. 53C, the presence of the mode loss action region 65 that acts on increase and decrease (in the modification example of the light emitting element of Example 18, specifically, a decrease) in oscillation mode loss makes it possible to increase, in the orthogonal projection image of the current injection region and the current non-injection inside region, light field intensities in the fundamental mode and the higher order mode to be generated.

Example 19

Example 19 is a modification of Examples 1 to 18, and relates to the light emitting element of the eighth configuration.

Incidentally, a resonator length $L_{OR}$ in a stacked structure configured by two DBR layers and the stacked structure formed therebetween is represented by:

$$L=(m\cdot\lambda_0)/(2\cdot n_{eq})$$

where $n_{eq}$ is an equivalent refractive index of the entire stacked structure, and $\lambda_0$ is a wavelength of laser light to be emitted from a surface emitting laser element (light emitting element). Here, m is a positive integer. Then, in the surface emitting laser element (light emitting element), the wavelength at which oscillation is possible is determined by the resonator length $L_{OR}$. Individual oscillation modes in which oscillation is possible are referred to as longitudinal modes. Of the longitudinal modes, one that coincides with a gain spectrum determined by the active layer is the mode in which laser oscillation is possible. An interval $\Delta\lambda$ of the longitudinal modes is represented by $$\lambda_0^2/(2 n_{eff}\cdot L)$$

where $n_{eff}$ is an effective refractive index. That is, as the resonator length $L_{OR}$ is longer, the interval $\Delta\lambda$ of the longitudinal modes is narrower. Therefore, in a case where the resonator length $L_{OR}$ is long, a plurality of longitudinal modes can exist in the gain spectrum, and oscillation is thus achievable in a plurality of longitudinal modes. Note that letting $\lambda_0$ represent oscillation wavelength, the equivalent refractive index $n_{eq}$ and the effective refractive index $n_{eff}$ have the following relationship.

$$n_{eff}=n_{eq}-\lambda_0\cdot(dn_{eq}/d\lambda_0)$$

Figure 66A:
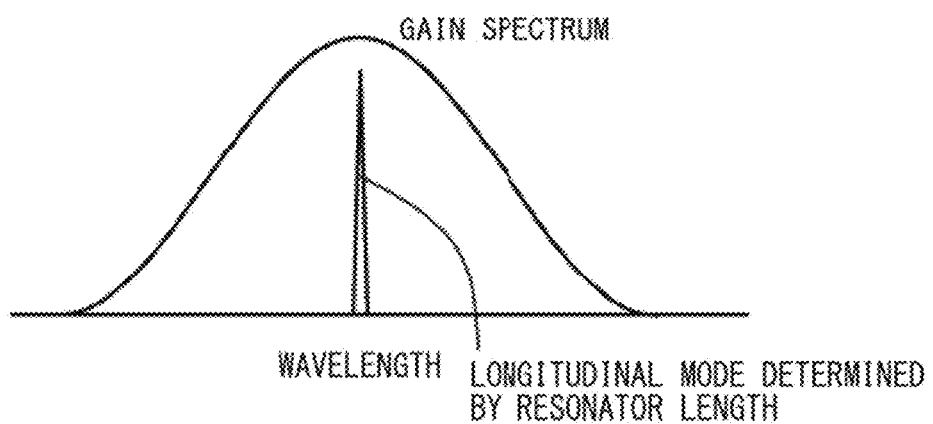
FIGS. 66A and 66B are conceptual diagrams schematically illustrating longitudinal modes present in a gain spectrum determined by an active layer.
Figure 66B:
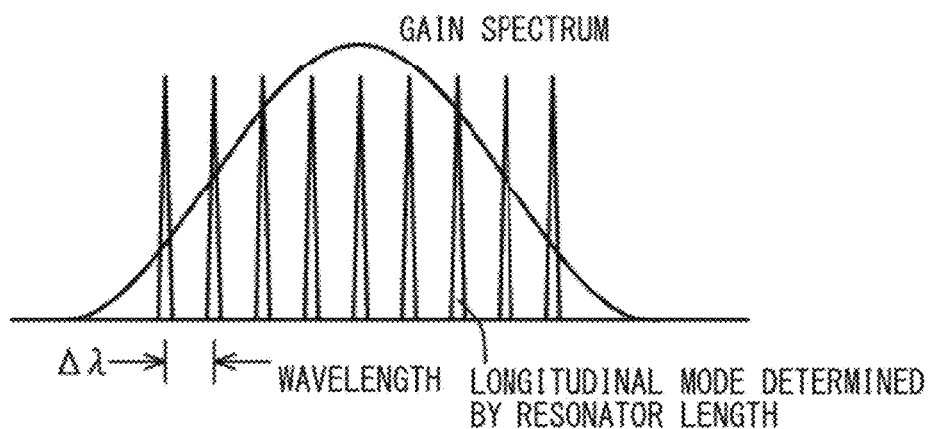
Figure 67:
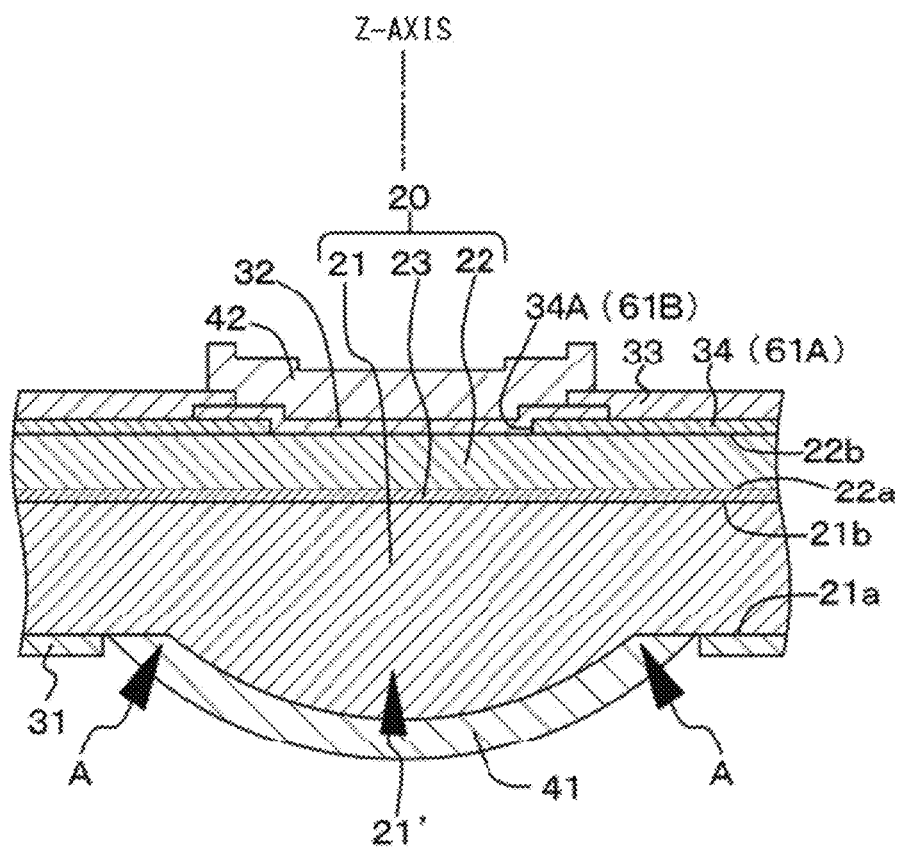
FIG. 67 is a schematic partial end view of an existing light emitting element.

Here, in a case where the stacked structure includes a GaAs-based compound semiconductor layer, the resonator length $L_{OR}$ is normally as short as 1 μm or less, and the laser light in the longitudinal mode emitted from the surface emitting laser element is of one kind (one wavelength) (see a conceptual diagram of FIG. 66A). Therefore, it is possible to accurately control the oscillation wavelength of the laser light in the longitudinal mode emitted from the surface emitting laser element. In contrast, in a case where the stacked structure includes a GaN-based compound semiconductor layer, the resonator length $L_{OR}$ is normally as long as several times the wavelength of the laser light emitted from the surface emitting laser element. Therefore, the laser light in the longitudinal mode which may be emitted from the surface emitting laser element would be of a plurality of kinds (see a conceptual diagram of FIG. 66B), and it is difficult to accurately control the oscillation wavelength of the laser light which may be emitted from the surface emitting laser element.

Figure 59:
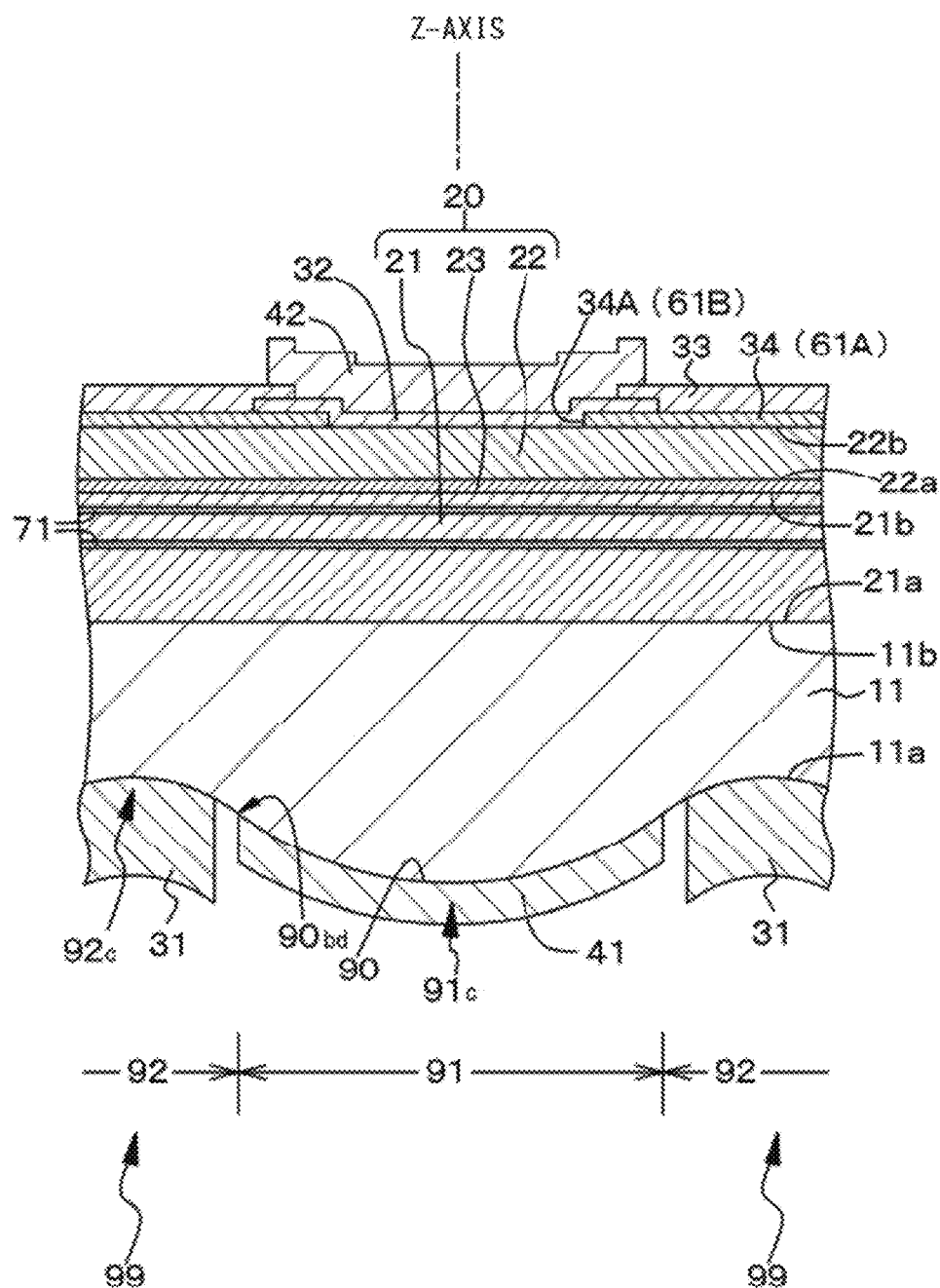
FIG. 59 is a schematic partial cross-sectional view of a light emitting element of Example 19.

As a schematic partial cross-sectional view is illustrated in FIG. 59, in the light emitting element of Example 19 or in light emitting elements of Examples 20 to 22 to be described later, in the stacked structure 20 including the second electrode 32, at least two light absorbing material layers 71, preferably at least four light absorbing material layers 71, and specifically, in Example 19, twenty light absorbing material layers 71, are formed in parallel with a virtual plane occupied by the active layer 23. Note that for simplification of the drawing, only two of the light absorbing material layers 71 are illustrated in the drawing.

In Example 19, the oscillation wavelength (desired oscillation wavelength to be emitted from the light emitting element) $\lambda_0$ is 450 nm. The twenty light absorbing material layers 71 include a compound semiconductor material narrower in band gap than the compound semiconductor configuring the stacked structure 20; specifically, the twenty light absorbing material layers 71 include n-$In_{0.2}Ga_{0.8}N$, and are formed within the first compound semiconductor layer 21. The light absorbing material layers 71 each have a thickness of $\lambda_0/(4\cdot n_{eq})$ or less, specifically 3 nm. Further, the light absorbing material layers 71 each have a light absorption coefficient that is twice or more, specifically $1\times10^3$ times, a light absorption coefficient of the first compound semiconductor layer 21 including an n-GaN layer.

In addition, the light absorbing material layers 71 are located at a minimum amplitude portion generated in a standing wave of light formed inside the stacked structure, and the active layer 23 is located at a maximum amplitude portion generated in the standing wave of light formed inside the stacked structure. A distance between a center in the thickness direction of the active layer 23 and a center in the thickness direction of the light absorbing material layer 71 adjacent to the active layer 23 is 46.5 nm. Further, $0.9\times\{(m\cdot\lambda_0)/(2\cdot n_{eq})\}\leq L_{Abs}\leq 1.1\times\{(m\cdot\lambda_0)/(2\cdot n_{eq})\}$ is satisfied where ne is an equivalent refractive index of two light absorbing material layers 71 and a part of the stacked structure located between the light absorbing material layers 71 (specifically, in Example 19, the first compound semiconductor layer 21) as a whole, and $L_{Abs}$ is the distance between the light absorbing material layers 71. Here, m is 1, or any of two or more integers inclusive of 1. Note that in Example 19, m=1. Therefore, the distance between adjacent light absorbing material layers 71 satisfies $$0.9\times\{\lambda_0/(2\cdot n_{eq})\}\leq L_{Abs}\leq 1.1\times\{\lambda_0/(2\cdot n_{eq})\}$$

in all the plurality of light absorbing material layers 71 (the twenty light absorbing material layers 71). The value of the equivalent refractive index $n_{eq}$ is specifically 2.42, and, when m=1, specifically, $$L_{Abs}=1\times 450/(2\times 2.42)=93.0 \text{ nm}.$$

Note that in some light absorbing material layers 71 among the twenty light absorbing material layers 71, m may be set to any integer of 2 or more.

In manufacturing the light emitting element of Example 19, the stacked structure 20 is formed in a step similar to [Step-100] of Example 1, and at this time, the twenty light absorbing material layers 71 are also formed within the first compound semiconductor layer 21. Except for this point, it is possible for the light emitting element of Example 19 to be manufactured by a method similar to that for the light emitting element of Example 1.

Figure 60:
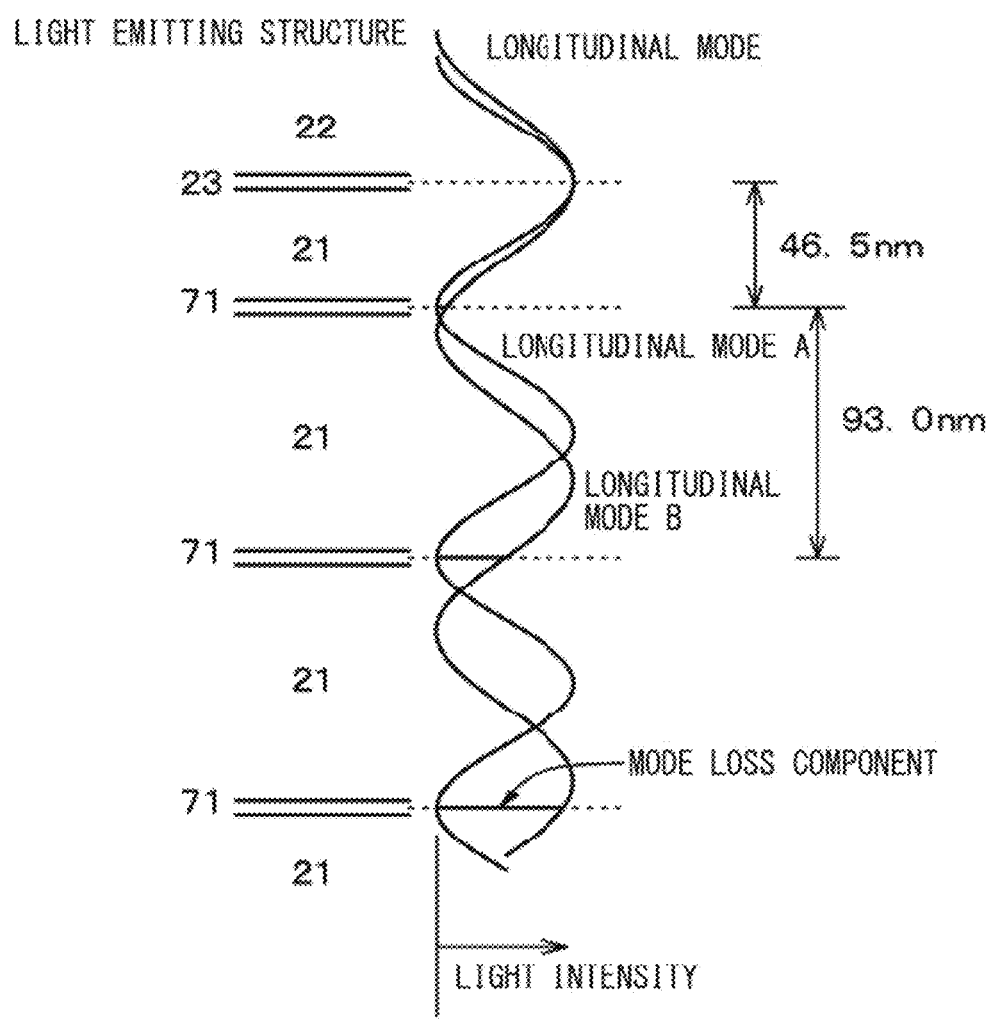
FIG. 60 is a diagram in which the schematic partial cross-sectional view of the light emitting element of Example 19 and two longitudinal modes including a longitudinal mode A and a longitudinal mode B are superimposed on each other.

In a case where a plurality of longitudinal modes is generated in the gain spectrum determined by the active layer 23, a schematic representation thereof is as illustrated in FIG. 60. Note that in FIG. 60, two longitudinal modes including a longitudinal mode A and a longitudinal mode B are illustrated. In addition, in this case, it is assumed that the light absorbing material layers 71 are located at a minimum amplitude portion of the longitudinal mode A, and are not located at a minimum amplitude portion of the longitudinal mode B. This minimizes mode loss of the longitudinal mode A; however, mode loss of the longitudinal mode B is large. In FIG. 60, a mode loss component of the longitudinal mode B is schematically indicated by a solid line. Therefore, oscillation is achieved more easily in the longitudinal mode A than in the longitudinal mode B. Accordingly, by using such a structure, that is, by controlling the position or the period of the light absorbing material layers 71, it is possible to stabilize a specific longitudinal mode, and to facilitate oscillation. Furthermore, it is possible to increase the mode loss for other undesired longitudinal modes, and therefore it is possible to suppress oscillation in such other undesired longitudinal modes.

As described above, in the light emitting element of Example 19, at least two light absorbing material layers are formed inside the stacked structure. This makes it possible to suppress oscillation of laser light in an undesired longitudinal mode, among the laser light in a plurality of longitudinal modes that may be emitted from the surface emitting laser element. As a result, it is possible to accurately control the oscillation wavelength of the laser light to be emitted. Moreover, because the light emitting element of Example 19 includes the first portion 19, it is possible to suppress the occurrence of diffraction loss with reliability.

Example 20

Example 20 is a modification of Example 19. In Example 19, the light absorbing material layers 71 include a compound semiconductor material that is narrower in band gap than the compound semiconductor configuring the stacked structure 20. Meanwhile, in Example 20, ten light absorbing material layers 71 include an impurity-doped compound semiconductor material, specifically, a compound semiconductor material having an impurity concentration (impurity: Si) of $1\times10^{19}/cm^3$ (specifically, n-GaN:Si). In addition, in Example 20, the oscillation wavelength $\lambda_0$ is set to 515 nm. Note that the composition of the active layer 23 is $In_{0.3}Ga_{0.7}N$. In Example 20, m=1; the value of $L_{Abs}$ is 107 nm; the distance between the center in the thickness direction of the active layer 23 and the center in the thickness direction of the light absorbing material layer 71 adjacent to the active layer 23 is 53.5 nm; and the thickness of the light absorbing material layer 71 is 3 nm. Except for the above points, it is possible for the configuration or structure of the light emitting element of Example 20 to be similar to that of the light emitting element of Example 19, and therefore detailed descriptions thereof will be omitted. Note that in some light absorbing material layers 71 among the ten light absorbing material layers 71, m may be set to any integer of 2 or more.

Example 21

Example 21 is also a modification of Example 19. In Example 21, five light absorbing material layers (referred to as "first light absorbing material layers" for the sake of convenience) have a configuration similar to that of the light absorbing material layers 71 of Example 19, that is, include n-$In_{0.3}Ga_{0.7}N$. Further, in Example 21, one light absorbing material layer (referred to as a "second light absorbing material layer" for the sake of convenience) includes a transparent electrically-conductive material. Specifically, the second light absorbing material layer serves also as a second electrode 32 which includes ITO. In Example 21, the oscillation wavelength $\lambda_0$ is set to 450 nm. In addition, m=1 and 2. In the case where m=1, the value of $L_AJ$ is 93.0 nm, the distance between the center in the thickness direction of the active layer 23 and the center in the thickness direction of the first light absorbing material layer adjacent to the active layer 23 is 46.5 nm, and the thickness of the five first light absorbing material layers is 3 nm. That is, in the five first light absorbing material layers, $$0.9\times\{\lambda_0/(2\cdot n_{eq})\}\leq L_{Abs}\leq 1.1\times\{/(2\cdot n_{eq})\}$$

is satisfied. In addition, for the first light absorbing material layer adjacent to the active layer 23 and the second light absorbing material layer, m=2. That is, $0.9\times\{(2\cdot\lambda_0)/(2\cdot n_{eq})\}\leq L_{Abs}\leq 1.1\times\{(2\cdot\lambda_0)/(2\cdot n_{eq})\}$ is satisfied. The light absorption coefficient of the one second light absorbing material layer serving also as the second electrode 32 is 2,000 $cm^{-1}$, its thickness is 30 nm, and the distance from the active layer 23 to the second light absorbing material layer is 139.5 nm. Except for the above points, it is possible for the configuration or structure of the light emitting element of Example 21 to be similar to that of the light emitting element of Example 19, and therefore detailed descriptions thereof will be omitted. Note that in some first light absorbing material layers among the five first light absorbing material layers, m may be set to any integer of 2 or more. Note that unlike Example 19, the number of the light absorbing material layers 71 may be one. In this case also, it is necessary that the positional relationship between the second light absorbing material layer serving also as the second electrode 32 and the light absorbing material layer 71 satisfy the following expression:

$$0.9\times\{(m\cdot\lambda_0)/(2\cdot n_{eq})\}\leq L_{Abs}\leq 1.1\times\{(m\cdot\lambda_0)/(2\cdot n_{eq})\}.$$

Example 22

Example 22 is a modification of Examples 19 to 21. More specifically, a light emitting element of Example 22 includes a surface emitting laser element (vertical resonator laser, VCSEL) that emits laser light from the top surface of the first compound semiconductor layer 21 through the first light reflection layer 41.

Figure 61:
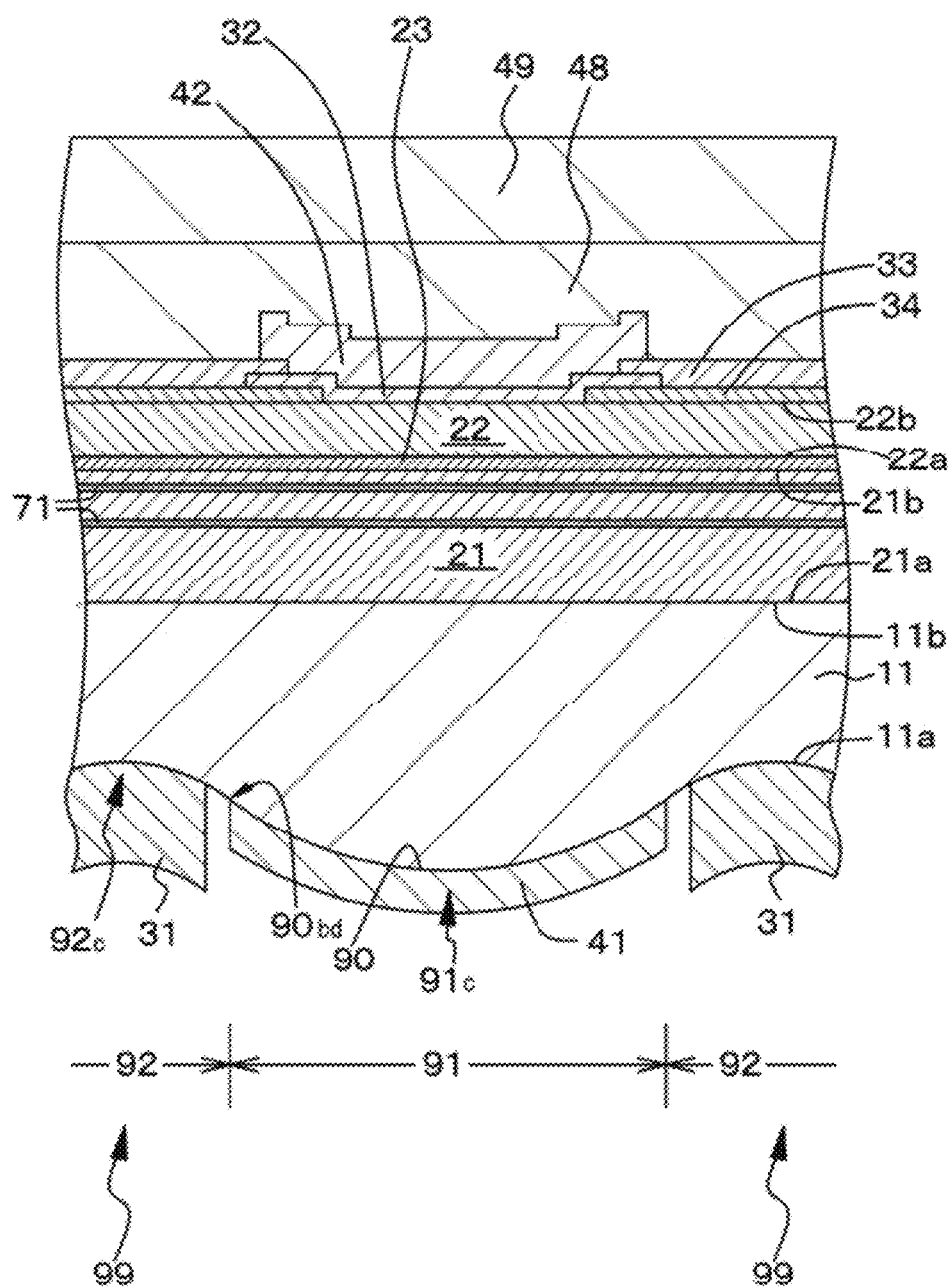
FIG. 61 is a schematic partial cross-sectional view of a light emitting element of Example 22.

In the light emitting element of Example 22, as a schematic partial cross-sectional view thereof is illustrated in FIG. 61, the second light reflection layer 42 is fixed, by a solder bonding method, onto the support substrate 49 including a silicon semiconductor substrate through the bonding layer 48 that includes a gold (Au) layer or a solder layer including tin (Sn).

It is possible for the light emitting element of Example 22 to be manufactured by a method similar to that for the light emitting element of Example 1, except that the twenty light absorbing material layers 71 are also formed within the first compound semiconductor layer 21 and that the support substrate 49 is not removed.

While the present disclosure has been described above on the basis of preferred Examples, the present disclosure is not limited to these Examples. The configurations and structures of the light emitting elements described in Examples are illustrative, and are modifiable on an as-needed basis. The methods of manufacturing the light emitting elements are also modifiable on an as-needed basis. In some cases, by appropriately selecting the bonding layer and the support substrate, it is possible to provide a surface emitting laser element that emits light from the top surface of the second compound semiconductor layer through the second light reflection layer. In some cases, a through hole reaching the first compound semiconductor layer may be formed in a region of each of the second compound semiconductor layer and the active layer that does not affect light emission, and a first electrode insulated from the second compound semiconductor layer and the active layer may be formed in the through hole. The first light reflection layer may extend to the second portion of the base part surface. That is, the first light reflection layer on the base part surface may include a so-called solid film. In addition, in this case, it is sufficient that a through hole is formed in the first light reflection layer extending to the second portion of the base part surface, and a first electrode coupled to the first compound semiconductor layer is formed in the through hole. Further, it is also possible to form the base part surface by providing a sacrificial layer by a nanoimprint method.

The base part surface may be configured by a surface of the second sacrificial layer. In addition, in this case, it is sufficient that the first light reflection layer is formed on the second sacrificial layer above the first sacrificial layer or on a portion of the second sacrificial layer above the first sacrificial layer.

A wavelength conversion material layer (color conversion material layer) may be provided in a light emitting region of the light emitting element. In addition, in this case, white light may be emitted through the wavelength conversion material layer (color conversion material layer). Specifically, in a case where the light produced by the active layer is to be emitted to the outside through the first light reflection layer, it is sufficient that the wavelength conversion material layer (color conversion material layer) is formed on a light emission side of the first light reflection layer, or in a case where the light produced by the active layer is to be emitted to the outside through the second light reflection layer, it is sufficient that the wavelength conversion material layer (color conversion material layer) is formed on a light emission side of the second light reflection layer.

In a case where blue light is to be emitted from a light emitting layer, employing any of the following forms makes it possible for white light to be emitted through the wavelength conversion material layer.

[A] By using a wavelength conversion material layer that converts blue light emitted from the light emitting layer into yellow light, white light with which blue and yellow are mixed is obtained as light emitted from the wavelength conversion material layer.

[B] By using a wavelength conversion material layer that converts blue light emitted from the light emitting layer into orange light, white light with which blue and orange are mixed is obtained as light emitted from the wavelength conversion material layer.

[C] By using a wavelength conversion material layer that converts blue light emitted from the light emitting layer into green light and a wavelength conversion material layer that converts the blue light into red light, white light with which blue, green, and red are mixed is obtained as light emitted from the wavelength conversion material layer.

Alternatively, in a case where ultraviolet light is to be emitted from the light emitting layer, employing any of the following forms makes it possible for white light to be emitted through the wavelength conversion material layer.

[D] By using a wavelength conversion material layer that converts ultraviolet light emitted from the light emitting layer into blue light and a wavelength conversion material layer that converts the ultraviolet light into yellow light, white light with which blue and yellow are mixed is obtained as light emitted from the wavelength conversion material layer.

[E] By using a wavelength conversion material layer that converts ultraviolet light emitted from the light emitting layer into blue light and a wavelength conversion material layer that converts the ultraviolet light into orange light, white light with which blue and orange are mixed is obtained as light emitted from the wavelength conversion material layer.

[F] By using a wavelength conversion material layer that converts ultraviolet light emitted from the light emitting layer into blue light, a wavelength conversion material layer that converts the ultraviolet light into green light, and a wavelength conversion material layer that converts the ultraviolet light into red light, white light with which blue, green, and red are mixed is obtained as light emitted from the wavelength conversion material layer.

Here, specific examples of a wavelength conversion material that is excited by blue light and emits red light include a red light emitting phosphor particle, more specifically, (ME:Eu)S [where "ME" represents at least one kind of atom selected from the group consisting of Ca, Sr, and Ba, and the same applies hereinafter], $(M:Sm)_x(Si,Al)_{12}(O,N)_{16}$ [where "M" represents at least one kind of atom selected from the group consisting of Li, Mg, and Ca, and the same applies hereinafter], $ME_2Si_5N_8:Eu$, $(Ca:Eu)SiN_2$, and $(Ca:Eu)AlSiN_3$. Further, specific examples of a wavelength conversion material that is excited by blue light and emits green light include a green light emitting phosphor particle, more specifically, $(ME:Eu)Ga_2S_4$, $(M:RE)_x(Si,Al)_{12}(O,N)_{16}$ [where "RE" represents Tb and Yb], $(M:Tb)_x(Si,Al)_{12}(O,N)_{16}$, $(M:Yb)$, $(Si,Al)_{12}(O,N)_{16}$, and $Si_{6-Z}Al_ZO_ZN_{8-Z}:Eu$. Further, specific examples of a wavelength conversion material that is excited by blue light and emits yellow light include a yellow light emitting phosphor particle, more specifically, YAG (yttrium-aluminum-garnet)-based phosphor particle. Note that a single kind of wavelength conversion material may be used, or two or more kinds of wavelength conversion materials may be used as a mixture. Furthermore, by using two or more kinds of wavelength conversion materials as a mixture, it is possible to achieve a configuration in which emission light of a color other than yellow, green, and red is to be emitted from a wavelength conversion material mixture product. Specifically, for example, a configuration in which a cyan color is to be emitted may be achieved, in which case, it is sufficient that the green light emitting phosphor particle (e.g., $LaPO_4:Ce$, Tb, $BaMgAl_{10}O_{17}:Eu,Mn$, $Zn_2SiO_4:Mn$, $MgAl_{11}O_{19}:Ce$, Tb, $Y_2SiO_5:Ce,Tb$, or $MgAl_{11}O_{19}:CE,Tb,Mn$) and the blue light emitting phosphor particle (e.g., $BaMgAl_{10}O_{17}:Eu$, $BaMg_2Al_{16}O_{27}:Eu$, $Sr_2P_2O_7:Eu$, $Sr_5(PO_4)_3Cl:Eu$, $(Sr,Ca,Ba,Mg)_5(PO_4)_3Cl:Eu$, $CaWO_4$, or $CaWO_4:Pb$) are used as a mixture.

Further, specific examples of a wavelength conversion material that is excited by ultraviolet light and emits red light include a red light emitting phosphor particle, more specifically, $Y_2O_3:Eu$, $YVO_4:Eu$, $Y(P,V)O_4:Eu$, 3.5MgO·0.5MgF$_2$·Ge$_2$:Mn, CaSiO$_3$:Pb,Mn, Mg$_6$AsO$_{11}$:Mn, (Sr,Mg)$_3$(PO$_4$)$_3$:Sn, La$_2$O$_2$S:Eu, and Y$_2$O$_2$S:Eu. Specific examples of a wavelength conversion material that is excited by ultraviolet light and emits green light include a green light emitting phosphor particle, more specifically, LaPO$_4$: Ce,Th, BaMgAl$_{10}$O$_{17}$:Eu,Mn, Zn$_2$SiO$_4$:Mn, MgAl$_{11}$O$_{19}$: Ce,Tb, Y$_2$SiO$_5$:Ce,Tb, MgAl$_{11}$O$_{19}$:CE,Tb,Mn, and Si$_{6-z}$Al$_z$O$_z$N$_{8-z}$:Eu. Further, specific examples of a wavelength conversion material that is excited by ultraviolet light and emits blue light include a blue light emitting phosphor particle, more specifically, BaMgAl$_{10}$O$_{17}$:Eu, BaMg$_2$Al$_{16}$O$_{27}$:Eu, Sr$_2$P$_2$O$_7$:Eu, Sr$_5$(PO$_4$)$_3$Cl:Eu, (Sr, Ca, Ba, Mg)$_5$(PO$_4$)$_3$Cl:Eu, CaWO$_4$, and CaWO$_4$:Pb. Further, specific examples of a wavelength conversion material that is excited by ultraviolet light and emits yellow light include a yellow light emitting phosphor particle, more specifically, a YAG-based phosphor particle. Note that a single kind of wavelength conversion material may be used, or two or more kinds of wavelength conversion materials may be used as a mixture. Further, by using two or more kinds of wavelength conversion materials as a mixture, it is possible to achieve a configuration in which emission light of a color other than yellow, green, and red is to be emitted from a wavelength conversion material mixture product. Specifically, a configuration in which a cyan color is to be emitted may be achieved, in which case, it is sufficient that the green light emitting phosphor particle and the blue light emitting phosphor particle described above are used as a mixture.

However, the wavelength conversion material (color conversion material) is not limited to the phosphor particles. Other examples of the wavelength conversion material include a light emitting particle of an indirect transition-type silicon-based material having a quantum well structure, such as a two-dimensional quantum well structure, a one-dimensional quantum well structure (quantum wire), or a zero-dimensional quantum well structure (quantum dot), in which a carrier wave function is localized in order to cause carriers to be efficiently converted into light as in a direct transition-type material, thus utilizing a quantum effect. It has also been reported that rare earth atoms added to a semiconductor material sharply emit light by means of an intra-shell transition, and a light emitting particle to which such a technique is applied is also usable.

As described above, examples of the wavelength conversion material may include a quantum dot. As the size (diameter) of the quantum dot becomes smaller, the band gap energy becomes higher, and the wavelength of light emitted from the quantum dot becomes shorter. That is, as the size of the quantum dot is smaller, light having a shorter wavelength (light on the blue light side) is emitted, and as the size of the quantum dot is larger, light having a longer wavelength (light on the red light side) is emitted. Therefore, fixing the material of a quantum dot and adjusting the size of the quantum dot makes it possible to obtain a quantum dot that emits light having a desired wavelength (performing color conversion into a desired color). Specifically, the quantum dot preferably has a core-shell structure. Examples of the material of the quantum dot include, but are not limited to: Si; Se; chalcopyrite-based compounds including CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$; perovskite-based materials; group III-V compounds including GaAs, GaP, InP, InAs, InGaAs, AlGaAs, InGaP, AlGaInP, InGaAsP, and GaN; CdSe, CdSeS, CdS, CdTe, In$_2$Se$_3$, In$_2$S$_3$, Bi$_2$Se$_3$, Bi$_2$S$_3$, ZnSe, ZnTe, ZnS, HgTe, HgS, PbSe, PbS, TiO$_2$, etc.

It is to be noted that the present disclosure may have the following configurations.

[A01]<<Light Emitting Element Array: First Aspect>>

A light emitting element array including a plurality of light emitting elements arranged,
  each of the light emitting elements including:
  a stacked structure including a stack of
    a first compound semiconductor layer having a first surface, and a second surface opposed to the first surface,
    an active layer facing the second surface of the first compound semiconductor layer, and
    a second compound semiconductor layer having a first surface facing the active layer and a second surface opposed to the first surface;
  a first light reflection layer formed on a base part surface located on a first surface side of the first compound semiconductor layer; and
  a second light reflection layer formed on a second surface side of the second compound semiconductor layer and having a flat shape, in which
  the base part surface extends to a peripheral region surrounded by the plurality of light emitting elements, and
  the base part surface has a concavo-convex shape, and is differentiable.

[A02] The light emitting element array according to [A01], in which the base part surface is smooth.

[A03]<<Light Emitting Element of First Configuration>>

The light emitting element array according to [A01] or [A02], in which a first portion of the base part surface on which the first light reflection layer is formed has an upwardly convex shape with respect to the second surface of the first compound semiconductor layer.

[A04]<<Light Emitting Element of (1-A)th Configuration>>

The light emitting element array according to [A03], in which a second portion of the base part surface occupying the peripheral region has a downwardly convex shape with respect to the second surface of the first compound semiconductor layer.

[A05] The light emitting element array according to [A04], in which a center part of the first portion of the base part surface is located on a vertex of a square lattice.
  [A06] The light emitting element array according to [A04], in which a center part of the first portion of the base part surface is located on a vertex of an equilateral triangular lattice.

[A07]<<Light Emitting Element of (1-B)th Configuration>>

The light emitting element array according to [A03], in which a second portion of the base part surface occupying the peripheral region has, toward a center part of the peripheral region, a downwardly convex shape, and an upwardly convex shape extending from the downwardly convex shape, with respect to the second surface of the first compound semiconductor layer.

[A08] The light emitting element array according to [A07], in which $$L_2 > L_1$$

is satisfied, where $L_1$ is a distance from the second surface of the first compound semiconductor layer to a center part of the first portion of the base part surface, and $L_2$ is a distance from the second surface of the first compound semiconductor layer to a center part of the second portion of the base part surface.

[A09] The light emitting element array according to [A07] or [A08], in which $$R_1 > R_2$$

is satisfied, where $R_1$ is a radius of curvature of a center part of the first portion of the base part surface (i.e., a radius of curvature of the first light reflection layer), and $R_2$ is a radius of curvature of a center part of the second portion of the base part.

[A10] The light emitting element array according to any one of [A07] to [A09], in which a center part of the first portion of the base part surface is located on a vertex of a square lattice.

[A11] The light emitting element array according to [A10], in which a center part of the second portion of the base part surface is located on a vertex of a square lattice.

[A12] The light emitting element array according any one of [A07] to [A09], in which a center part of the first portion of the base part surface is located on a vertex of an equilateral triangular lattice.

[A13] The light emitting element array according to [A12], in which a center part of the second portion of the base part surface is located on a vertex of an equilateral triangular lattice.

[A14] The light emitting element array according any one of [A07] to [A13], in which a radius of curvature $R_2$ of a center part of the second portion of the base part surface is greater than or equal to $1 \times 10^{-6}$ m, preferably greater than or equal to $3 \times 10^{-6}$ m, and more preferably greater than or equal to $5 \times 10^{-6}$ m.

[A15] <<Light Emitting Element of (1-C)th Configuration>>

The light emitting element array according to [A03], in which, with respect to the second surface of the first compound semiconductor layer, a second portion of the base part surface occupying the peripheral region has an annular convex shape surrounding the first portion of the base part surface and a downwardly convex shape extending from the annular convex shape toward the first portion of the base part surface.

[A16] The light emitting element array according to [A15], in which $$L_2' > L_1$$

is satisfied, where $L_1$ is a distance from the second surface of the first compound semiconductor layer to a center part of the first portion of the base part surface, and $L_2'$ is a distance from the second surface of the first compound semiconductor layer to an apex part of the annular convex shape of the second portion of the base part surface.

[A17] The light emitting element array according to [A15] or [A16], in which $$R_1 > R_2'$$

is satisfied, where $R_1$ is a radius of curvature of a center part of the first portion of the base part surface (i.e., a radius of curvature of the first light reflection layer), and $R_2'$ is a radius of curvature of an apex part of the annular convex shape of the second portion of the base part surface.

[A18] The light emitting element array according to any one of [A15] to [A17], in which a radius of curvature $R_2'$ of an apex part of the annular convex shape of the second portion of the base part surface is greater than or equal to $1 \times 10^{-6}$ m, preferably greater than or equal to $3 \times 10^{-6}$ m, and more preferably greater than or equal to $5 \times 10^{-6}$ m.

[A19] The light emitting element array according to any one of [A07] to [A18], in which a bump is provided in a portion on the second surface side of the second compound semiconductor layer opposed to a convex-shaped portion in the second portion of the base part surface.

[A20] The light emitting element array according to any one of [A04] to [A06], in which a bump is provided in a portion on the second surface side of the second compound semiconductor layer opposed to a center part of the first portion of the base part surface.

[A21] The light emitting element array according to any one of [A01] to [A20], in which a formation pitch of the light emitting elements is greater than or equal to 3 μm and smaller than or equal to 50 μm, preferably greater than or equal to 5 μm and smaller than or equal to 30 μm, and more preferably greater than or equal to 8 μm and smaller than or equal to 25 μm.

[A22] The light emitting element array according any one of [A01] to [A21], in which a radius of curvature $R_1$ of a center part of a first portion of the base part surface (i.e., a radius of curvature of the first light reflection layer) is greater than or equal to $1 \times 10^{-5}$ m, preferably greater than or equal to $3 \times 10^{-5}$ m.

[A23] The light emitting element array according any one of [A01] to [A22], in which the stacked structure includes at least one kind of material selected from the group consisting of a GaN-based compound semiconductor, an InP-based compound semiconductor, and a GaAs-based compound semiconductor.

[A24] The light emitting element array according any one of [A01] to [A23], in which $1 \times 10^{-5}$ m $\leq L_{OR}$ is satisfied, where $L_{OR}$ is a resonator length.

[A25] The light emitting element array according any one of [A01] to [A24], in which a figure drawn by a first portion of the base part surface when the base part surface is cut along a virtual plane including a stacking direction of the stacked structure is a part of a circle or a part of a parabola.

[A26] <<Light Emitting Element Array: Second Aspect>>

A light emitting element array including a plurality of light emitting elements arranged, each of the light emitting elements including:
a stacked structure including a stack of
a first compound semiconductor layer having a first surface, and a second surface opposed to the first surface,
an active layer facing the second surface of the first compound semiconductor layer, and
a second compound semiconductor layer having a first surface facing the active layer and a second surface opposed to the first surface;
a first light reflection layer formed on a base part surface located on a first surface side of the first compound semiconductor layer; and
a second light reflection layer formed on a second surface side of the second compound semiconductor layer and having a flat shape, in which
when a portion of the base part surface on which the first light reflection layer is formed is referred to as a first portion of the base part surface and a portion of the base part surface extending from a part of the first portion of the base part surface is referred to as a second portion of the base part surface, and when a virtual plane that is orthogonal to an orthogonal projection image of a line segment connecting a center of the first portion of the base part surface and a center of the second portion of the base part surface onto the first surface of the first compound semiconductor layer, that passes through the center of the first portion of the base part surface and that is parallel to a thickness direction of the stacked structure is referred to as a virtual η$\xi$ plane, a height of the first portion of the base part surface is higher than a height of the second portion of the base part surface, when cut along a virtual plane parallel to the virtual η$\xi$ plane, the first portion of the base part surface has a cross-sectional shape that is an upwardly convex shape and is differentiable, and the second portion of the base part surface has a cross-sectional shape that is an upwardly convex shape and is differentiable, with respect to the second surface of the first compound semiconductor layer, and the first portion of the base part surface and the second portion of the base part surface are continuous smoothly.

[A27] The light emitting element array according to [A26], in which when a virtual plane that is parallel to the thickness direction of the stacked structure, that passes through the center of the first portion of the base part surface and that is orthogonal to the virtual η$\xi$ plane is referred to as a virtual $\zeta\xi$ plane, when the first portion and the second portion of the base part surface are cut along the virtual (plane, the first portion of the base part surface has an upwardly convex shape, and has a downwardly convex shape at and near a boundary region with the second portion, whereas the second portion of the base part surface has a downwardly convex shape at and near a boundary region with the first portion, with respect to the second surface of the first compound semiconductor layer.

[A28] The light emitting element array according to [A27], in which the base part surface at and near the boundary region between the first portion and the second portion has a saddle shape.

[A29] The light emitting element array according to any one of [A26] to [A28], in which a center part of the first portion of the base part surface is located on a vertex of a square lattice.

[A30] The light emitting element array according to any one of [A26] to [A28], in which a center part of the first portion of the base part surface is located on a vertex of an equilateral triangular lattice.

[A31] The light emitting element array according to any one of [A26] to [A30], in which a distance from the second surface of the first compound semiconductor layer to a center part of the first portion of the base part surface is longer than a distance from the second surface of the first compound semiconductor layer to a center part of the second portion of the base part surface.

[A32] The light emitting element array according to any one of [A26] to [A31], in which $R_1 > R_2$ is satisfied, where $R_1$ is a radius of curvature of a center part of the first portion of the base part surface (i.e., a radius of curvature of the first light reflection layer), and $R_2$ is a radius of curvature of a center part of the second portion of the base part.

[A33] The light emitting element array according to any one of [A26] to [A32], in which a bump is provided in a portion on the second surface side of the second compound semiconductor layer opposed to a center part of the first portion of the base part surface.

[A34] The light emitting element array according to any one of [A26] to [A33], in which a formation pitch of the light emitting elements is greater than or equal to 3 μm and smaller than or equal to 50 μm, preferably greater than or equal to 5 μm and smaller than or equal to 30 μm, and more preferably greater than or equal to 8 μm and smaller than or equal to 25 μm.

[A35] The light emitting element array according to any one of [A26] to [A34], in which a radius of curvature $R_1$ of a center part of the first portion of the base part surface (i.e., a radius of curvature of the first light reflection layer) is greater than or equal to $1 \times 10^{-5}$ m, preferably greater than or equal to $3 \times 10^{-5}$ m.

[A36] The light emitting element array according to any one of [A26] to [A35], in which the stacked structure includes at least one kind of material selected from the group consisting of a GaN-based compound semiconductor, an InP-based compound semiconductor, and a GaAs-based compound semiconductor.

[A37] The light emitting element array according to any one of [A26] to [A36], in which $1 \times 10^{-5}$ m$\leq L_{OR}$ is satisfied, where $L_{OR}$ is a resonator length.

[A38] The light emitting element array according to any one of [A26] to [A37], in which a figure drawn by the first portion of the base part surface when the base part surface is cut along a virtual plane including the stacking direction of the stacked structure is a part of a circle or a part of a parabola.

[A39]<<Light Emitting Element of Second Configuration>>

The light emitting element array according to any one of [A01] to [A38], in which the first surface of the first compound semiconductor layer configures the base part surface.

[A40]<<Light Emitting Element of Third Configuration>>

The light emitting element array according to any one of [A01] to [A38], in which a compound semiconductor substrate is provided between the first surface of the first compound semiconductor layer and the first light reflection layer, and the base part surface is configured by a surface of the compound semiconductor substrate.

[A41]<<Light Emitting Element of Fourth Configuration>>

The light emitting element array according to any one of [A01] to [A38], in which a base is provided between the first surface of the first compound semiconductor layer and the first light reflection layer, or a compound semiconductor substrate and a base are provided between the first surface of the first compound semiconductor layer and the first light reflection layer, and the base part surface is configured by a surface of the base.

[A42] The light emitting element array according to [A41], in which a material configuring the base is at least one kind of material selected from the group consisting of a transparent dielectric material such as $TiO_2$, $Ta_2O_5$, or $SiO_2$, a silicone-based resin, and an epoxy-based resin.

[A43] The light emitting element array according to any one of [A01] to [A42], in which the first light reflection layer is formed on the base part surface.

[A44] The light emitting element array according to any one of [A01] to [A43], in which a value of a thermal conductivity of the stacked structure is higher than a value of a thermal conductivity of the first light reflection layer.

[B01]<<Light Emitting Element Array of Fifth Configuration>>

The light emitting element array according to any one of [A01] to [A44], in which the second compound semiconductor layer is provided with a current injection region, and a current non-injection region surrounding the current injection region, and a shortest distance $D_{CI}$ from an area centroid point of the current injection region to a boundary between the current injection region and the current non-injection region satisfies an expression below:

$$D_{CI} \geq \omega_0/2$$

provided that $$\omega_0^2 \equiv (\lambda_0/\pi)\{L_{OR}(R_1 - L_{OR})\}^{1/2}$$

where $\lambda_0$: wavelength (oscillation wavelength) of desired light mainly emitted from the light emitting element;

$L_{OR}$: resonator length; and $R_1$: radius of curvature of a center part of a first portion of the base part surface (i.e., radius of curvature of the first light reflection layer).

[B02] The light emitting element array according to [B01], further including:

a mode loss action site that is provided on the second surface of the second compound semiconductor layer and configures a mode loss action region acting on increase and decrease in oscillation mode loss;

a second electrode formed to extend from a position on the second surface of the second compound semiconductor layer to a position on the mode loss action site; and a first electrode electrically coupled to the first compound semiconductor layer, in which the second light reflection layer is formed on the second electrode, the current injection region, a current non-injection inside region surrounding the current injection region, and a current non-injection outside region surrounding the current non-injection inside region are formed in the stacked structure, and an orthogonal projection image of the mode loss action region and an orthogonal projection image of the current non-injection outside region overlap each other.

[B03] The light emitting element array according to [B01] or [B02], in which a radius $r_1$ of the first portion satisfies $$\omega_0 \leq r_1 \leq 20 \cdot \omega_0.$$

[B04] The light emitting element array according to any one of [B01] to [B03], in which $D_{CI} \geq \omega_0$ is satisfied.

[B05] The light emitting element array according to any one of [B01] to [B04], in which $R_1 \leq 1 \times 10^{-3}$ m is satisfied.

[C01]<<Light Emitting Element Array of Sixth Configuration>>

The light emitting element array according to any one of [A01] to [A44], further including:

a mode loss action site that is provided on the second surface of the second compound semiconductor layer and configures a mode loss action region acting on increase and decrease in oscillation mode loss;

a second electrode formed to extend from a position on the second surface of the second compound semiconductor layer to a position on the mode loss action site; and a first electrode electrically coupled to the first compound semiconductor layer, in which the second light reflection layer is formed on the second electrode, a current injection region, a current non-injection inside region surrounding the current injection region, and a current non-injection outside region surrounding the current non-injection inside region are formed in the stacked structure, and an orthogonal projection image of the mode loss action region and an orthogonal projection image of the current non-injection outside region overlap each other.

[C02] The light emitting element array according to [C01], in which the current non-injection outside region is located below the mode loss action region.

[C03] The light emitting element array according to [C01] or [C02], in which $$0.01 \leq S_1/(S_1 + S_2) \leq 0.7$$

is satisfied, where $S_1$ is an area of an orthogonal projection image of the current injection region, and $S_2$ is an area of an orthogonal projection image of the current non-injection inside region.

[C04] The light emitting element array according to any one of [C01] to [C03], in which the current non-injection inside region and the current non-injection outside region are formed by ion injection into the stacked structure.

[C05] The light emitting element array according to [C04], in which ion species is at least one kind of ion selected from the group consisting of boron, proton, phosphorus, arsenic, carbon, nitrogen, fluorine, oxygen, germanium, and silicon.

[C06]<<Light Emitting Element Array of (6-B)th Configuration>>

The light emitting element array according to any one of [C01] to [C05], in which the current non-injection inside region and the current non-injection outside region are formed by irradiation of the second surface of the second compound semiconductor layer with plasma, by an ashing process on the second surface of the second compound semiconductor layer, or by a reactive ion etching process on the second surface of the second compound semiconductor layer.

[C07]<<Light Emitting Element Array of (6-C)th Configuration>>

The light emitting element array according to any one of [C01] to [C06], in which the second light reflection layer includes a region that causes light from the first light reflection layer to be reflected or scattered toward an outside of a resonator structure configured by the first light reflection layer and the second light reflection layer.

[C08] The light emitting element array according to any one of [C01] to [C07], in which $$OL_0 > OL_2$$

is satisfied, where $OL_2$ is an optical distance from the active layer to the second surface of the second compound semiconductor layer in the current injection region, and $OL_0$ is an optical distance from the active layer to a top surface of the mode loss action site in the mode loss action region.

[C09] The light emitting element array according to any one of [C01] to [C08], in which light having a higher order mode generated is scattered and lost by the mode loss action region toward an outside of a resonator structure configured by the first light reflection layer and the second light reflection layer to thereby cause an increase in oscillation mode loss.

[C10] The light emitting element array according to any one of [C01] to [C09], in which the mode loss action site includes a dielectric material, a metal material, or an alloy material.

[C11] The light emitting element array according to [C10], in which
the mode loss action site includes the dielectric material, and
an optical thickness of the mode loss action site is of a value other than an integer multiple of ¼ of a wavelength of light generated in the light emitting element array.

[C12] The light emitting element array according to [C10], in which
the mode loss action site includes the dielectric material, and
an optical thickness of the mode loss action site is an integer multiple of ¼ of a wavelength of light generated in the light emitting element array.

[C13]<<Light Emitting Element Array of (6-D)th Configuration>>
The light emitting element array according to any one of [C01] to [C03], in which
a convex part is formed on the second surface side of the second compound semiconductor layer, and
the mode loss action site is formed on a region of the second surface of the second compound semiconductor layer surrounding the convex part.

[C14] The light emitting element array according to [C13], in which $$OL_0 < OL_2$$

is satisfied, where $OL_2$ is an optical distance from the active layer to the second surface of the second compound semiconductor layer in the current injection region, and $OL_0$ is an optical distance from the active layer to a top surface of the mode loss action site in the mode loss action region.

[C15] The light emitting element array according to [C13] or [C14], in which light having a higher order mode generated is confined in the current injection region and the current non-injection inside region by the mode loss action region to thereby cause a decrease in oscillation mode loss.

[C16] The light emitting element array according to any one of [C13] to [C15], in which the mode loss action site includes a dielectric material, a metal material, or an alloy material.

[C17] The light emitting element array according to any one of [C01] to [C16], in which the second electrode includes a transparent electrically-conductive material.

[D01]<<Light Emitting Element Array of Seventh Configuration>>
The light emitting element array according to any one of [A01] to [A44], further including:
a second electrode formed on the second surface of the second compound semiconductor layer;
a second light reflection layer formed on the second electrode;
a mode loss action site that is provided on the first surface of the first compound semiconductor layer and configures a mode loss action region acting on increase and decrease in oscillation mode loss; and
a first electrode electrically coupled to the first compound semiconductor layer, in which
the first light reflection layer is formed to extend from a position on the first surface of the first compound semiconductor layer to a position on the mode loss action site,
a current injection region, a current non-injection inside region surrounding the current injection region, and a current non-injection outside region surrounding the current non-injection inside region are formed in the stacked structure, and
an orthogonal projection image of the mode loss action region and an orthogonal projection image of the current non-injection outside region overlap each other.

[D02] The light emitting element array according to [D01], in which $$0.01 \leq S_1'/(S_1'+S_2') \leq 0.7$$

is satisfied, where $S_1$ is an area of an orthogonal projection image of the current injection region, and $S_2$ is an area of an orthogonal projection image of the current non-injection inside region.

[D03]<<Light Emitting Element Array of (7-A)th Configuration>>
The light emitting element array according to [D01] or [D02], in which the current non-injection inside region and the current non-injection outside region are formed by ion injection into the stacked structure.

[D04] The light emitting element array according to [D03], in which ion species is at least one kind of ion selected from the group consisting of boron, proton, phosphorus, arsenic, carbon, nitrogen, fluorine, oxygen, germanium, and silicon.

[D05]<<Light Emitting Element Array of (7-B)th Configuration>>
The light emitting element array according to any one of [D01] to [D04], in which the current non-injection inside region and the current non-injection outside region are formed by irradiation of the second surface of the second compound semiconductor layer with plasma, by an ashing process on the second surface of the second compound semiconductor layer, or by a reactive ion etching process on the second surface of the second compound semiconductor layer.

[D06]<<Light Emitting Element Array of (7-C)th Configuration>>
The light emitting element array according to any one of [D01] to [D05], in which the second light reflection layer includes a region that causes light from the first light reflection layer to be reflected or scattered toward an outside of a resonator structure configured by the first light reflection layer and the second light reflection layer.

[D07] The light emitting element array according to any one of [D01] to [D06], in which $$OL_0' > OL_1'$$

is satisfied, where $OL_1'$ is an optical distance from the active layer to the first surface of the first compound semiconductor layer in the current injection region, and $OL_0'$ is an optical distance from the active layer to a top surface of the mode loss action site in the mode loss action region.

[D08] The light emitting element array according to any one of [D01] to [D07], in which light having a higher order mode generated is scattered and lost by the mode loss action region toward an outside of a resonator structure configured by the first light reflection layer and the second light reflection layer to thereby cause an increase in oscillation mode loss.

[D09] The light emitting element array according to any one of [D01] to [D08], in which the mode loss action site includes a dielectric material, a metal material, or an alloy material.

[D10] The light emitting element array according to [D09], in which the mode loss action site includes the dielectric material, and an optical thickness of the mode loss action site is of a value other than an integer multiple of ¼ of a wavelength of light generated in the light emitting element array.

[D11] The light emitting element array according to [D09], in which
the mode loss action site includes the dielectric material, and
an optical thickness of the mode loss action site is an integer multiple of ¼ of a wavelength of light generated in the light emitting element array.

[D12] <<Light Emitting Element Array of (7-D)th Configuration>>
The light emitting element array according to [D01] or [D02], in which
a convex part is formed on the first surface side of the first compound semiconductor layer, and
the mode loss action site is formed on a region of the first surface of the first compound semiconductor layer surrounding the convex part.

[D13] The light emitting element array according to [D12], in which $$OL_0' < OL_1'$$

is satisfied, where $OL_1'$ is an optical distance from the active layer to the first surface of the first compound semiconductor layer in the current injection region, and $OL_0'$ is an optical distance from the active layer to a top surface of the mode loss action site in the mode loss action region.

[D14] The light emitting element array according to [D01] or [D02], in which
a convex part is formed on the first surface side of the first compound semiconductor layer, and
the mode loss action site is configured by a region of the first compound semiconductor layer surrounding the convex part.

[D15] The light emitting element array according to any one of [D12] to [D14], in which light having a higher order mode generated is confined in the current injection region and the current non-injection inside region by the mode loss action region to thereby cause a decrease in oscillation mode loss.

[D16] The light emitting element array according to any one of [D12] to [D15], in which the mode loss action site includes a dielectric material, a metal material, or an alloy material.

[D17] The light emitting element array according to any one of [D01] to [D16], in which the second electrode includes a transparent electrically-conductive material.

[E01] <<Light Emitting Element Array of Eighth Configuration>>
The light emitting element array according to any one of [A01] to [D17], in which at least two light absorbing material layers are formed in parallel with a virtual plane occupied by the active layer in the stacked structure including the second electrode.

[E02] The light emitting element array according to [E01], in which at least four light absorbing material layers are formed.

[E03] The light emitting element array according to [E01] or [E02], in which $$0.9 \times \{(m \cdot \lambda_0)/(2 \cdot n_{ep})\} \leq L_{Abs} \leq 1.1 \times \{(m \cdot \lambda_0)/(2 \cdot n_{ep})\}$$

is satisfied, where $\lambda_0$ is an oscillation wavelength, n, is an equivalent refractive index of two light absorbing material layers and a part of the stacked structure located between the light absorbing material layers as a whole, and $L_{Abs}$ is a distance between the light absorbing material layers, provided that m is 1, or any of two or more integers inclusive of 1.

[E04] The light emitting element array according to any one of [E01] to [E03], in which the light absorbing material layers each have a thickness of $\lambda_0/(4 \cdot n_{eq})$.

[E05] The light emitting element array according to any one of [E01] to [E04], in which the light absorbing material layers are located at a minimum amplitude portion generated in a standing wave of light formed inside the stacked structure.

[E06] The light emitting element array according to any one of [E01] to [E05], in which the active layer is located at a maximum amplitude portion generated in a standing wave of light formed inside the stacked structure.

[E07] The light emitting element array according to any one of [E01] to [E06], in which the light absorbing material layers each have a light absorption coefficient that is twice or more a light absorption coefficient of a compound semiconductor configuring the stacked structure.

[E08] The light emitting element array according to any one of [E01] to [E07], in which the light absorbing material layers include at least one kind of material selected from the group consisting of a compound semiconductor material having a band gap narrower than that of a compound semiconductor configuring the stacked structure, a compound semiconductor material doped with an impurity, a transparent electrically-conductive material, and a light-reflection-layer constituent material having a light absorbing property.

[F01] <<Light Emitting Element: First Aspect>>
A light emitting element including:
a stacked structure including a stack of
  a first compound semiconductor layer having a first surface, and a second surface opposed to the first surface,
  an active layer facing the second surface of the first compound semiconductor layer, and
  a second compound semiconductor layer having a first surface facing the active layer and a second surface opposed to the first surface;
a first light reflection layer formed on a base part surface located on a first surface side of the first compound semiconductor layer; and
a second light reflection layer formed on a second surface side of the second compound semiconductor layer and having a flat shape, in which
the base part surface extends to a peripheral region, and
the base part surface has a concavo-convex shape, and is differentiable.

[F02] <<Light Emitting Element: Second Aspect>>
A light emitting element including:
a stacked structure including a stack of a first compound semiconductor layer having a first surface, and a second surface opposed to the first surface,
an active layer facing the second surface of the first compound semiconductor layer, and
a second compound semiconductor layer having a first surface facing the active layer and a second surface opposed to the first surface;
a first light reflection layer formed on a base part surface located on a first surface side of the first compound semiconductor layer; and
a second light reflection layer formed on a second surface side of the second compound semiconductor layer and having a flat shape, in which
when a portion of the base part surface on which the first light reflection layer is formed is referred to as a first portion of the base part surface and a portion of the base part surface extending from a part of the first portion of the base part surface is referred to as a second portion of the base part surface, and
when a virtual plane that is orthogonal to an orthogonal projection image of a line segment connecting a center of the first portion of the base part surface and a center of the second portion of the base part surface onto the first surface of the first compound semiconductor layer, that passes through the center of the first portion of the base part surface and that is parallel to a thickness direction of the stacked structure is referred to as a virtual η ξ plane,
a height of the first portion of the base part surface is higher than a height of the second portion of the base part surface,
when cut along a virtual plane parallel to the virtual η ξ plane, the first portion of the base part surface has a cross-sectional shape that is an upwardly convex shape and is differentiable, and the second portion of the base part surface has a cross-sectional shape that is an upwardly convex shape and is differentiable, with respect to the second surface of the first compound semiconductor layer, and
the first portion of the base part surface and the second portion of the base part surface are continuous smoothly.

[G01]<<Method of Manufacturing Light Emitting Element Array: First Aspect>>

A method of manufacturing a light emitting element array including a plurality of light emitting elements, each of the light emitting elements including
a stacked structure including a stack of
a first compound semiconductor layer having a first surface, and a second surface opposed to the first surface,
an active layer facing the second surface of the first compound semiconductor layer, and
a second compound semiconductor layer having a first surface facing the active layer and a second surface opposed to the first surface,
a first light reflection layer formed on a base part surface located on a first surface side of the first compound semiconductor layer, and
a second light reflection layer formed on a second surface side of the second compound semiconductor layer and having a flat shape, in which
the base part surface extends to a peripheral region surrounded by the plurality of light emitting elements, and
the base part surface has a concavo-convex shape, and is differentiable,
the method including:
forming, after forming the stacked structure, the second light reflection layer on the second surface side of the second compound semiconductor layer; subsequently,
making, after forming a first sacrificial layer on a first portion of the base part surface on which the first light reflection layer is to be formed, a surface of the first sacrificial layer into a convex shape; thereafter,
forming a second sacrificial layer on a second portion of the base part surface exposed between the first sacrificial layers and on the first sacrificial layers, and making a surface of the second sacrificial layer into a concavo-convex shape; subsequently,
etching back the second sacrificial layer and the first sacrificial layer and further etching back inwardly from the base part surface, and thereby forming a convex part in the first portion of the base part surface and forming at least a concave part in the second portion of the base part surface, with respect to the second surface of the first compound semiconductor layer; and thereafter
forming the first light reflection layer on the first portion of the base part surface.

[G02]<<Method of Manufacturing Light Emitting Element Array: Second Aspect>>

A method of manufacturing a light emitting element array including a plurality of light emitting elements, each of the light emitting elements including
a stacked structure including a stack of
a first compound semiconductor layer having a first surface, and a second surface opposed to the first surface,
an active layer facing the second surface of the first compound semiconductor layer, and
a second compound semiconductor layer having a first surface facing the active layer and a second surface opposed to the first surface,
a first light reflection layer formed on a base part surface located on a first surface side of the first compound semiconductor layer, and
a second light reflection layer formed on a second surface side of the second compound semiconductor layer and having a flat shape, in which
the base part surface extends to a peripheral region surrounded by the plurality of light emitting elements, and
the base part surface has a concavo-convex shape, and is differentiable,
the method including:
forming, after forming the stacked structure, the second light reflection layer on the second surface side of the second compound semiconductor layer; subsequently,
making, after forming a first sacrificial layer on a first portion of the base part surface on which the first light reflection layer is to be formed, a surface of the first sacrificial layer into a convex shape; thereafter,
etching back the first sacrificial layer and further etching back inwardly from the base part surface, and thereby forming a convex part in the first portion of the base part surface with respect to the second surface of the first compound semiconductor layer; subsequently,
etching back, after forming a second sacrificial layer on the base part surface, the second sacrificial layer and further etching back inwardly from the base part surface, and thereby forming a convex part in the first portion of the base part surface and forming at least a concave part in a second portion of the base part surface, with respect to the second surface of the first compound semiconductor layer; and thereafter, forming the first light reflection layer on the first portion of the base part surface.

[G03]<<Method of Manufacturing Light Emitting Element Array: Third Aspect>>

A method of manufacturing a light emitting element array including
  a stacked structure including a stack of
    a first compound semiconductor layer having a first surface, and a second surface opposed to the first surface,
    an active layer facing the second surface of the first compound semiconductor layer, and
    a second compound semiconductor layer having a first surface facing the active layer and a second surface opposed to the first surface,
  a first light reflection layer formed on a base part surface located on a first surface side of the first compound semiconductor layer, and
  a second light reflection layer formed on a second surface side of the second compound semiconductor layer and having a flat shape, in which
  when a portion of the base part surface on which the first light reflection layer is formed is referred to as a first portion of the base part surface and a portion of the base part surface extending from a part of the first portion of the base part surface is referred to as a second portion of the base part surface, and
  when a virtual plane that is orthogonal to an orthogonal projection image of a line segment connecting a center of the first portion of the base part surface and a center of the second portion of the base part surface onto the first surface of the first compound semiconductor layer, that passes through the center of the first portion of the base part surface and that is parallel to a thickness direction of the stacked structure is referred to as a virtual $\eta\xi$ plane,
  a height of the first portion of the base part surface is higher than a height of the second portion of the base part surface,
the method including:
  forming, after forming the stacked structure, the second light reflection layer on the second surface side of the second compound semiconductor layer; subsequently,
  performing formation of a first sacrificial layer on the first portion of the base part surface on which the first light reflection layer is to be formed and, in conjunction therewith, formation of a second sacrificial layer extending from the first sacrificial layer and thinner than the first sacrificial layer on the second portion of the base part surface, and thereafter making the first sacrificial layer and the second sacrificial layer into a convex shape; subsequently,
  etching back the first sacrificial layer and the second sacrificial layer and further etching back inwardly from the base part surface, and thereby obtaining the base part surface, in which, when cut along a virtual plane parallel to the virtual $\eta\xi$ plane, the first portion of the base part surface has a cross-sectional shape that is an upwardly convex shape and is differentiable, and the second portion of the base part surface has a cross-sectional shape that is an upwardly convex shape and is differentiable, with respect to the second surface of the first compound semiconductor layer, and the first portion of the base part surface and the second portion of the base part surface are continuous smoothly; and thereafter,
  forming the first light reflection layer on the first portion of the base part surface.

[G04] The method of manufacturing a light emitting element array according to [G03], in which the performing of formation of the first sacrificial layer on the first portion of the base part surface on which the first light reflection layer is to be formed and, in conjunction therewith, formation of the second sacrificial layer extending from the first sacrificial layer and thinner than the first sacrificial layer on the second portion of the base part surface includes
  after forming a sacrificial layer or material layer on the base part surface,
  exposing the sacrificial layer or material layer to light by using an exposure apparatus, with a formation pitch of the first portion of the base part surface on which the first light reflection layer is to be formed being set to be smaller than a pattern formation limit width of the exposure apparatus being used.

[G05]<<Method of Manufacturing Light Emitting Element Array: Nanoimprint Method>>

A method of manufacturing a light emitting element array including a plurality of light emitting elements, each of the light emitting elements including
  a stacked structure including a stack of
    a first compound semiconductor layer having a first surface, and a second surface opposed to the first surface,
    an active layer facing the second surface of the first compound semiconductor layer, and
    a second compound semiconductor layer having a first surface facing the active layer and a second surface opposed to the first surface,
  a first light reflection layer formed on a base part surface located on a first surface side of the first compound semiconductor layer, and
  a second light reflection layer formed on a second surface side of the second compound semiconductor layer and having a flat shape, in which
  the base part surface extends to a peripheral region surrounded by the plurality of light emitting elements, and
  the base part surface has a concavo-convex shape, and is differentiable,
the method including:
  preparing a mold having a surface complementary to the base part surface;
  forming, after forming the stacked structure, the second light reflection layer on the second surface side of the second compound semiconductor layer; subsequently,
  transferring, after forming a sacrificial layer on the base part surface on which the first light reflection layer is to be formed, a shape of the surface of the mold complementary to the base part surface onto the sacrificial layer and forming a concavo-convex part in the sacrificial layer; thereafter,
  etching back the sacrificial layer and further etching back inwardly from the base part surface, and thereby forming a convex part in a first portion of the base part surface and forming at least a concave part in a second portion of the base part surface, with respect to the second surface of the first compound semiconductor layer; and thereafter forming the first light reflection layer on the first portion of the base part surface.

REFERENCE SIGNS LIST 10A, 10B, 10C, 10D, 10E, 10F . . . light emitting element (surface light emitting element, surface emitting laser element), 11 . . . compound semiconductor substrate (substrate for manufacturing light emitting element array), 11a . . . first surface of the compound semiconductor substrate (substrate for manufacturing light emitting element array) facing a first compound semiconductor layer, 11b . . . second surface of the compound semiconductor substrate (substrate for manufacturing light emitting element array) facing the first compound semiconductor layer, 20 . . . stacked structure, 21 . . . first compound semiconductor layer, 21a . . . first surface of the first compound semiconductor layer, 21b . . . second surface of the first compound semiconductor layer, 22 . . . second compound semiconductor layer, 22a . . . first surface of the second compound semiconductor layer, 22b . . . second surface of the second compound semiconductor layer, 23 . . . active layer (light emitting layer), 31 . . . first electrode, 32 . . . second electrode, 33 . . . second pad electrode, 34 . . . insulating layer (current confinement layer), 34A . . . opening provided in the insulating layer (current confinement layer), 35 . . . bump, 41 . . . first light reflection layer, 42 . . . second light reflection layer, 42A . . . inclined part having a normal tapered shape formed in the second light reflection layer, 48 . . . bonding layer, 49 . . . support substrate, 51, 61 . . . current injection region, 61A . . . current injection region, 61B . . . current non-injection region, 52, 62 . . . current non-injection inside region, 53, 63 . . . current non-injection outside region, 54, 64 . . . mode loss action site (mode loss action layer), 54A, 54B, 64A . . . opening formed in the mode loss action site, 55, 65 . . . mode loss action region, 71 . . . light absorbing material layer, 81, 81', 181, 181', 281' . . . first sacrificial layer, 82, 182, 182', 282' . . . second sacrificial layer, 83, 83' . . . portion of the first sacrificial layer for forming a center part of a second portion, 90, 190 . . . base part surface, $90_{bd}$ . . . boundary between a first portion and the second portion, 91, 191 . . . first portion of the base part surface, 91' . . . convex part formed in the first portion of the base part surface, 91A . . . convex part formed in the first portion of the base part surface, $91_c$ . . . center part of the first portion of the base part surface, 191' . . . boundary region of the first portion with the second portion, 191A . . . boundary region between the first portion of the base part surface and an exposed surface in the first surface of the first compound semiconductor layer, 92, 192 . . . second portion of the base part surface, 92A . . . concave part formed in the second portion of the base part surface, $92_c$ . . . center part of the second portion of the base part surface, $92_b$ . . . portion having a downwardly convex shape of the second portion of the base part surface, 192' . . . boundary region of the second portion with the first portion, 192A . . . boundary region between the second portion of the base part surface and the exposed surface in the first surface of the first compound semiconductor layer, 93 . . . annular convex shape surrounding the first portion of the base part surface, 94A . . . downwardly convex shape extending from the annular convex shape toward the first portion of the base part surface, 94B . . . region of the second portion of the base part surface surrounded by the annular convex shape, 95 . . . base, 96 . . . convexo-concave part for forming the base part surface, 97 . . . planarization film, 99 . . . peripheral region

The invention claimed is:

1. A light emitting element array, comprising:
a plurality of light emitting elements, wherein each light emitting element of the plurality of light emitting elements comprises:
a stacked structure that includes a stack of
a first compound semiconductor layer that has a first surface and a second surface, wherein the second surface is opposite to the first surface,
an active layer that faces the second surface of the first compound semiconductor layer, and
a second compound semiconductor layer that has a third surface and a fourth surface, wherein
the third surface faces the active layer, and
the fourth surface is opposite to the third surface;
a first light reflection layer on a first portion of a base part surface, wherein the base part surface is located on a side of the first surface of the first compound semiconductor layer; and
a second light reflection layer on a side of the fourth surface of the second compound semiconductor layer, wherein
the second light reflection layer has a flat shape,
the base part surface extends to a peripheral region surrounded by the plurality of light emitting elements,
the base part surface has a concavo-convex shape,
the first portion of the base part surface has an upwardly convex shape with respect to the second surface of the first compound semiconductor layer, and
the base part surface is differentiable.

2. The light emitting element array according to claim 1, wherein the base part surface is smooth.

3. The light emitting element array according to claim 1, wherein a second portion of the base part surface that occupies the peripheral region has a downwardly convex shape with respect to the second surface of the first compound semiconductor layer.

4. The light emitting element array according to claim 3, wherein a center part of the first portion of the base part surface is located on a vertex of a square lattice.

5. The light emitting element array according to claim 3, wherein a center part of the first portion of the base part surface is located on a vertex of an equilateral triangular lattice.

6. The light emitting element array according to claim 1, wherein
a second portion of the base part surface that occupies the peripheral region includes:
a downwardly convex shape towards a center part of the peripheral region, and
an upwardly convex shape that extends from the downwardly convex shape, with respect to the second surface of the first compound semiconductor layer.

7. The light emitting element array according to claim 6, wherein
$L_2 > L_1$ is satisfied, where
L$_1$ is a distance from the second surface of the first compound semiconductor layer to a center part of the first portion of the base part surface, and
L$_2$ is a distance from the second surface of the first compound semiconductor layer to a center part of the second portion of the base part surface.

8. The light emitting element array according to claim 6, wherein a center part of the first portion of the base part surface is located on a vertex of a square lattice.

9. The light emitting element array according to claim 6, wherein a center part of the second portion of the base part surface is located on a vertex of a square lattice.

10. The light emitting element array according to claim 6, wherein a center part of the first portion of the base part surface is located on a vertex of a first equilateral triangular lattice.

11. The light emitting element array according to claim 10, wherein a center part of the second portion of the base part surface is located on a vertex of a second equilateral triangular lattice.

12. The light emitting element array according to claim 6, further comprising
a bump in a portion on the side of the fourth surface of the second compound semiconductor layer, wherein
the portion is opposed to a convex-shaped portion in the second portion of the base part surface.

13. The light emitting element array according to claim 1, wherein, with respect to the second surface of the first compound semiconductor layer, a second portion of the base part surface that occupies the peripheral region includes:
an annular convex shape that surrounds the first portion of the base part surface, and
a downwardly convex shape that extends from the annular convex shape toward the first portion of the base part surface.

14. The light emitting element array according to claim 1, wherein a formation pitch of the plurality of light emitting elements is greater than or equal to 3 μm and smaller than or equal to 50 μm.

15. The light emitting element array according to claim 1, wherein the stacked structure further includes at least one kind of material selected from the group consisting of a GaN-based compound semiconductor, an InP-based compound semiconductor, and a GaAs-based compound semiconductor.

16. A light emitting element array, comprising:
a plurality of light emitting elements, wherein each light emitting element of the plurality of light emitting elements comprises-including:
a stacked structure that includes a stack of
a first compound semiconductor layer that has a first surface and a second surface, wherein the second surface is opposite to the first surface,
an active layer that faces the second surface of the first compound semiconductor layer, and
a second compound semiconductor layer that has a third surface and a fourth surface, wherein
the third surface faces the active layer, and
the fourth surface is opposite to the third surface;
a first light reflection layer on a first portion of a base part surface, wherein the base part surface is located on a side of the first surface of the first compound semiconductor layer; and
a second light reflection layer on a side of the fourth surface of the second compound semiconductor layer, wherein
the second light reflection layer has a flat shape,
a second portion of the base part surface extends from a part of the first portion of the base part surface,
in a case where a virtual plane that is orthogonal to an orthogonal projection image of a line segment onto the first surface of the first compound semiconductor layer, that passes through a center of the first portion of the base part surface and that is parallel to a thickness direction of the stacked structure is referred to as a virtual nξ plane, a height of the first portion of the base part surface is higher than a height of the second portion of the base part surface, wherein the line segment connects the center of the first portion of the base part surface and a center of the second portion of the base part surface,
based on a cut along a virtual plane parallel to the virtual nξ plane, the first portion of the base part surface has a cross-sectional shape that is an upwardly convex shape and is differentiable, and the second portion of the base part surface has a cross-sectional shape that is an upwardly convex shape and is differentiable, with respect to the second surface of the first compound semiconductor layer, and
the first portion of the base part surface and the second portion of the base part surface are continuous smoothly.

17. A light emitting element, comprising:
a stacked structure that includes a stack of
a first compound semiconductor layer that has a first surface and a second surface, wherein the second surface is opposite to the first surface,
an active layer that faces the second surface of the first compound semiconductor layer, and
a second compound semiconductor layer that has a third surface and a fourth surface, wherein
the third surface faces the active layer, and
the fourth surface is opposite to the third surface;
a first light reflection layer on a first portion of a base part surface, wherein the base part surface is located on a side of the first surface of the first compound semiconductor layer; and
a second light reflection layer on a side of the fourth surface of the second compound semiconductor layer, wherein
the second light reflection layer has a flat shape,
the base part surface extends to a peripheral region,
the base part surface has a concavo-convex shape,
the first portion of the base part surface has an upwardly convex shape with respect to the second surface of the first compound semiconductor layer, and
the base part surface is differentiable.

18. A light emitting element, comprising:
a stacked structure that includes a stack of
a first compound semiconductor layer that has a first surface and a second surface, wherein the second surface is opposite to the first surface,
an active layer that faces the second surface of the first compound semiconductor layer, and
a second compound semiconductor layer that has a third surface and a fourth surface, wherein
the third surface faces the active layer, and the fourth surface is opposite to the third surface;
a first light reflection layer on a first portion of a base part surface, wherein the base part surface is located on a side of the first surface of the first compound semiconductor layer; and
a second light reflection layer on a side of the fourth surface of the second compound semiconductor layer, wherein
the second light reflection layer has a flat shape, a second portion of the base part surface extends from a part of the first portion of the base part surface,
when in a case where a virtual plane that is orthogonal to an orthogonal projection image of a line segment onto the first surface of the first compound semiconductor layer, that passes through a center of the first portion of the base part surface and that is parallel to a thickness direction of the stacked structure is referred to as a virtual ng plane, a height of the first portion of the base part surface is higher than a height of the second portion of the base part surface, wherein the line segment connects the center of the first portion of the base part surface and a center of the second portion of the base part surface,
based on a cut along a virtual plane parallel to the virtual na plane, the first portion of the base part surface has a cross-sectional shape that is an upwardly convex shape and is differentiable, and the second portion of the base part surface has a cross-sectional shape that is an upwardly convex shape and is differentiable, with respect to the second surface of the first compound semiconductor layer, and
the first portion of the base part surface and the second portion of the base part surface are continuous smoothly.

19. A method of manufacturing a light emitting element array including a plurality of light emitting elements, each of the plurality of light emitting elements including:
a stacked structure including a stack of
a first compound semiconductor layer having a first surface, and a second surface opposite to the first surface,
an active layer facing the second surface of the first compound semiconductor layer, and
a second compound semiconductor layer having a third surface facing the active layer and a fourth surface opposite to the third surface,
a first light reflection layer on a base part surface located on a side of the first surface of the first compound semiconductor layer, and
a second light reflection layer on a side of the fourth surface of the second compound semiconductor layer, wherein
the second light reflection layer has a flat shape,
the base part surface extends to a peripheral region surrounded by the plurality of light emitting elements,
the base part surface has a concavo-convex shape, and
the base part surface is differentiable,
the method comprising:
forming, after forming the stacked structure, the second light reflection layer on the side of the fourth surface of the second compound semiconductor layer;
making, after forming a plurality of first sacrificial layers on a first portion of the base part surface on which the first light reflection layer is to be formed, a surface of the plurality of first sacrificial layers into a convex shape;
forming a second sacrificial layer on a second portion of the base part surface exposed between the plurality of first sacrificial layers and on the plurality of first sacrificial layers, and making a surface of the second sacrificial layer into a concavo-convex shape;
etching back the second sacrificial layer and the plurality of first sacrificial layers and further etching back inwardly from the base part surface, and thereby forming a convex part in the first portion of the base part surface and forming at least a concave part in the second portion of the base part surface, with respect to the second surface of the first compound semiconductor layer; and
forming the first light reflection layer on the first portion of the base part surface.

20. A method of manufacturing a light emitting element array including a plurality of light emitting elements, each of the plurality of light emitting elements including:
a stacked structure including a stack of
a first compound semiconductor layer having a first surface, and a second surface opposite to the first surface,
an active layer facing the second surface of the first compound semiconductor layer, and
a second compound semiconductor layer having a third surface facing the active layer and a fourth surface opposite to the third surface,
a first light reflection layer on a base part surface located on a side of the first surface of the first compound semiconductor layer, and
a second light reflection layer on a side of the fourth surface of the second compound semiconductor layer, wherein
the second light reflection layer has a flat shape,
the base part surface extends to a peripheral region surrounded by the plurality of light emitting elements,
the base part surface has a concavo-convex shape, and
the base part surface is differentiable,
the method comprising:
forming, after forming the stacked structure, the second light reflection layer on the side of the fourth surface of the second compound semiconductor layer;
making, after forming a first sacrificial layer on a first portion of the base part surface on which the first light reflection layer is to be formed, a surface of the first sacrificial layer into a convex shape;
etching back the first sacrificial layer and further etching back inwardly from the base part surface, and thereby forming a convex part in the first portion of the base part surface with respect to the second surface of the first compound semiconductor layer;
etching back, after forming a second sacrificial layer on the base part surface, the second sacrificial layer and further etching back inwardly from the base part surface, and thereby forming a convex part in the first portion of the base part surface and forming at least a concave part in a second portion of the base part surface, with respect to the second surface of the first compound semiconductor layer; and
forming the first light reflection layer on the first portion of the base part surface.

21. A method of manufacturing a light emitting element array including:

a stacked structure including a stack of
- a first compound semiconductor layer having a first surface, and a second surface opposite to the first surface,
- an active layer facing the second surface of the first compound semiconductor layer, and
- a second compound semiconductor layer having a third surface facing the active layer and a fourth surface opposite to the third surface, a first light reflection layer on a base part surface located on a side of the first surface of the first compound semiconductor layer, and a second light reflection layer on a side of the fourth surface of the second compound semiconductor layer, wherein in a case where a portion of the base part surface on which the first light reflection layer is formed is referred to as a first portion of the base part surface and a portion of the base part surface extending from a part of the first portion of the base part surface is referred to as a second portion of the base part surface, and in a case where a virtual plane that is orthogonal to an orthogonal projection image of a line segment onto the first surface of the first compound semiconductor layer, that passes through a center of the first portion of the base part surface and that is parallel to a thickness direction of the stacked structure is referred to as a virtual ng plane, a height of the first portion of the base part surface is higher than a height of the second portion of the base part surface, wherein the line segment connects the center of the first portion of the base part surface and a center of the second portion of the base part surface, the method comprising:

forming, after forming the stacked structure, the second light reflection layer on the side of the fourth surface of the second compound semiconductor layer;

performing formation of a first sacrificial layer on the first portion of the base part surface on which the first light reflection layer is to be formed and, in conjunction therewith, formation of a second sacrificial layer extending from the first sacrificial layer and thinner than the first sacrificial layer on the second portion of the base part surface, and thereafter making the first sacrificial layer and the second sacrificial layer into a convex shape;

etching back the first sacrificial layer and the second sacrificial layer and further etching back inwardly from the base part surface, and thereby obtaining the base part surface, wherein, in a case where a cut is along a virtual plane parallel to the virtual ng plane, the first portion of the base part surface has a cross-sectional shape that is an upwardly convex shape and is differentiable, and the second portion of the base part surface has a cross-sectional shape that is an upwardly convex shape and is differentiable, with respect to the second surface of the first compound semiconductor layer, and the first portion of the base part surface and the second portion of the base part surface are continuous smoothly; and forming the first light reflection layer on the first portion of the base part surface.

22. The method of manufacturing a light emitting element array according to claim 21, wherein the performing of the formation of the first sacrificial layer on the first portion of the base part surface on which the first light reflection layer is to be formed and, in conjunction therewith, the formation of the second sacrificial layer extending from the first sacrificial layer and thinner than the first sacrificial layer on the second portion of the base part surface includes after forming a sacrificial layer or a material layer on the base part surface, exposing the sacrificial layer or the material layer to light based on an exposure apparatus, with a formation pitch of the first portion of the base part surface on which the first light reflection layer is to be formed being set to be smaller than a pattern formation limit width of the exposure apparatus used.

* * * * *